US011953827B2

(12) United States Patent
Fukushima et al.

(10) Patent No.: US 11,953,827 B2
(45) Date of Patent: Apr. 9, 2024

(54) MOLECULAR RESIST COMPOSITION AND PATTERNING PROCESS

(71) Applicant: Shin-Etsu Chemical Co., Ltd., Tokyo (JP)

(72) Inventors: Masahiro Fukushima, Joetsu (JP); Masaki Ohashi, Joetsu (JP); Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 289 days.

(21) Appl. No.: 16/858,092

(22) Filed: Apr. 24, 2020

(65) Prior Publication Data

US 2020/0379345 A1 Dec. 3, 2020

(30) Foreign Application Priority Data

May 27, 2019 (JP) ................................ 2019-098585

(51) Int. Cl.
*G03F 7/004* (2006.01)
*G03F 7/16* (2006.01)
(Continued)

(52) U.S. Cl.
CPC .............. *G03F 7/004* (2013.01); *G03F 7/162* (2013.01); *G03F 7/20* (2013.01); *G03F 7/30* (2013.01)

(58) Field of Classification Search
CPC . G03F 7/004; G03F 7/162; G03F 7/20; G03F 7/30; G03F 7/322; G03F 7/38; G03F 7/0046; G03F 7/0045; G03F 7/0397; G03F 7/0392; G03F 7/039; G03F 7/168; G03F 7/2002; G03F 7/085; G03F 7/027;
(Continued)

(56) References Cited

U.S. PATENT DOCUMENTS 5,786,131 A 7/1998 Allen et al.
8,227,183 B2 7/2012 Tsubaki et al.
(Continued)

FOREIGN PATENT DOCUMENTS

JP 8-15865 A 1/1996
JP 2007-145797 A 6/2007
(Continued)

OTHER PUBLICATIONS

Lawson et al., "Single Molecule Chemically Amplified Resists Based on Ionic and Non-ionic PAGs", Proc. of SPIE, (2008), vol. 6923, 69230K. Cited in Specification. (10 pages).
(Continued)

*Primary Examiner* — Mark F. Huff
*Assistant Examiner* — Richard David Champion
(74) *Attorney, Agent, or Firm* — WHDA, LLP

(57) ABSTRACT

A molecular resist composition is provided comprising (A) a betaine type onium compound having a sulfonium cation moiety and a sulfonate anion moiety in a common molecule, the sulfonium cation moiety having a phenyl group substituted with an optionally heteroatom-containing monovalent hydrocarbon group, the phenyl group being attached to the sulfur atom, and (B) an organic solvent, the resist composition being free of a base resin. When processed by lithography using KrF, ArF excimer laser, EB or EUV, the resist composition is improved in dissolution contrast, EL, MEF, and LWR.

10 Claims, 5 Drawing Sheets

(51) Int. Cl.
*G03F 7/20* (2006.01)
*G03F 7/30* (2006.01)

(58) Field of Classification Search
CPC .. C07D 307/00; C07D 487/14; C07D 245/02; C07D 498/14; C08F 116/10; C08F 116/36; C08F 116/14; C08F 220/302; C08F 220/301; C08F 124/00; C08F 128/06; C08F 220/1812; C08F 220/1818; C08F 220/303; C07C 69/73; C07C 69/76; C07C 69/86; C07C 69/54; C07C 2601/08; C07C 2601/14; C07C 2603/74; H01L 51/0047; H01L 51/0018
See application file for complete search history.

(56) References Cited

U.S. PATENT DOCUMENTS

| | | | |
|---|---|---|---|
| 8,951,718 B2 | 2/2015 | Tsubaki et al. | |
| 9,291,904 B2 | 3/2016 | Tsubaki et al. | |
| 9,348,220 B2 | 5/2016 | Aqad et al. | |
| 9,465,298 B2 | 10/2016 | Tsubaki et al. | |
| 2015/0140489 A1* | 5/2015 | Robinson | G03F 7/38 540/578 |
| 2017/0008982 A1* | 1/2017 | Hasegawa | G03F 7/0045 |
| 2018/0059543 A1 | 3/2018 | Mitsui et al. | |
| 2020/0048191 A1 | 2/2020 | Suga et al. | |
| 2020/0319550 A1* | 10/2020 | Fukushima | C07D 319/06 |
| 2020/0379345 A1 | 12/2020 | Fukushima et al. | |

FOREIGN PATENT DOCUMENTS

| | | | |
|---|---|---|---|
| JP | 2008-281974 A | 11/2008 | |
| JP | 2008-281975 A | 11/2008 | |
| JP | 4554665 B2 | 9/2010 | |
| JP | 5061484 B2 | 10/2012 | |
| JP | 2013-8020 A | 1/2013 | |
| JP | 5317181 B2 | 10/2013 | |
| JP | 2014-102334 A | 6/2014 | |
| JP | 2015-060034 A | 3/2015 | |
| JP | 2015-63472 A | 4/2015 | |
| JP | 5723802 B2 | 5/2015 | |
| JP | 5865725 B2 | 2/2016 | |
| JP | 2016-147879 A | 8/2016 | |
| JP | 6130109 B2 | 5/2017 | |
| JP | 6155013 B2 | 6/2017 | |
| JP | 2018-43977 A | 3/2018 | |
| JP | 2020169157 A * | 10/2020 | C07C 309/12 |
| TW | 201821402 A | 6/2018 | |
| TW | I637939 B | 10/2018 | |

OTHER PUBLICATIONS

Dammel et al., "193 nm Immersion Lithography—Taking the Plunge", Journal of Photopolymer Science and Technology, 2004, vol. 17, No. 4, pp. 587-601. (18 pages).

Office Action dated Feb. 19, 2021, issued in TW Application No. 109110957 (counterpart to U.S. Appl. No. 16/839,402). (9 pages).

Office Action dated Jul. 7, 2021, issued in KR Application No. 10-2020-0041166 (counterpart to U.S. Appl. No. 16/839,402), with English translation. (14 pages).

Non-Final Office Action dated Mar. 16, 2022, issued in U.S. Appl. No. 16/839,402. (22 pages).

Office Action dated Feb. 17, 2022, issued in counterpart KR application No. 10-2020-0063173, with English Translation. (10 pages).

* cited by examiner

MOLECULAR RESIST COMPOSITION AND PATTERNING PROCESS

CROSS-REFERENCE TO RELATED APPLICATION

This non-provisional application claims priority under 35 U.S.C. § 119(a) on Patent Application No. 2019-098585 filed in Japan on May 27, 2019, the entire contents of which are hereby incorporated by reference.

TECHNICAL FIELD

This invention relates to a molecular resist composition comprising a betaine type onium compound, and a pattern forming process using the resist composition.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With the advance of miniaturization, it is confirmed that line width roughness (LWR) has an impact on the performance of transistors. A reduction of LWR is thus demanded. Effective approaches for reducing LWR include an increase in the amount of PAG added, addition of an acid generator capable of generating an acid which does not cause deprotection of a protective group, and binding of PAG to a polymer backbone. Highly transparent PAGs which do not detract from transparency even when added in larger amounts, acid generators capable of generating weak acids, and PAG-bound polymers have been developed.

Conventional resist compositions based on polymers or base resins sometimes suffer from problems including the occurrence of LWR due to uneven film quality, the occurrence of LWR and the formation of bridging defects due to uneven dissolution of resist film in a developer. Efforts to develop molecular resist compositions based on low molecular weight compounds were made under the hypothesis that low molecular weight compounds are more effective for reducing LWR due to the smallness of their molecular size than polymers.

Such low molecular weight compounds include phenol compounds such as acid labile group-substituted phenolic low nuclear compounds, calix-resorcin, NORIA, and truxene, cyclodextrin, and the like. Patent Document 1 discloses a molecular resist composition comprising acid labile group-substituted cholate. As compared with polymeric resist compositions, molecular resist compositions allow for extensive and non-uniform acid diffusion. For this reason, molecular resist compositions fail to achieve a LWR level surpassing polymeric resist compositions.

Non-Patent Document 1 describes a molecular resist composition comprising a photoacid generator in the form of a salt compound having an ionic bond between cation and anion and a non-ionic photoacid generator. Upon exposure, the photoacid generator is decomposed to generate a corresponding strong acid. During development in an alkaline developer, the exposed region of resist film is dissolved whereas the unexposed region is insolubilized, which indicates an improved dissolution contrast. A pattern is formed in this way. The molecular resist composition using such PAGs achieves improvements in performance to some, but unsatisfactory extent. For meeting the demand for further miniaturization, it would be desirable to have a molecular resist composition which is improved in resolution and LWR.

CITATION LIST

Patent Document 1: JP-A H08-015865 (U.S. Pat. No. 5,786,131)

Non-Patent Document 1: Proc. of SPIE Vol. 6923, 69230K (2008)

DISCLOSURE OF INVENTION

An object of the invention is to provide a molecular resist composition based on a low molecular weight compound which is improved in lithographic performance factors including dissolution contrast, exposure latitude (EL), mask error factor (MEF), and LWR when processed by photolithography using high-energy radiation such as KrF excimer laser, ArF excimer laser, EB or EUV; and a pattern forming process using the resist composition.

The inventors have found that when a molecular resist composition is designed as comprising a betaine type onium compound of specific structure and a solvent, a sufficient dissolution contrast is available from only the photo-decomposition reaction of the onium compound upon exposure, so that the resist composition is improved in lithographic performance factors such as EL, MEF, and LWR, and is quite useful for precise micropatterning.

In one aspect, the invention provides a molecular resist composition comprising:

(A) a betaine type onium compound having a sulfonium cation moiety and a sulfonate anion moiety in a common molecule, the sulfonium cation moiety having a sulfur atom and a phenyl group substituted with an optionally heteroatom-containing $C_1$-$C_{50}$ monovalent hydrocarbon group, the phenyl group being attached to the sulfur atom, and (B) an organic solvent, the resist composition being free of a base resin.

Typically, the betaine type onium compound has the formula (A).

(A)

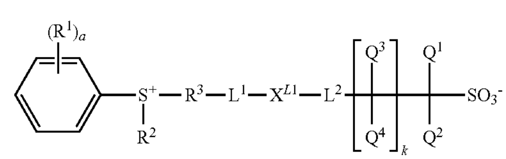

Herein a is an integer of 1 to 5, k is an integer of 0 to 3; $Q^1$ and $Q^2$ are each independently fluorine or a $C_1$-$C_6$ fluoroalkyl group; $Q^3$ and $Q^4$ are each independently hydrogen, fluorine or a $C_1$-$C_6$ fluoroalkyl group; $L^1$ and $L^2$ are each independently a single bond, ether bond, ester bond, sulfonate bond, carbonate bond, or carbamate bond; $X^{L1}$ is a single bond or a $C_1$-$C_{40}$ divalent hydrocarbon group which may contain a heteroatom; $R^1$ is a $C_3$-$C_{40}$ monovalent hydrocarbon group which may contain a heteroatom other than fluorine or a $C_1$-$C_{40}$ monovalent fluorinated hydrocarbon group which may contain a heteroatom other than fluorine, in case of a ≥2, $R^1$ may be identical or different and two $R^1$ may bond together to form a ring with the atoms to which they are attached; $R^2$ is a $C_1$-$C_{50}$ monovalent hydrocarbon group which may contain a heteroatom; $R^3$ is a $C_1$-$C_{50}$ divalent hydrocarbon group which may contain a heteroatom; any two of the phenyl group to which $R^1$ is attached, $R^2$, and $R^3$ may bond together to form a ring with the sulfur atom to which they are attached.

Preferably, the betaine type onium compound has the formula (A-1).

(A-1)

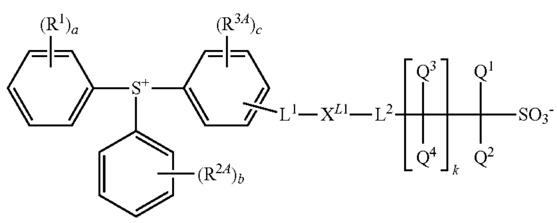

Herein a, k, $Q^1$ to $Q^4$, $L^1$, $L^2$, $X^{L1}$, and $R^1$ are as defined above, $R^{2A}$ and $R^{3A}$ are each independently a $C_1$-$C_{40}$ monovalent hydrocarbon group which may contain a heteroatom, b is an integer of 0 to 5, c is an integer of 0 to 4; in case of b≥2, $R^{2A}$ may be identical or different and two $R^{2A}$ may bond together to form a ring with the atoms to which they are attached, in case of c≥2, $R^{3A}$ may be identical or different and two $R^{3A}$ may bond together to form a ring with the atoms to which they are attached.

More preferably, the betaine type onium compound has the formula (A-2).

(A-2)

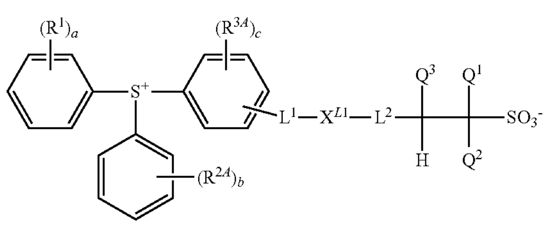

Herein a, b, c, $Q^1$ to $Q^3$, L, $L^2$, $X^{L1}$, $R^1$, $R^{2A}$, and $R^{3A}$ are as defined above.

The molecular resist composition may further comprise (C) a surfactant and/or (D) a quencher.

In another aspect, the invention provides a pattern forming process comprising the steps of applying the molecular resist composition defined above onto a substrate to form a resist film thereon, exposing the resist film to high-energy radiation, and developing the exposed resist film in a developer.

Typically, the high-energy radiation is i-line, KrF excimer laser, ArF excimer laser, EB, or EUV of wavelength 3 to 15 nm.

Advantageous Effects of Invention

The molecular resist composition of the invention is improved in dissolution contrast when processed by lithography. There is formed a pattern having satisfactory performance in terms of EL, MEF and LWR.

DESCRIPTION OF EMBODIMENTS

Figure 1:
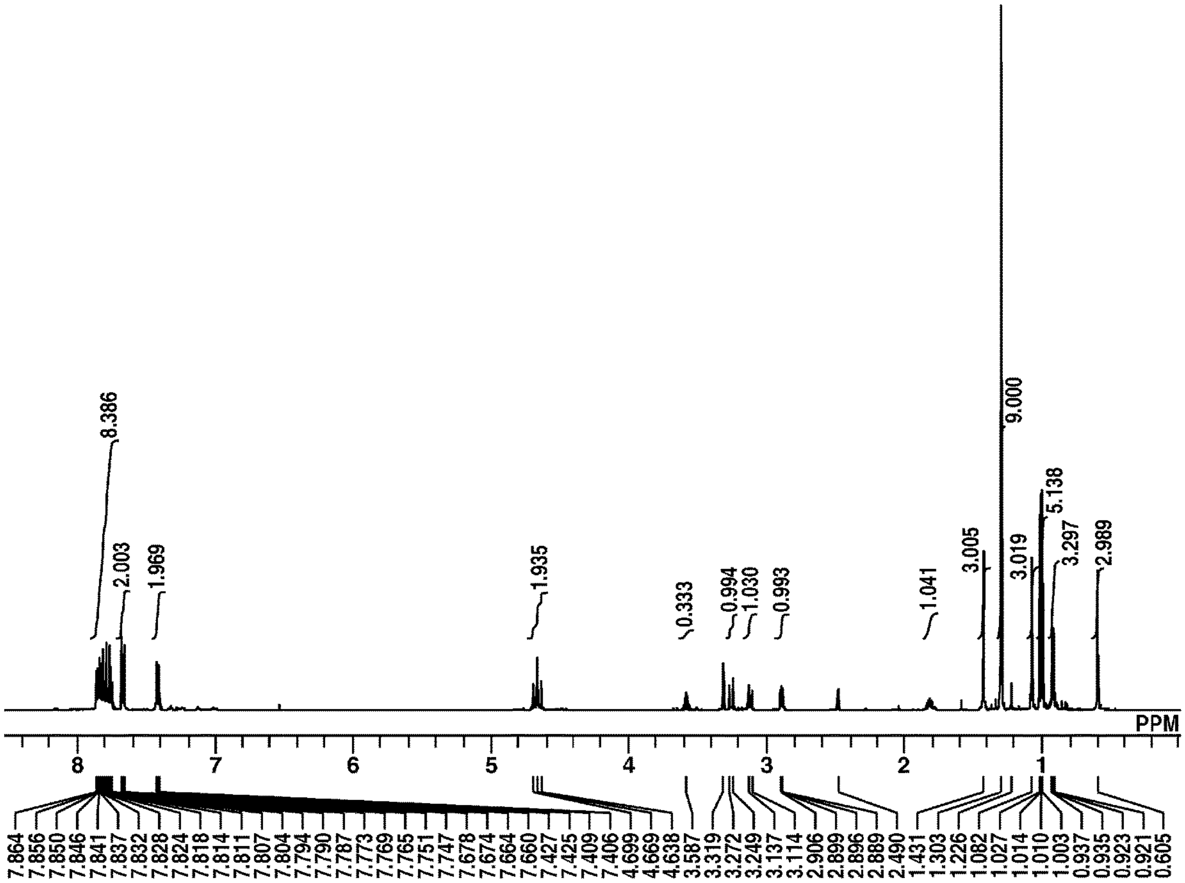
FIG. 1 is a diagram showing the $^1$H-NMR spectrum of PAG-1 in Synthesis Example 1-1-6.

As used herein, the singular forms "a," "an" and "the" include plural referents unless the context clearly dictates otherwise. The notation ($C_n$-$C_m$) means a group containing from n to m carbon atoms per group. In chemical formulae, the broken line designates a valence bond, and Me stands for methyl.

The abbreviations and acronyms have the following meaning.

EB: electron beam

EUV: extreme ultraviolet

Mw: weight average molecular weight

Mn: number average molecular weight

Mw/Mn: molecular weight distribution or dispersity

GPC: gel permeation chromatography

PEB: post-exposure bake

PAG: photoacid generator

LWR: line width roughness

EL: exposure latitude

MEF: mask error factor

CDU: critical dimension uniformity

Molecular Resist Composition

The invention provides a molecular resist composition comprising (A) a betaine type onium compound and (B) an organic solvent, the resist composition being free of a base resin.

Betaine Type Onium Compound

Component (A) is a betaine type onium compound having a sulfonium cation moiety and a sulfonate anion moiety in a common molecule. The sulfonium cation moiety has a sulfur atom and a phenyl group substituted with an optionally heteroatom-containing $C_1$-$C_{50}$ monovalent hydrocarbon group, the phenyl group being attached to the sulfur atom.

Preferably the betaine type onium compound has the formula (A).

(A)

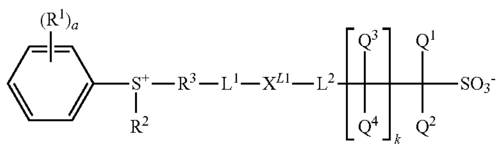

In formula (A), "a" is an integer of 1 to 5, and k is an integer of 0 to 3, preferably 1.

$Q^1$ and $Q^2$ are each independently fluorine or a $C_1$-$C_6$ fluoroalkyl group, preferably fluorine. $Q^3$ and $Q^4$ are each independently hydrogen, fluorine or a $C_1$-$C_6$ fluoroalkyl group.

$L^1$ and $L^2$ are each independently a single bond, ether bond, ester bond, sulfonate bond, carbonate bond, or carbamate bond. $L^1$ is preferably a single bond, ether bond or ester bond, more preferably a single bond. $L^2$ is preferably a single bond, ether bond or ester bond, more preferably an ether bond.

$X^{L1}$ is a single bond or a $C_1$-$C_{40}$ divalent hydrocarbon group which may contain a heteroatom. The divalent hydrocarbon group may be straight, branched or cyclic and examples thereof include alkanediyl groups and divalent saturated cyclic hydrocarbon groups. Typical of the heteroatom are oxygen, nitrogen and sulfur. $X^{L1}$ is preferably a single bond.

Preferred examples of the $C_1$-$C_{40}$ divalent hydrocarbon group which may contain a heteroatom, represented by $X^{L1}$, are shown below. Herein, * (asterisk) designates a bond to $L^1$ or $L^2$.

$X^{L}$-1

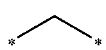

$X^{L}$-2

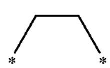

$X^{L}$-3

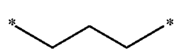

$X^{L}$-4

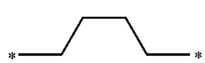

$X^{L}$-5

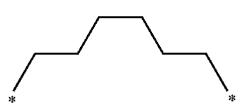

$X^{L}$-6

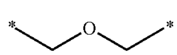

$X^{L}$-7

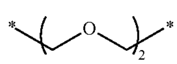

$X^{L}$-8

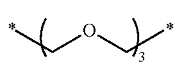

$X^{L}$-9

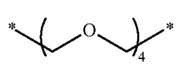

$X^{L}$-10

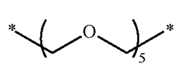

-continued $X^{L}$-11

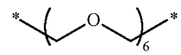

$X^{L}$-12

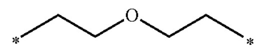

$X^{L}$-13

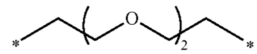

$X^{L}$-14

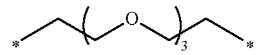

$X^{L}$-15

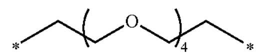

$X^{L}$-16

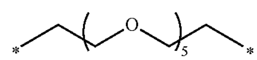

$X^{L}$-17

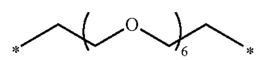

$X^{L}$-18

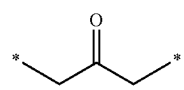

$X^{L}$-19

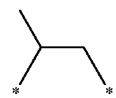

$X^{L}$-20

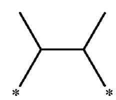

$X^{L}$-21

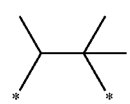

$X^{L}$-22

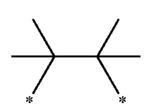

$X^{L}$-23

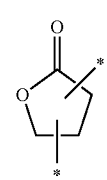

$X^{L}$-24

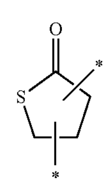

-continued
$X^L$-25
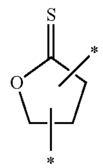
$X^L$-26
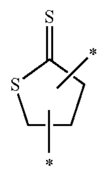
$X^L$-27
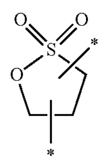
$X^L$-28
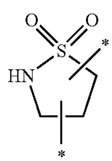
$X^L$-29
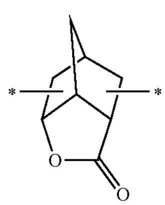
$X^L$-30
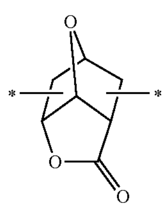
$X^L$-31
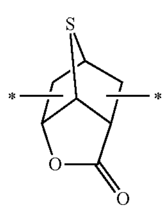
$X^L$-32
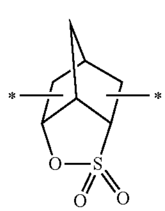
-continued
$X^L$-33
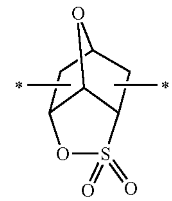
$X^L$-34
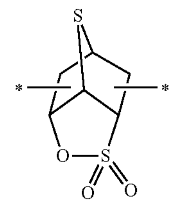
$X^L$-35
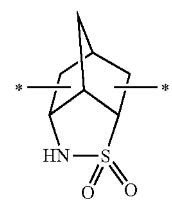
$X^L$-36
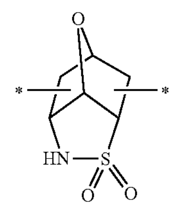
$X^L$-37
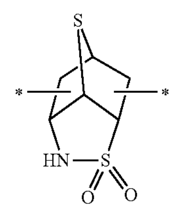
$X^L$-38
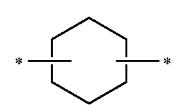
$X^L$-39
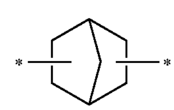
$X^L$-40
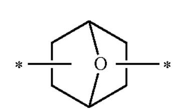
$X^L$-41
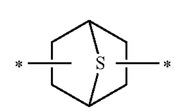
$X^L$-42
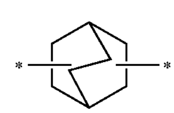

-continued

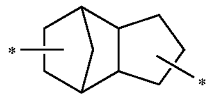

$X^{L}$-43

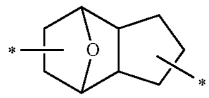

$X^{L}$-44

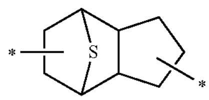

$X^{L}$-45

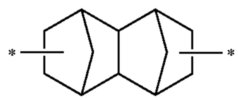

$X^{L}$-46

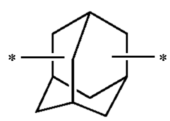

$X^{L}$-47

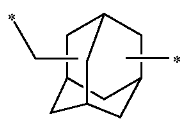

$X^{L}$-48

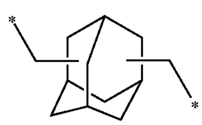

$X^{L}$-49

Of these, $X^{L}$-1 to $X^{L}$-22 and $X^{L}$-47 to $X^{L}$-49 are more preferred, with $X^{L}$-1 to $X^{L}$-17 being most preferred.

In formula (A), $R^1$ is a $C_3$-$C_{40}$ monovalent hydrocarbon group which may contain a heteroatom other than fluorine or a $C_1$-$C_{40}$ monovalent fluorinated hydrocarbon group which may contain a heteroatom other than fluorine. The monovalent hydrocarbon group may be straight, branched or cyclic. Examples include alkyl groups such as n-propyl, isopropyl, n-butyl, sec-butyl, tert-butyl, tert-pentyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbomyl, tricyclo[5.2.1.$0^{2,6}$]decanyl, adamantyl, and adamantylmethyl, and aryl groups such as phenyl, naphthyl and anthracenyl. Examples of the monovalent fluorinated hydrocarbon group include the foregoing monovalent hydrocarbon groups in which some or all hydrogen atoms are substituted by fluorine atoms.

In the monovalent hydrocarbon group or monovalent fluorinated hydrocarbon group, some hydrogen may be substituted by a moiety containing a heteroatom such as oxygen, sulfur, nitrogen, chlorine, bromine or iodine, or some carbon may be replaced by a moiety containing a heteroatom such as oxygen, sulfur or nitrogen, so that the group may contain a hydroxyl, cyano, carbonyl, ether bond, ester bond, sulfonate bond, carbonate bond, carbamate bond, amide bond, imide bond, lactone ring, sultone ring, thiolactone ring, lactam ring, sultam ring, carboxylic anhydride (—C(═O)—O—C(═O)—), or haloalkyl moiety. It is noted that any carbon atom in R bonded to a carbon atom on the phenyl group in formula (A) may be replaced by the heteroatom-containing moiety.

When a is 2 or more (i.e., a ≥2), $R^1$ may be identical or different and two $R^1$ may bond together to form a ring with the atoms to which they are attached. Examples of the ring thus formed include cyclopropane, cyclobutane, cyclopentane, cyclohexane, norbornane and adamantane rings.

The monovalent hydrocarbon group which may contain a heteroatom other than fluorine or the monovalent fluorinated hydrocarbon group which may contain a heteroatom other than fluorine, represented by $R^1$, may be an acid labile group of acetal form. The preferred acid labile group of acetal form has the following formula (A').

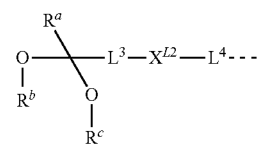

(A')

In formula (A'), $L^3$ and $L^4$ are each independently a single bond, ether bond, ester bond, sulfonate bond, carbonate bond or carbamate bond. $L^3$ is preferably a single bond, ether bond, or ester bond, more preferably a single bond. $L^4$ is preferably a single bond, ether bond, or ester bond, more preferably a single bond.

In formula (A'), $X^{L2}$ is a single bond or a $C_1$-$C_{40}$ divalent hydrocarbon group which may contain a heteroatom. Examples of the optionally heteroatom-containing $C_1$-$C_{40}$ divalent hydrocarbon group $X^{L2}$ include the foregoing $X^{L}$-1 to $X^{L}$-49. $X^{L2}$ is preferably a single bond.

In formula (A'), $R^a$ is hydrogen or a $C_1$-$C_{20}$ monovalent hydrocarbon group which may contain a heteroatom. The monovalent hydrocarbon group may be straight, branched or cyclic. Examples include alkyl groups such as methyl, ethyl, propyl, isopropyl, n-butyl, sec-butyl, tert-butyl, tert-pentyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbomyl, tricyclo[5.2.1.$0^{2,6}$]decanyl, adamantyl, and adamantylmethyl, and aryl groups such as phenyl, naphthyl and anthracenyl. In the monovalent hydrocarbon group, some hydrogen may be substituted by a moiety containing a heteroatom such as oxygen, sulfur, nitrogen or halogen, or a moiety containing a heteroatom such as oxygen, sulfur or nitrogen may intervene between carbon atoms, so that the group may contain a hydroxyl, cyano, carbonyl, ether bond, ester bond, sulfonate bond, carbonate bond, carbamate bond, amide bond, imide bond, lactone ring, sultone ring, thiolactone ring, lactam ring, sultam ring, carboxylic anhydride, or haloalkyl moiety. Of these, $R^a$ is preferably hydrogen, a $C_1$-$C_6$ alkyl group or $C_6$-$C_{10}$ aryl group, more preferably hydrogen or methyl, most preferably methyl.

In formula (A'), $R^b$ and $R^c$ are each independently a $C_1$-$C_{40}$ monovalent hydrocarbon group which may contain a heteroatom. $R^b$ and $R^c$ may bond together to form a ring with the oxygen atoms to which they are attached and the intervening carbon atom. The monovalent hydrocarbon group may be straight, branched or cyclic. Examples thereof are as exemplified above for $R^a$. When some hydrogen on the monovalent hydrocarbon group is substituted by halogen, fluorine substitution is preferred.

When $R^b$ and $R^c$ do not bond together or form a ring, each forms an acyclic acetal structure with the adjacent oxygen atom. When $R^b$ and $R^c$ bond together to forma ring, they forma cyclic acetal structure with the adjacent oxygen atoms. It is preferred from the standpoints of ease of synthesis and storage stability that $R^b$ and $R^c$ form a cyclic acetal structure, especially an acetal structure of 5, 6 or 7-membered ring.

Examples of the acid labile group of acetal form are shown below, but not limited thereto. Herein $R^a$ is as defined above.

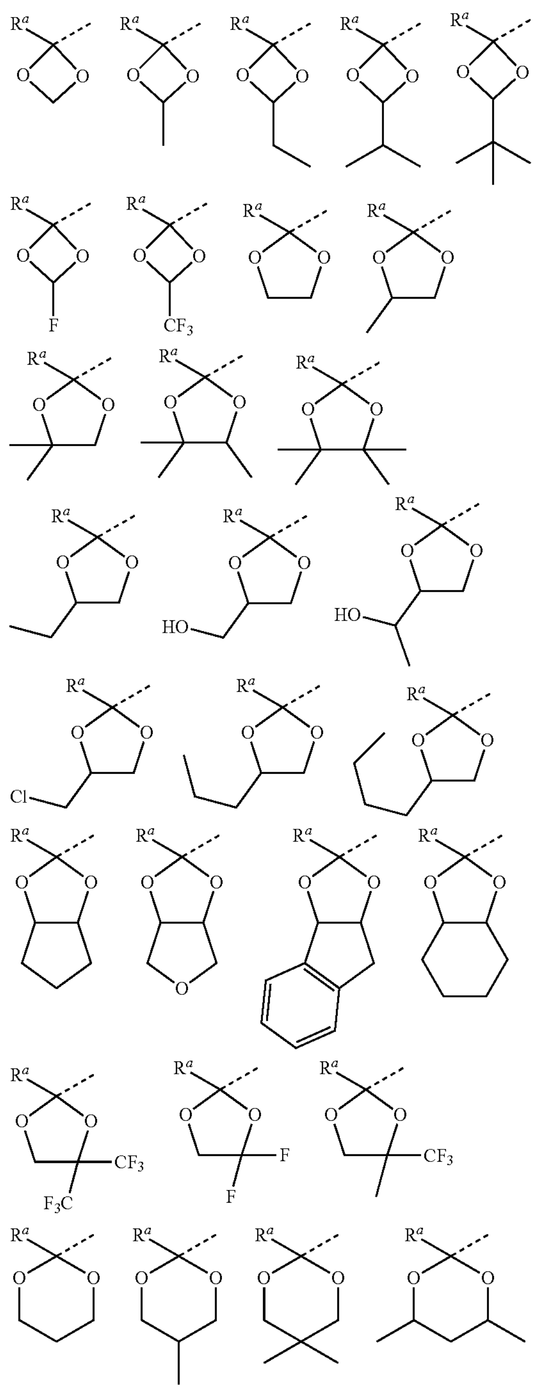

-continued

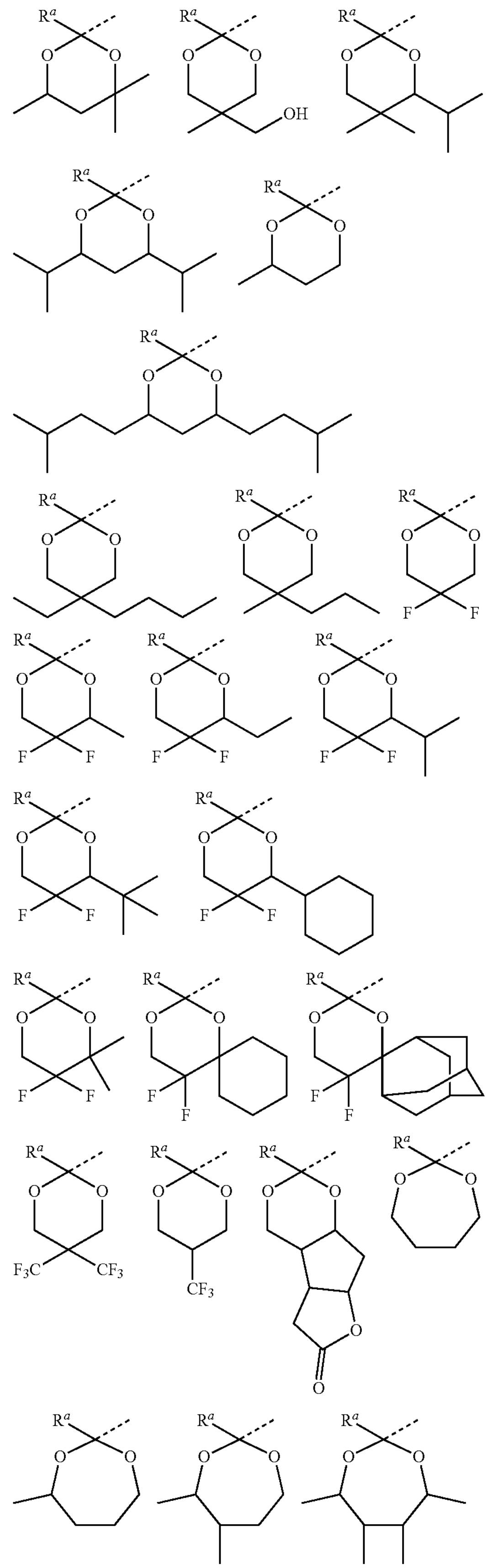

-continued

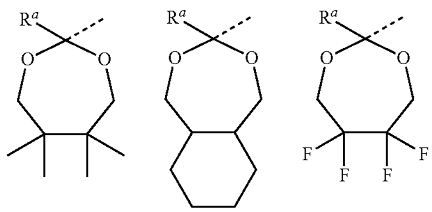

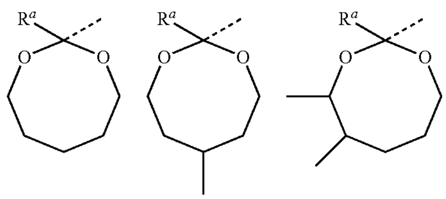

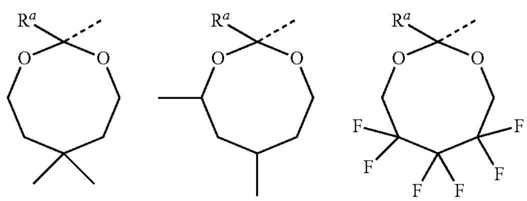

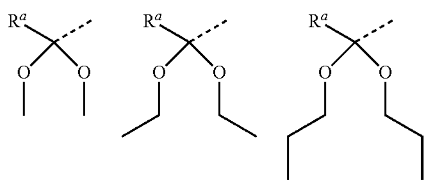

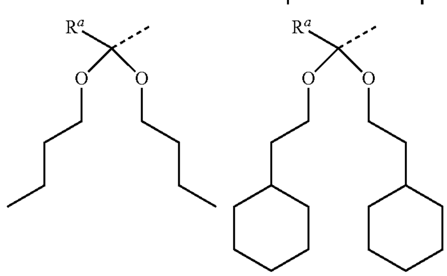

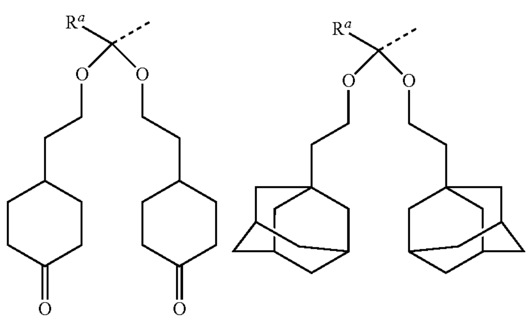

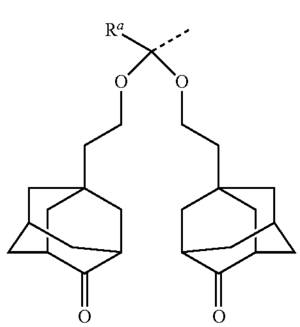

-continued

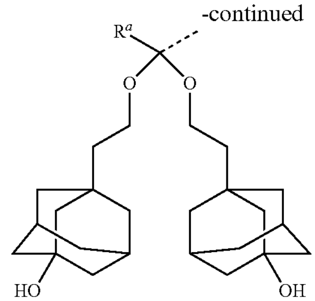

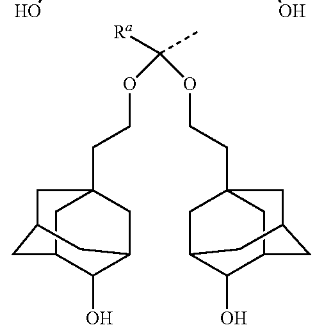

Inter alia, $R^1$ is preferably selected from $C_3$-$C_{30}$ alkyl groups which may contain a heteroatom other than fluorine, $C_1$-$C_{30}$ fluoroalkyl groups which may contain a heteroatom other than fluorine, $C_6$-$C_{20}$ aryl groups which may contain a heteroatom, and acid labile groups of acetal form having formula (A').

In formula (A), $R^2$ is a $C_1$-$C_{50}$ monovalent hydrocarbon group which may contain a heteroatom. The monovalent hydrocarbon group may be straight, branched or cyclic. Examples thereof include monovalent aliphatic hydrocarbon groups such as alkyl and alkenyl groups, and monovalent aromatic hydrocarbon groups such as aryl and aralkyl groups.

Suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbomyl, and adamantyl. Suitable alkenyl groups include vinyl, allyl, propenyl, butenyl, hexenyl, and cyclohexenyl.

Suitable aryl groups include phenyl; alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl; naphthyl; alkylnaphthyl groups such as methylnaphthyl and ethylnaphthyl; and dialkylnaphthyl groups such as dimethylnaphthyl and diethylnaphthyl. Suitable aralkyl groups include benzyl, 1-phenylethyl and 2-phenylethyl.

In these groups, some hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonate bond, carbonate bond, lactone ring, sultone ring, carboxylic anhydride, or haloalkyl moiety.

Examples of the heteroatom-containing monovalent aliphatic hydrocarbon group include oxo-containing alkyl groups such as 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Examples of the heteroatom-containing monovalent aromatic hydrocarbon group include heteroaryl groups such as thienyl; hydroxyphenyl groups such as 4-hydroxyphenyl; fluorinated phenyl groups such as fluorophenyl and difluorophenyl; alkoxyphenyl groups such as 4-methoxyphenyl, 3-methoxyphenyl, 2-methoxyphenyl, 4-ethoxyphenyl, 4-tert-butoxyphenyl, 3-tert-butoxyphenyl; alkoxynaphthyl groups such as methoxynaphthyl, ethoxynaphthyl, n-propoxynaphthyl and n-butoxynaphthyl; dialkoxynaphthyl groups such as dimethoxynaphthyl and diethoxynaphthyl; and aryloxoalkyl groups such as 2-phenyl-2-oxoethyl, 2-(1-naphthyl)-2-oxoethyl, and 2-(2-naphthyl)-2-oxoethyl.

Inter alia, $R^2$ is preferably selected from monovalent aromatic hydrocarbon groups which may contain a heteroatom, more preferably aryl groups which may contain a heteroatom, even more preferably alkylphenyl, alkoxyphenyl, and fluorinated phenyl groups.

In formula (A), $R^3$ is a $C_1$-$C_{50}$, preferably $C_1$-$C_{20}$ divalent hydrocarbon group which may contain a heteroatom. The divalent hydrocarbon group may be straight, branched or cyclic. Examples thereof include straight alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; divalent saturated cyclic hydrocarbon groups such as cyclopentanediyl, cyclohexanediyl, norbornanediyl, and adamantanediyl; and divalent aromatic hydrocarbon groups such as phenylene and naphthylene. In the foregoing groups, some hydrogen may be substituted by an alkyl group such as methyl, ethyl, propyl, n-butyl, or tert-butyl, or by a moiety containing a heteroatom such as oxygen, sulfur, nitrogen or halogen, so that the group may contain a hydroxyl, cyano, carbonyl, ether bond, ester bond, sulfonate bond, carbonate bond, lactone ring, sultone ring, carboxylic anhydride or haloalkyl moiety. $R^3$ is preferably a divalent aromatic hydrocarbon group, more preferably phenylene or a phenylene group substituted with an alkyl moiety or heteroatom-containing moiety.

In formula (A), any two of the phenyl group to which R is attached, $R^2$, and $R^3$ may bond together to form a ring with the sulfur atom to which they are attached. Examples of the sulfonium cation corresponding to this embodiment are shown below.

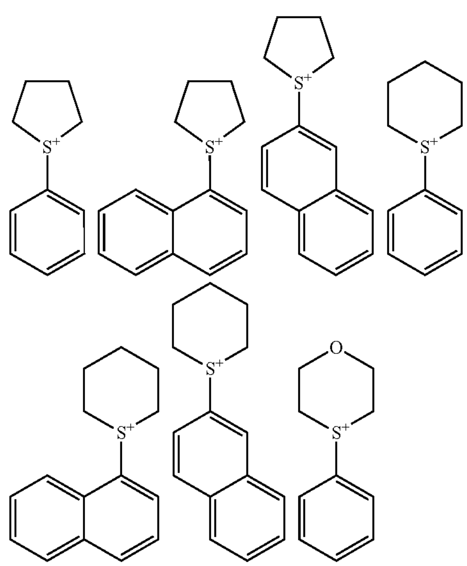

-continued

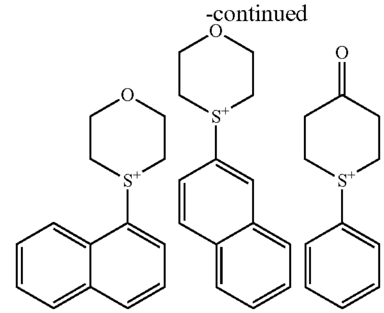

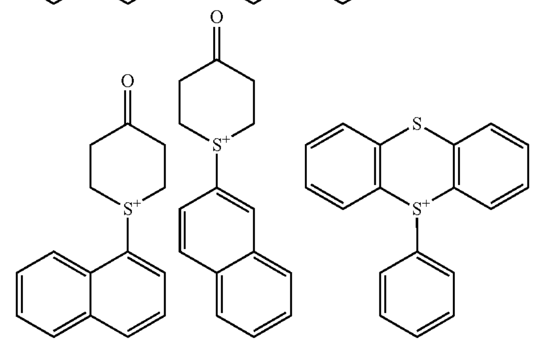

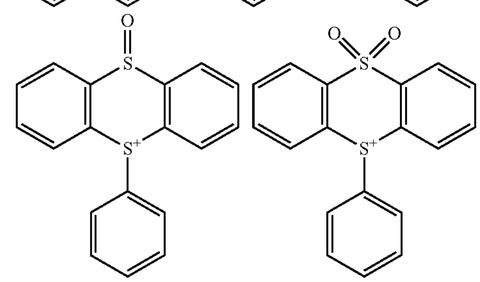

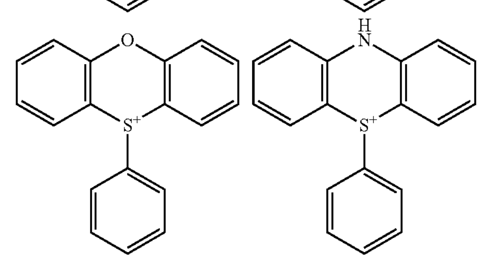

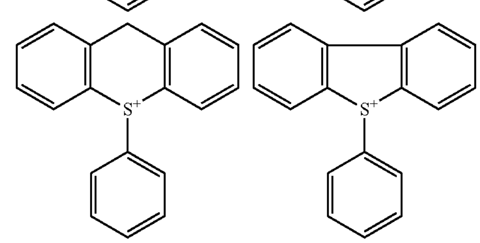

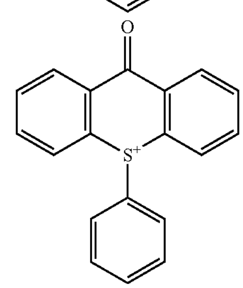

Of the betaine type onium compounds having formula (A), those compounds having the formula (A-1) are preferred.

(A-1)

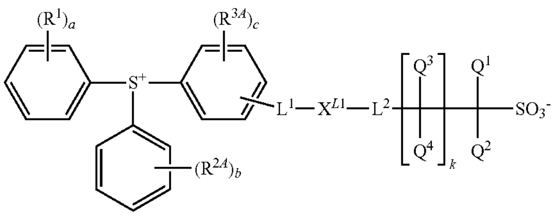

In formula (A-1), a, k, $Q^1$ to $Q^4$, $L^1$, $L^2$, $X^{L1}$, and $R^1$ areas defined above. $R^{2A}$ and $R^{3A}$ are each independently a $C_1$-$C_{40}$ monovalent hydrocarbon group which may contain a heteroatom. Examples of the monovalent hydrocarbon group include methyl and ethyl as well as those exemplified above for the $C_3$-$C_{40}$ monovalent hydrocarbon group $R^1$. Also $R^{2A}$ may be an acid labile group of acetal form, preferably a group having formula (A').

In formula (A-1), b is an integer of 0 to 5, and c is an integer of 0 to 4. In case of b≥2, $R^{2A}$ may be identical or different and two $R^{2A}$ may bond together to form a ring with the atoms to which they are attached. In case of c≥2, $R^{3A}$ may be identical or different and two $R^{3A}$ may bond together to form a ring with the atoms to which they are attached.

Of the betaine type onium compounds having formula (A-1), those compounds having the formula (A-2) are more preferred.

(A-2)

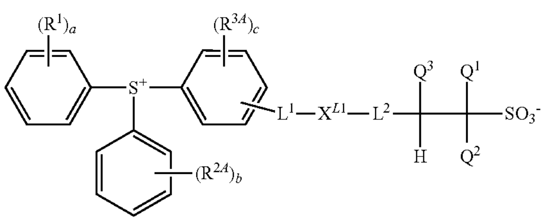

In formula (A-2), a, b, c, $Q^1$ to $Q^3$, L, $L^2$, $X^{L1}$, $R^1$, $R^{2A}$ and $R^{3A}$ are as defined above.

Illustrative examples of the betaine type onium compound having formula (A) are shown below, but not limited thereto. Herein $Q^3$ is as defined above.

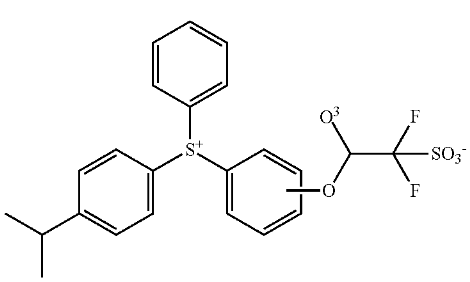

-continued

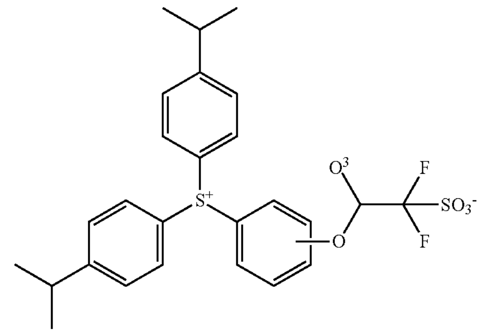

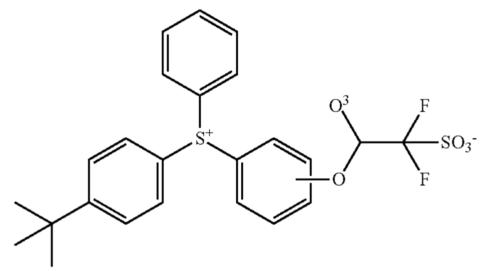

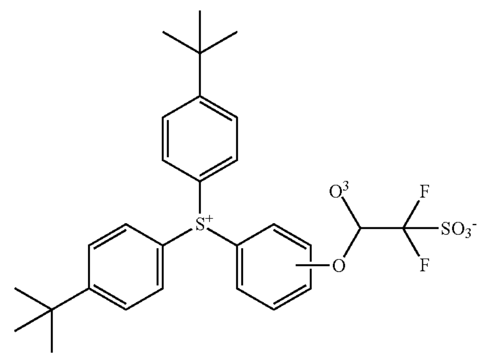

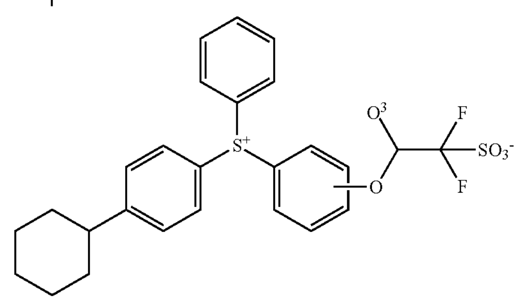

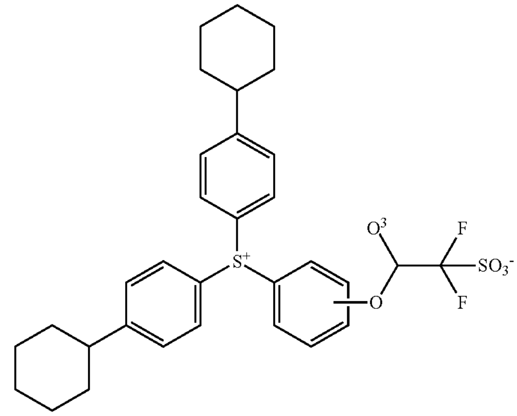

-continued
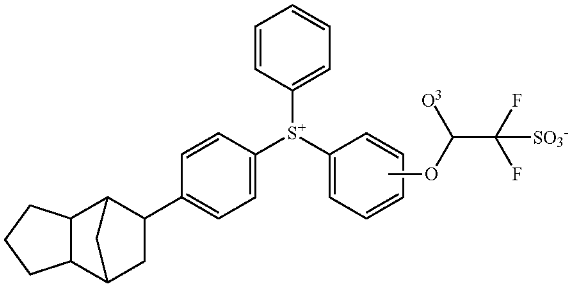
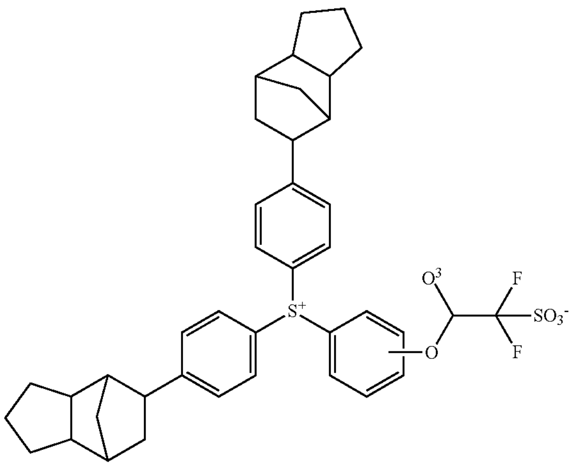
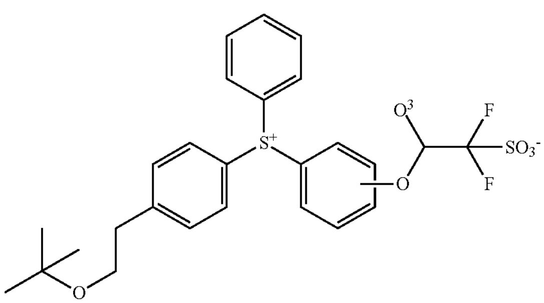
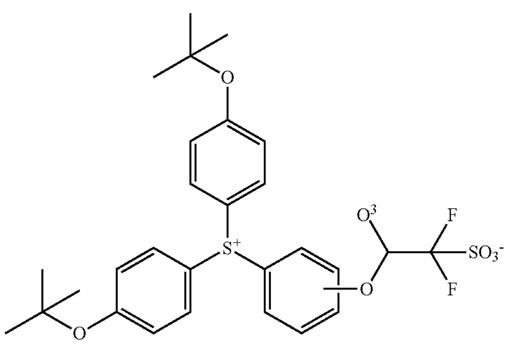
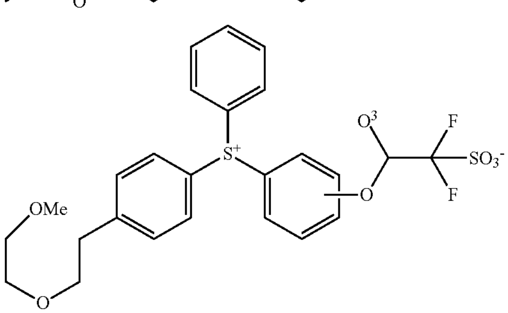
-continued
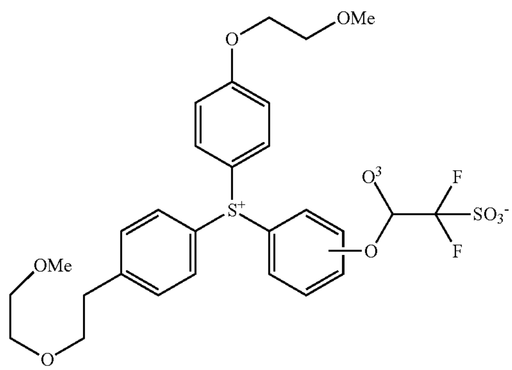
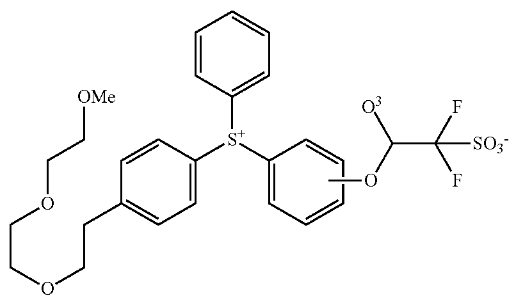
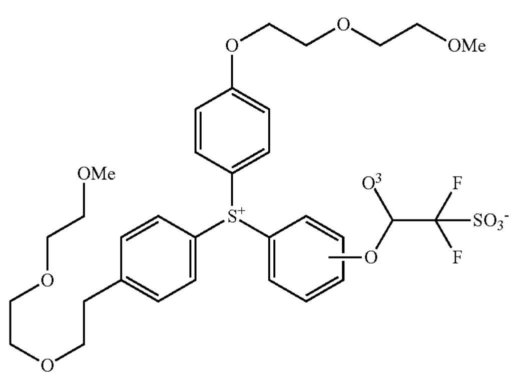
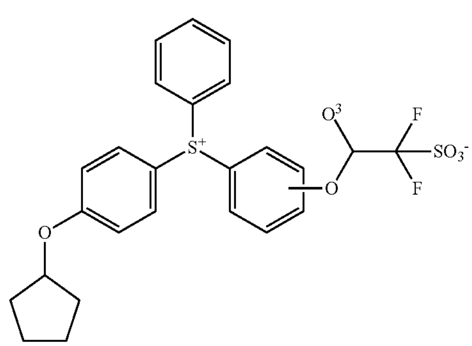

-continued
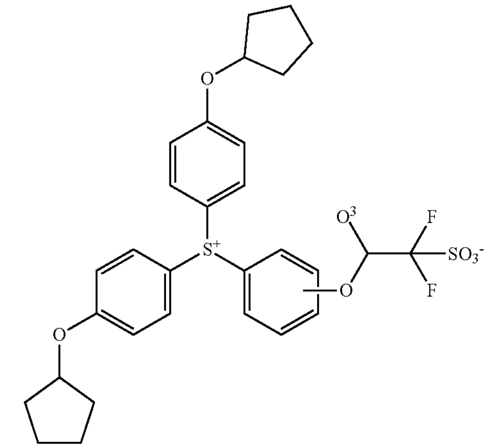
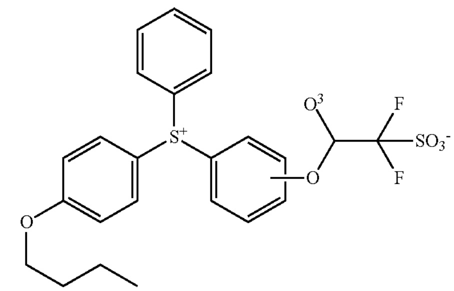
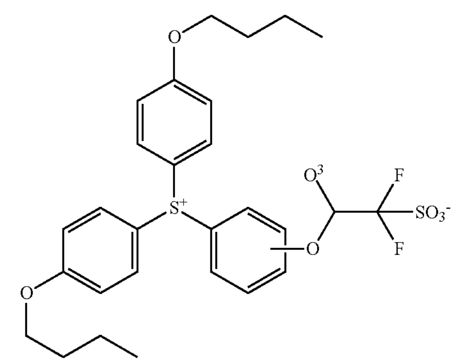
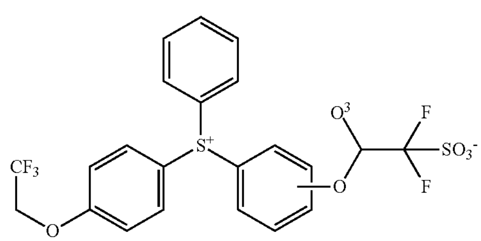
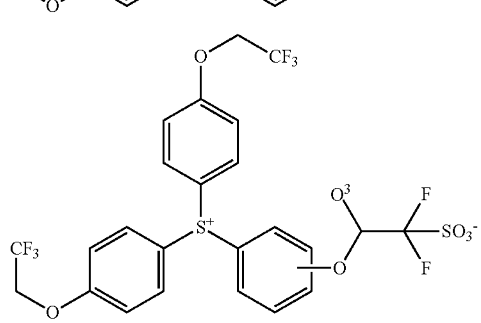
-continued
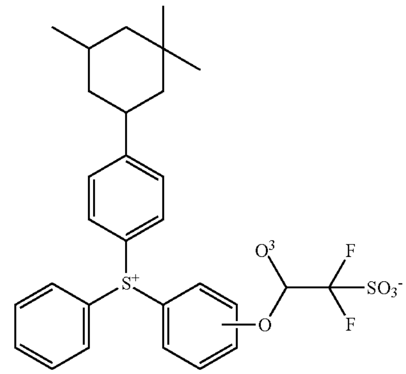
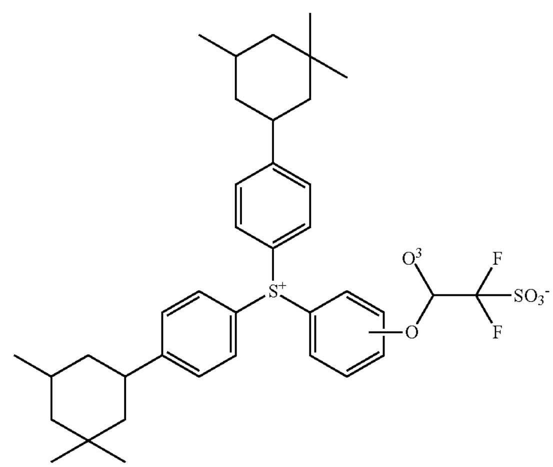
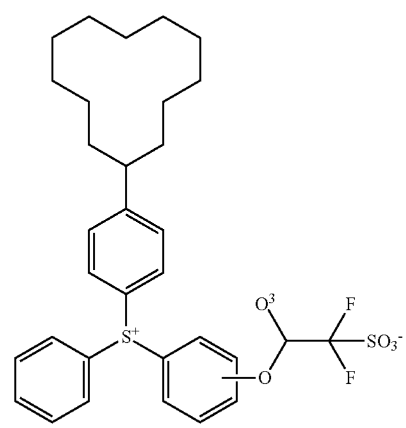

-continued
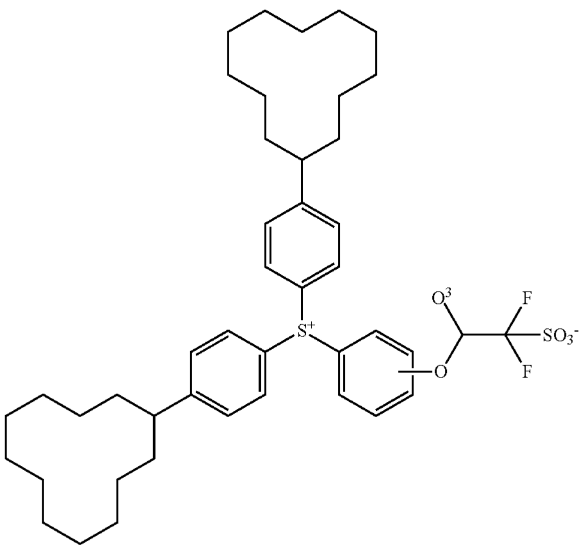
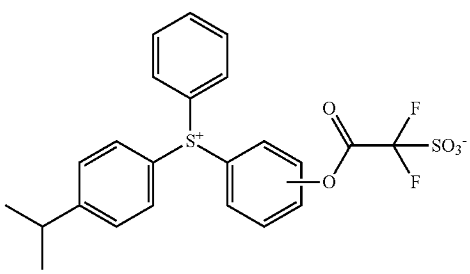
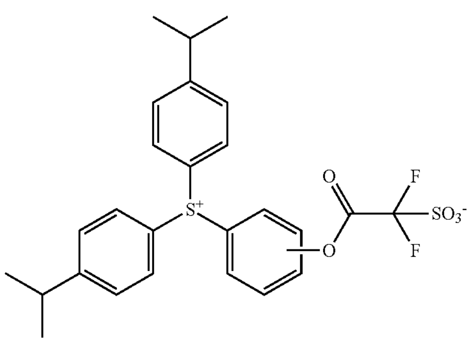
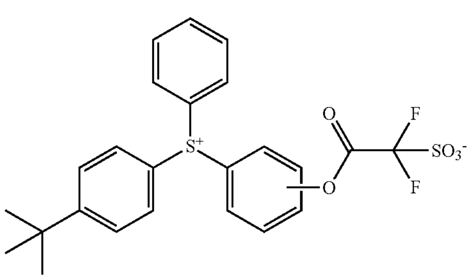
-continued
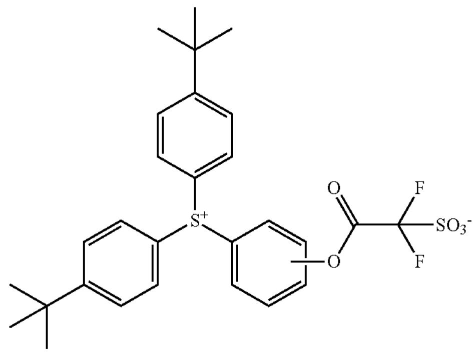
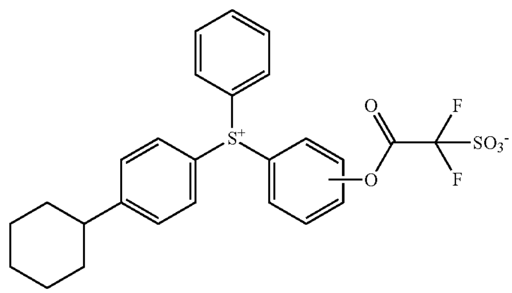
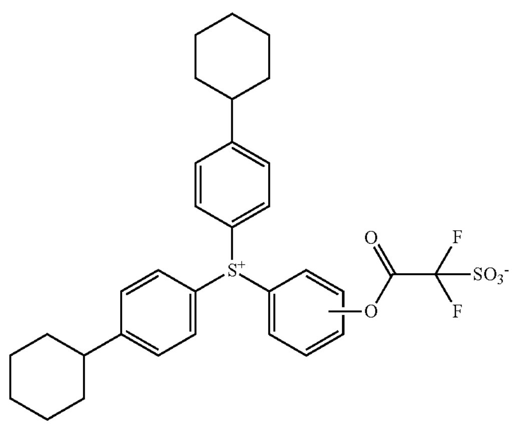
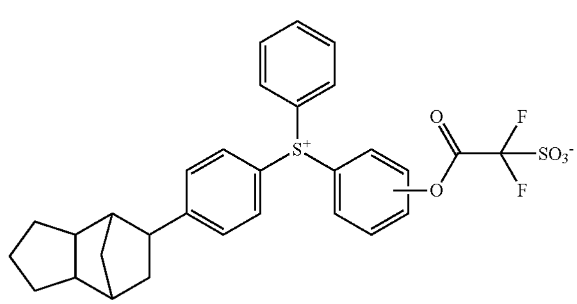

-continued
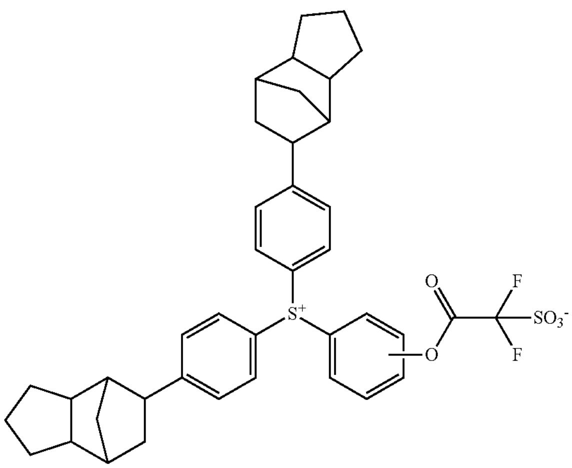
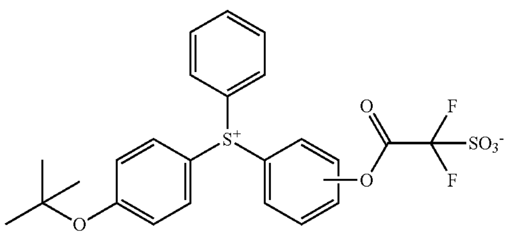
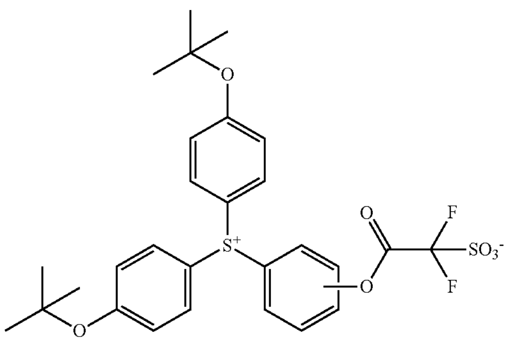
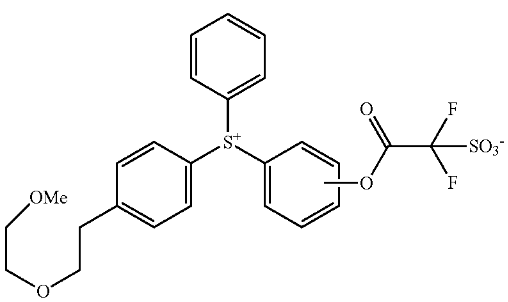
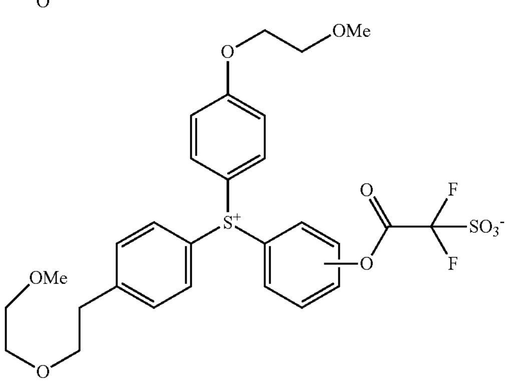
-continued
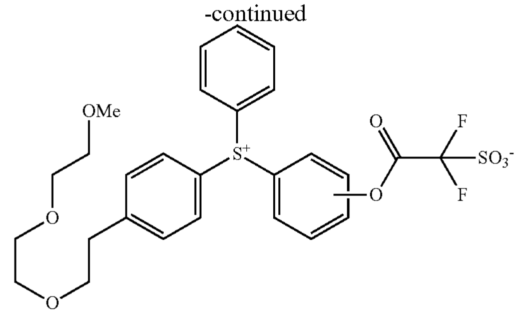
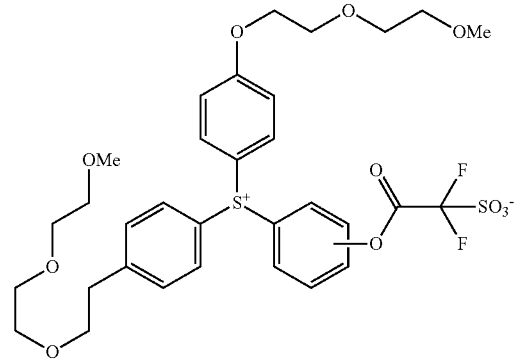
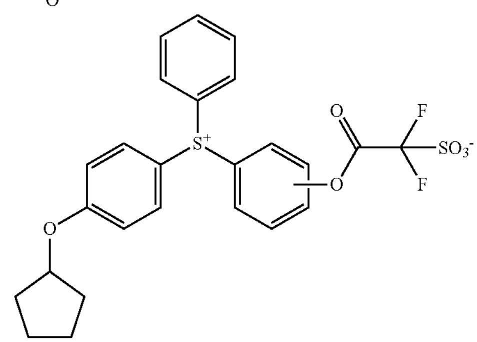
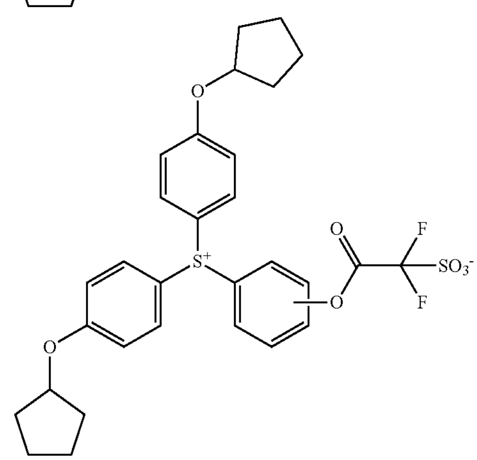
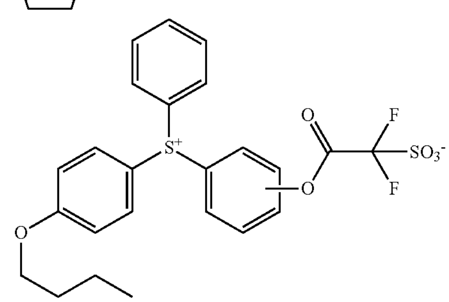

-continued
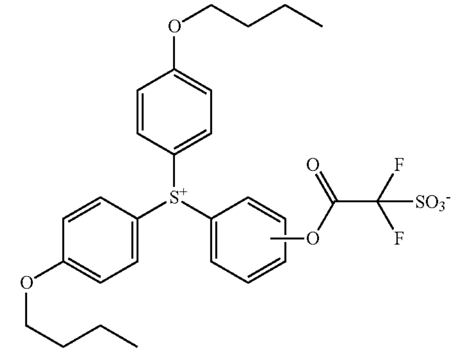
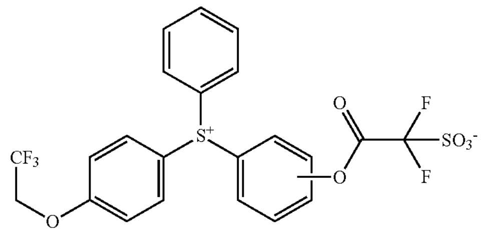
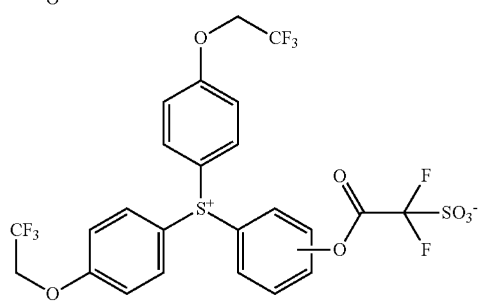
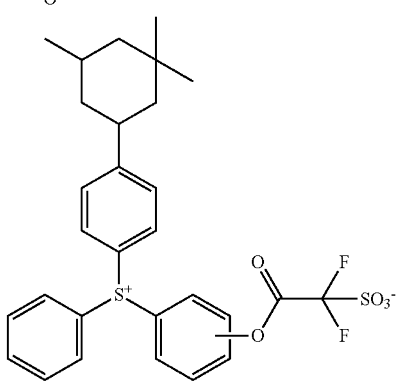
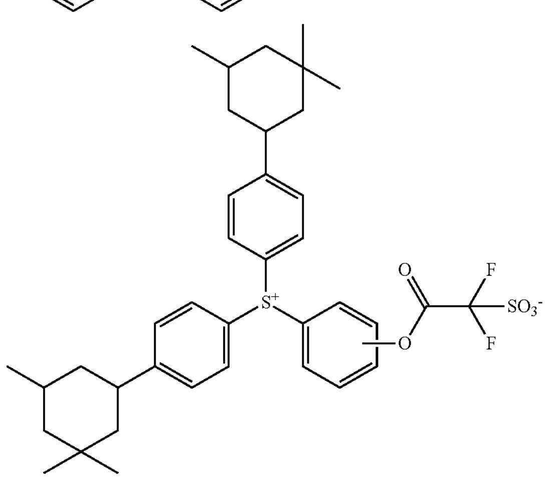
-continued
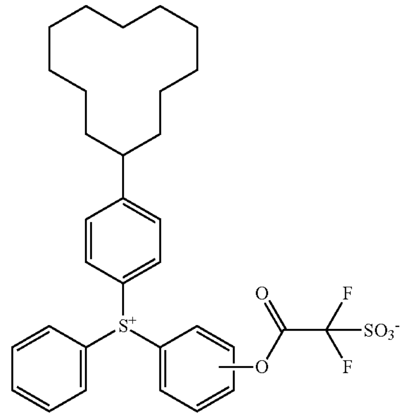
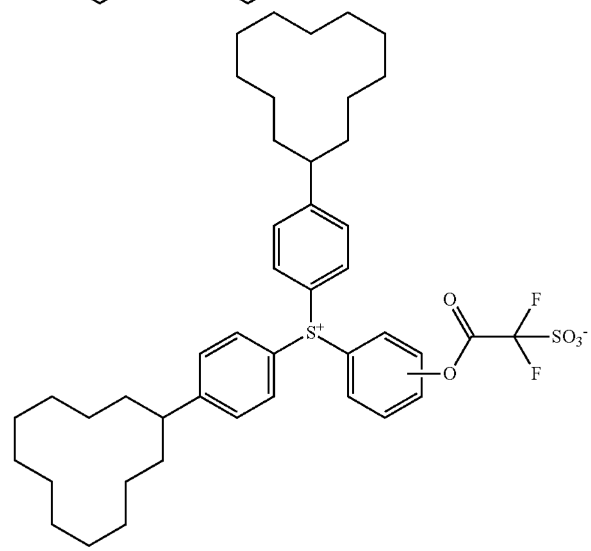
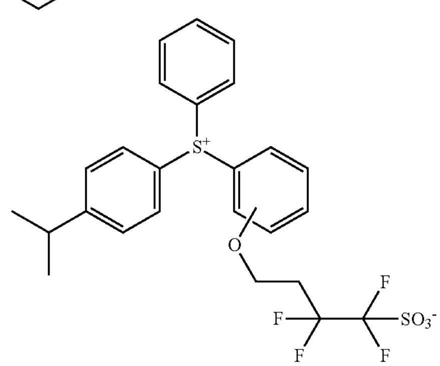
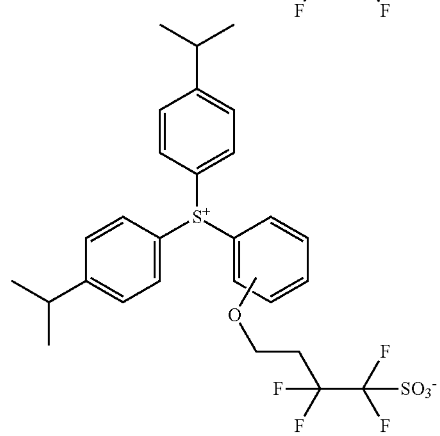

-continued
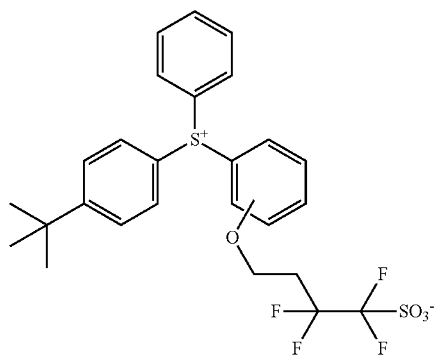
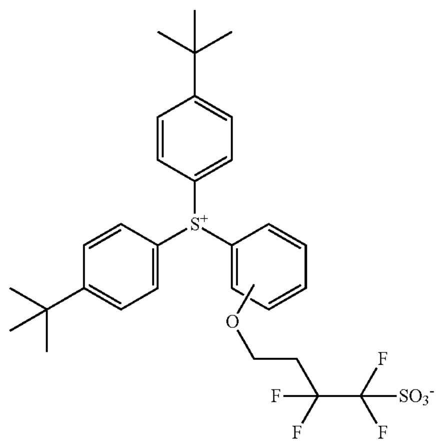
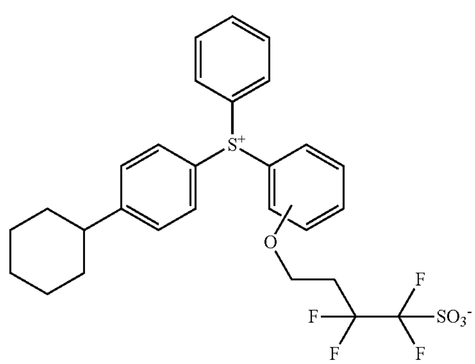
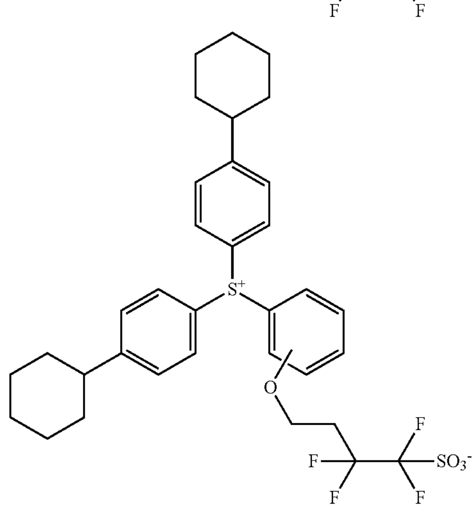
-continued
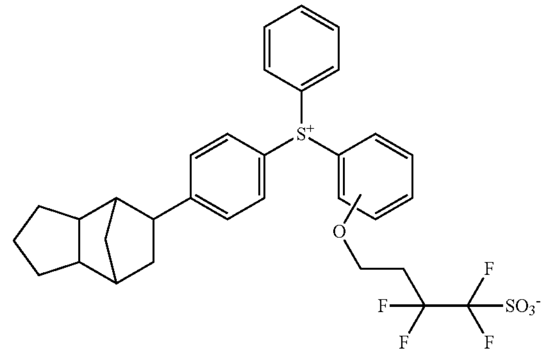
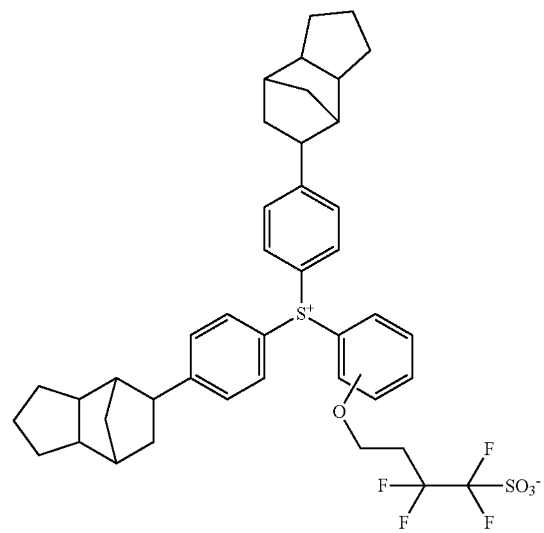
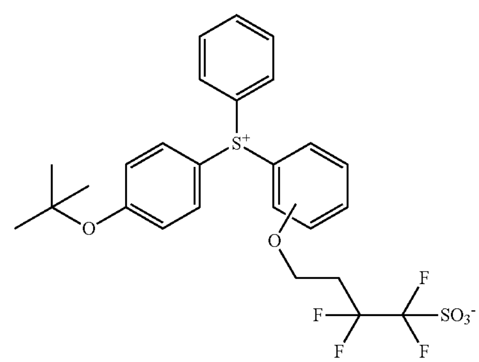
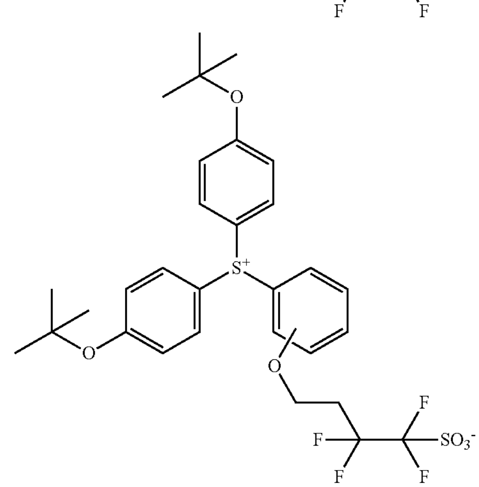

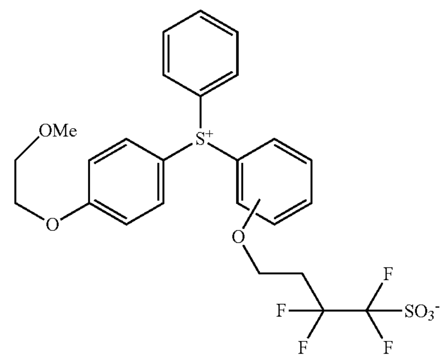
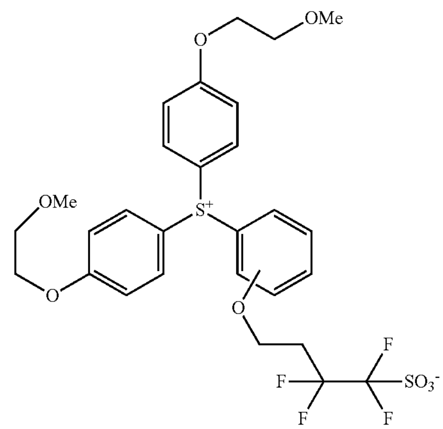
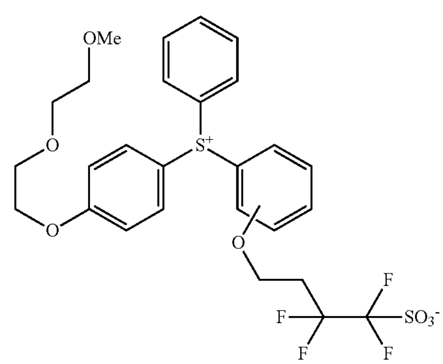
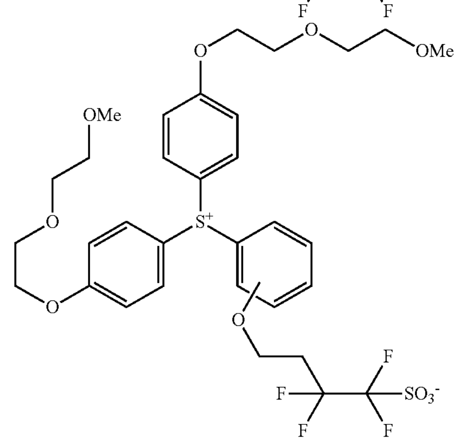
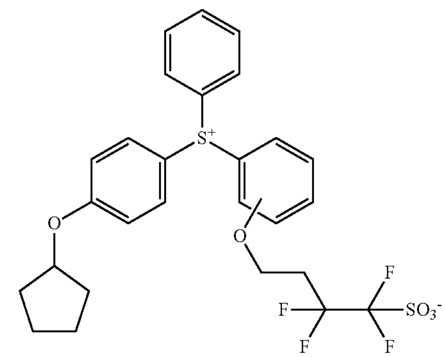
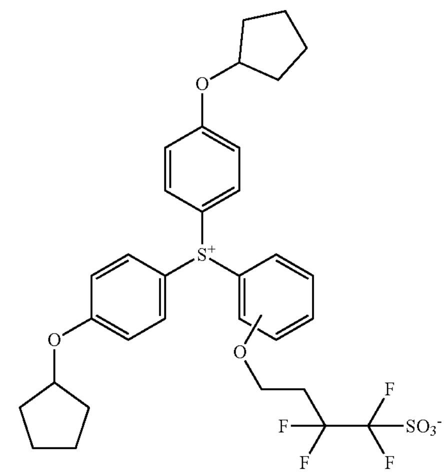
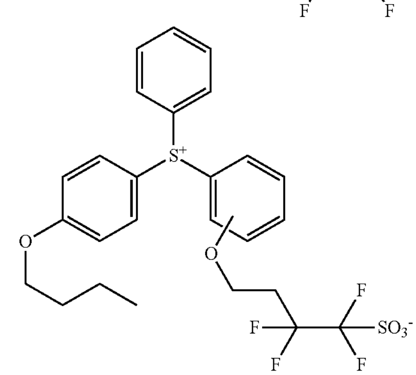
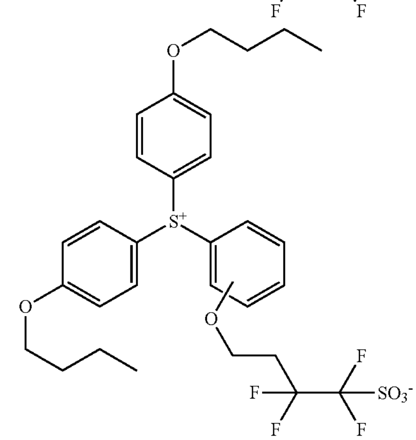

-continued
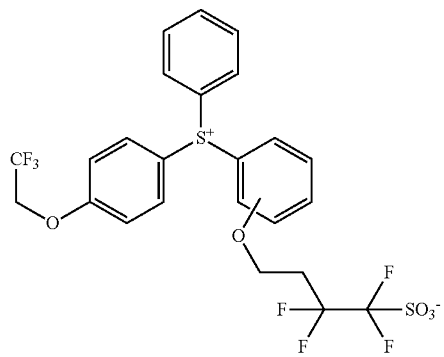
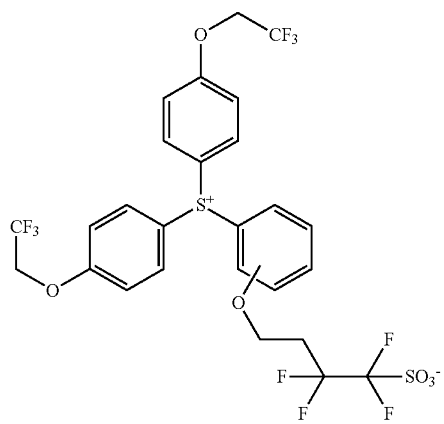
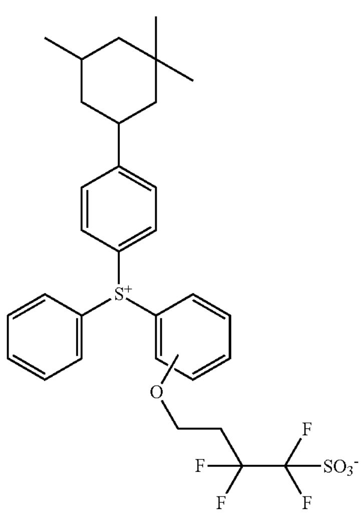
-continued
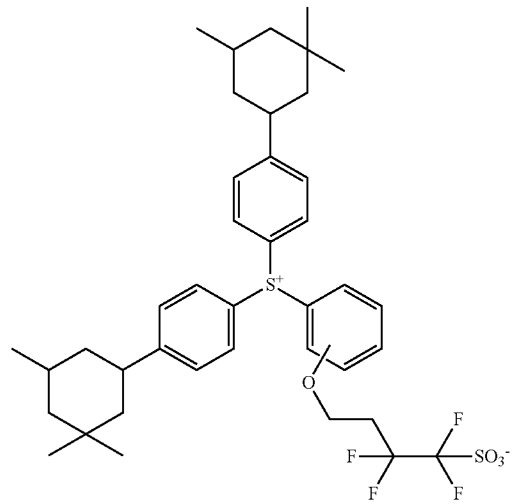
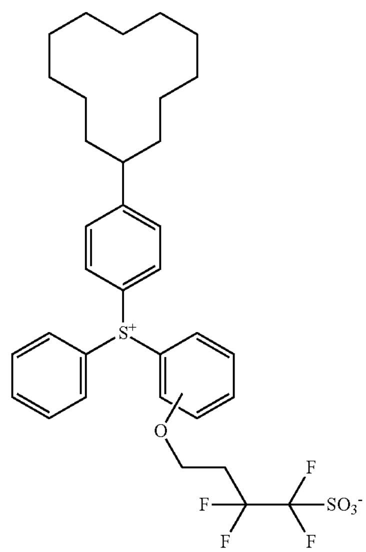
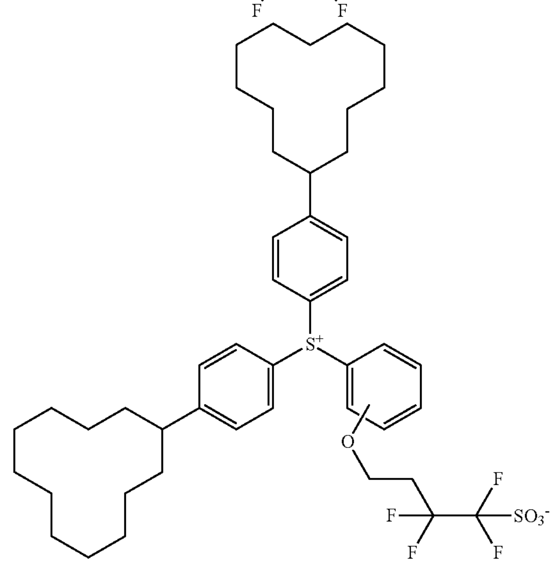

-continued
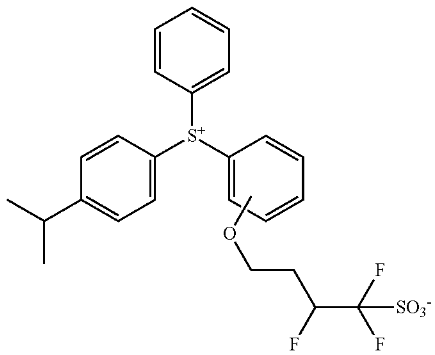
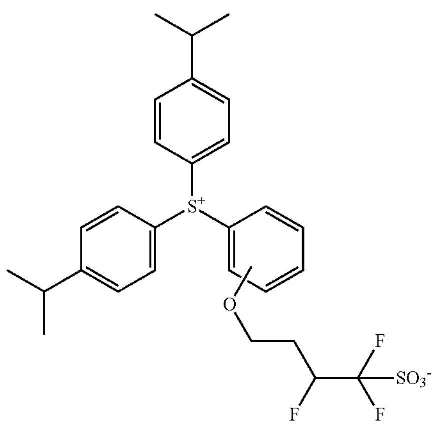
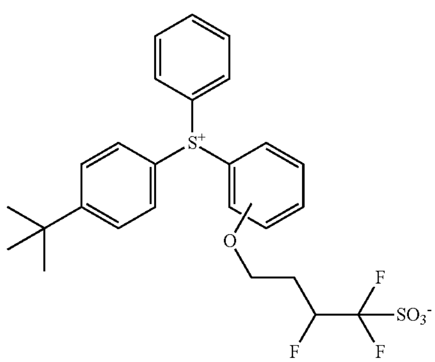
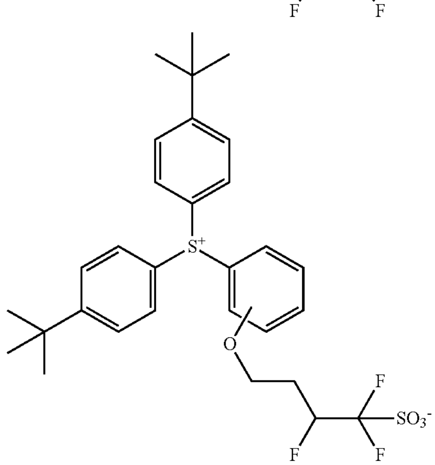
-continued
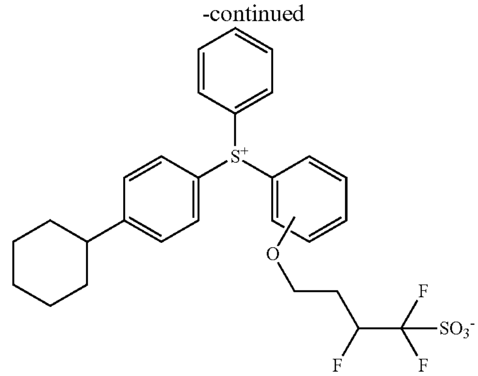
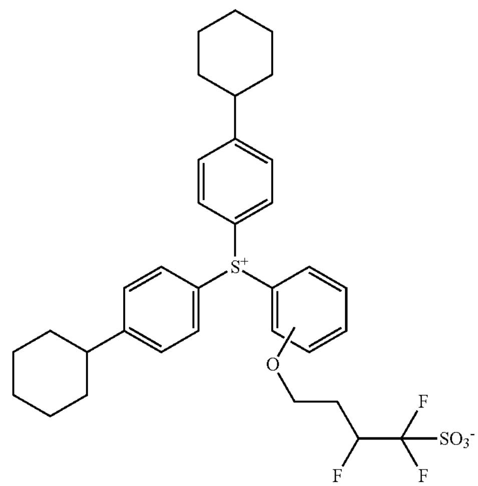
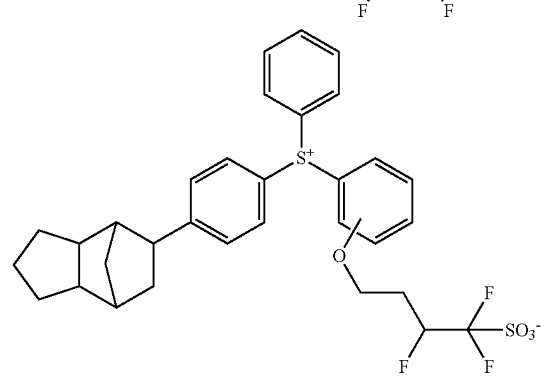
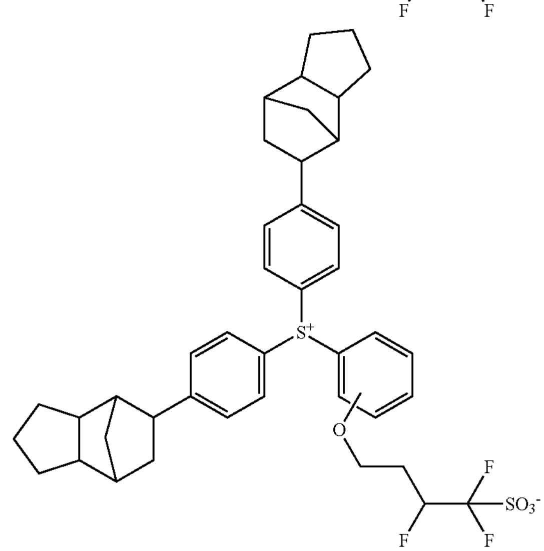

-continued
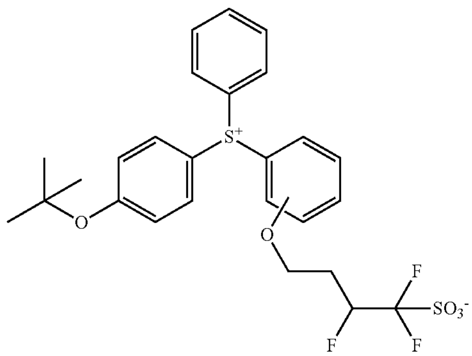
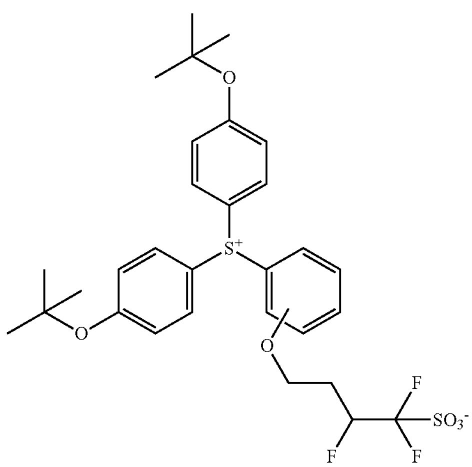
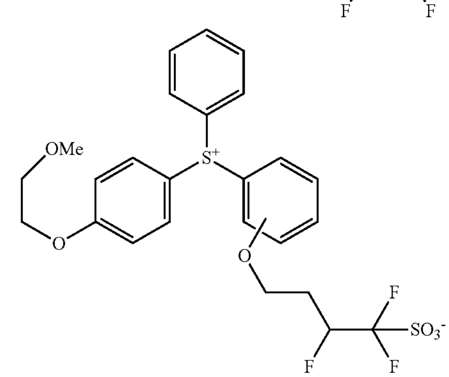
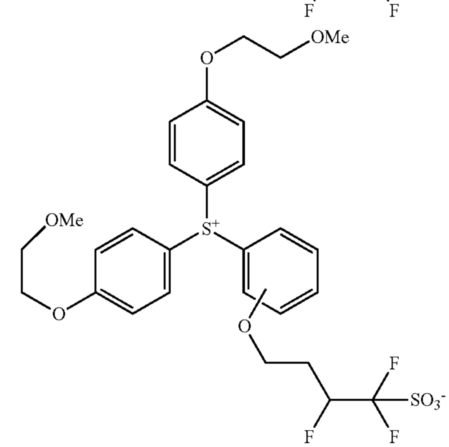
-continued
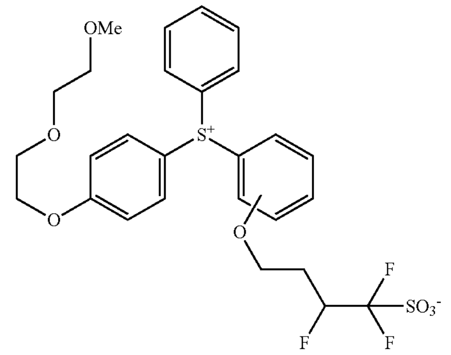
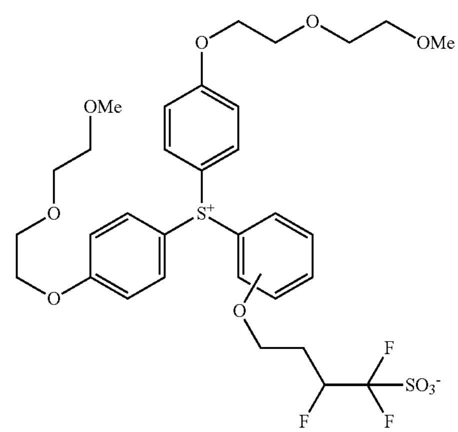
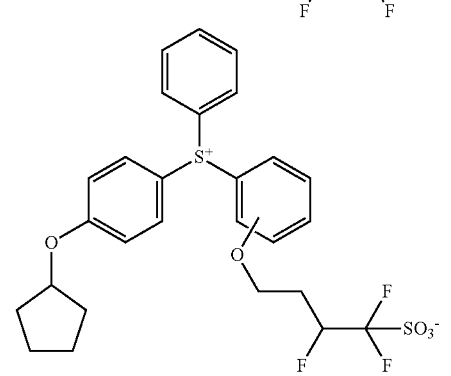
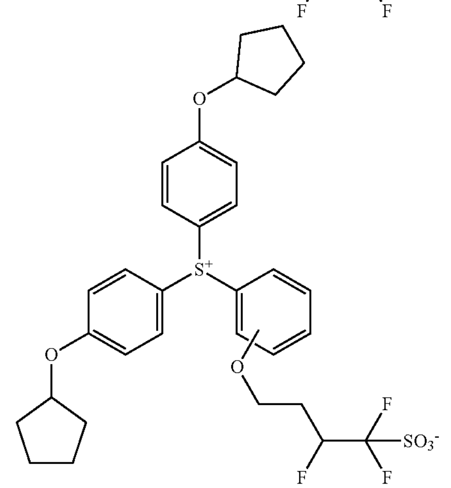

-continued
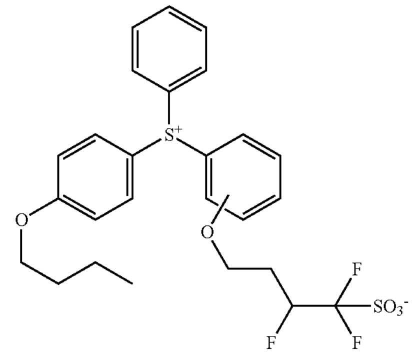
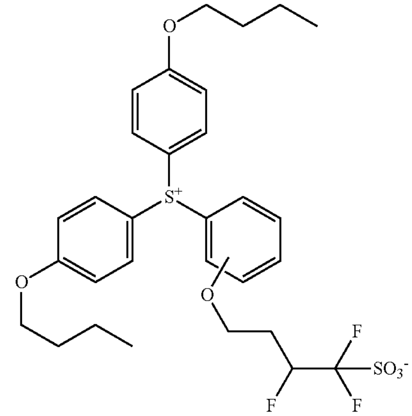
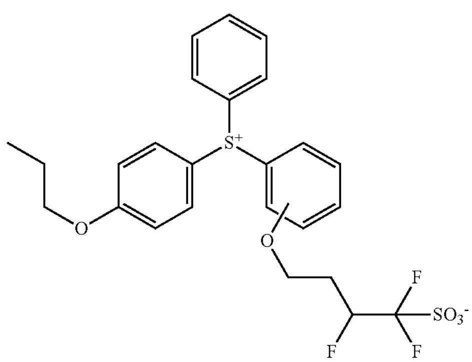
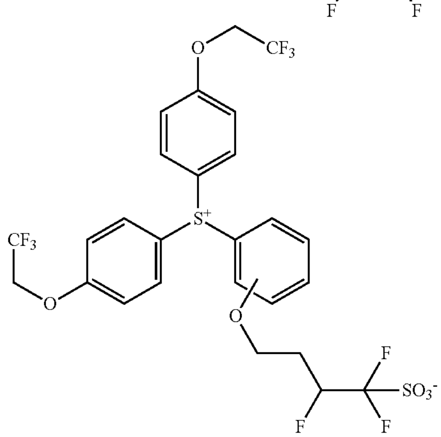
-continued
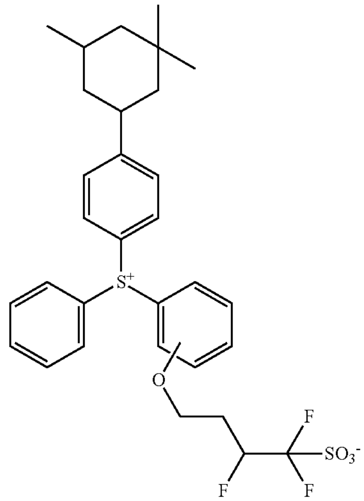
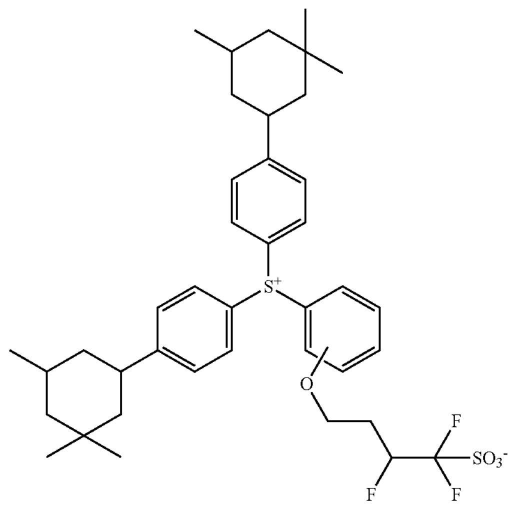
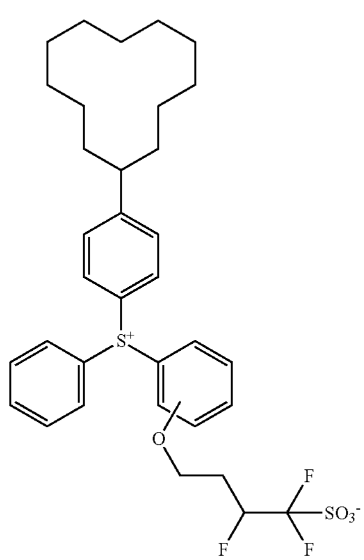

-continued
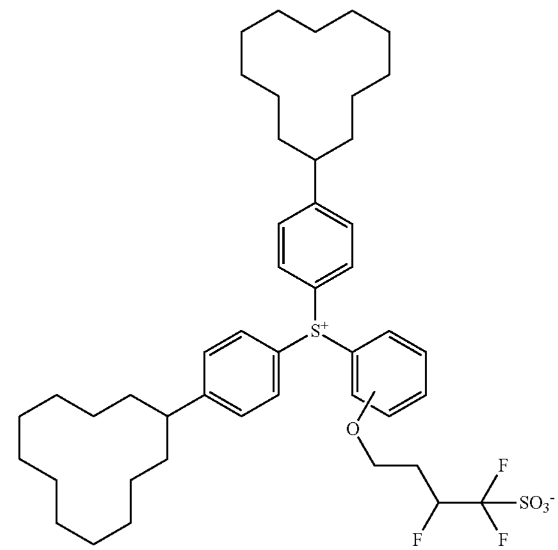
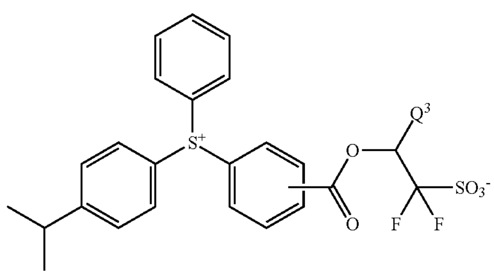
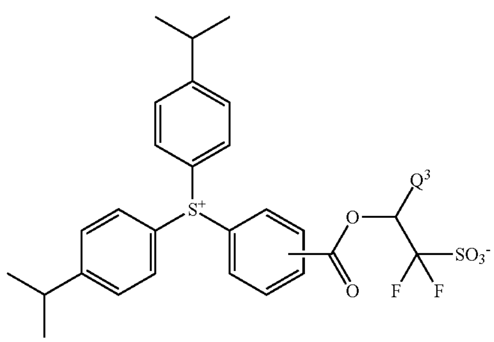
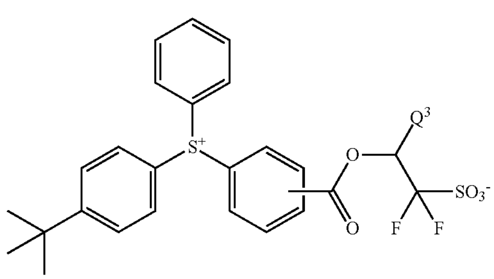
-continued
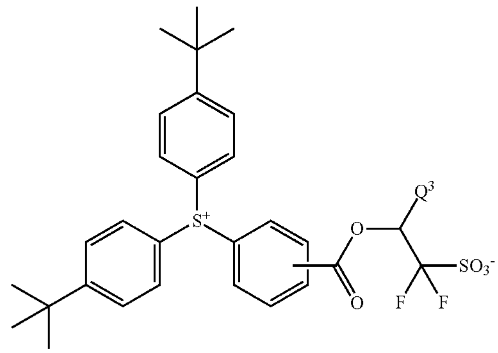
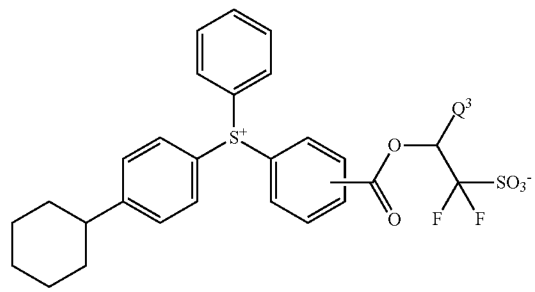
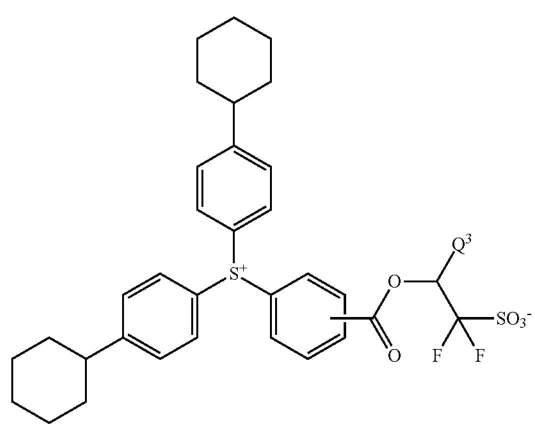
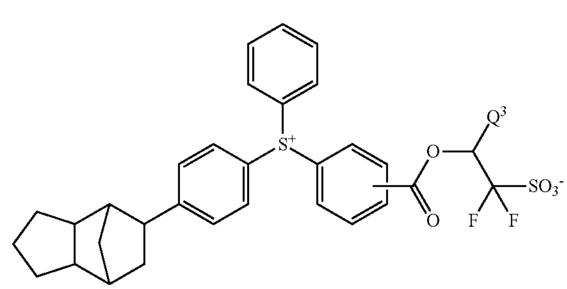

-continued
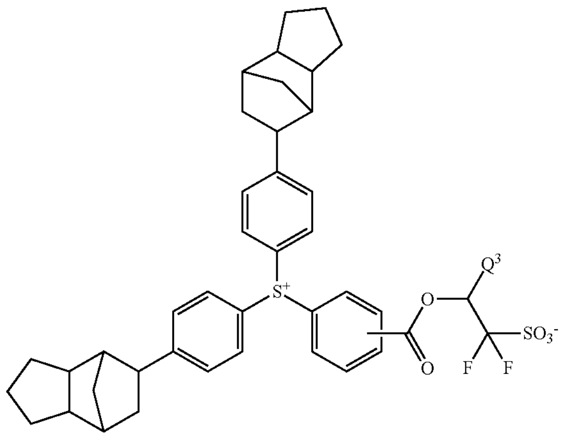
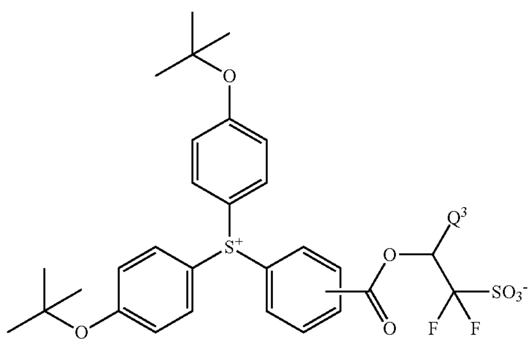
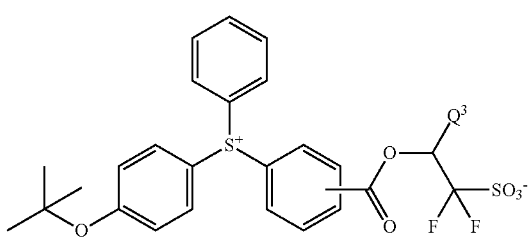
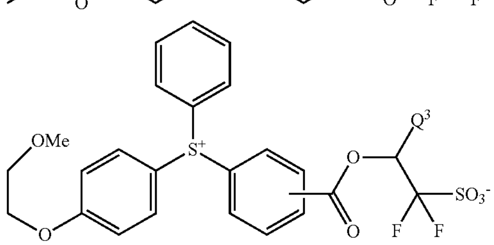
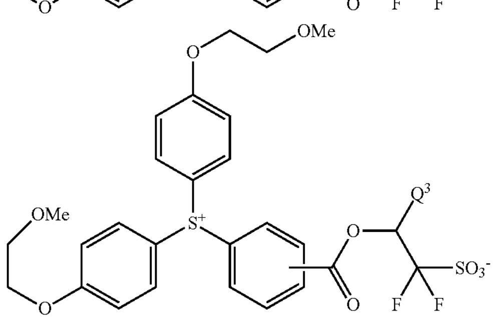
-continued
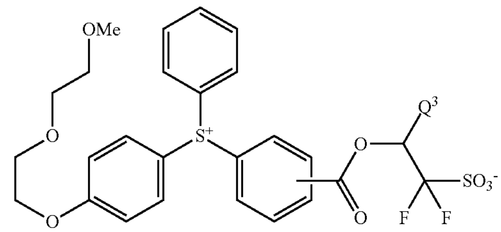
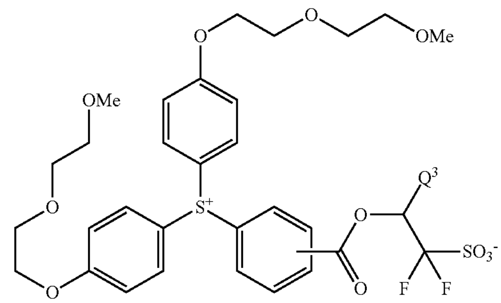
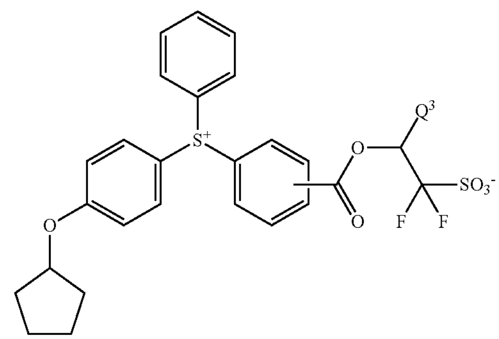
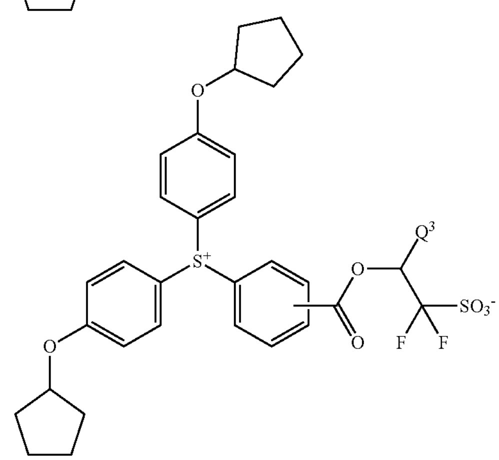
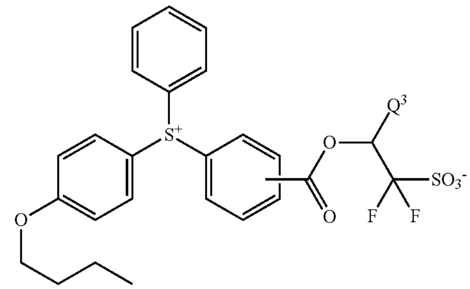

-continued
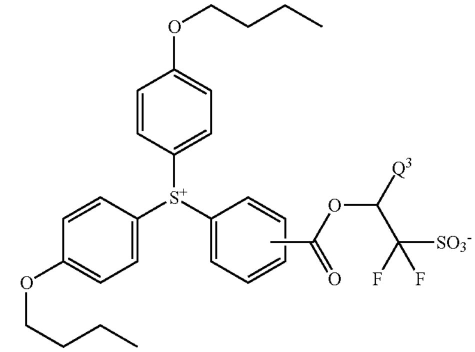
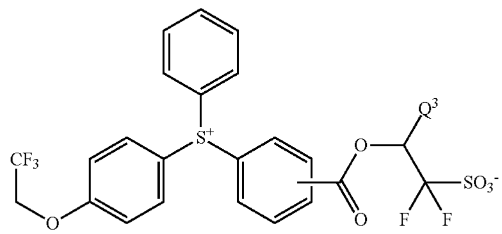
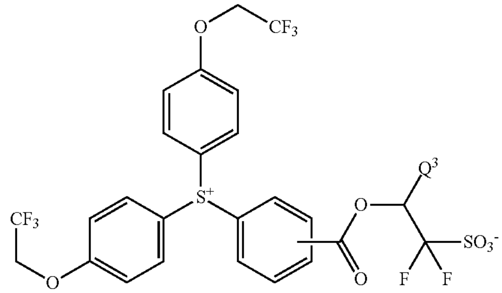
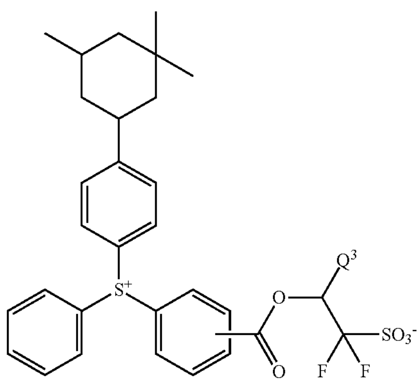
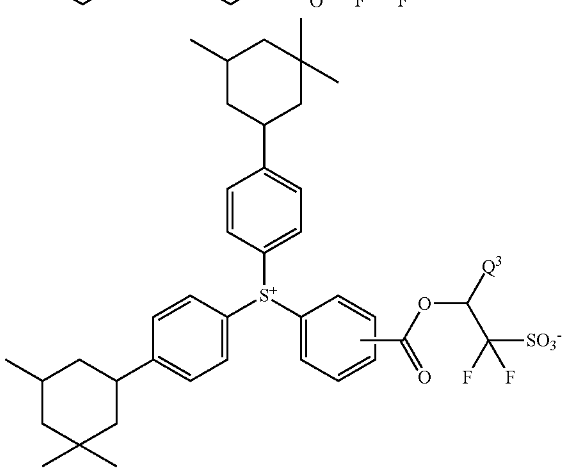
-continued
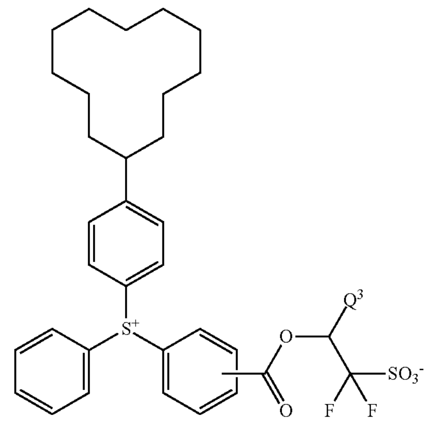
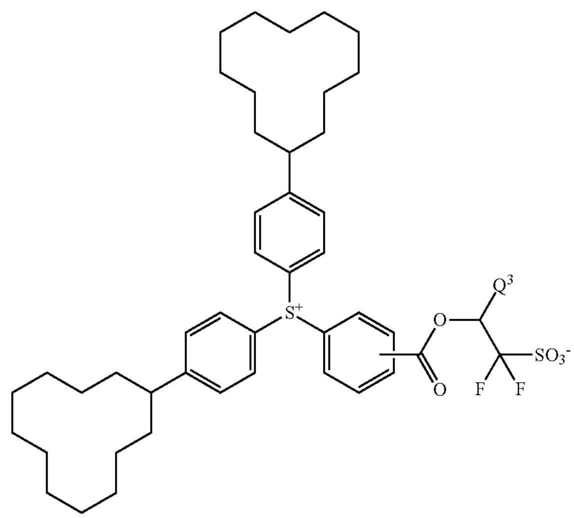
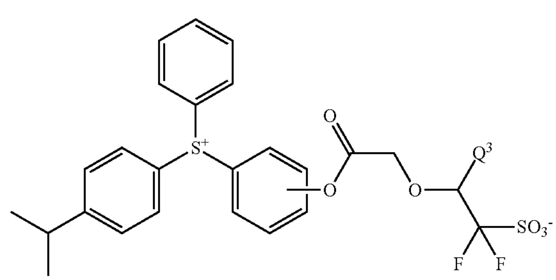
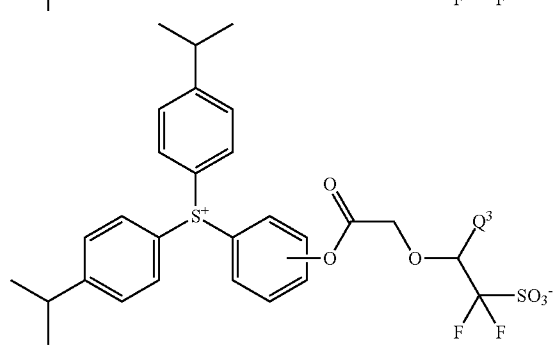

-continued
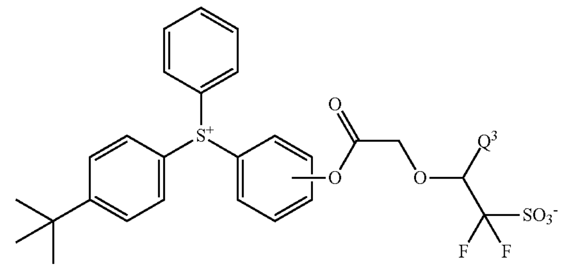
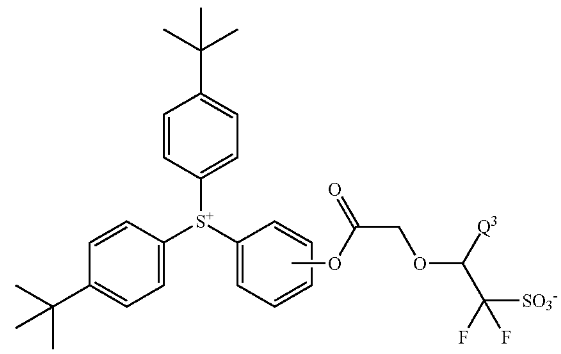
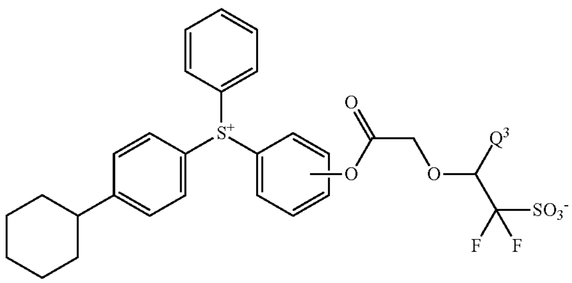
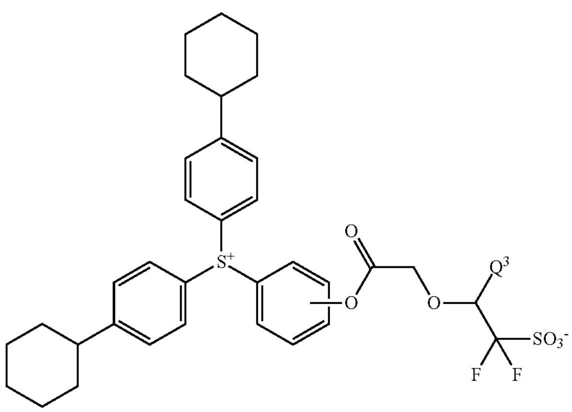
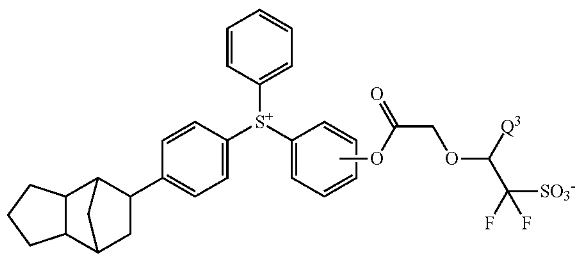
-continued
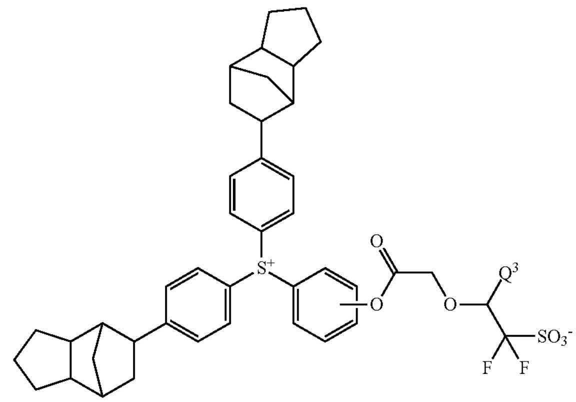
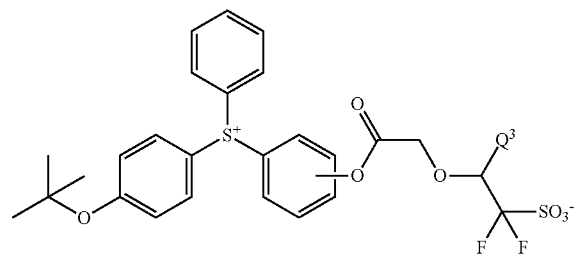
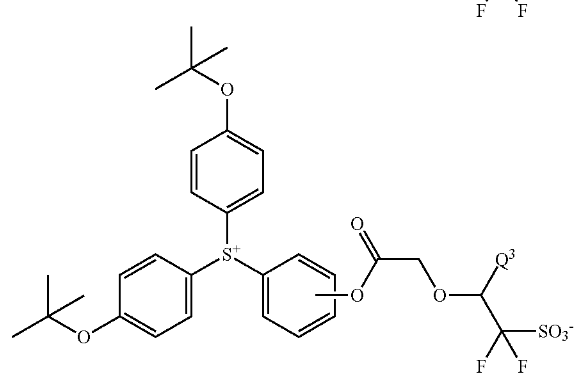
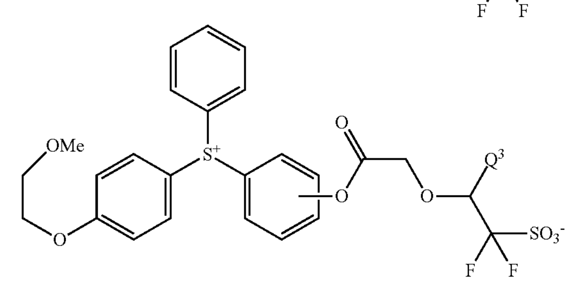
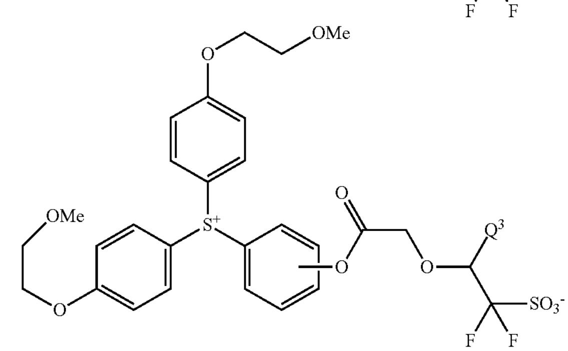

-continued
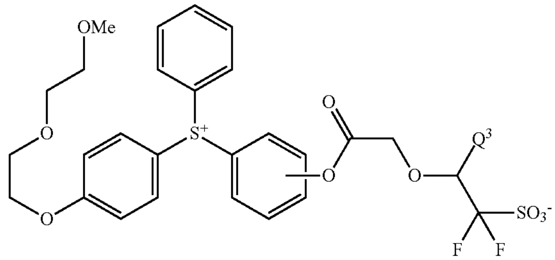
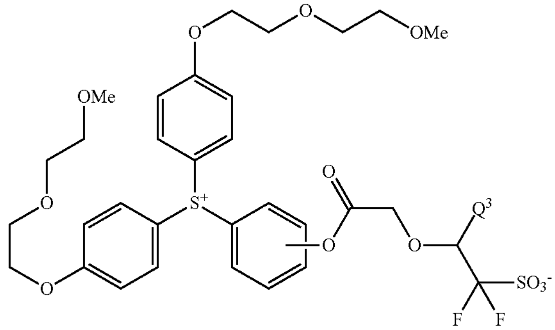
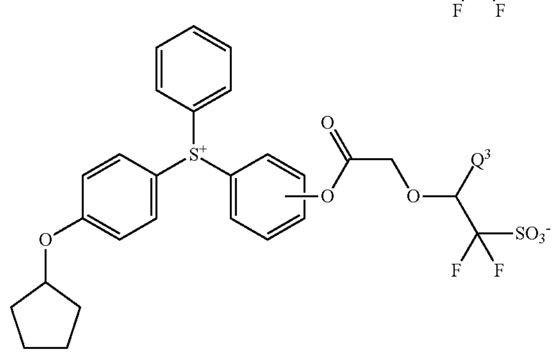
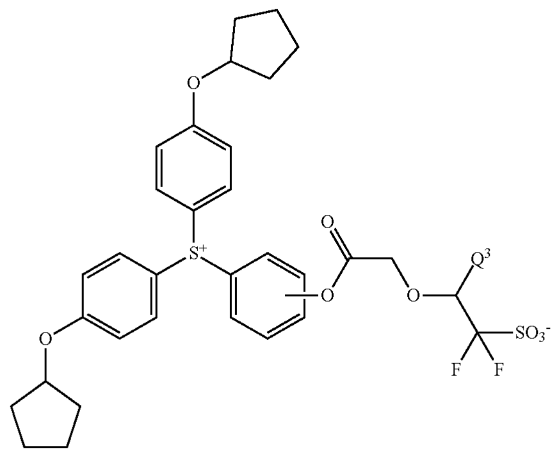
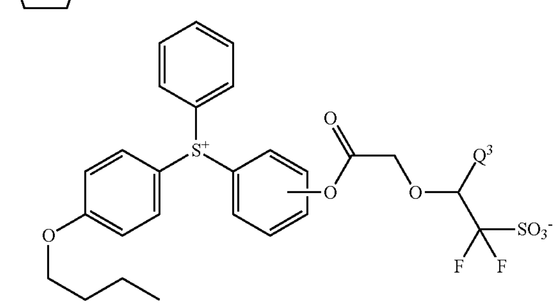
-continued
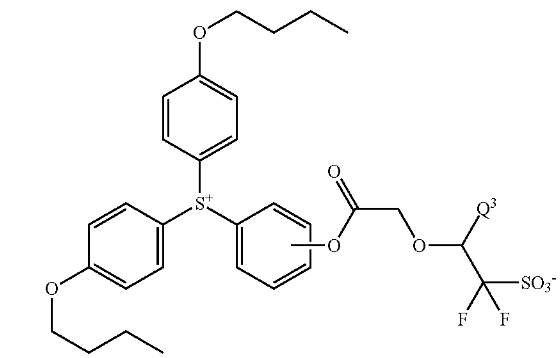
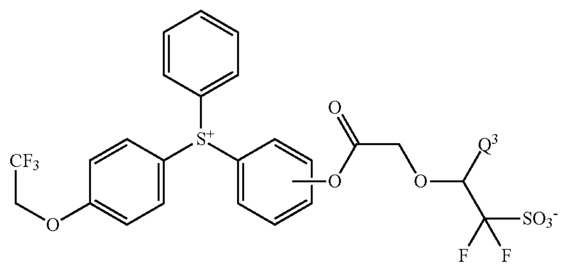
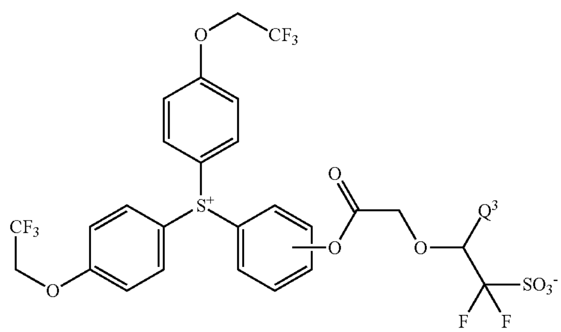
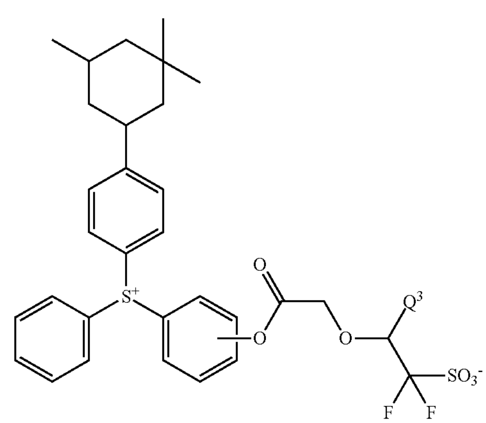

-continued
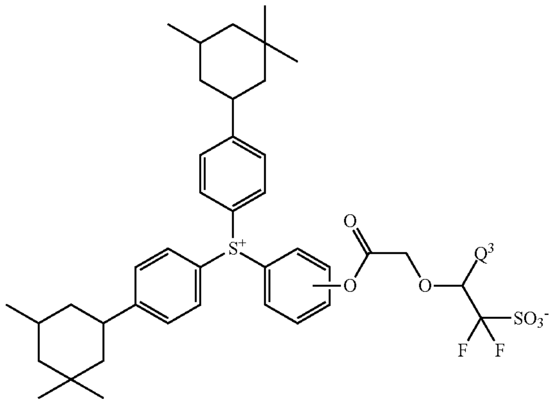
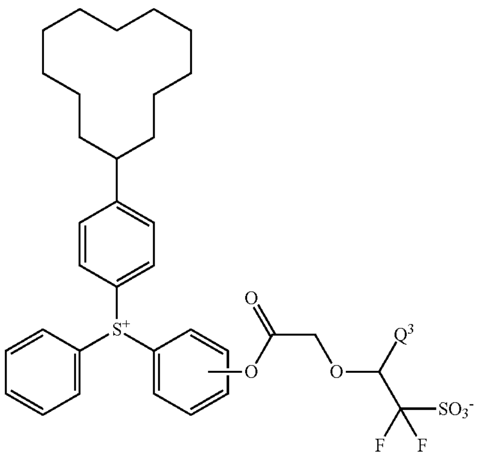
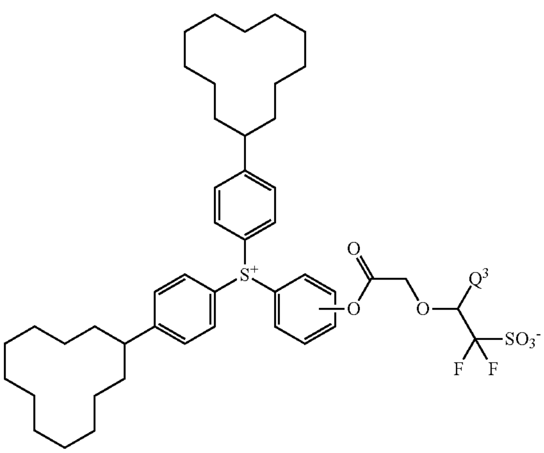
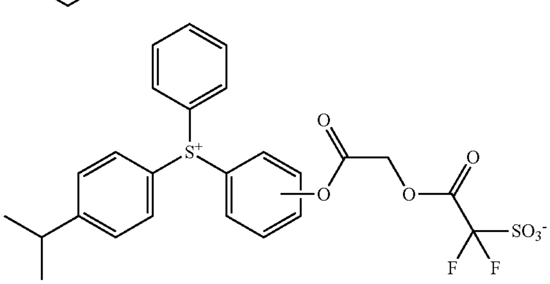
-continued
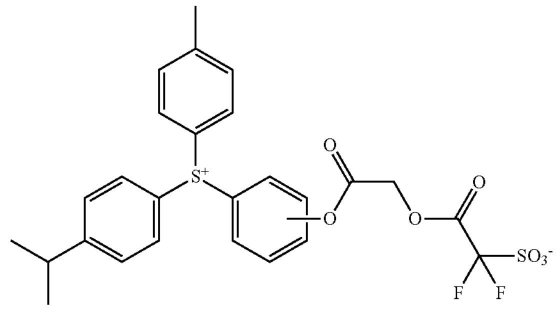
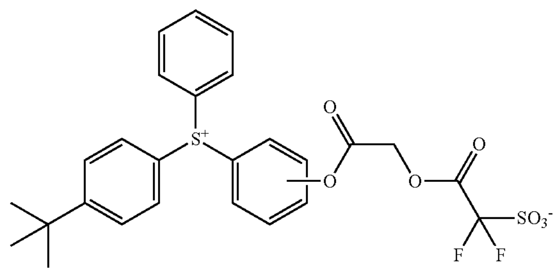
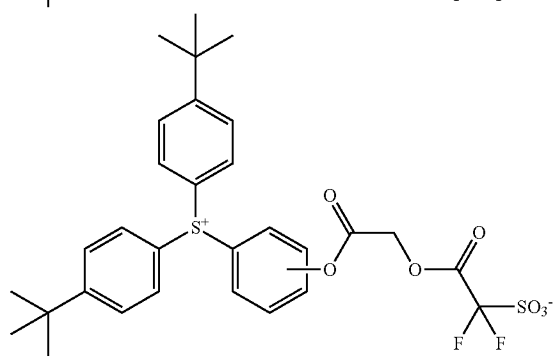
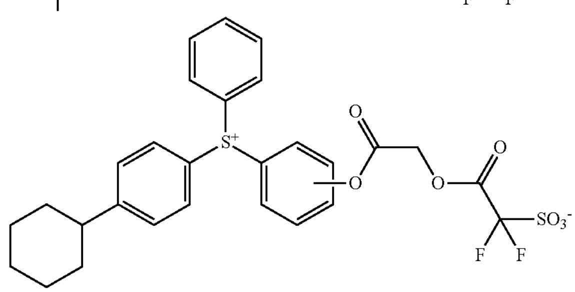
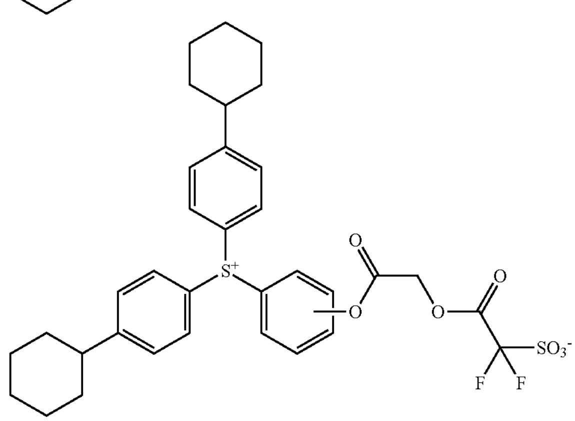

-continued
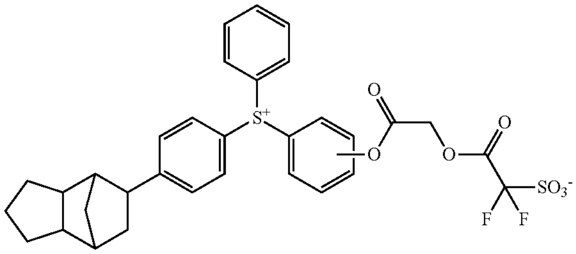
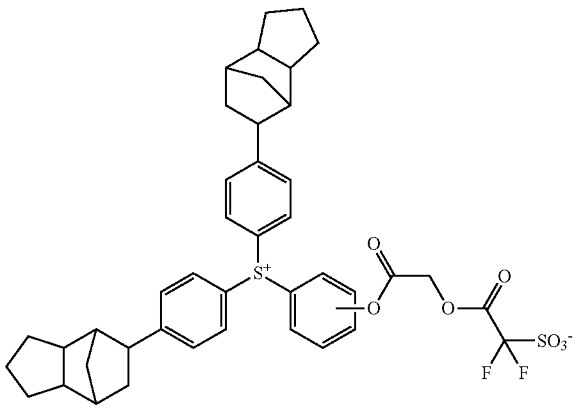
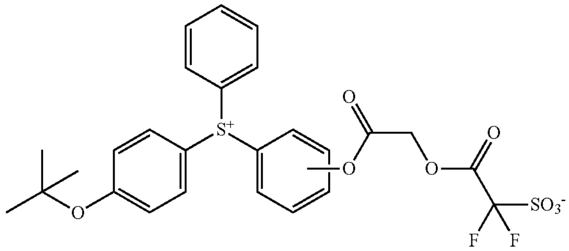
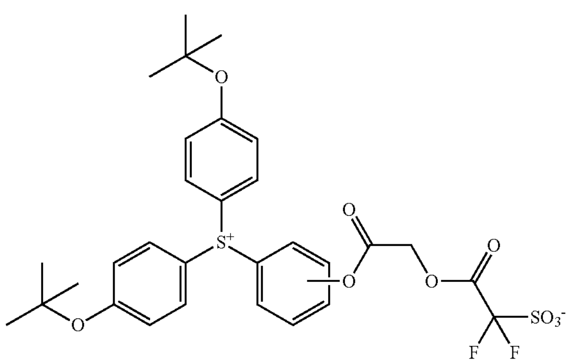
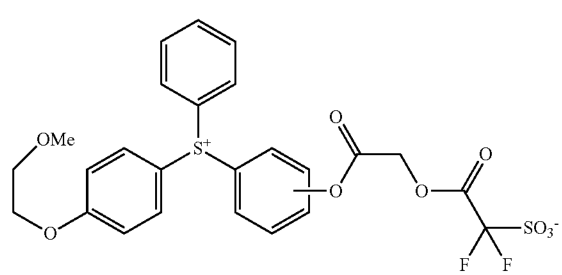
-continued
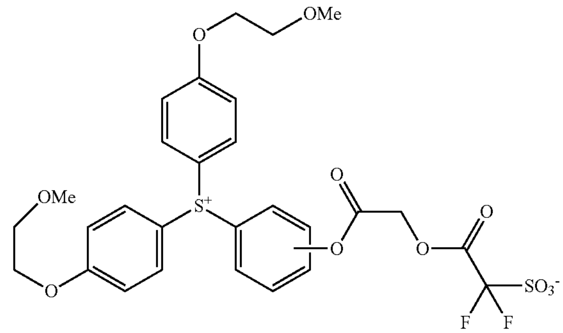
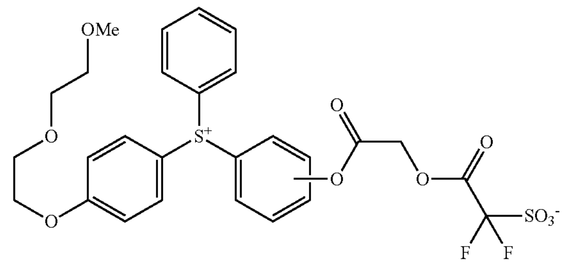
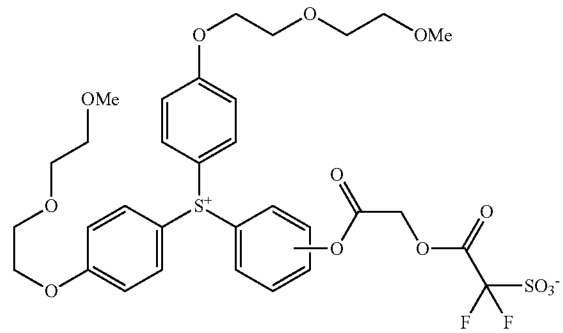
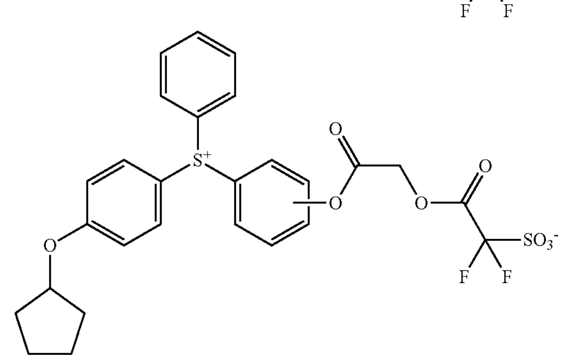
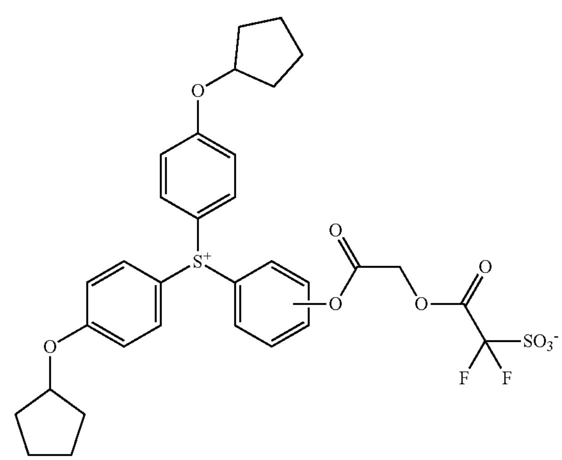

-continued
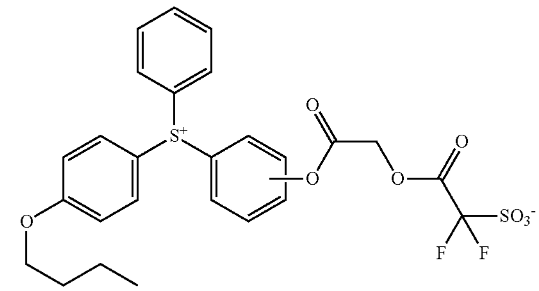
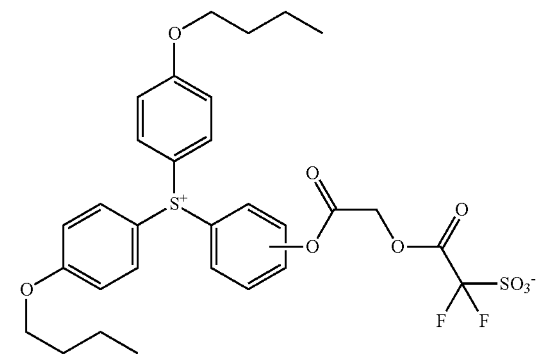
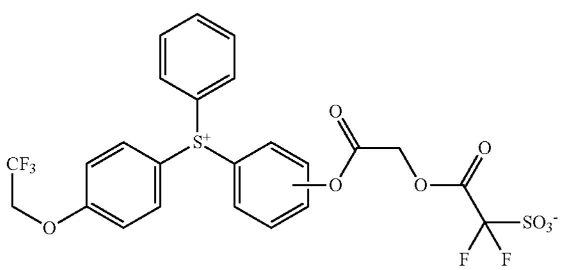
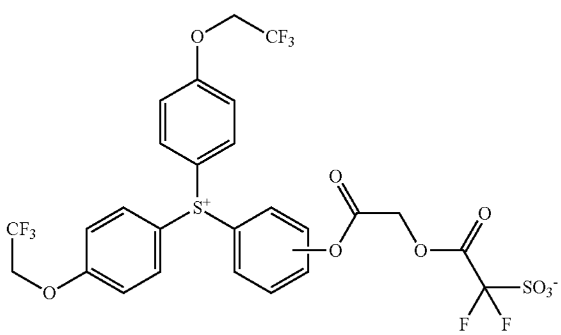
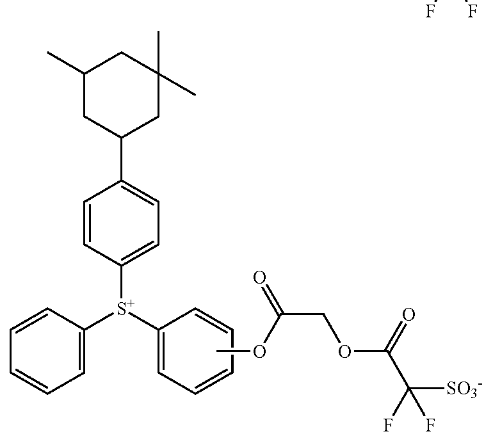
-continued
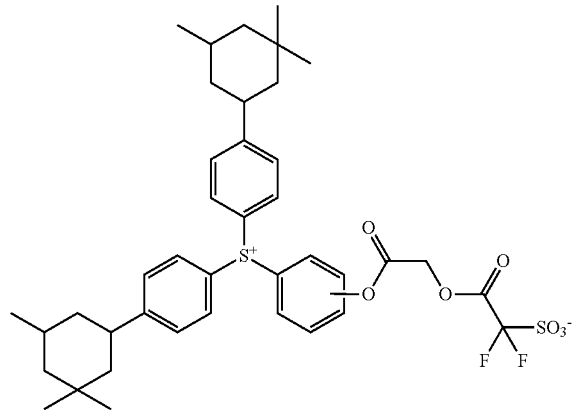
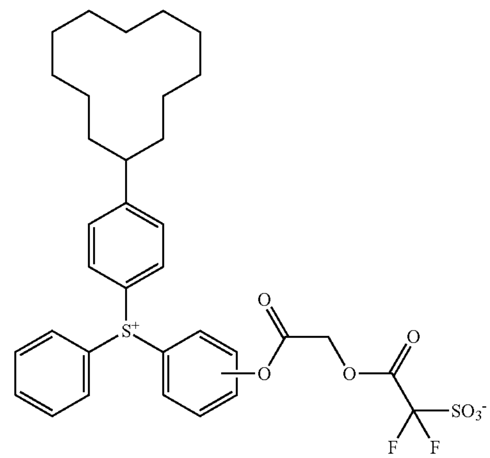
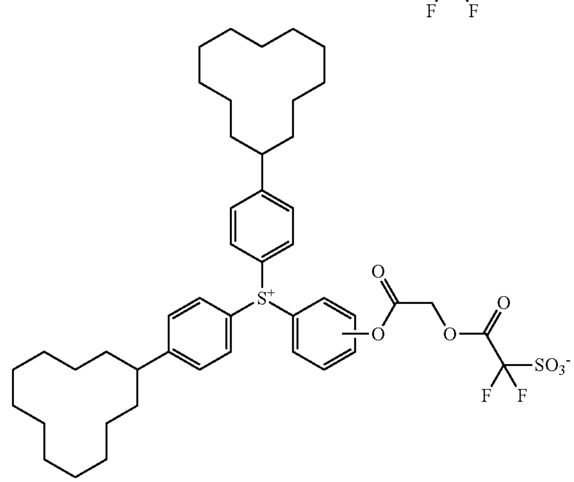
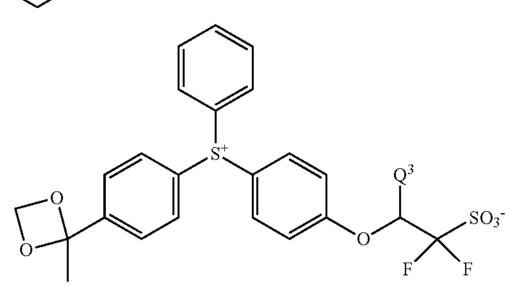

-continued
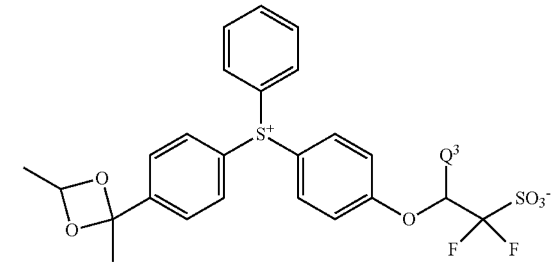
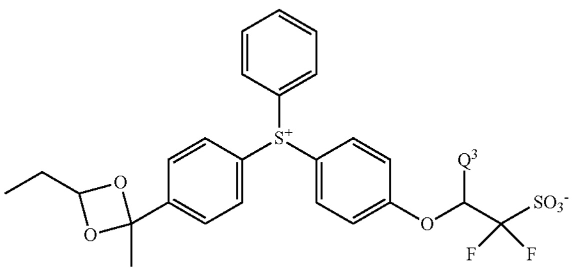
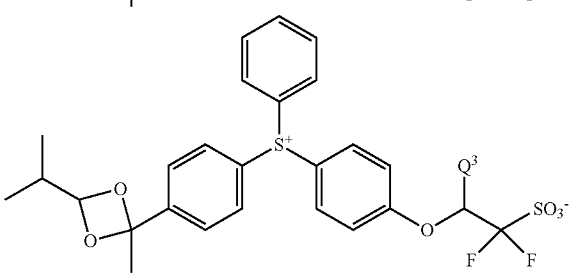
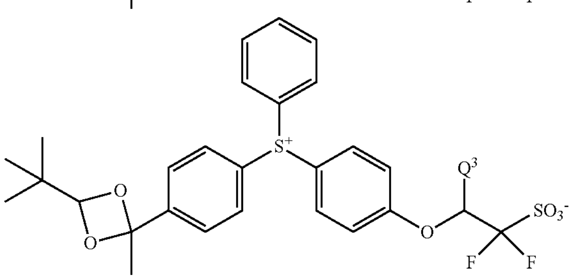
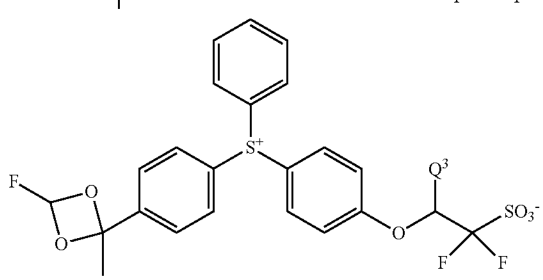
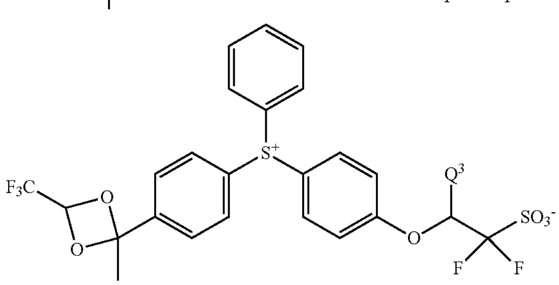
-continued
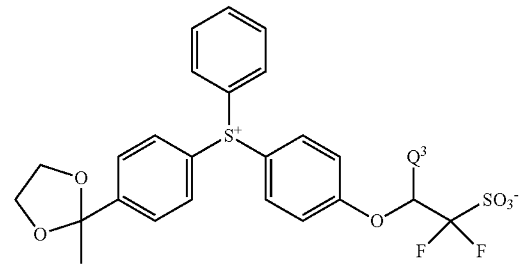
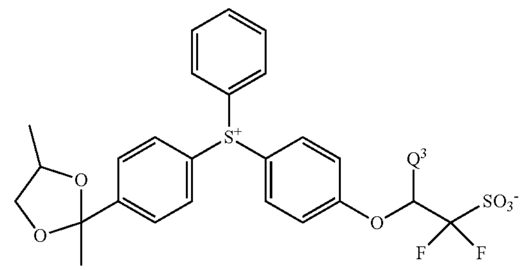
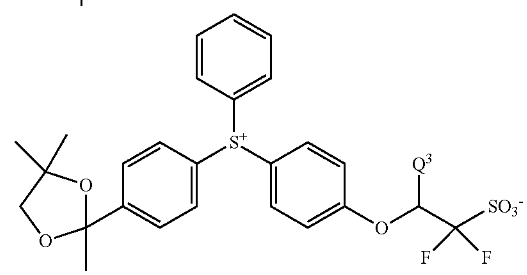
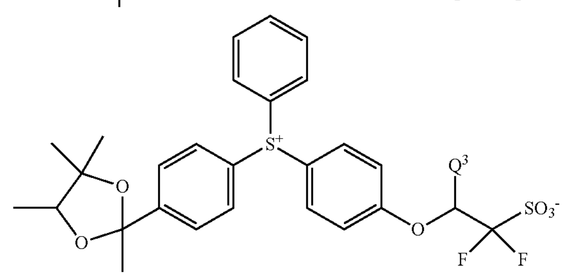
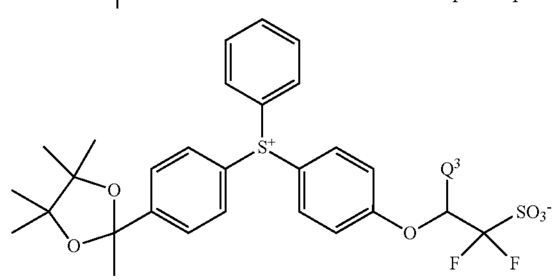
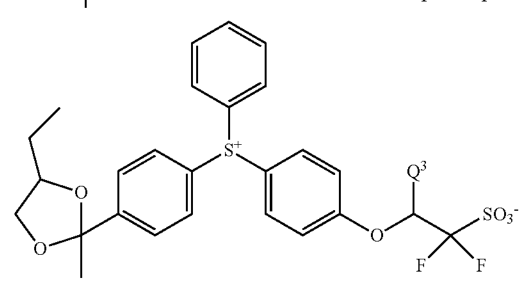

-continued
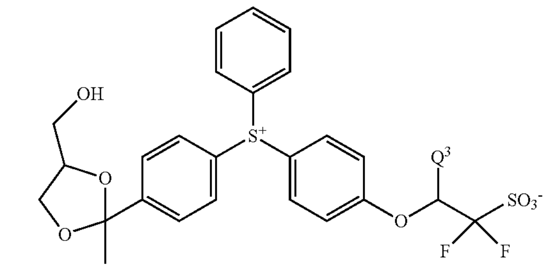
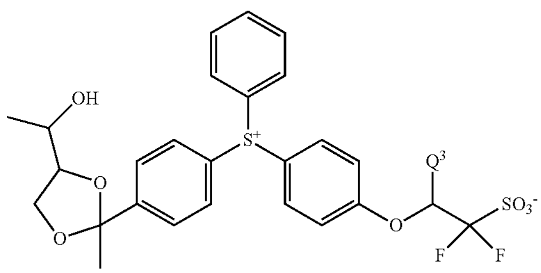
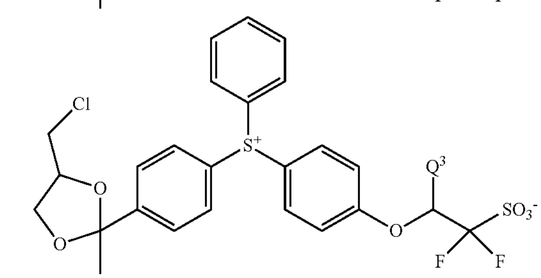
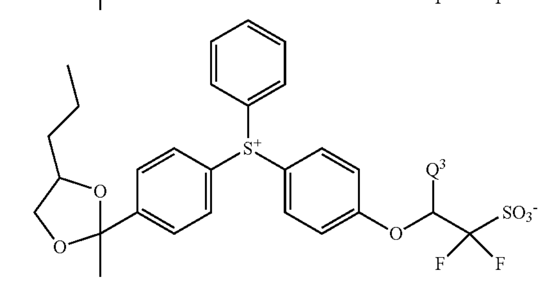
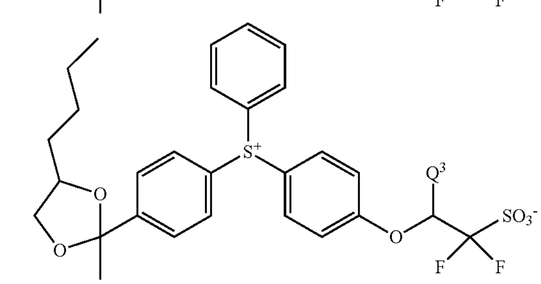
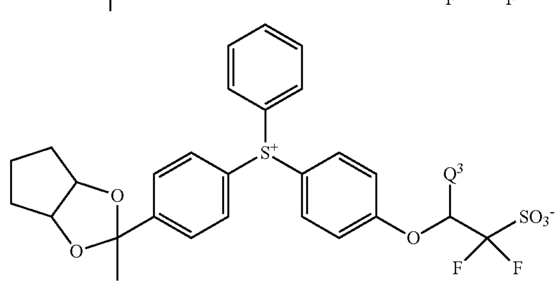
-continued
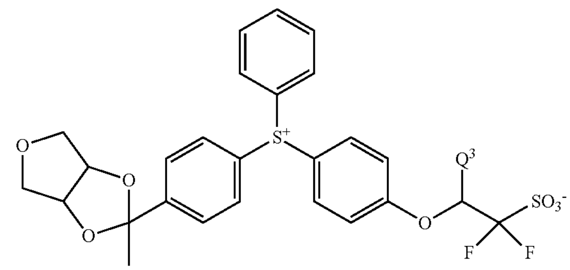
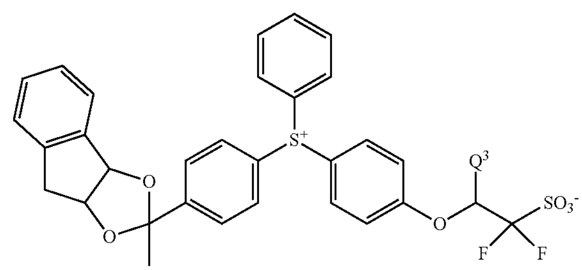
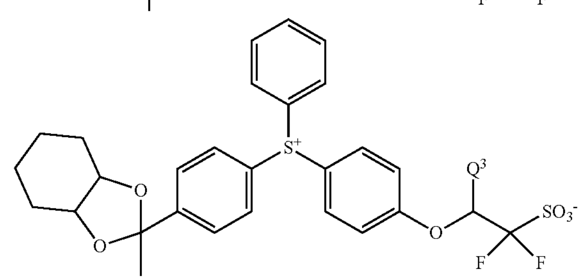
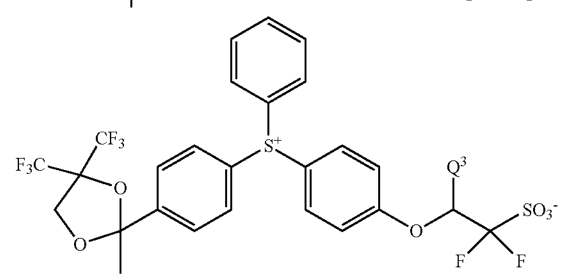
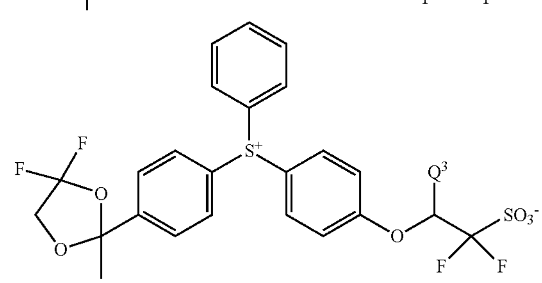
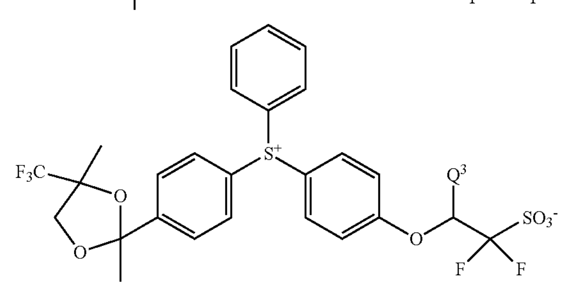

-continued
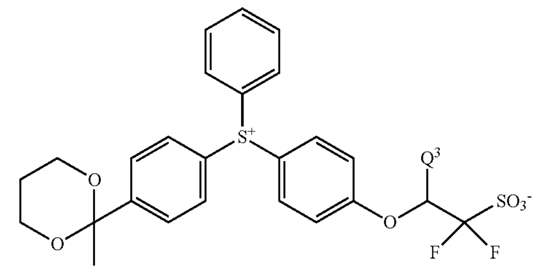
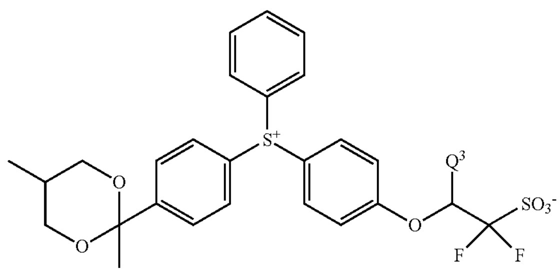
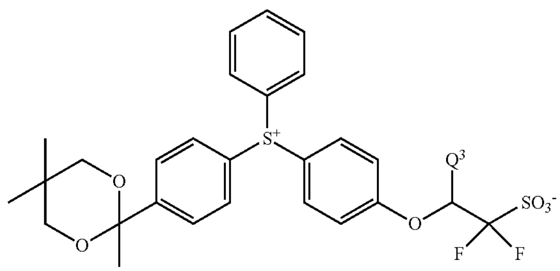
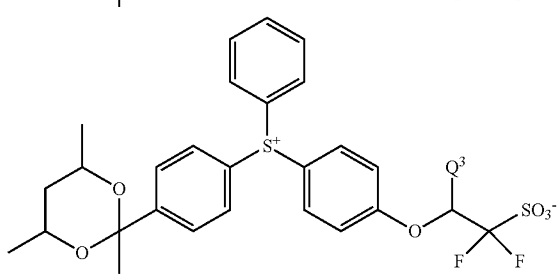
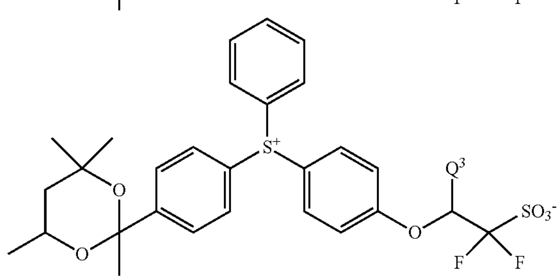
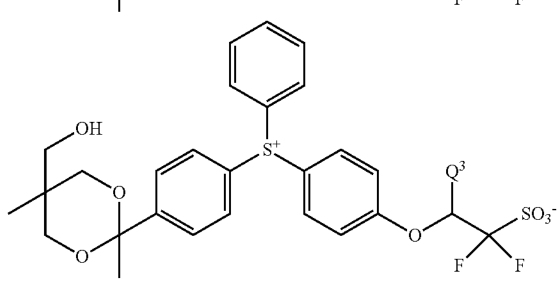
-continued
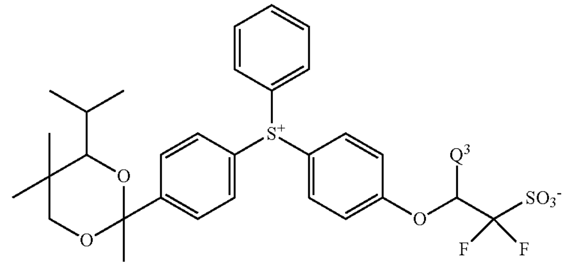
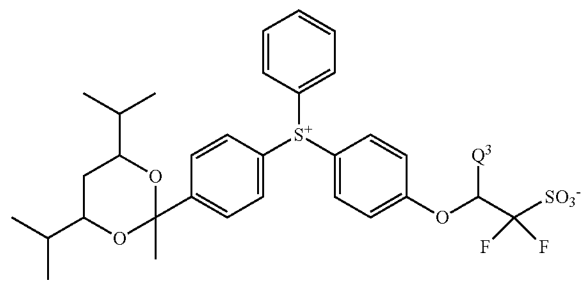
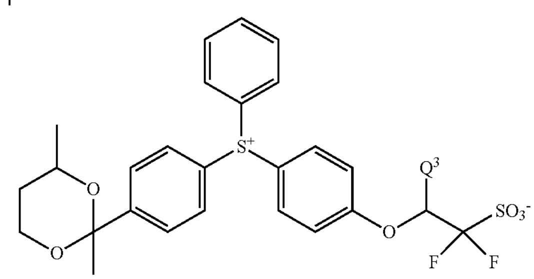
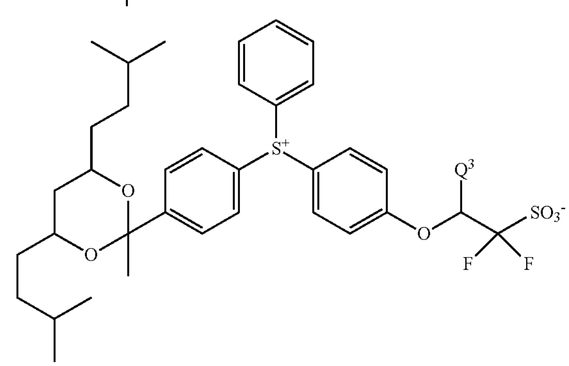
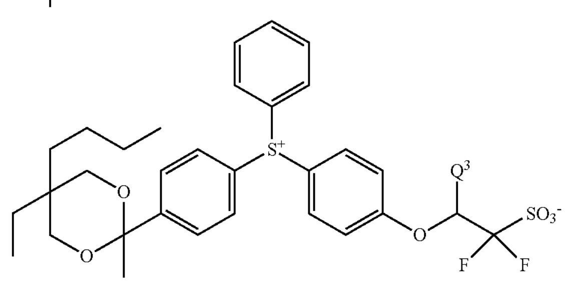
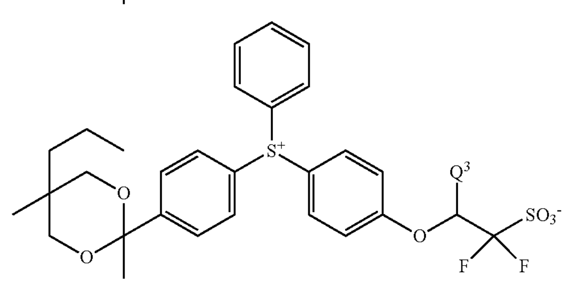

-continued
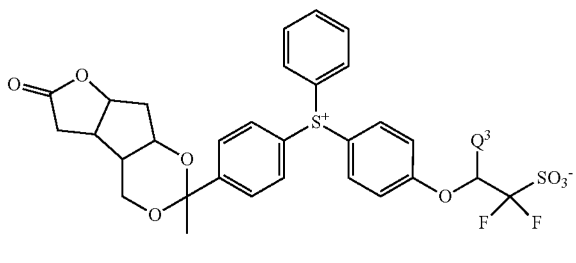
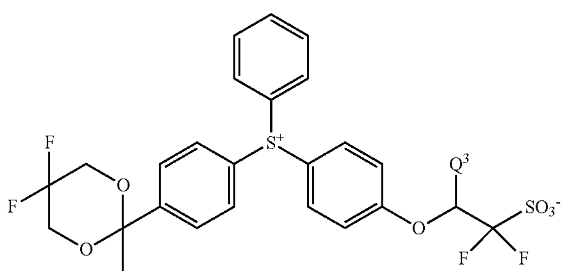
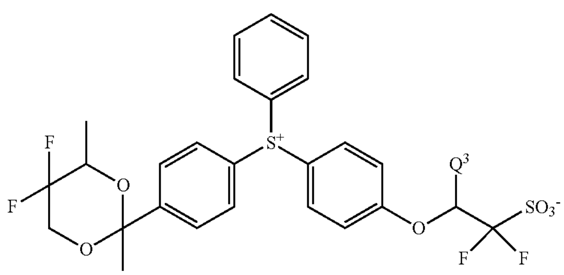
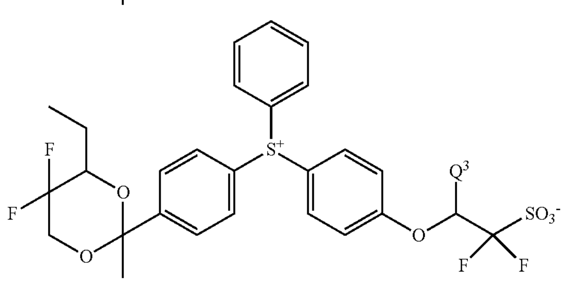
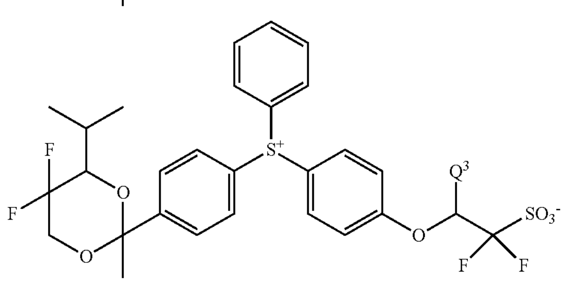
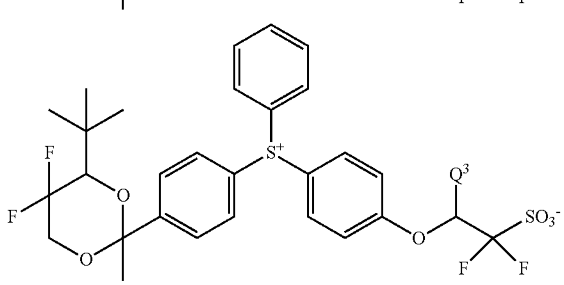
-continued
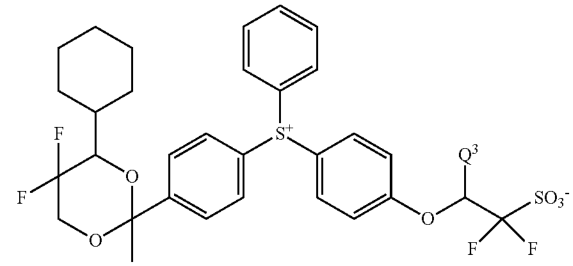
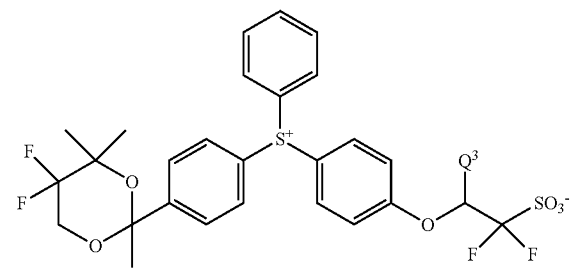
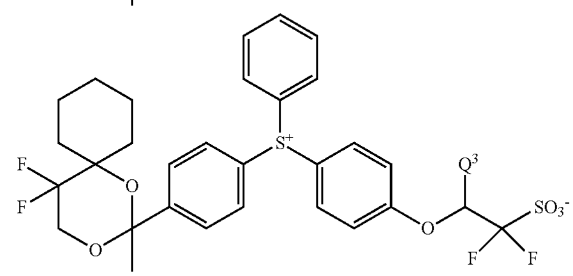
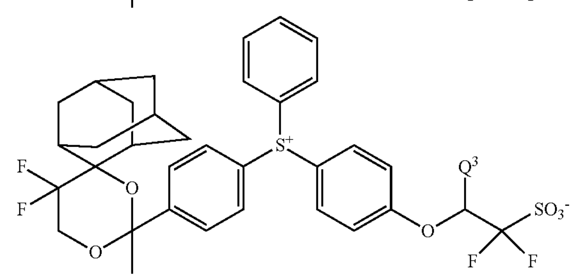
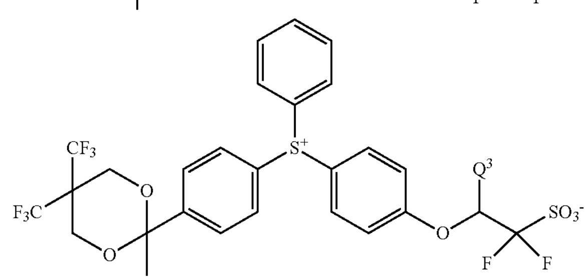
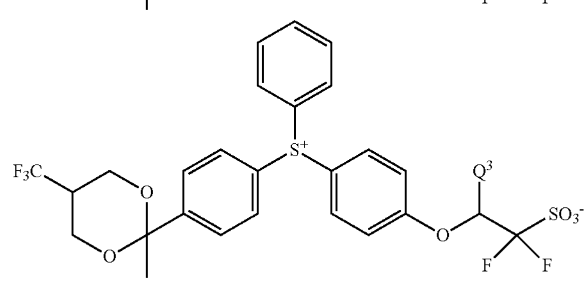

-continued
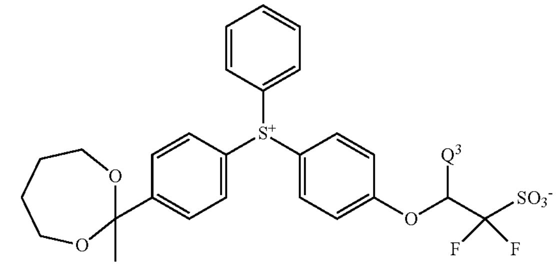
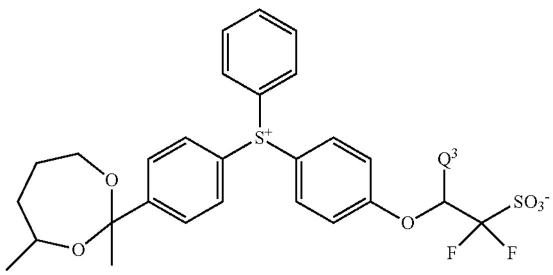
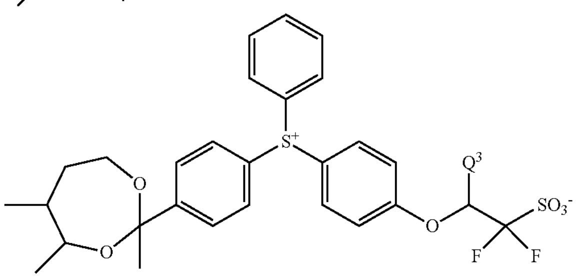
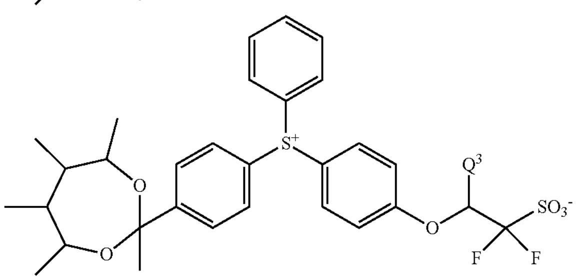
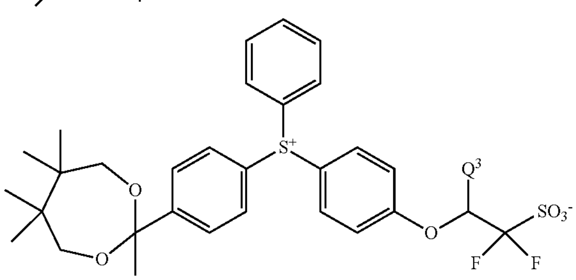
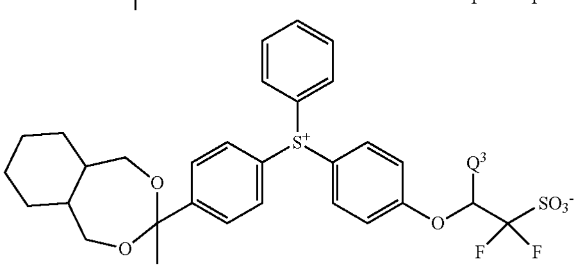
-continued
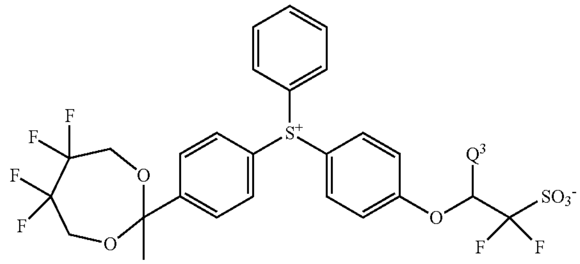
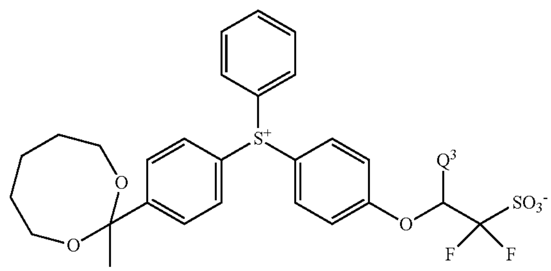
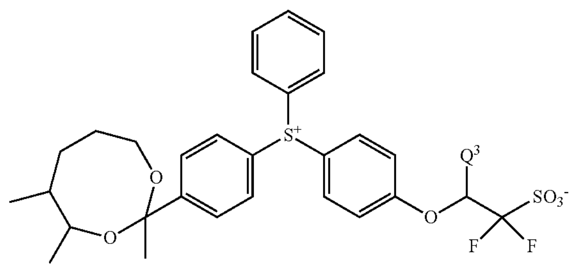
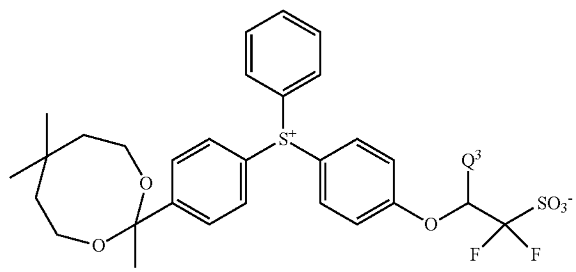
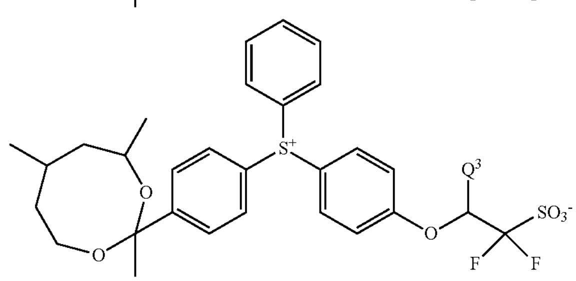
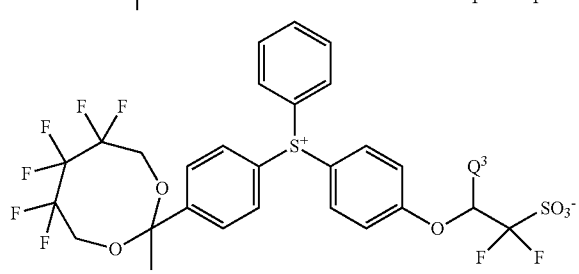

-continued
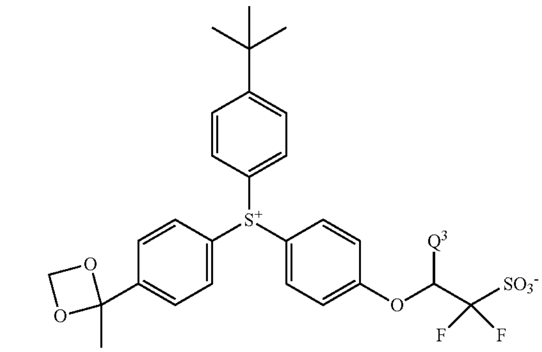
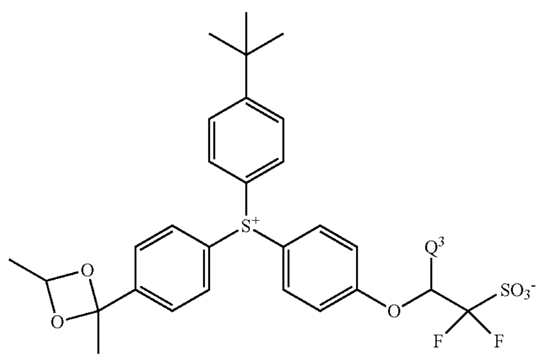
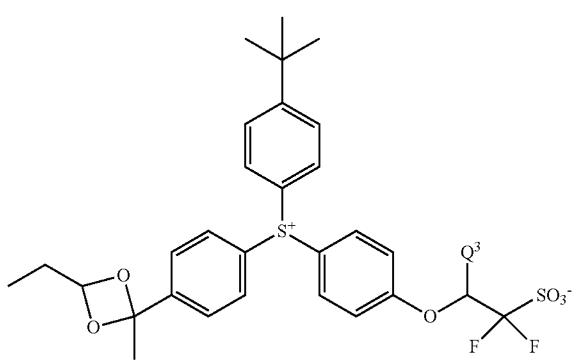
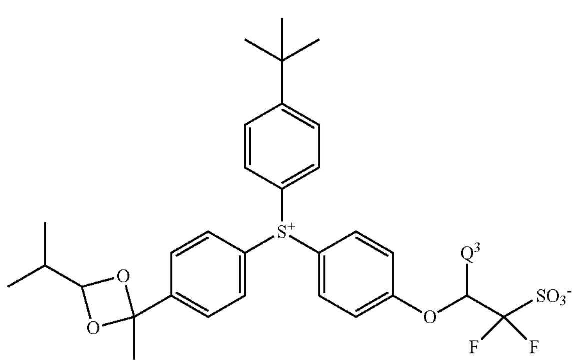
-continued
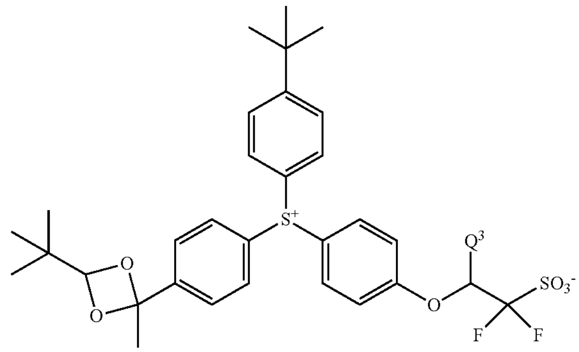
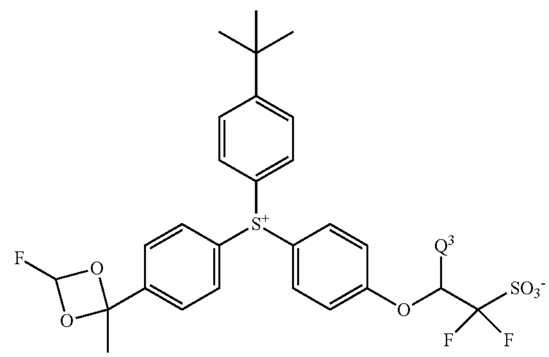
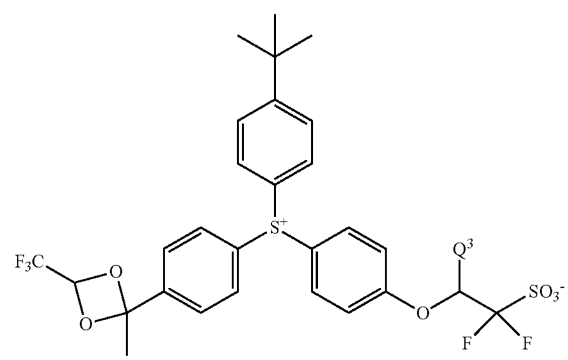
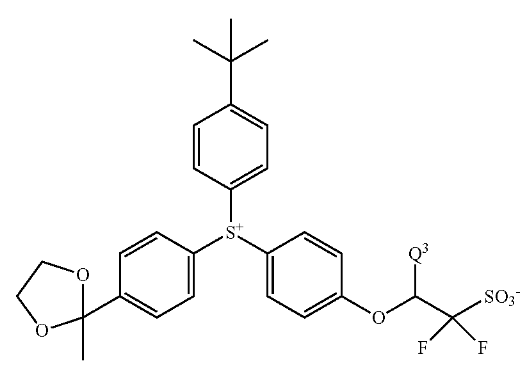

-continued
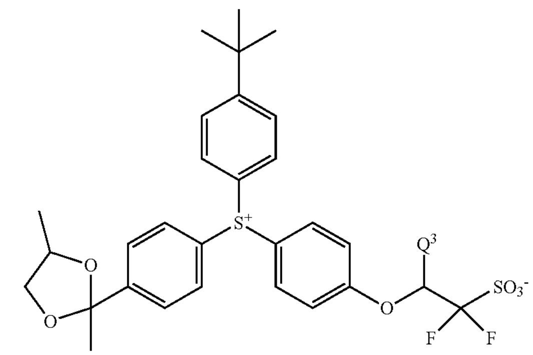
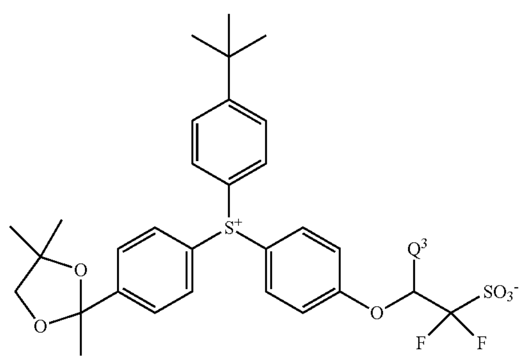
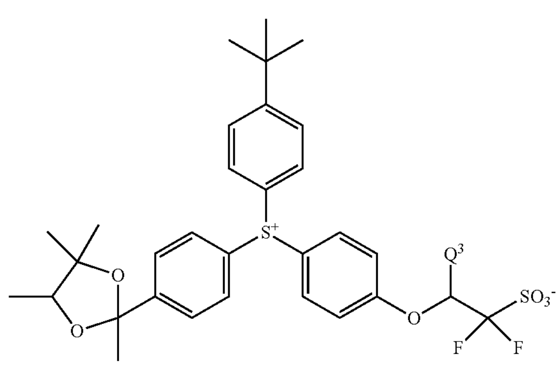
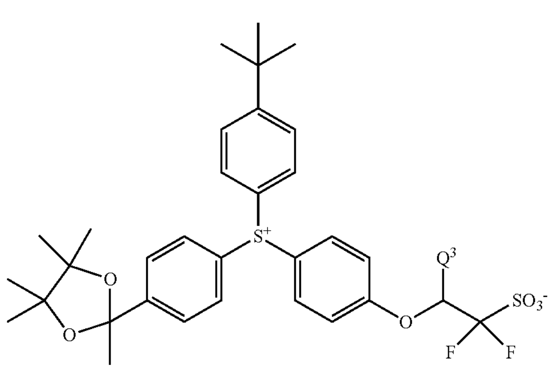
-continued
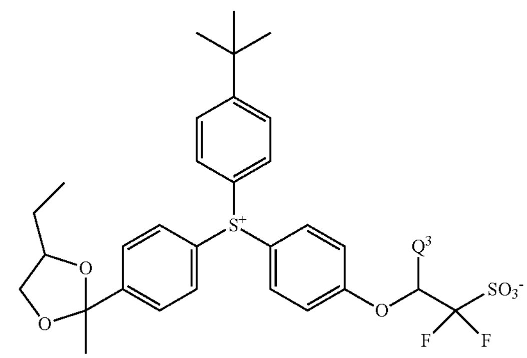
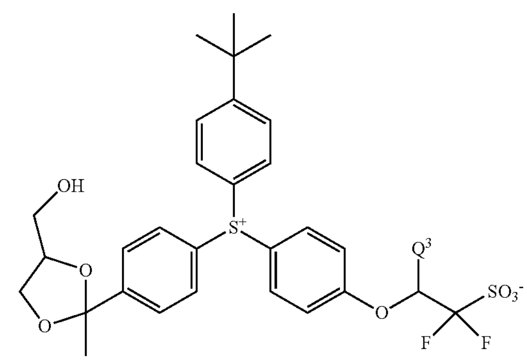
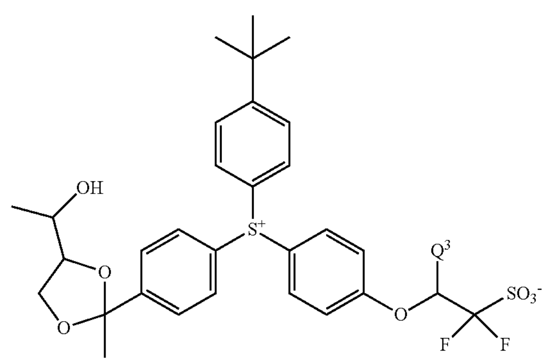
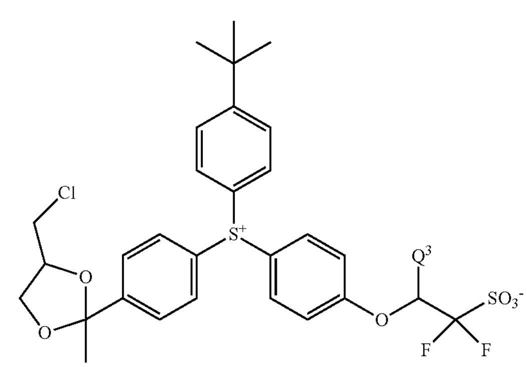

-continued
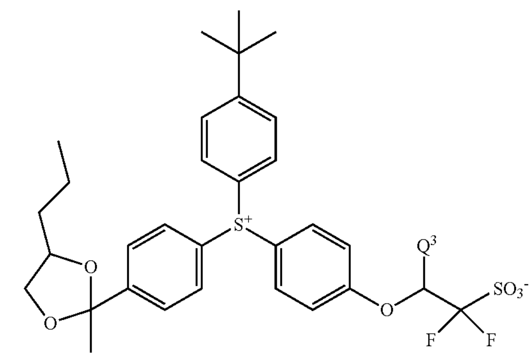
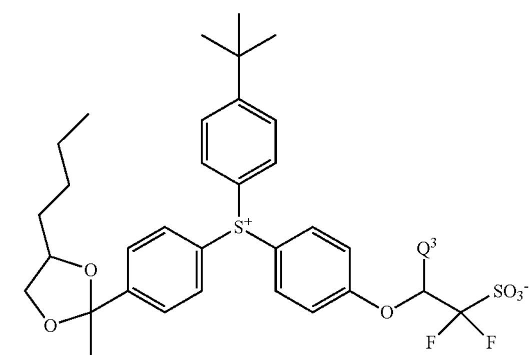
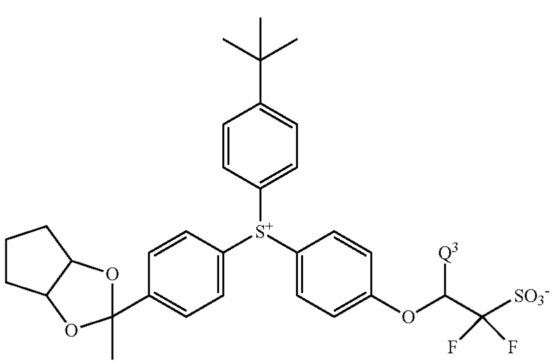
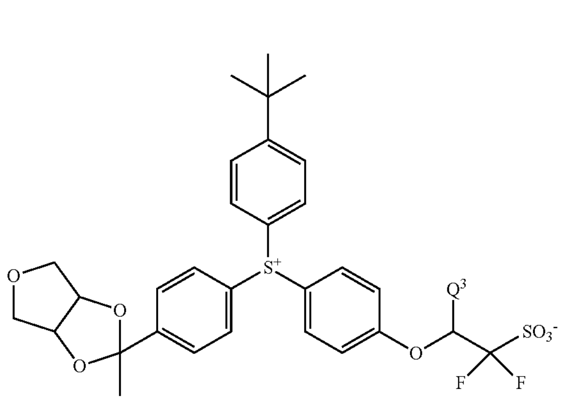
-continued
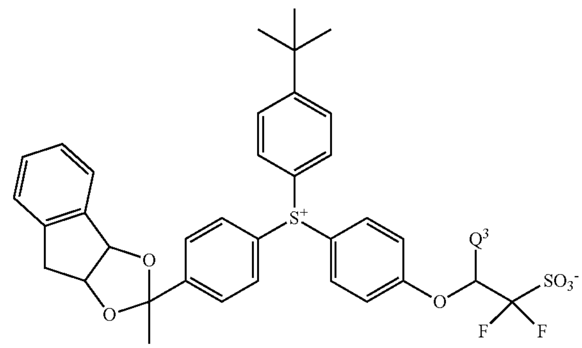
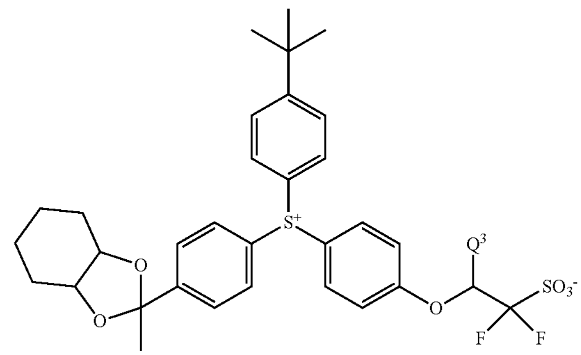
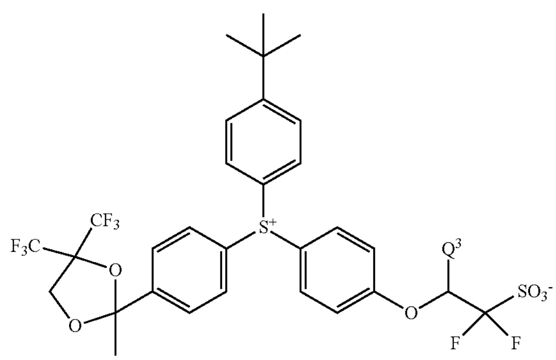
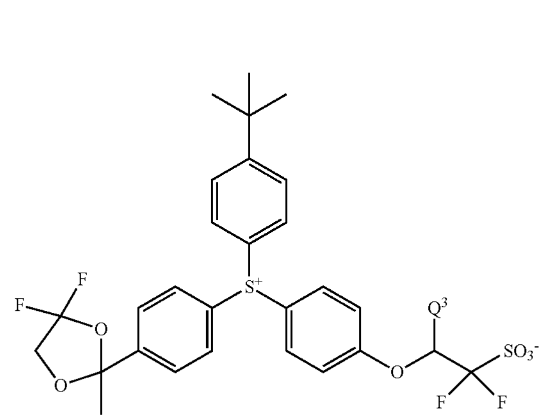

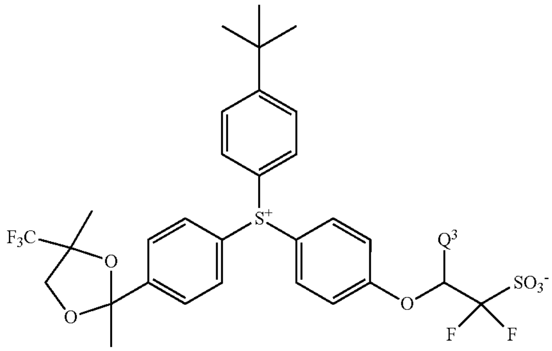
S+
F3C
O
O
Q3
SO3-
F
F
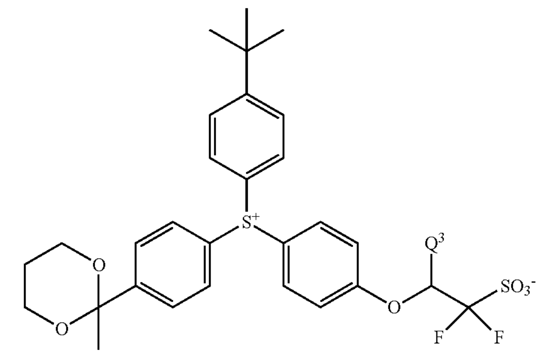
S+
O
O
Q3
SO3-
F
F
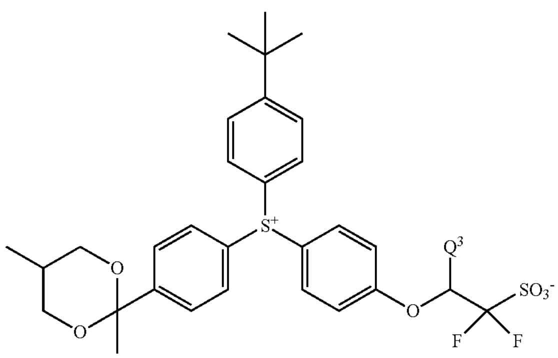
S+
O
O
Q3
SO3-
F
F
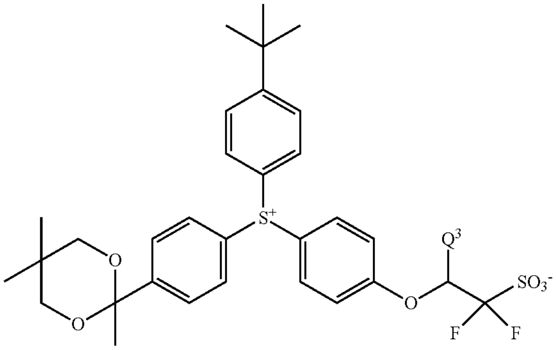
S+
O
O
Q3
SO3-
F
F
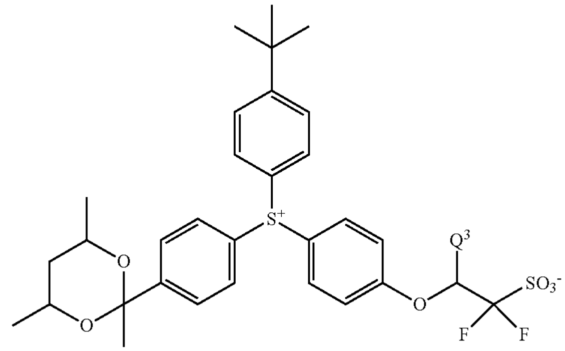
S+
O
O
Q3
SO3-
F
F
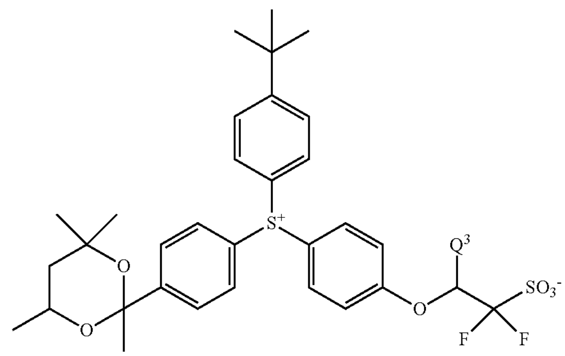
S+
O
O
Q3
SO3-
F
F
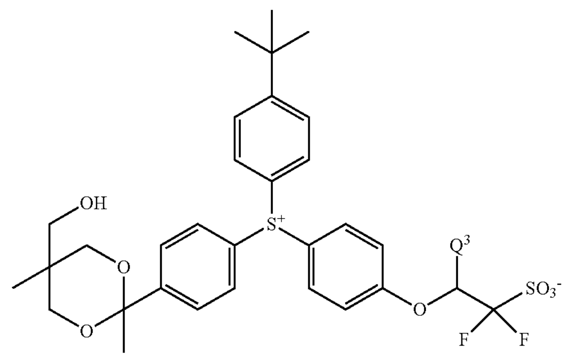
OH
S+
O
O
Q3
SO3-
F
F
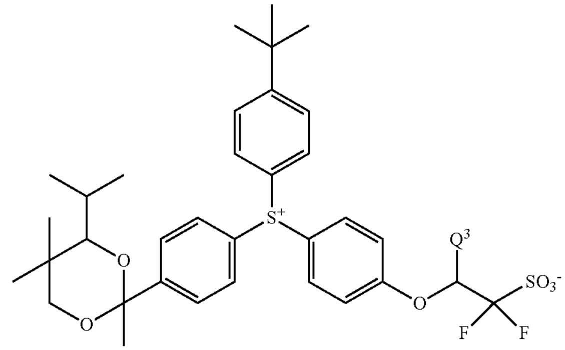
S+
O
O
Q3
SO3-
F
F -continued
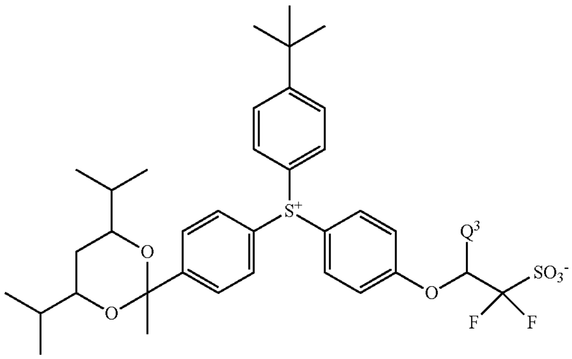
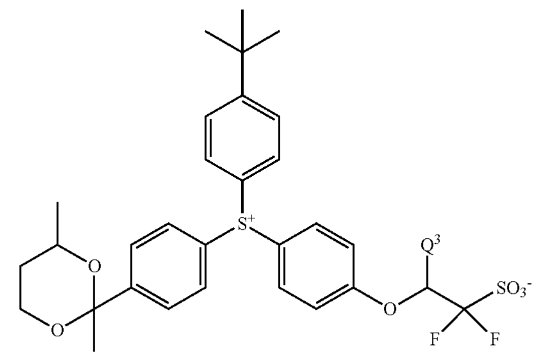
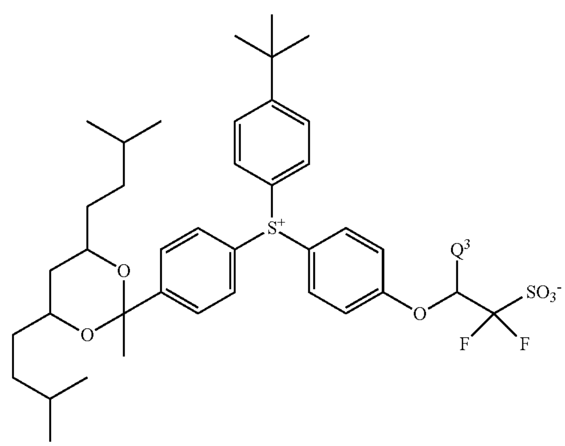
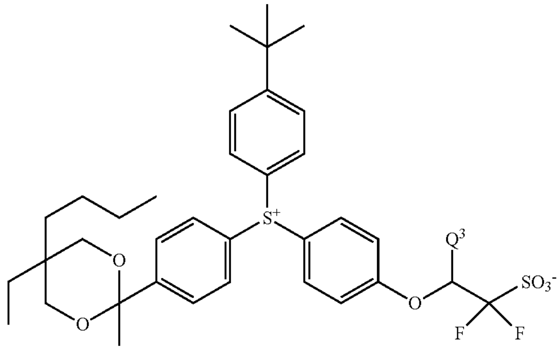
-continued
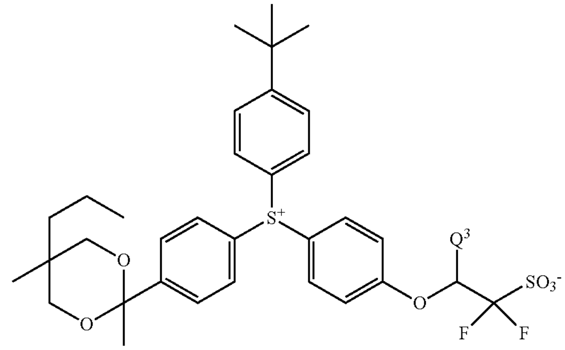
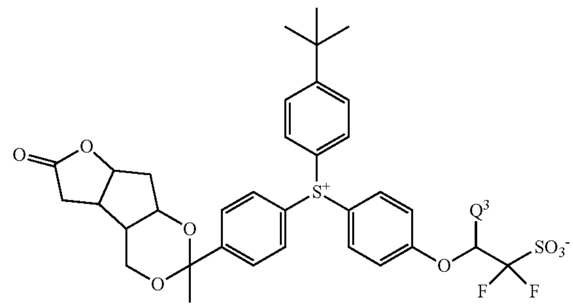
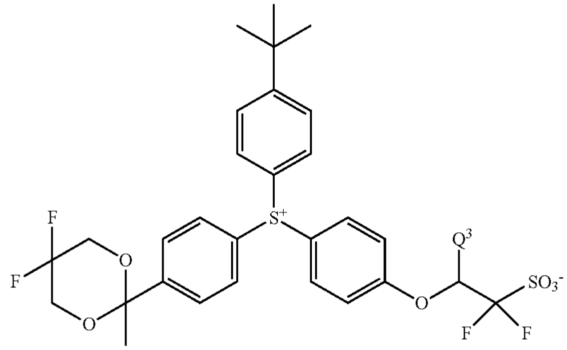
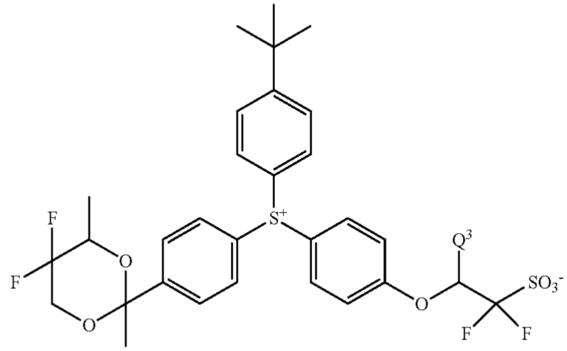
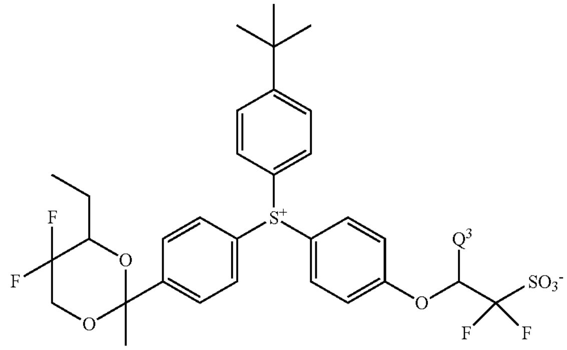

-continued
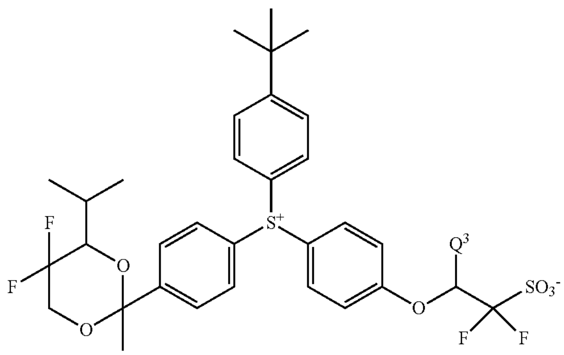
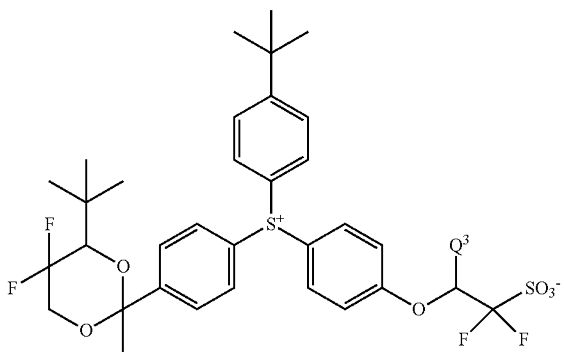
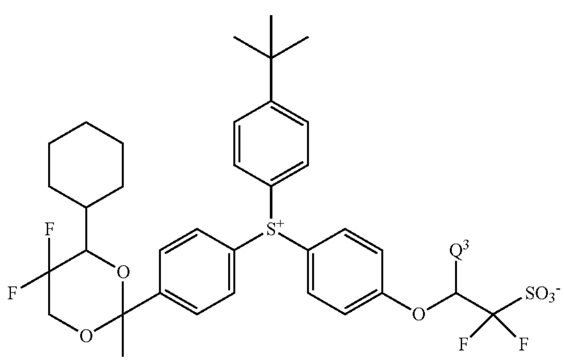
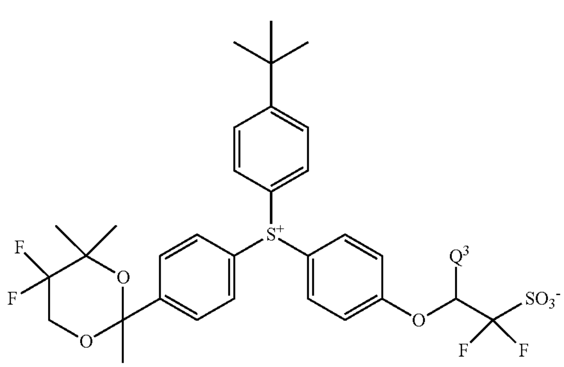
-continued
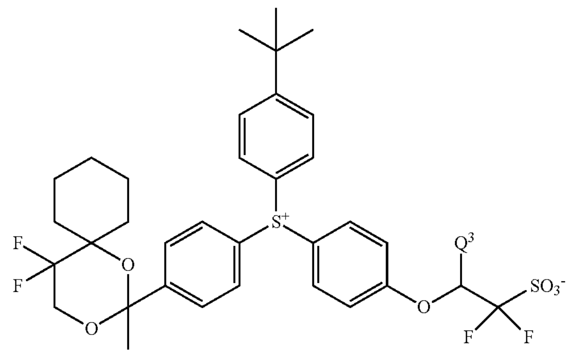
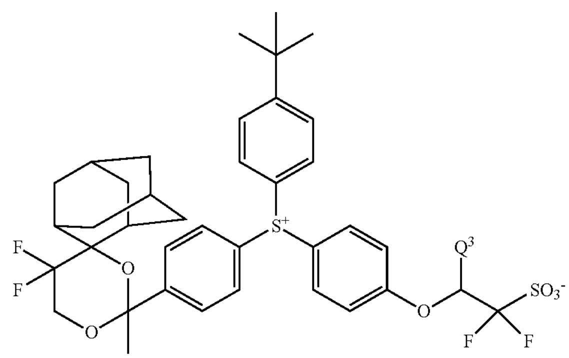
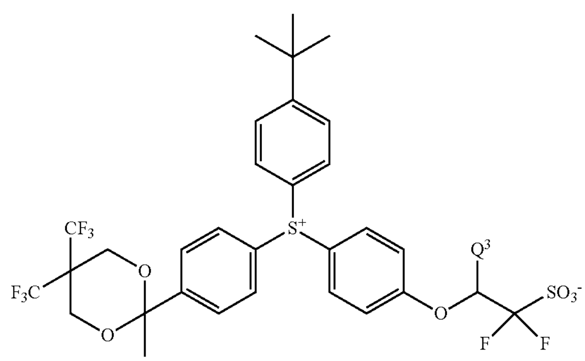
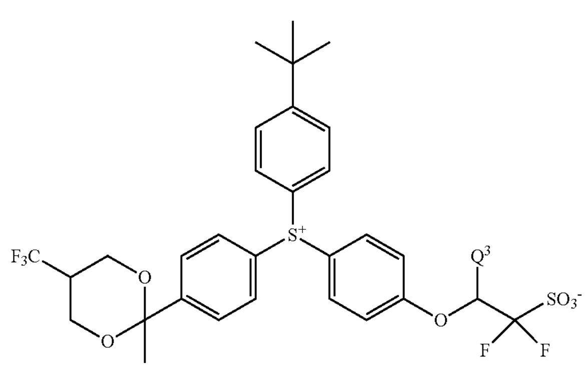

-continued
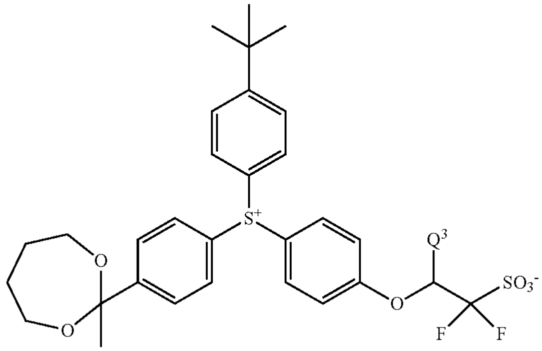
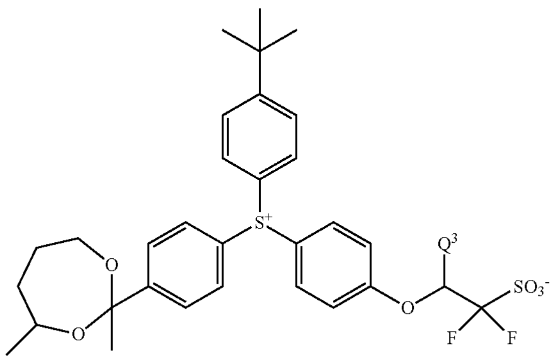
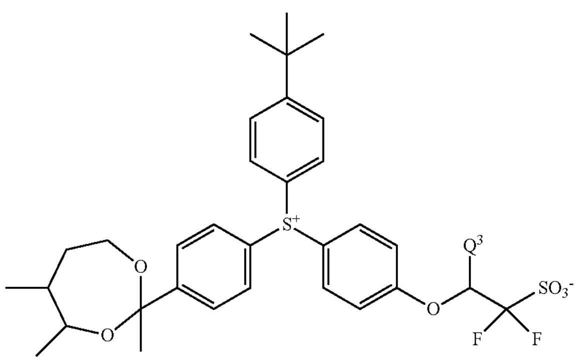
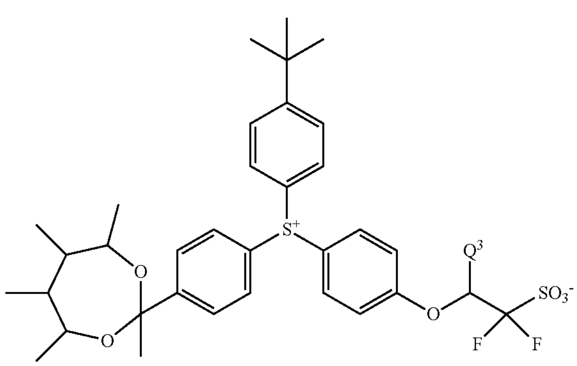
-continued
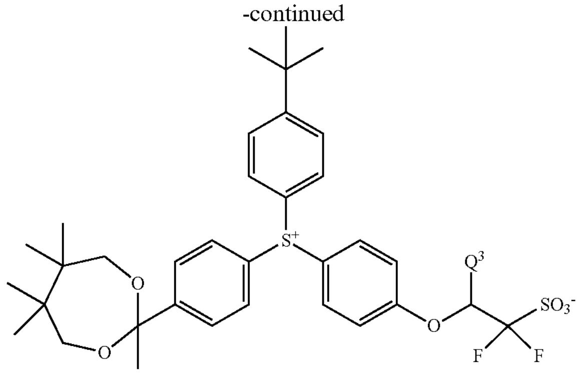
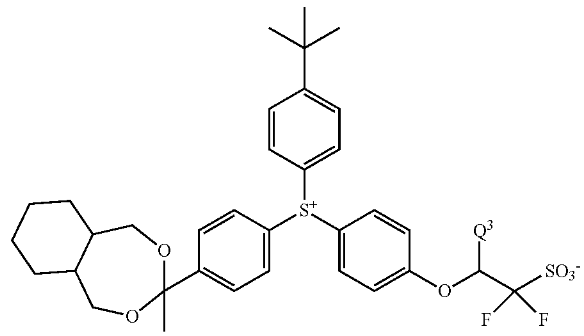
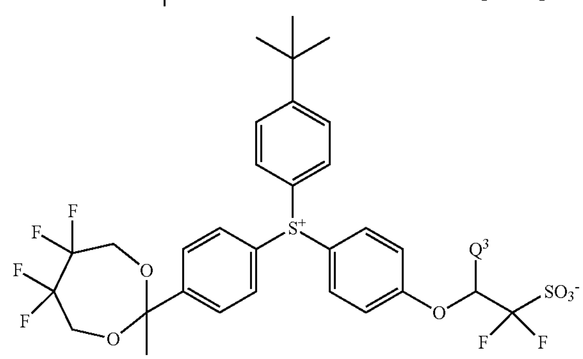
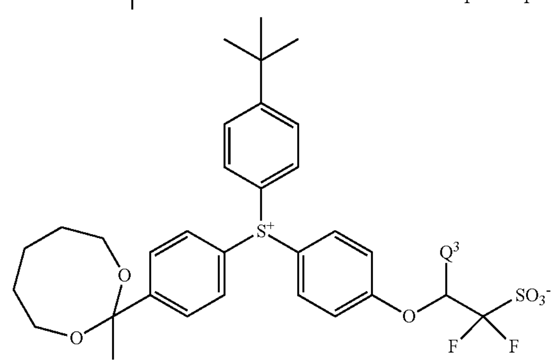
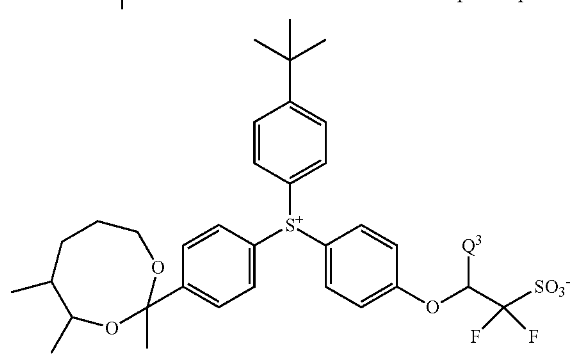

-continued
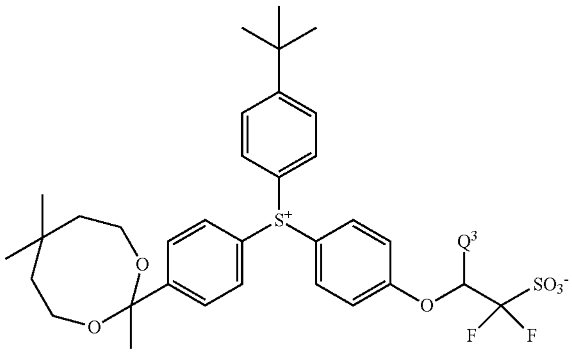
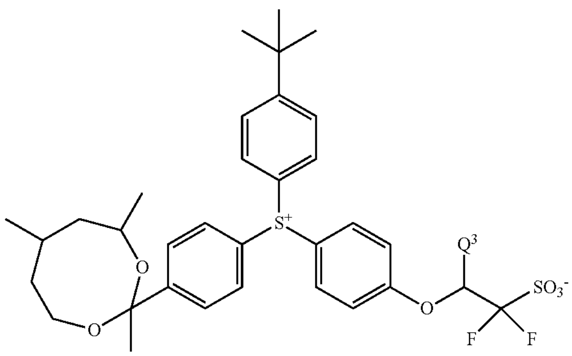
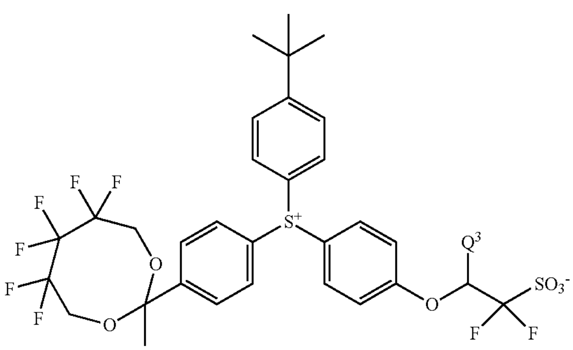
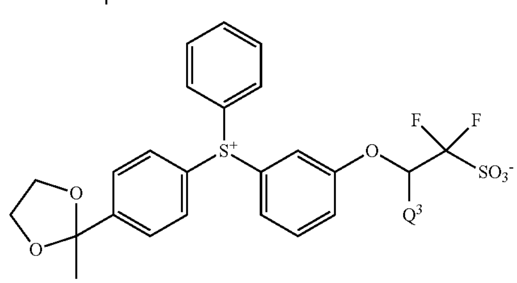
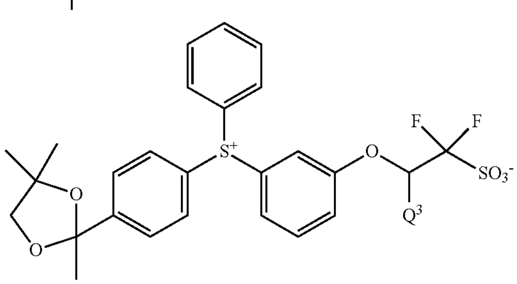
-continued
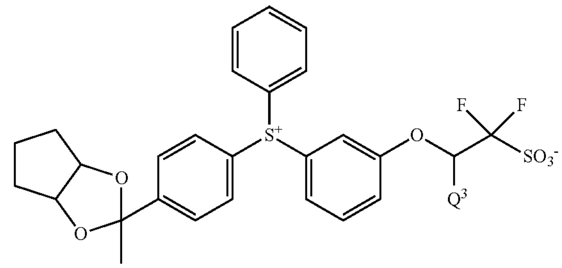
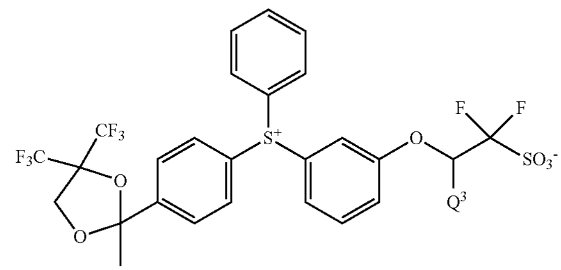
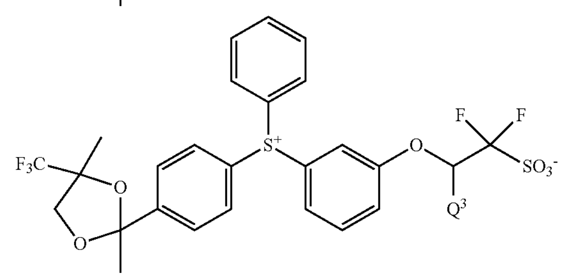
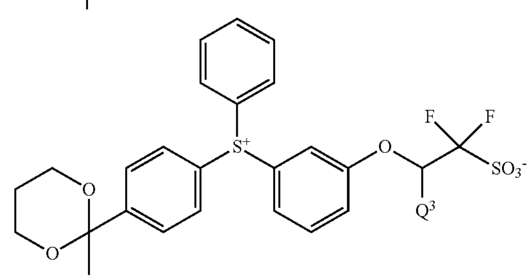
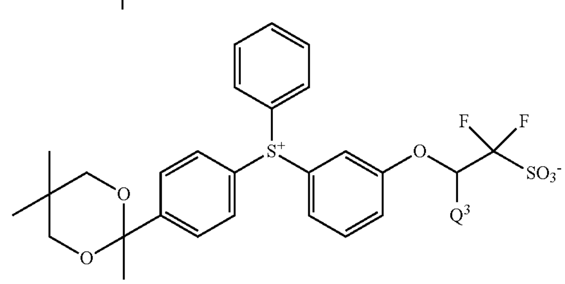
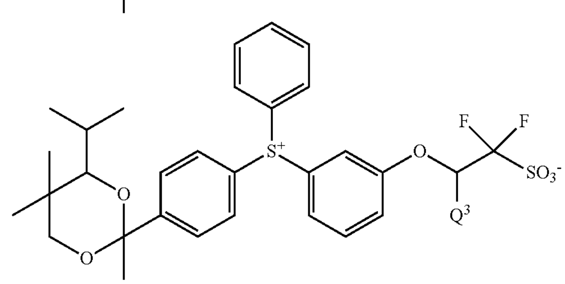

-continued
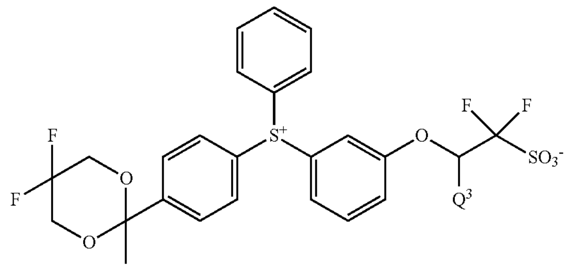
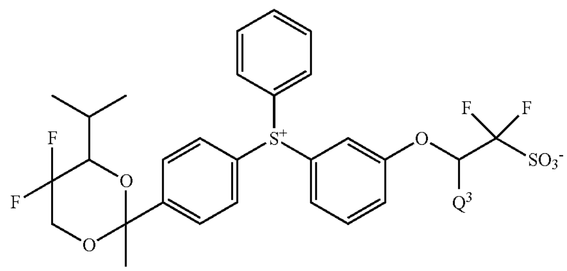
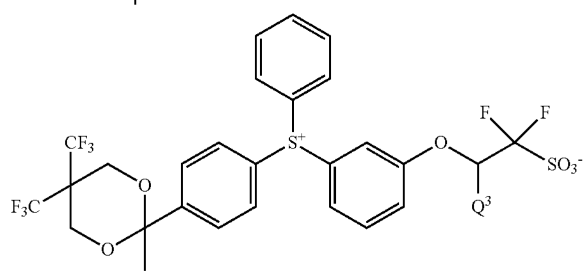
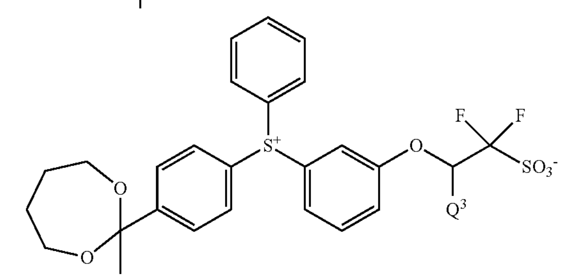
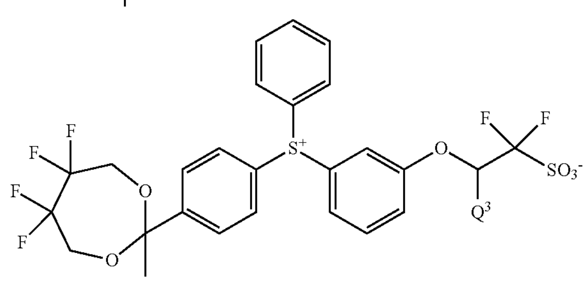
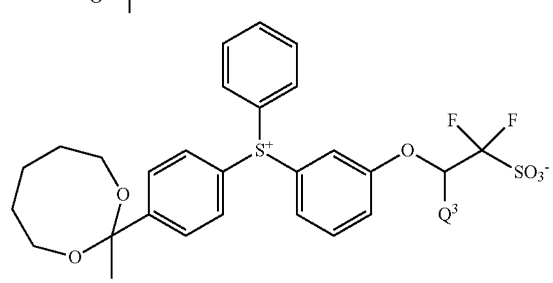
-continued
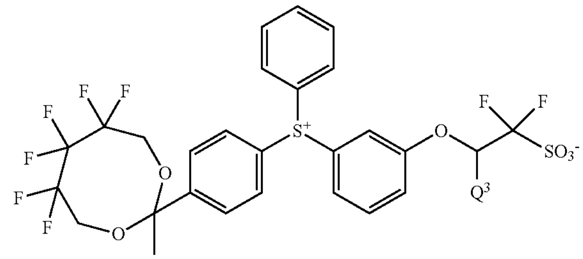
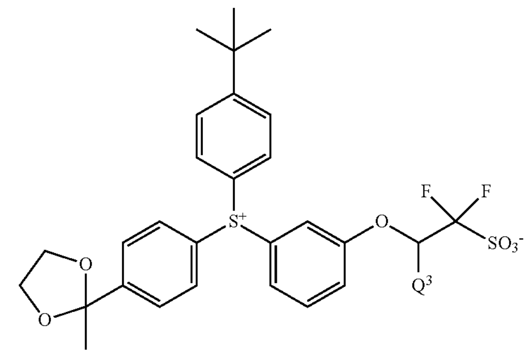
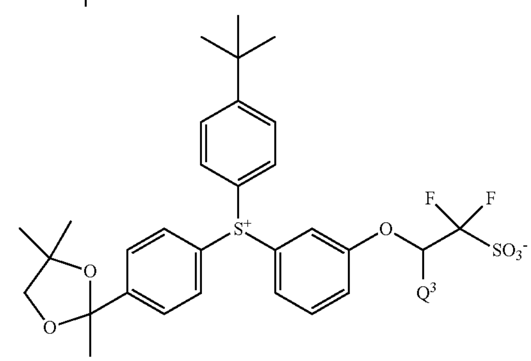
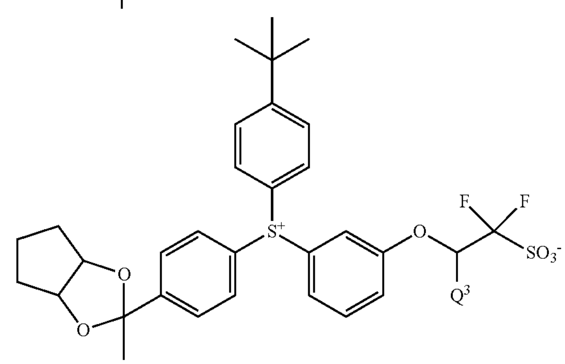
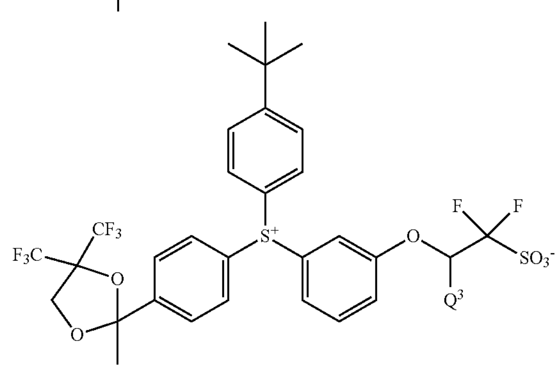

-continued
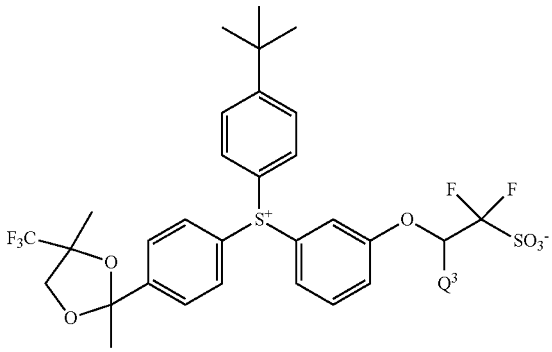
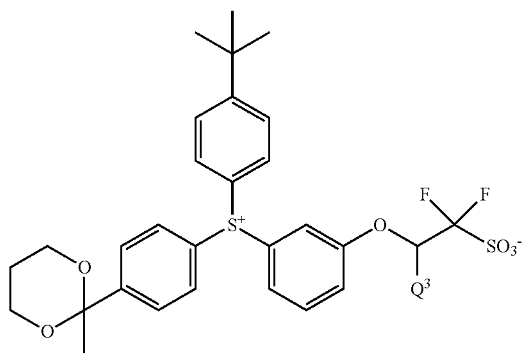
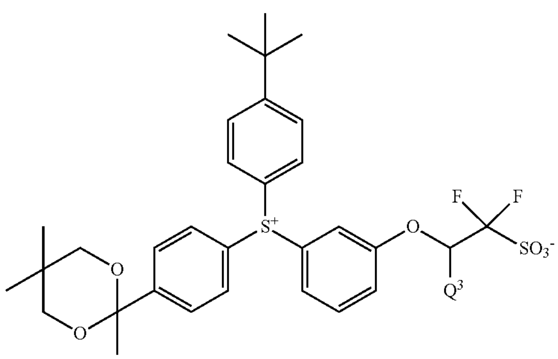
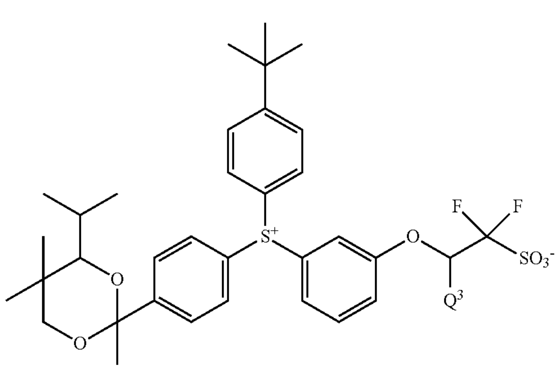
-continued
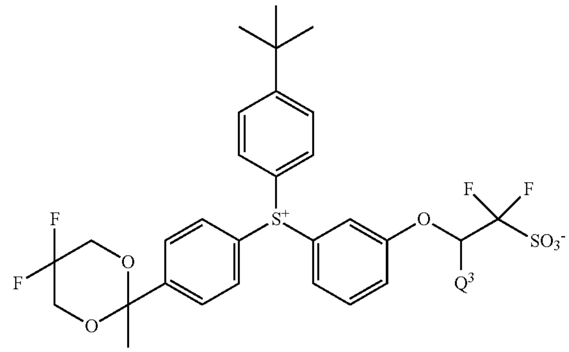
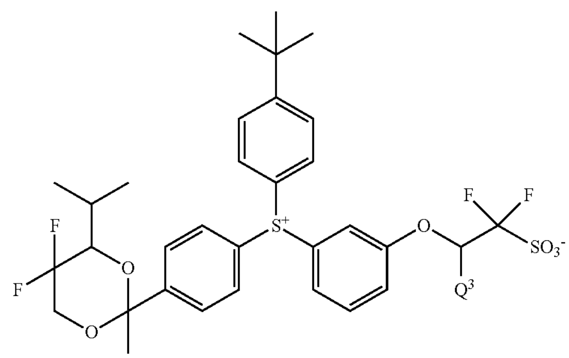
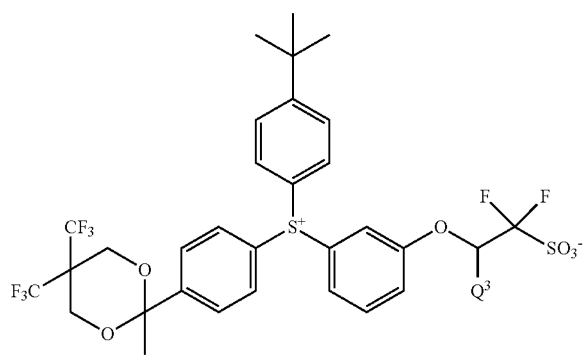
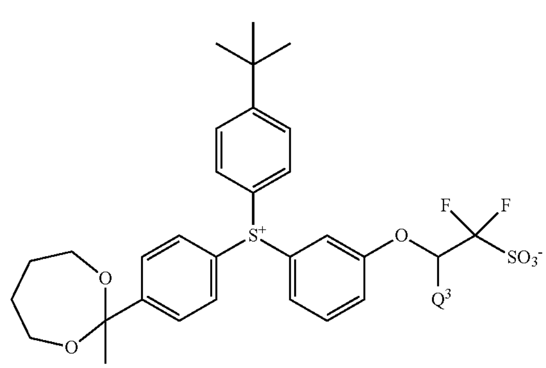

-continued
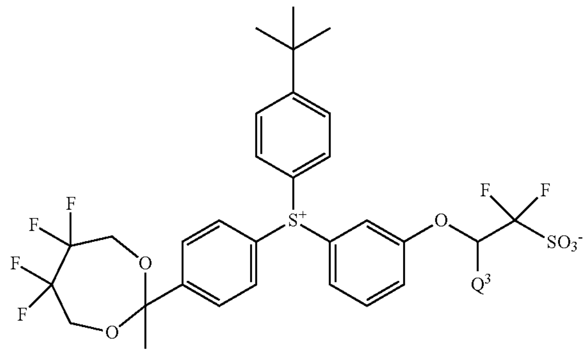
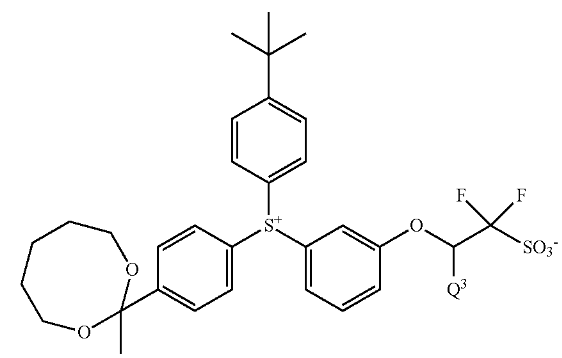
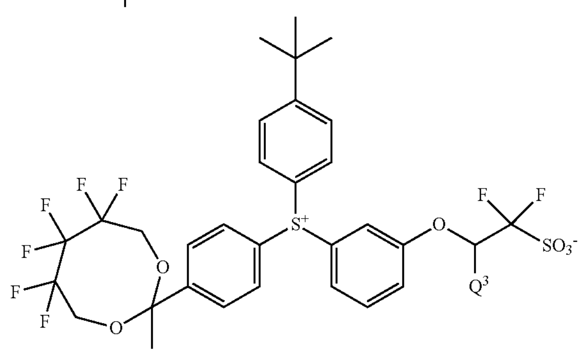
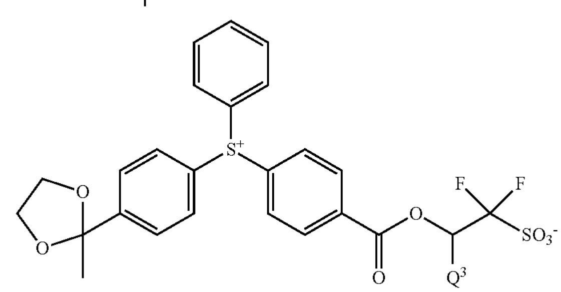
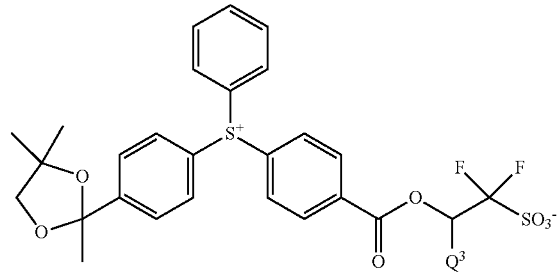
-continued
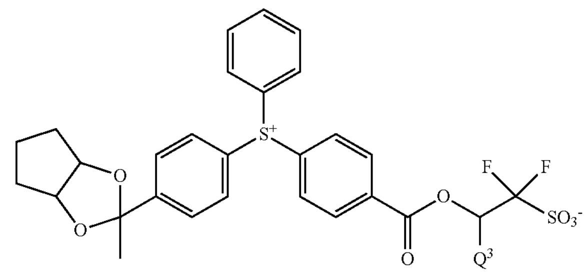
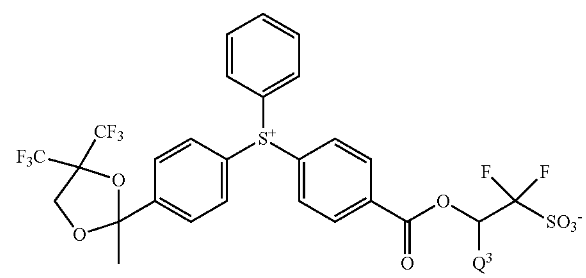
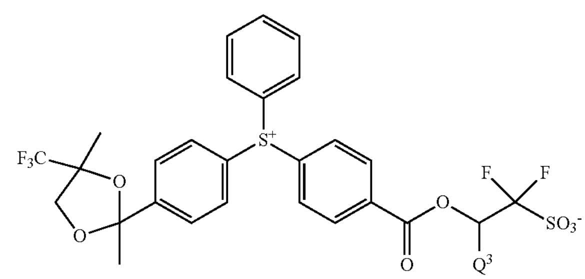
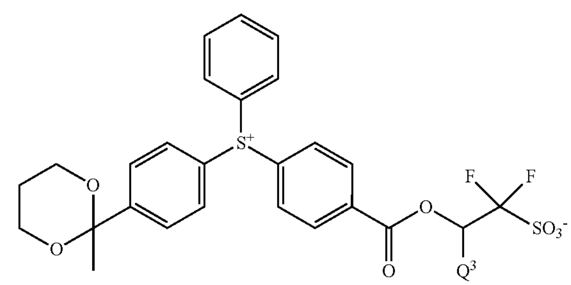
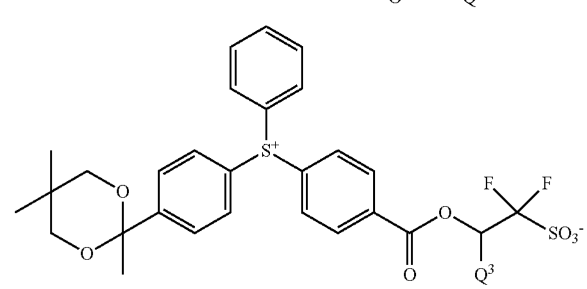
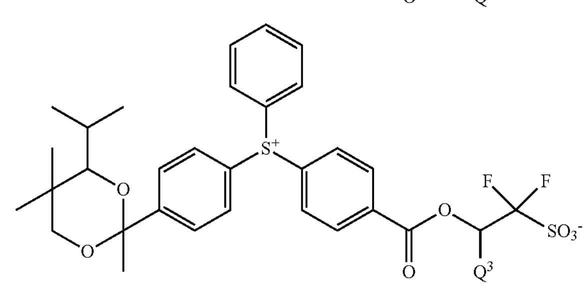

-continued
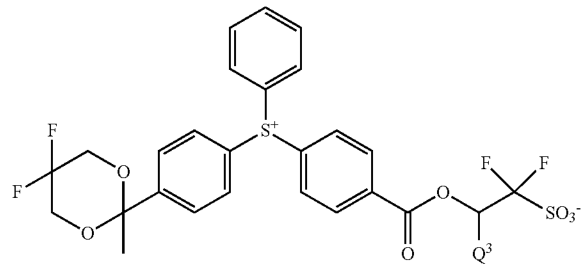
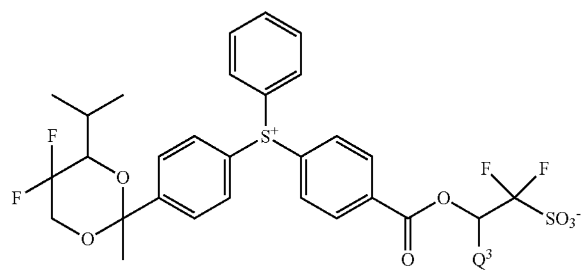
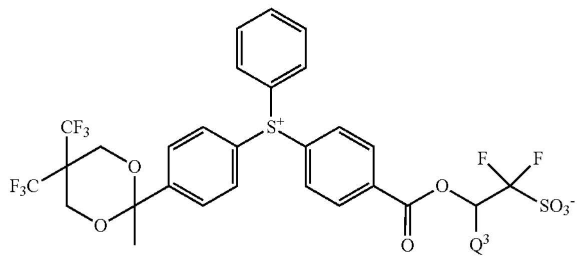
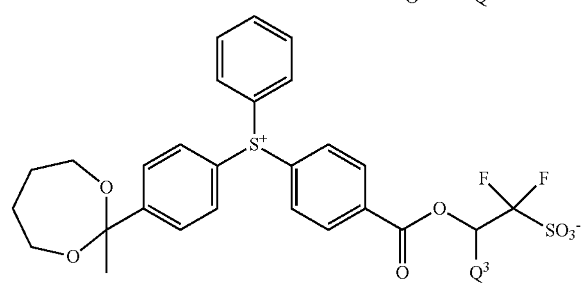
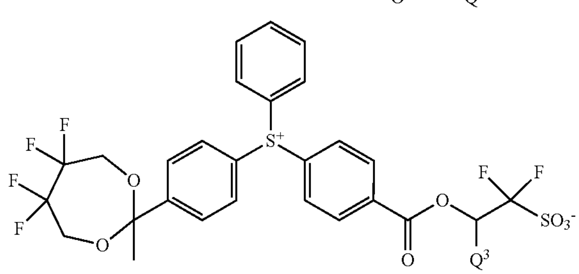
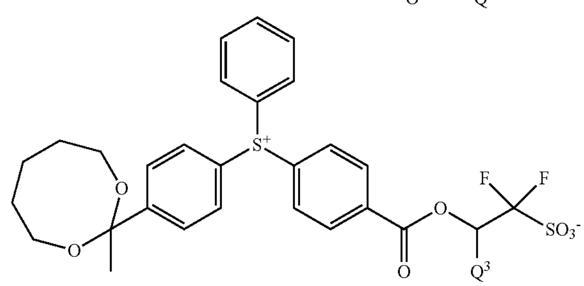
-continued
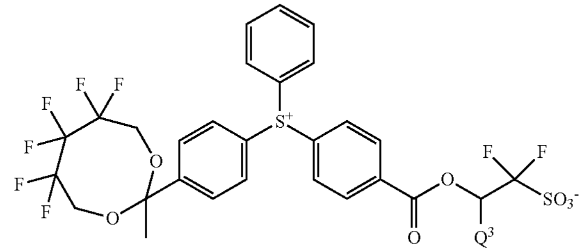
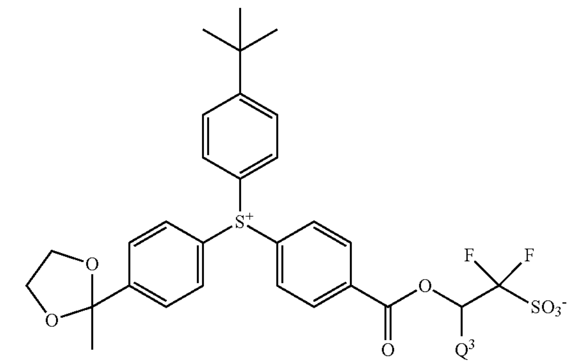
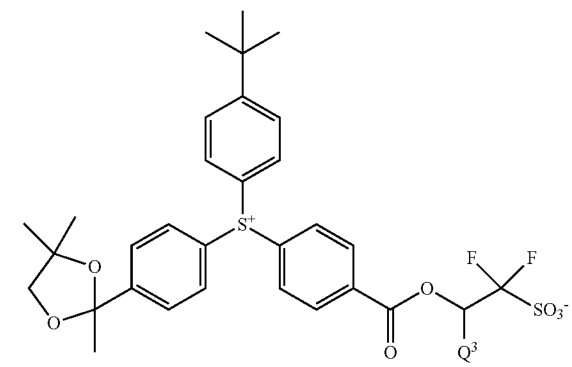
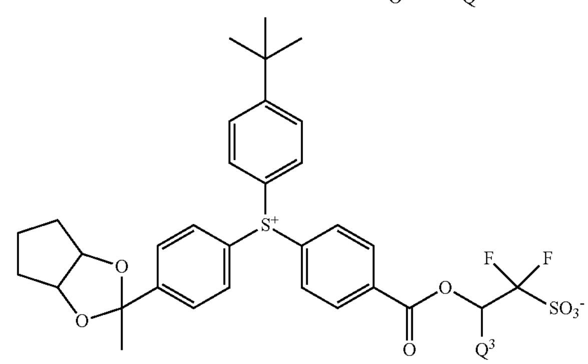
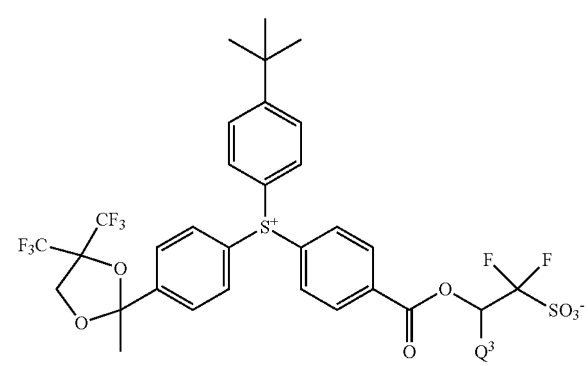

-continued
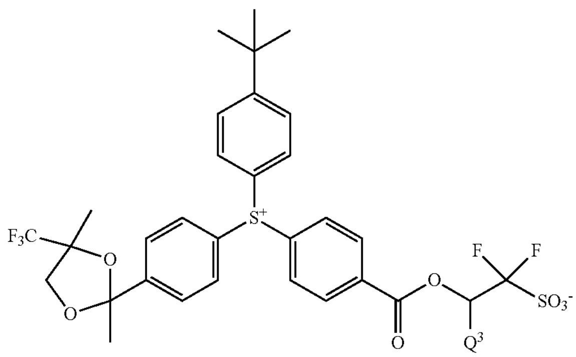
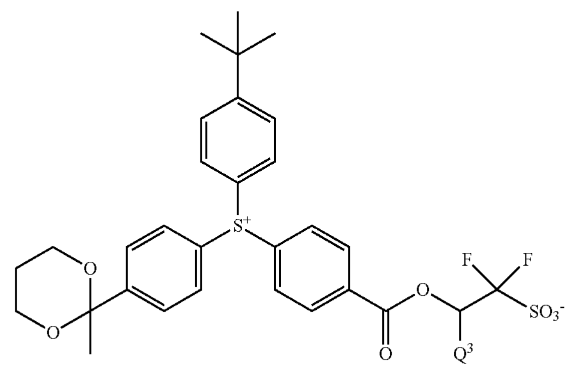
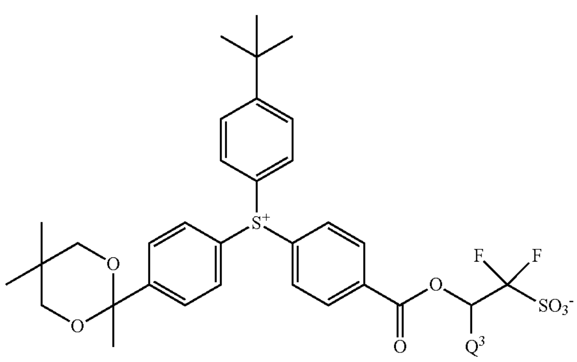
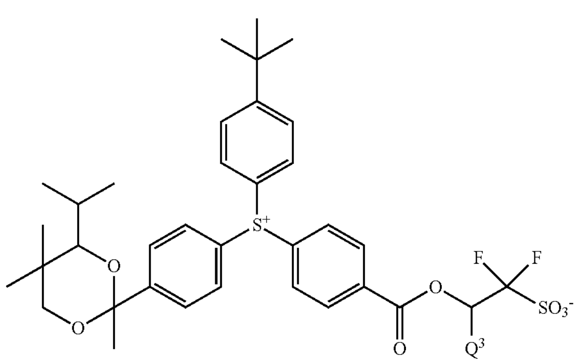
-continued
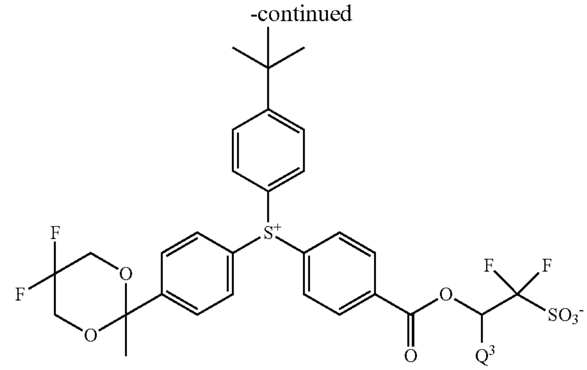
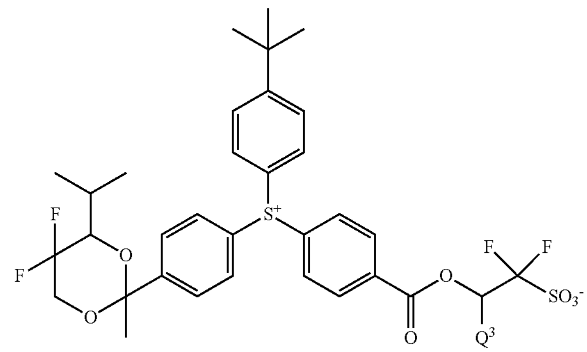
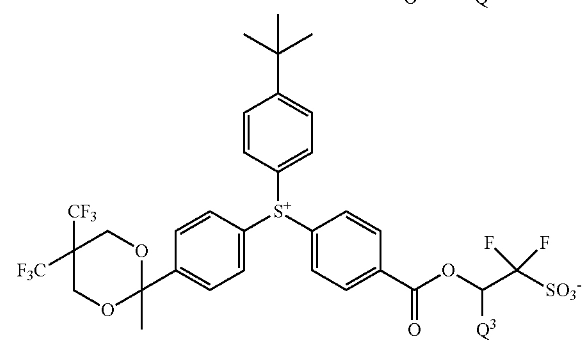
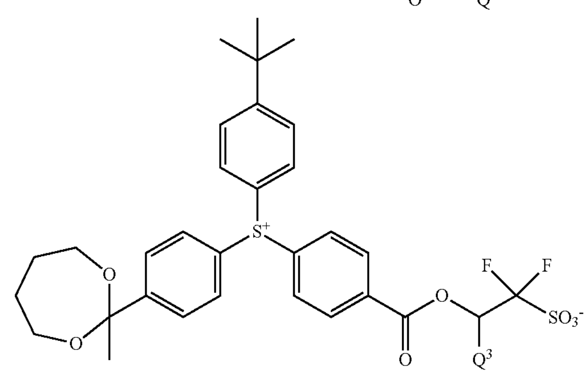
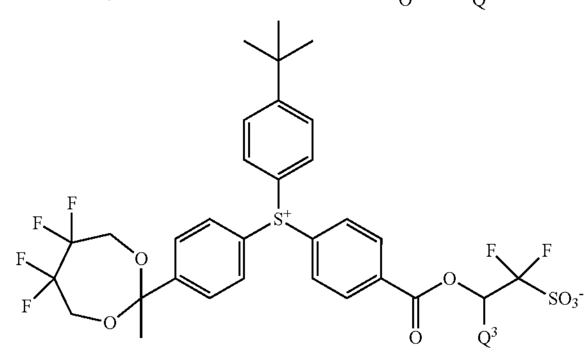

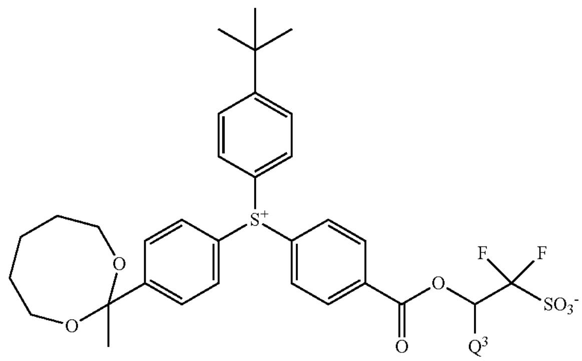
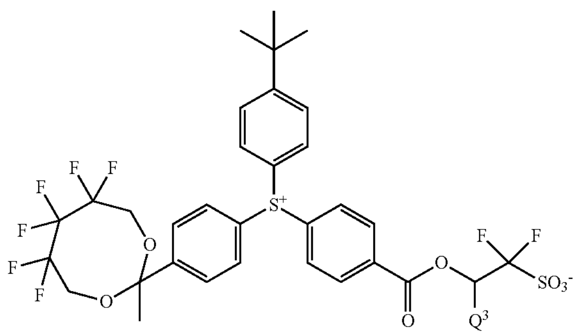
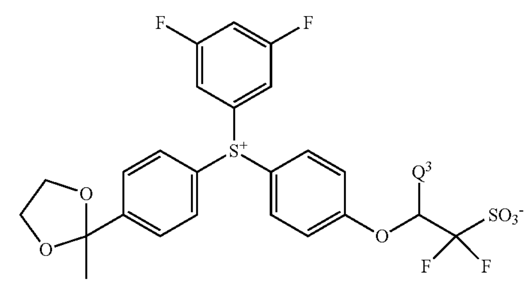
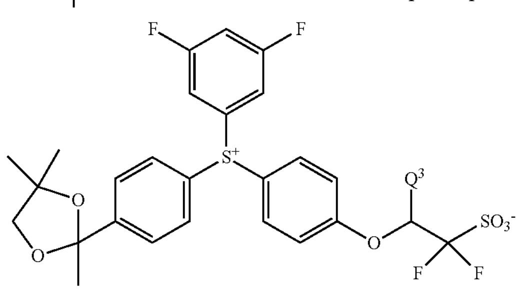
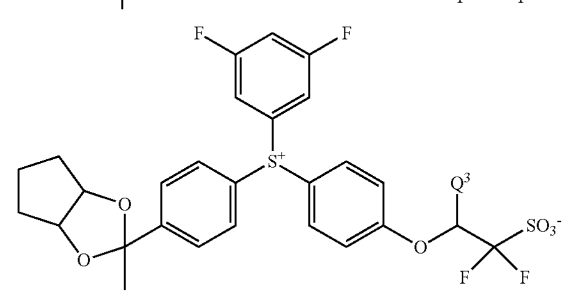
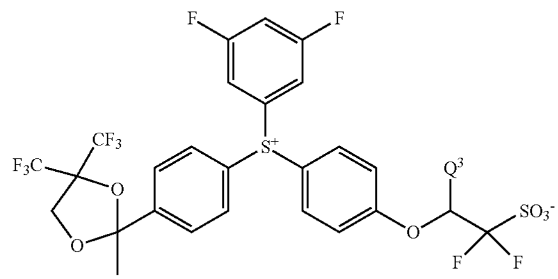
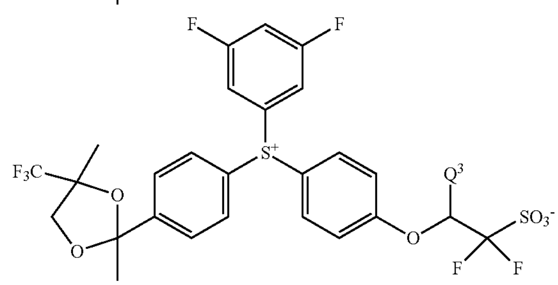
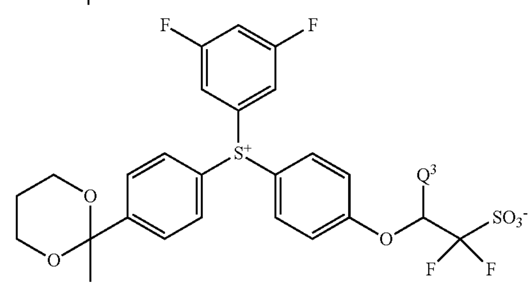
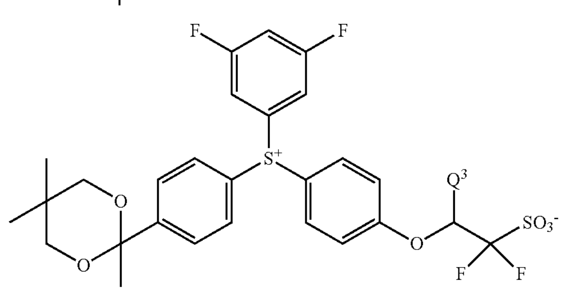
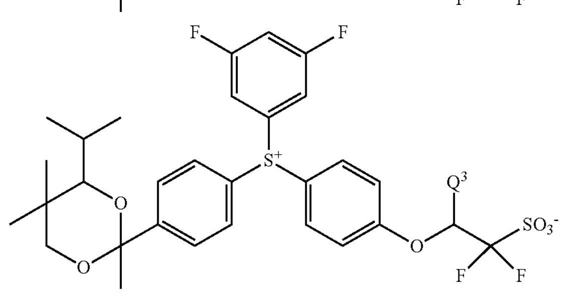
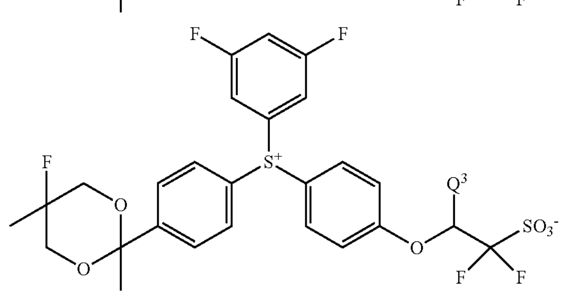

-continued
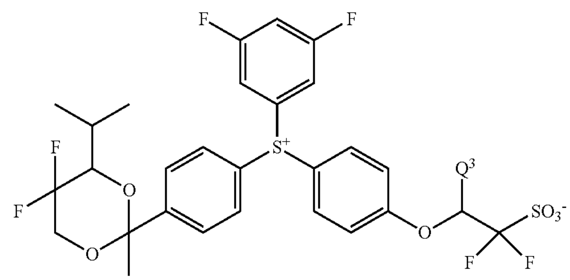
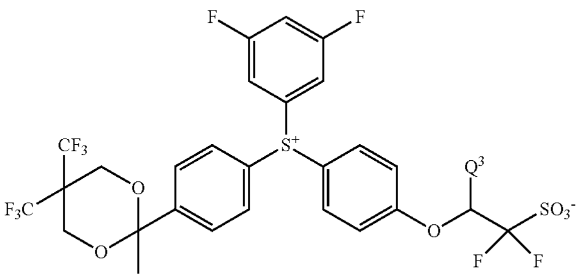
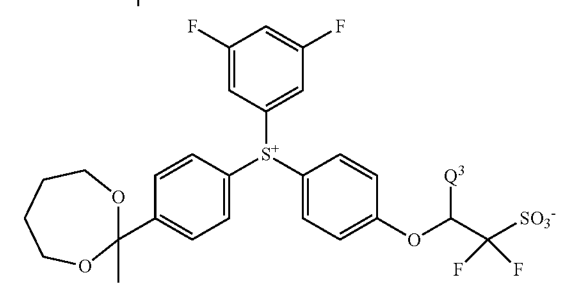
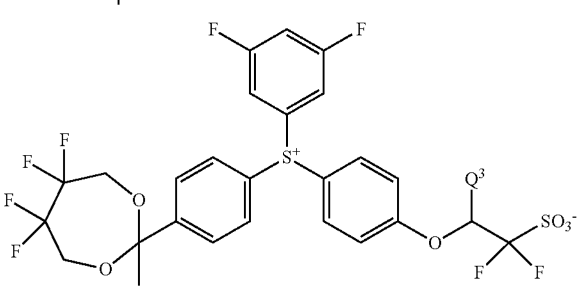
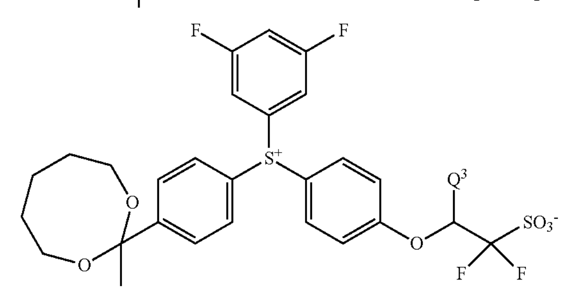
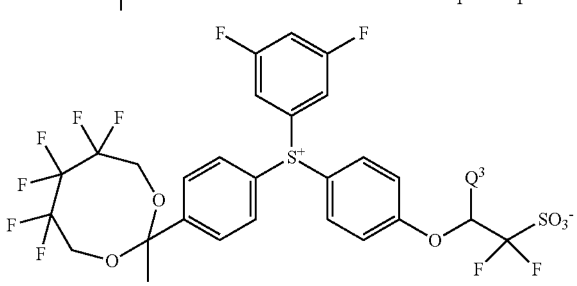
-continued
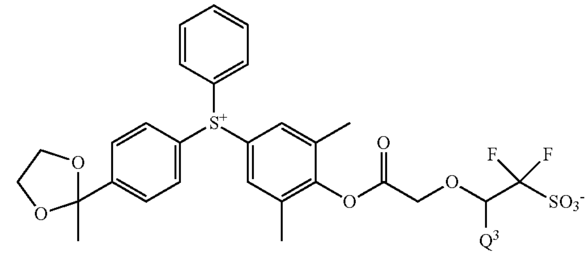
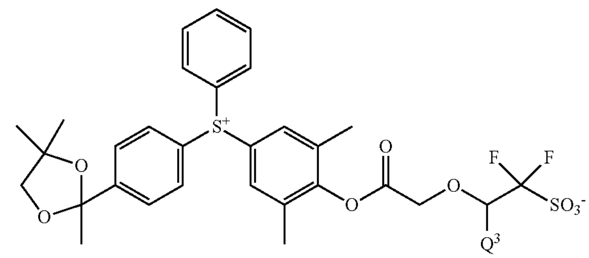
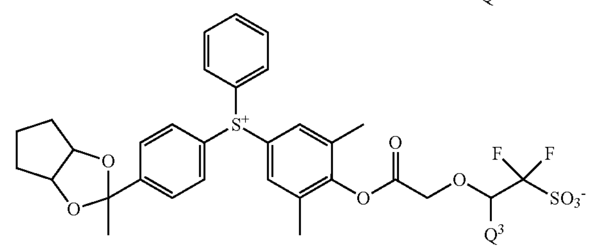
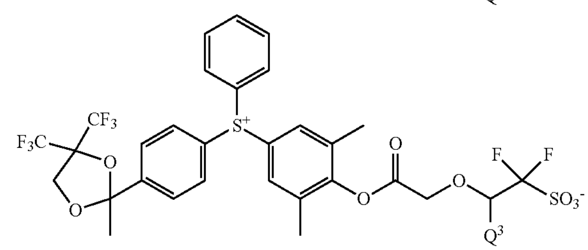
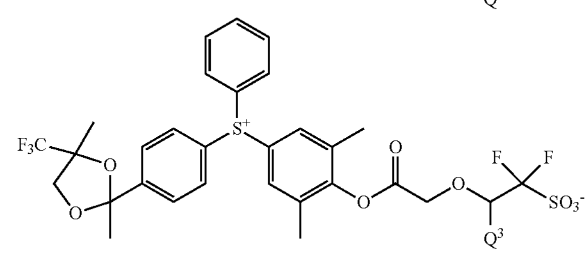
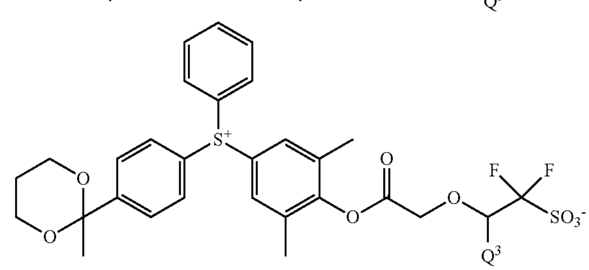
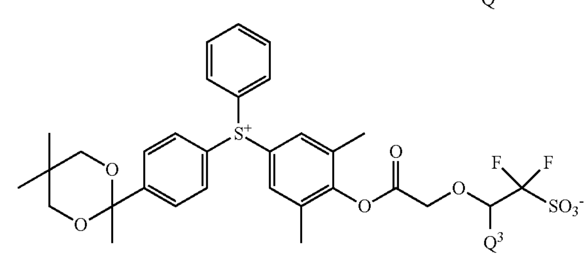

-continued
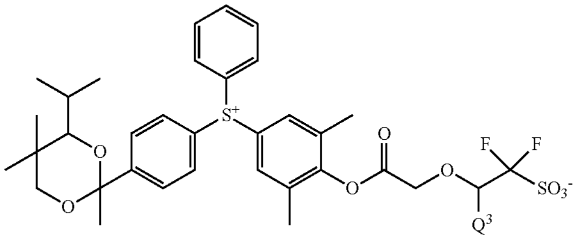
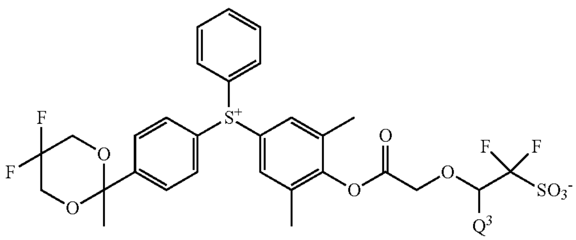
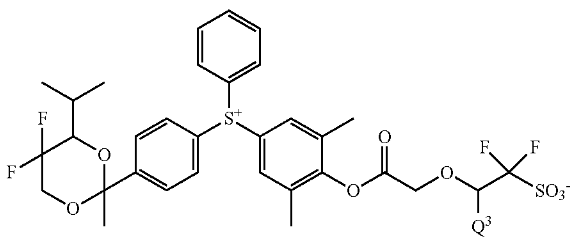
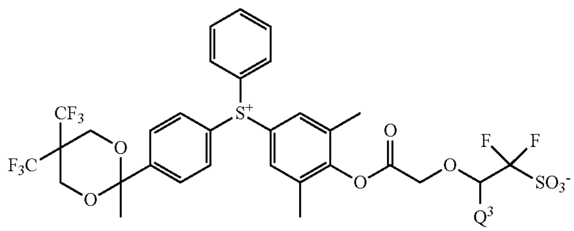
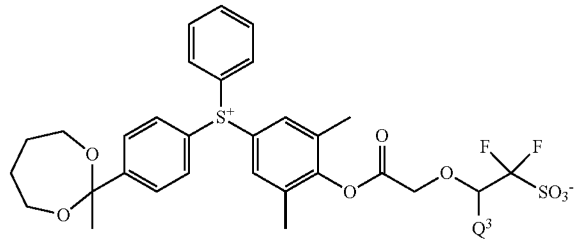
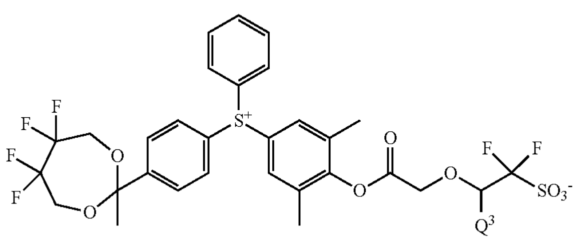
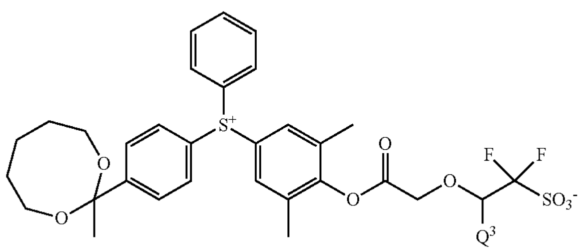
-continued
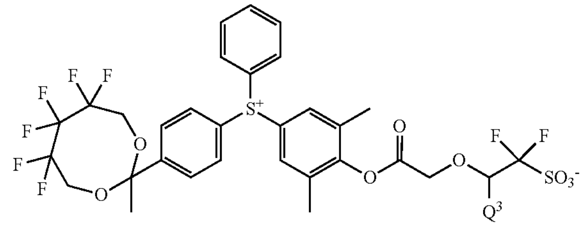
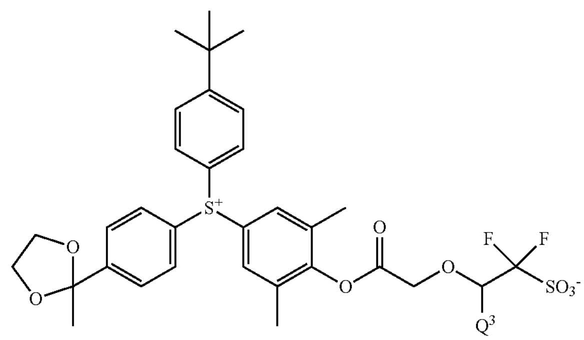
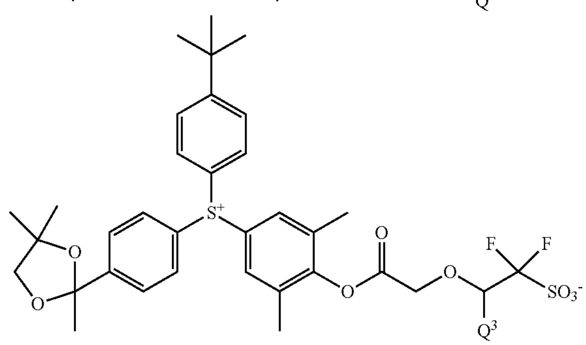
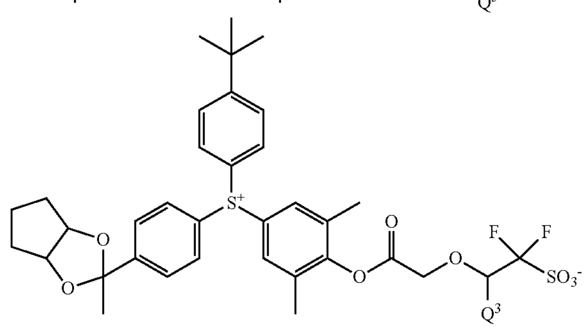
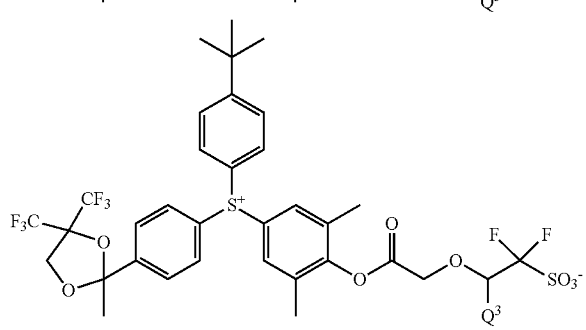

-continued
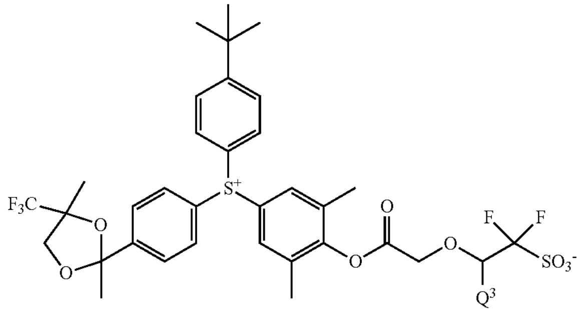
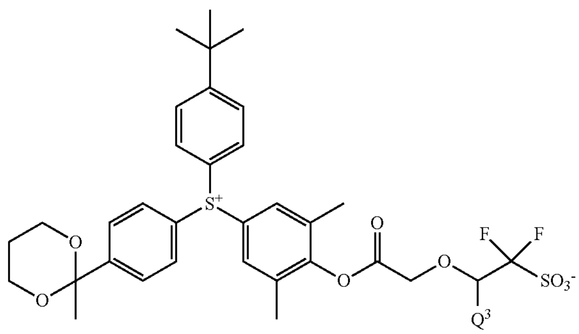
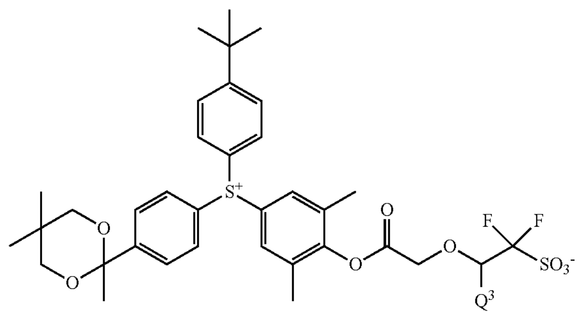
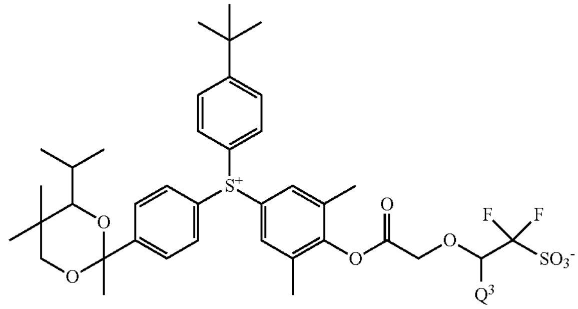
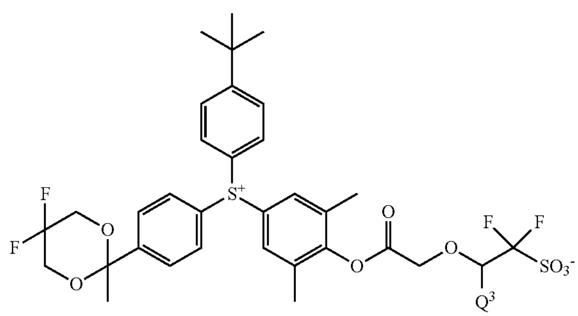
-continued
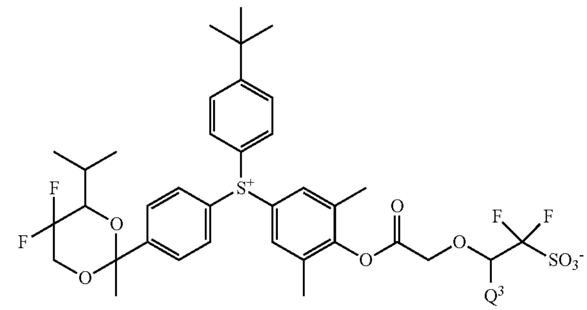
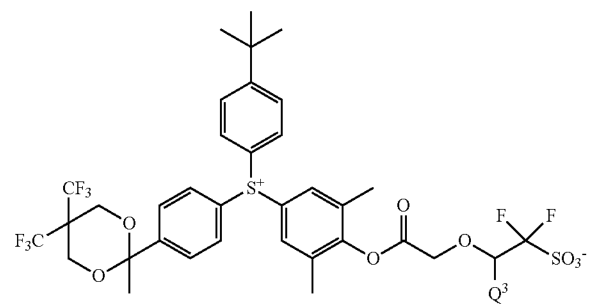
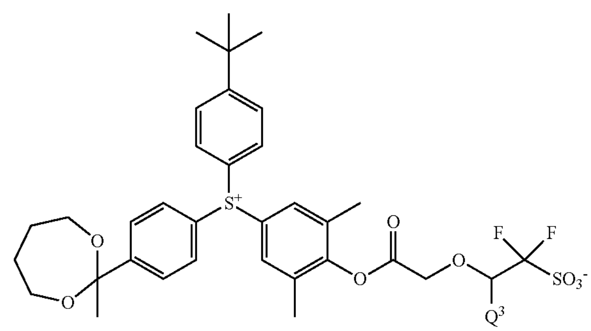
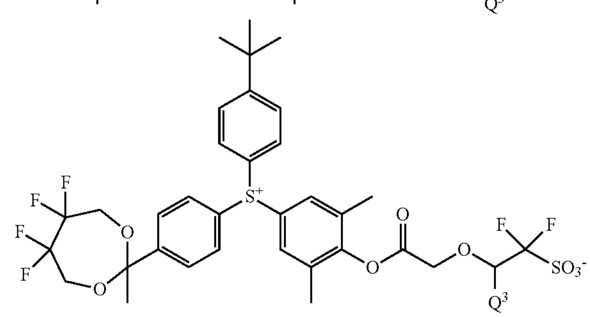
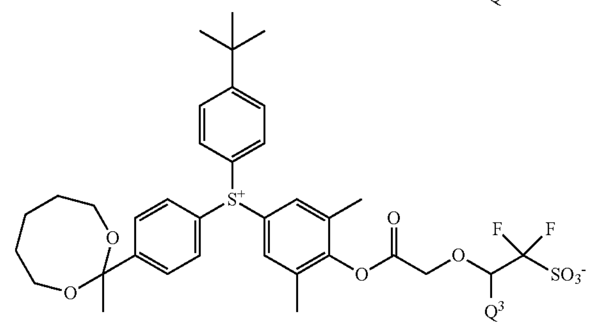

-continued
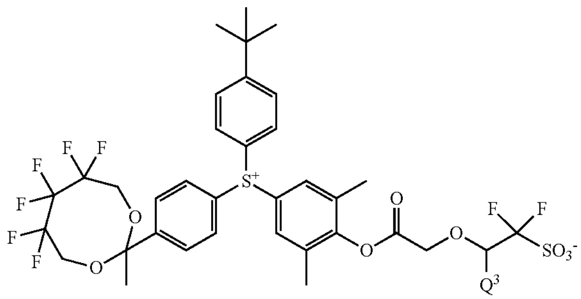
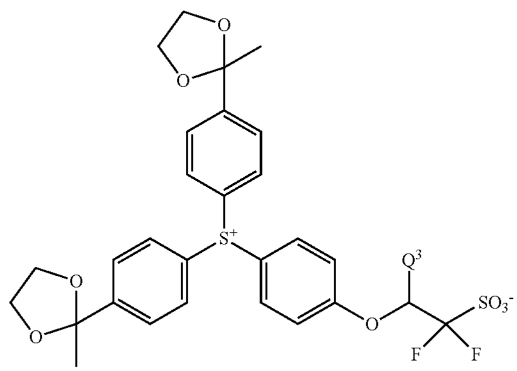
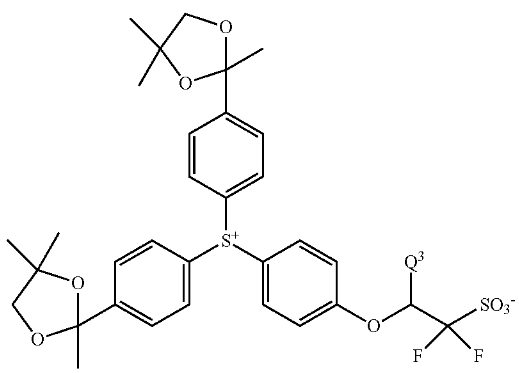
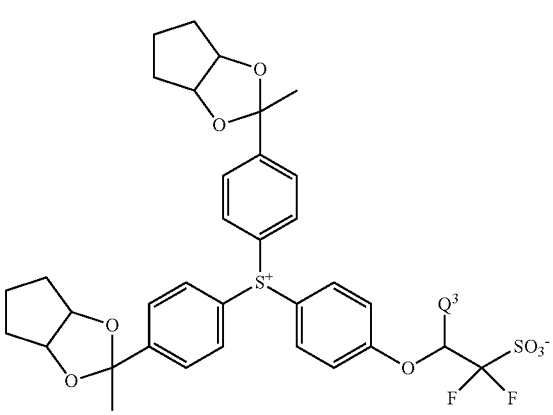
-continued
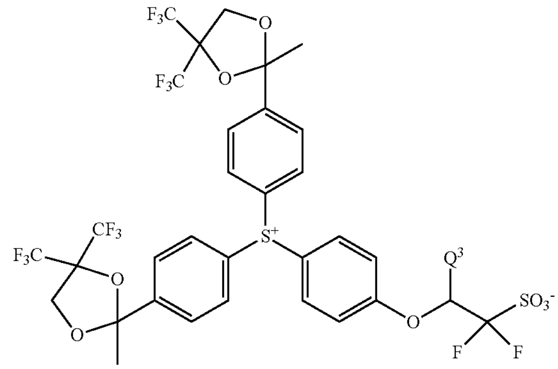
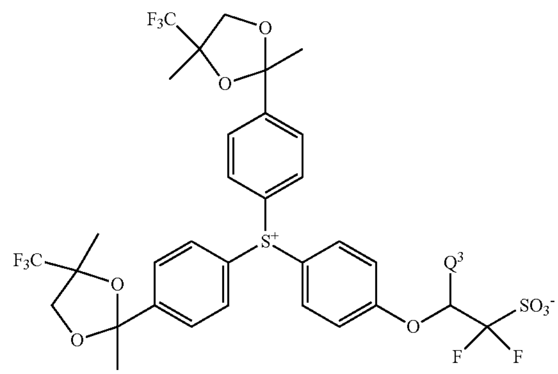
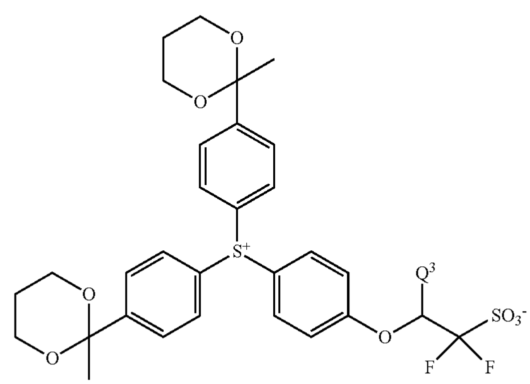
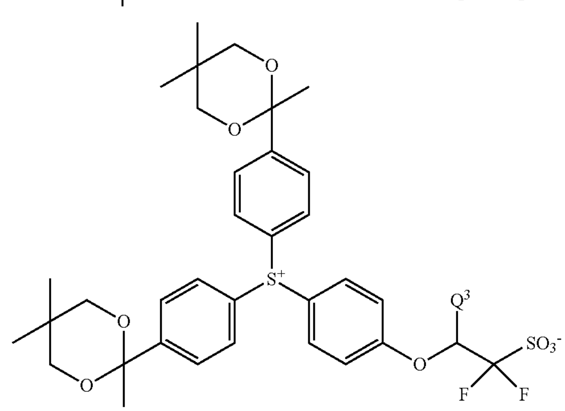

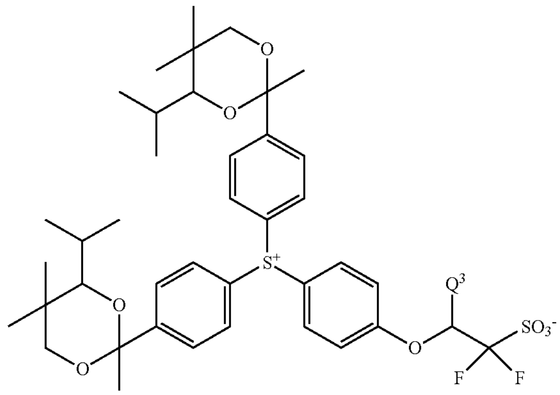
O
O
S+
O
O
Q3
O
SO3-
F
F
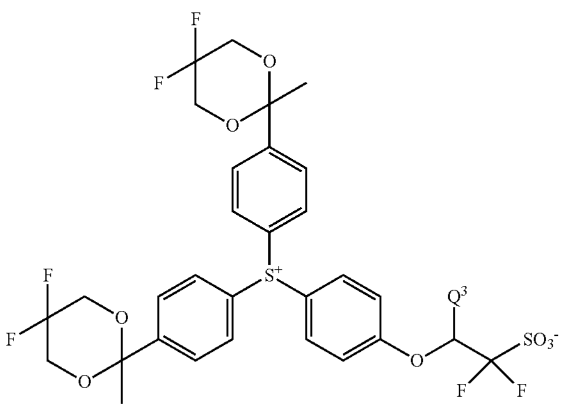
F
F
O
O
S+
F
F
O
O
Q3
O
SO3-
F
F
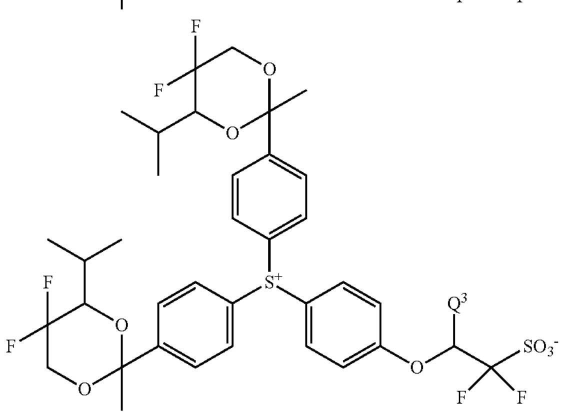
F
F
O
O
S+
F
F
O
O
Q3
O
SO3-
F
F
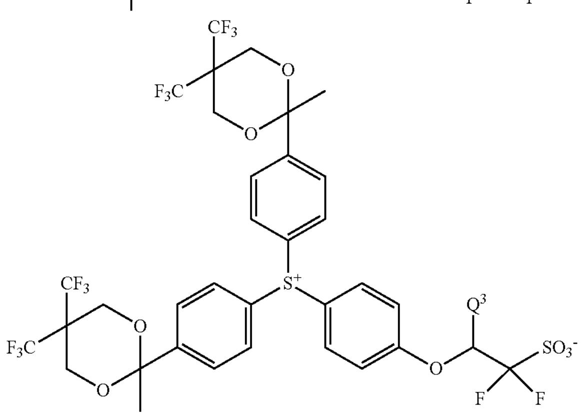
CF3
F3C
O
O
S+
CF3
F3C
O
O
Q3
O
SO3-
F
F
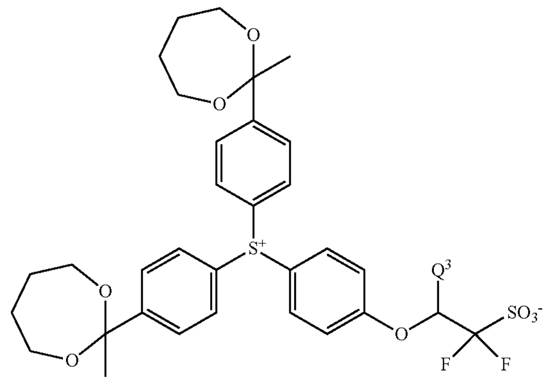
O
O
S+
O
O
Q3
O
SO3-
F
F
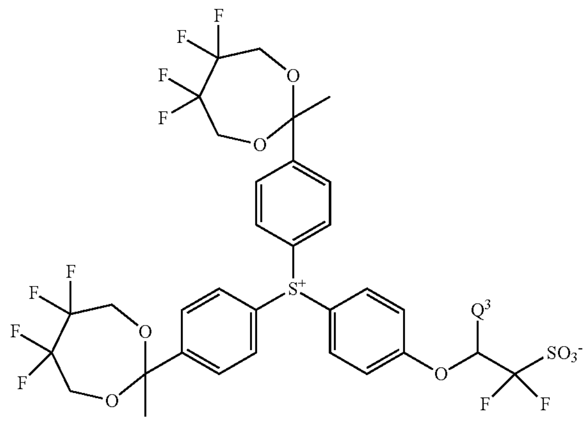
F
F
F
F
O
O
S+
F
F
F
F
O
O
Q3
O
SO3-
F
F
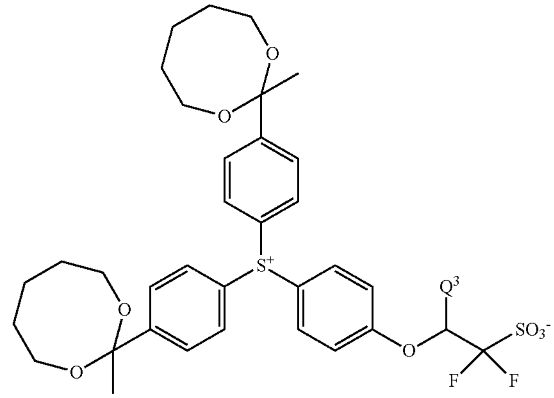
O
O
S+
O
O
Q3
O
SO3-
F
F
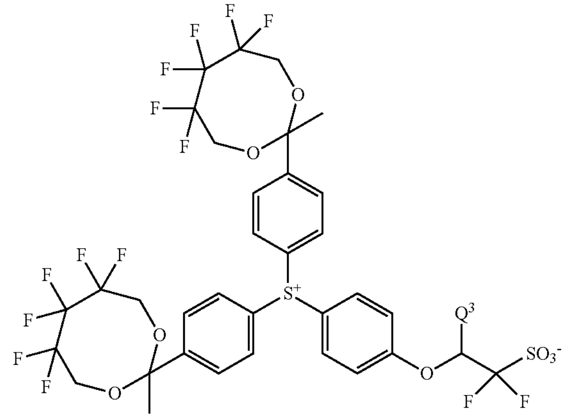
F
F
F
F
F
F
O
O
S+
F
F
F
F
F
F
O
O
Q3
O
SO3-
F
F -continued
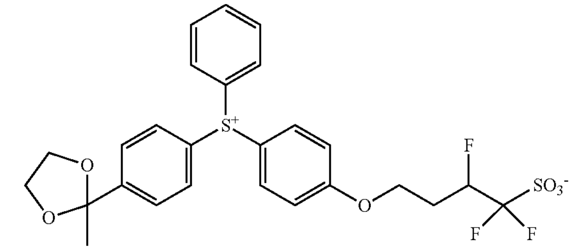
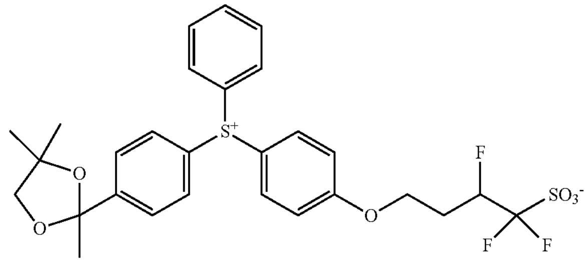
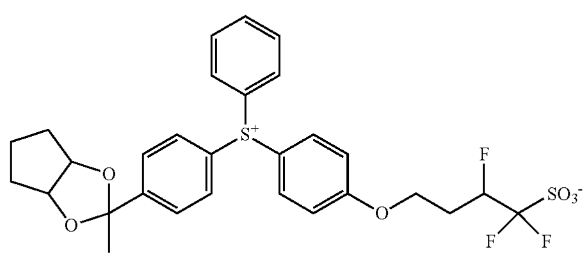
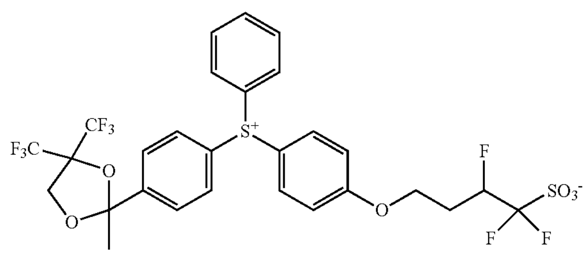
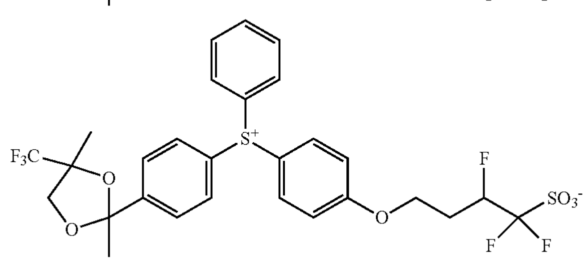
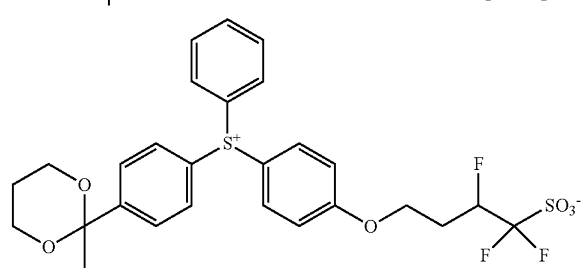
-continued
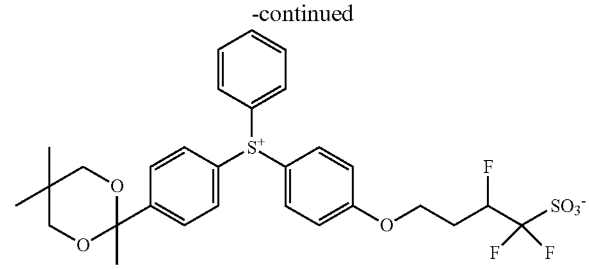
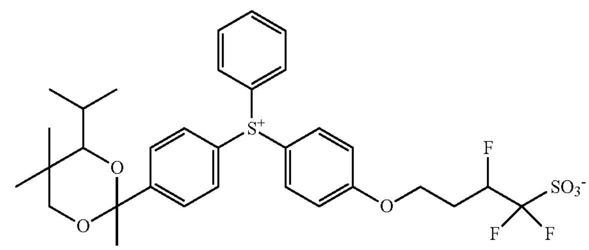
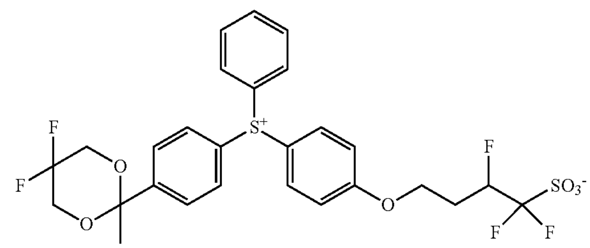
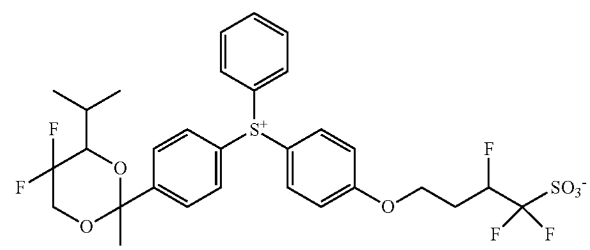
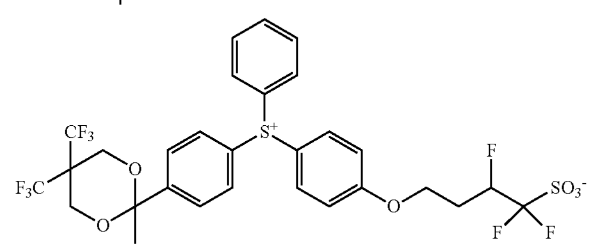
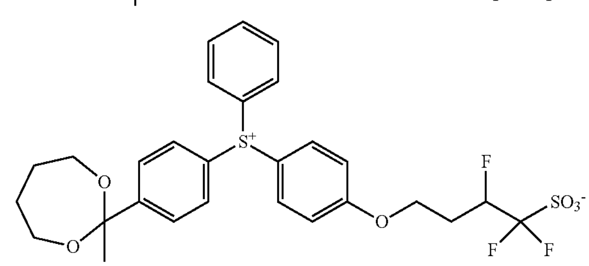
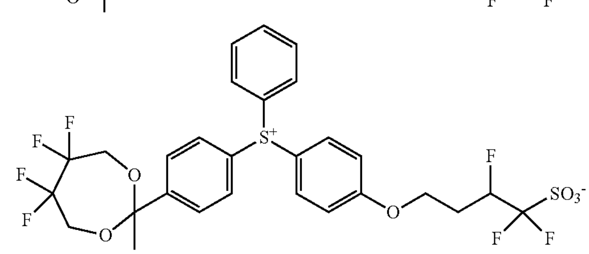

-continued
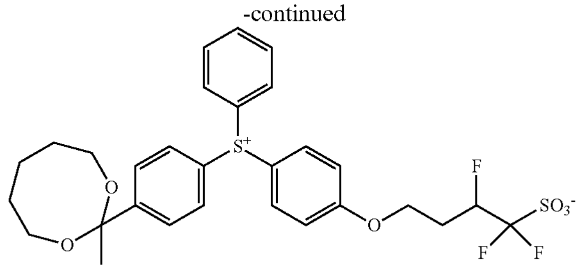
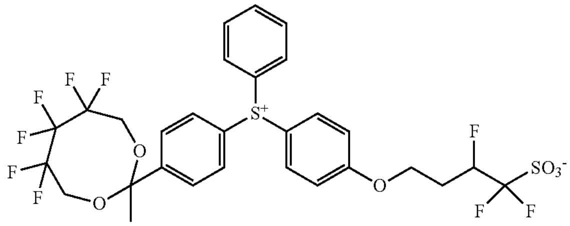
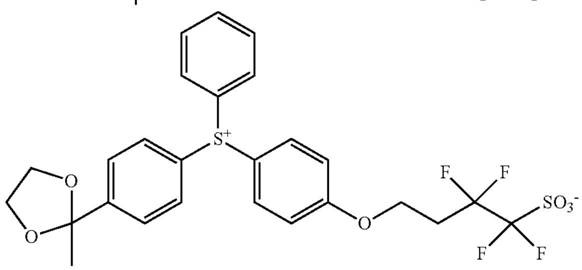
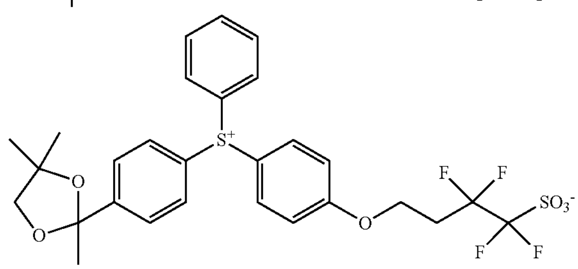
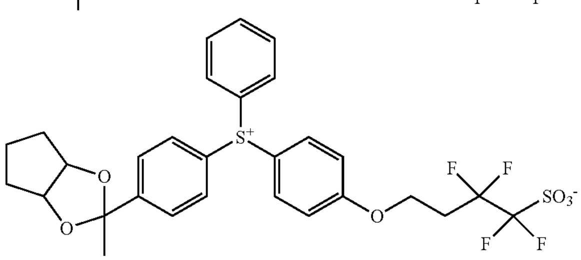
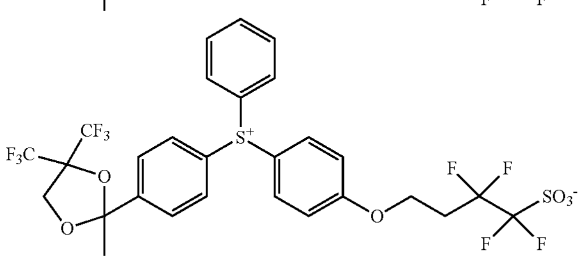
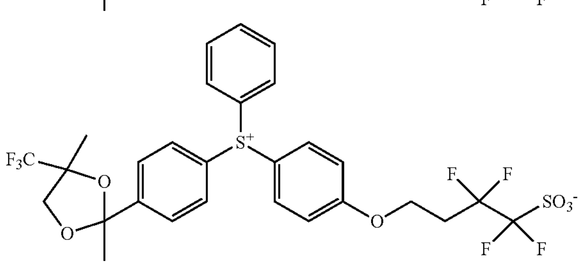
-continued
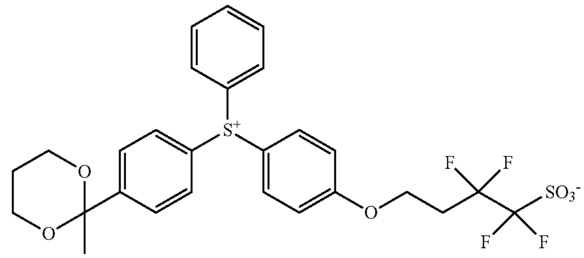
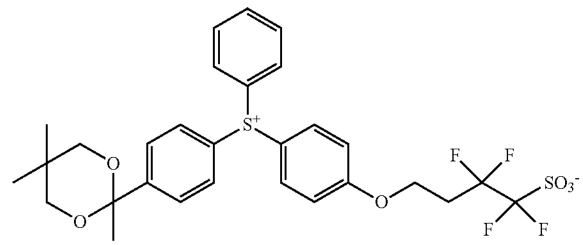
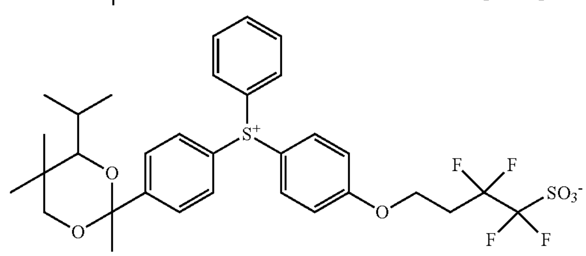
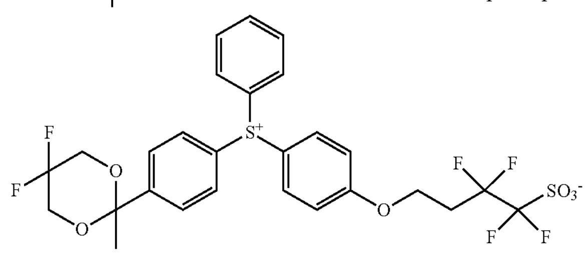
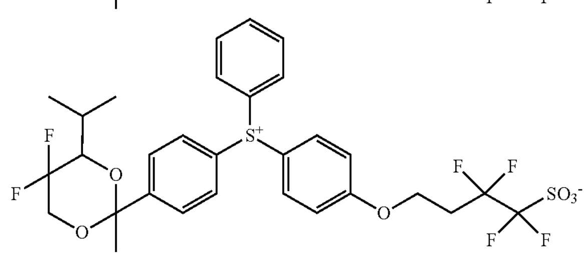
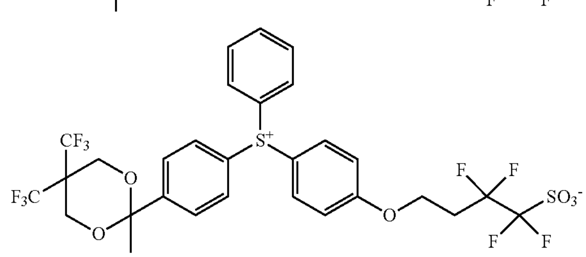
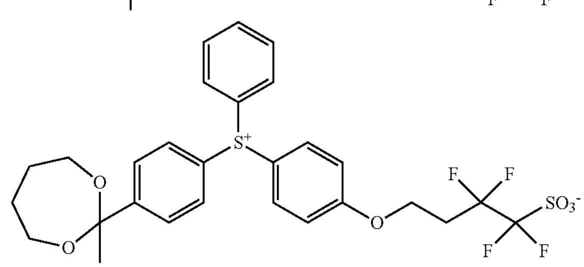

-continued
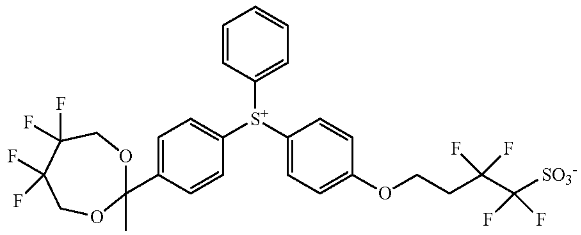
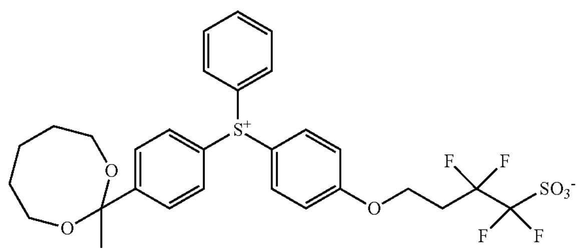
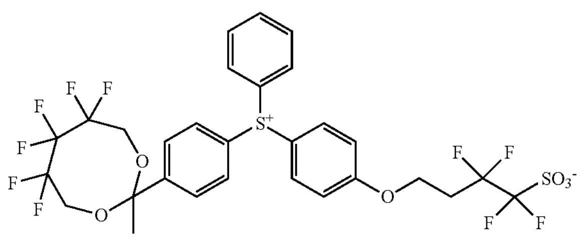
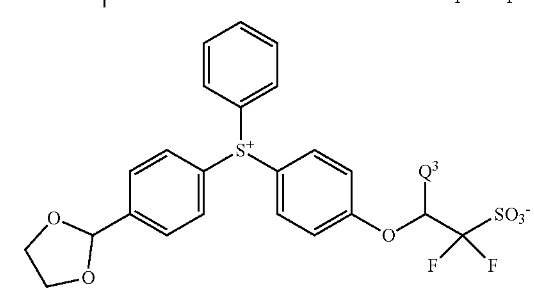
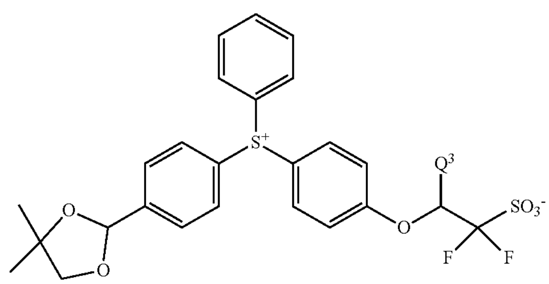
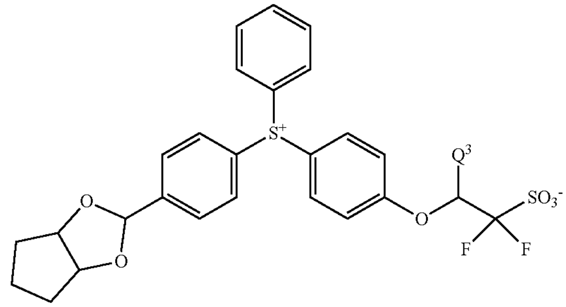
-continued
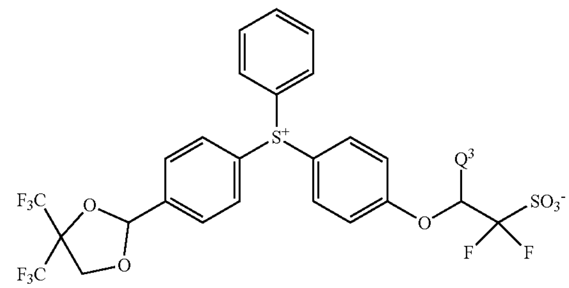
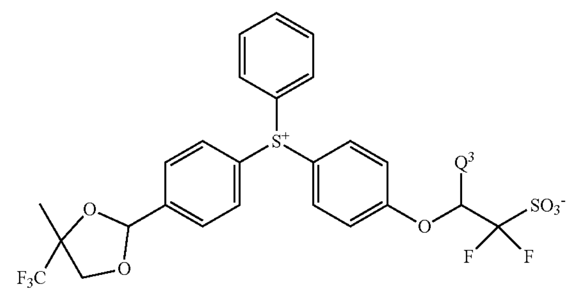
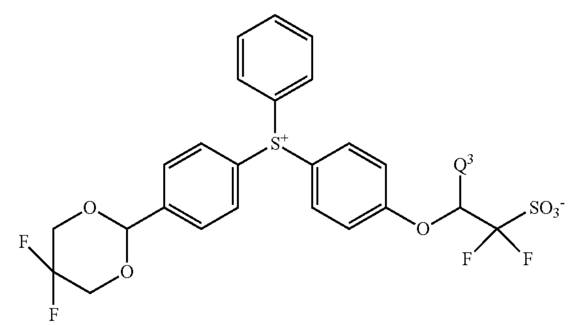
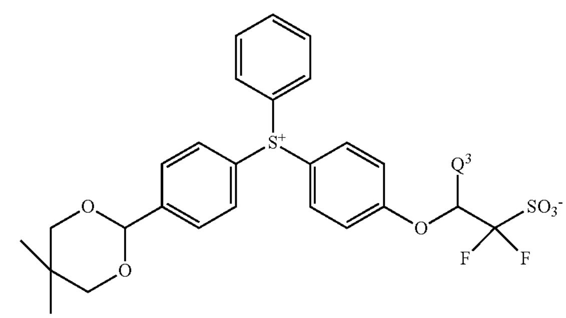
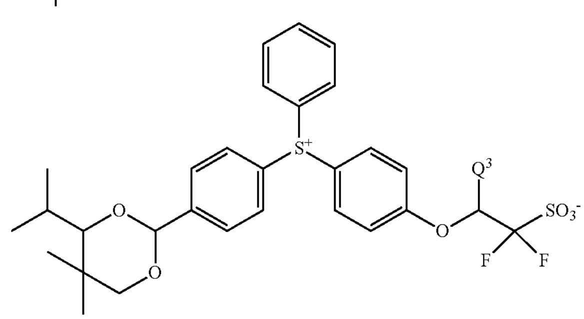

-continued
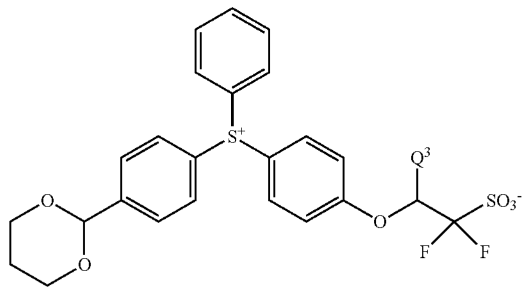
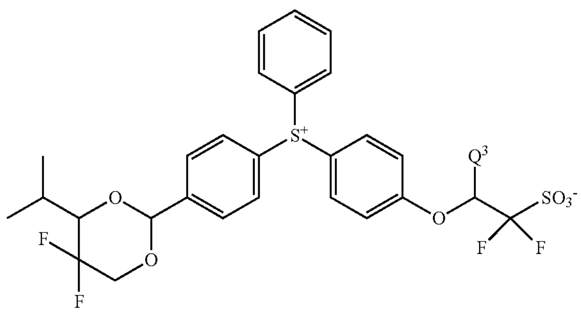
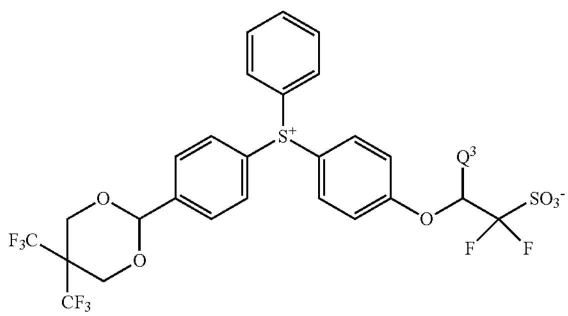
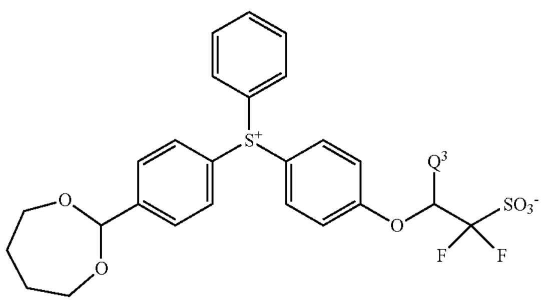
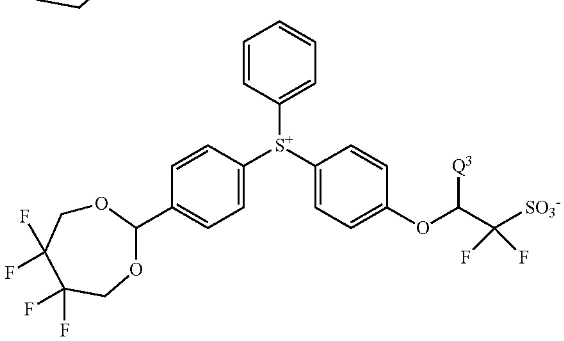
-continued
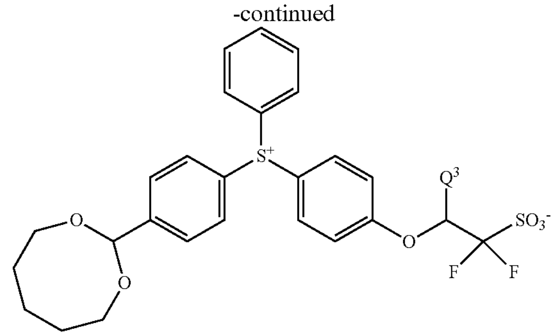
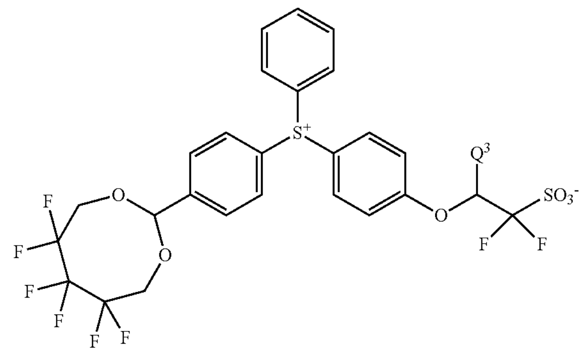
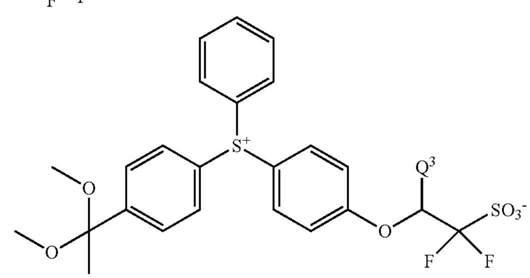
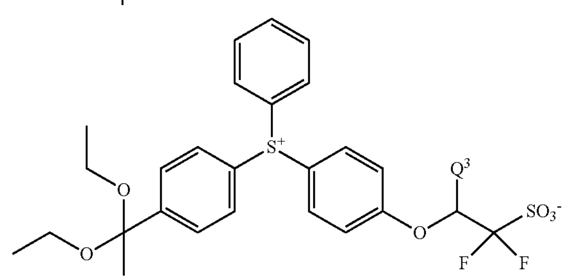
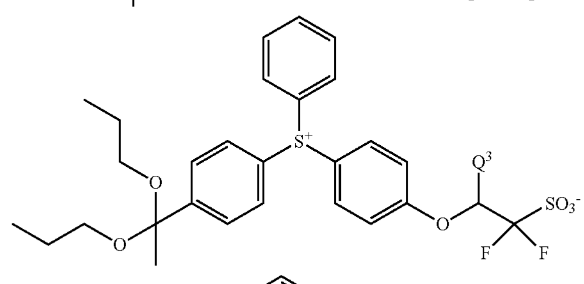
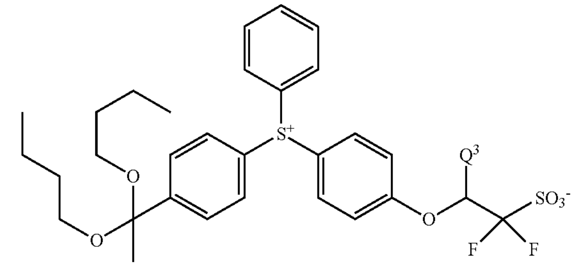

-continued
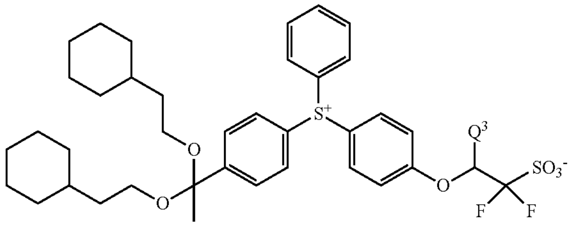
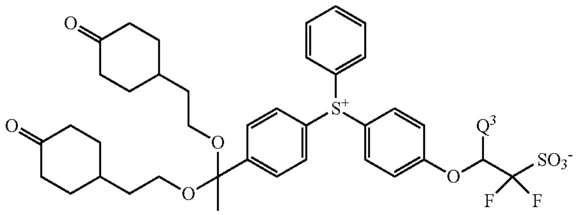
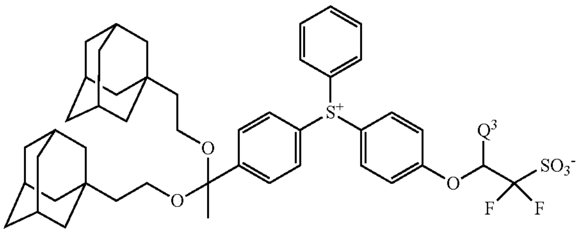
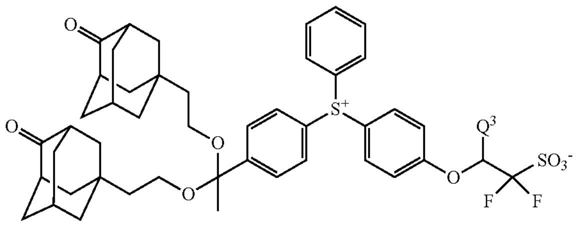
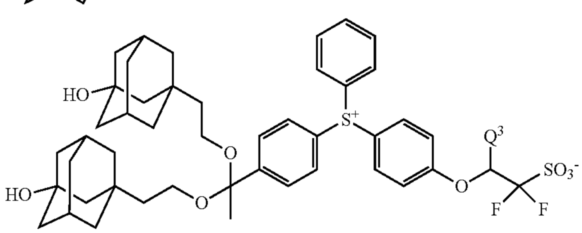
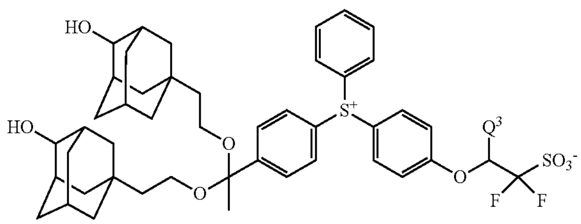
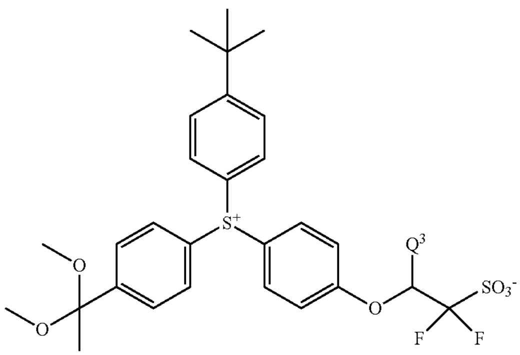
-continued
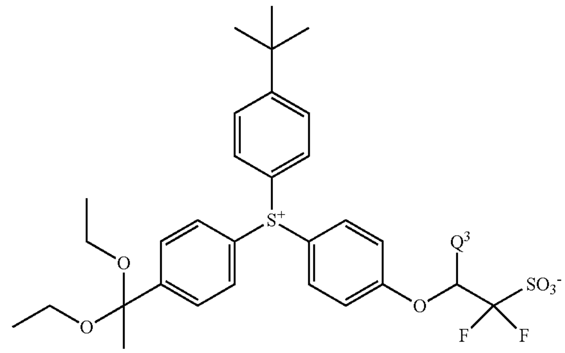
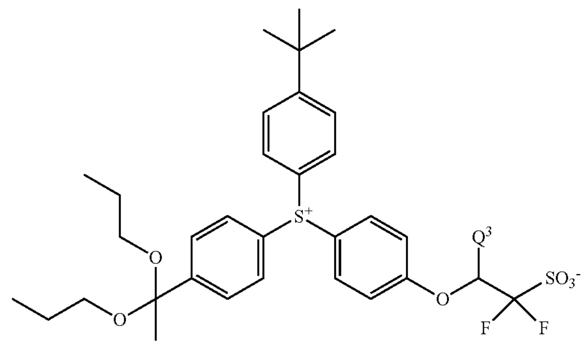
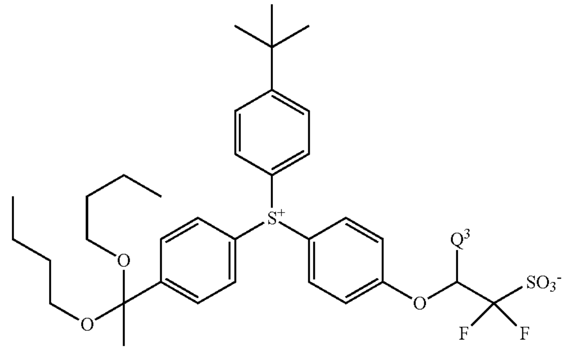
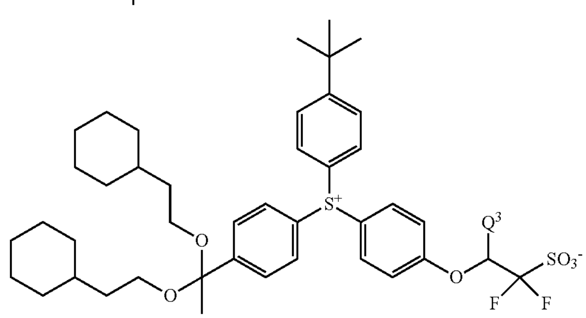
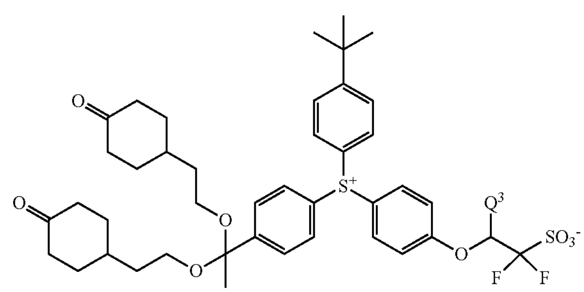

-continued
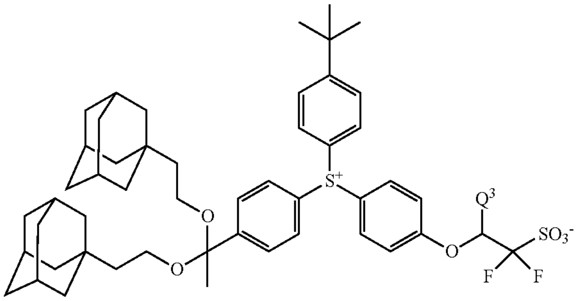
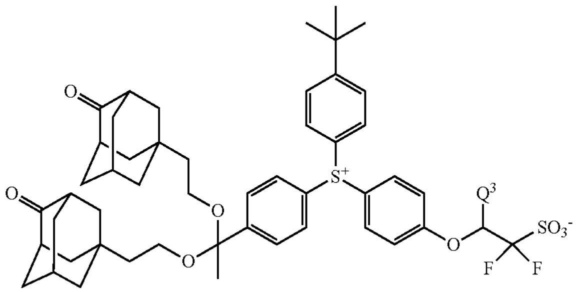
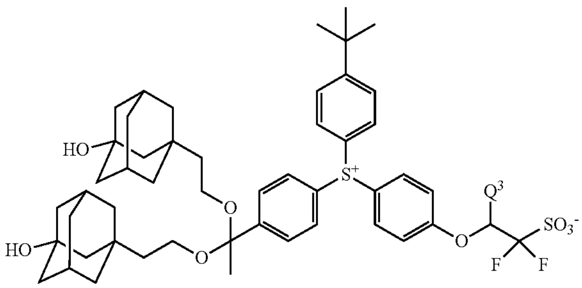
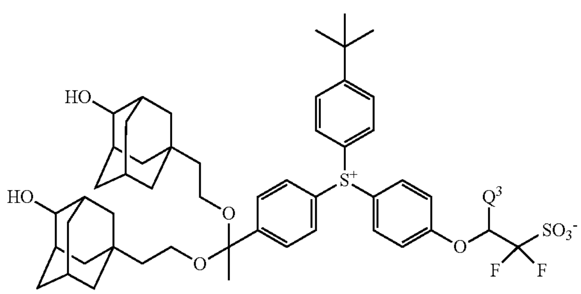
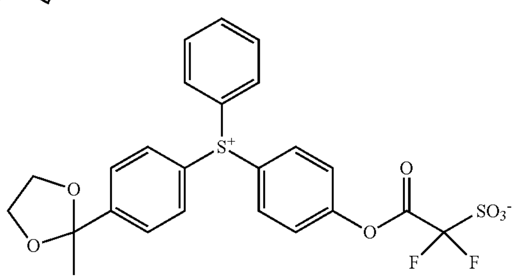
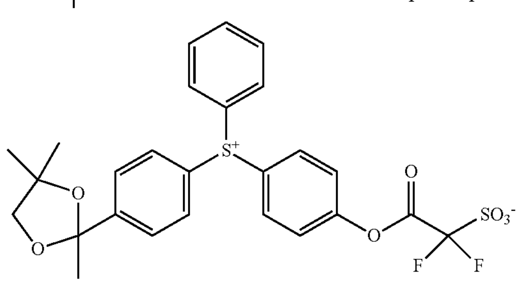
-continued
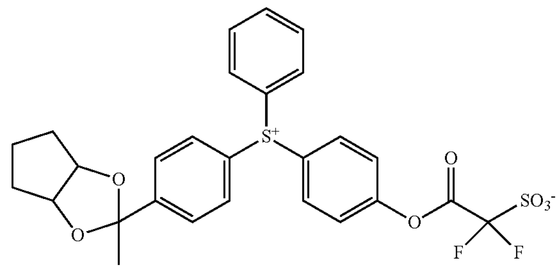
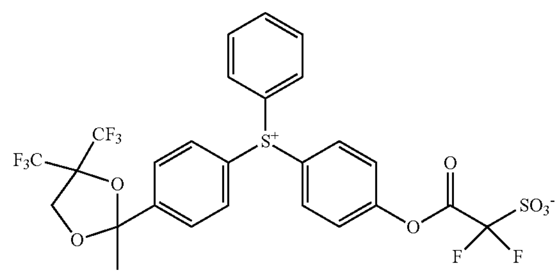
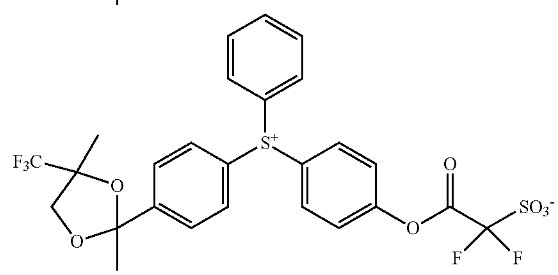
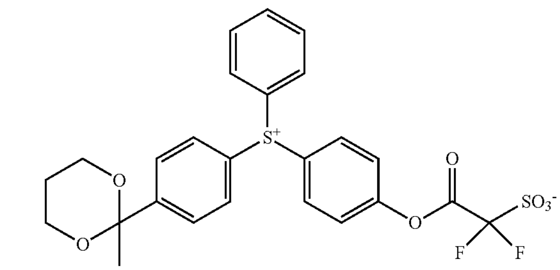
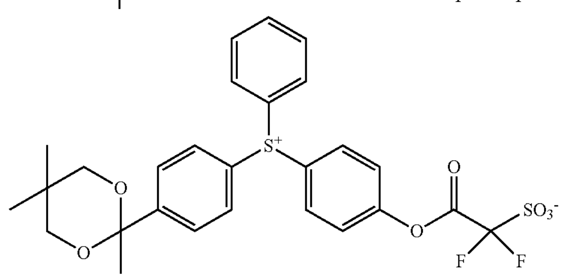
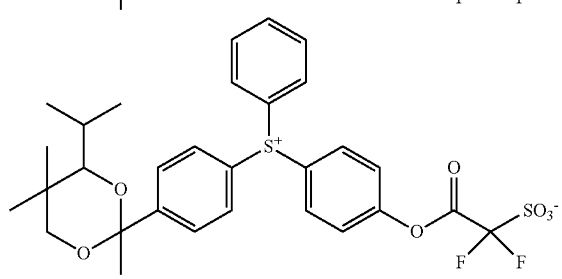

-continued
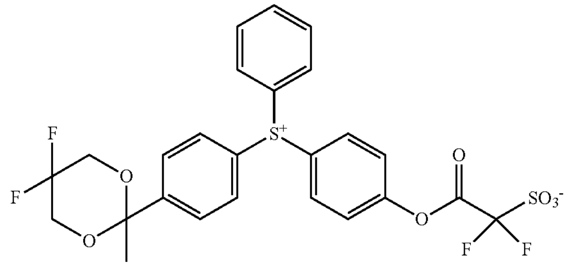
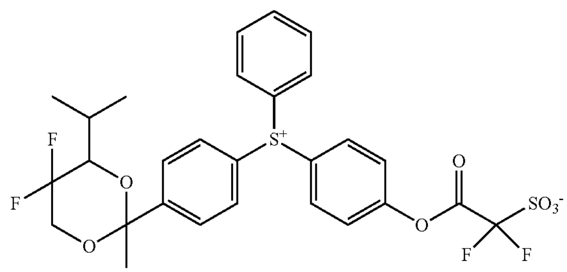
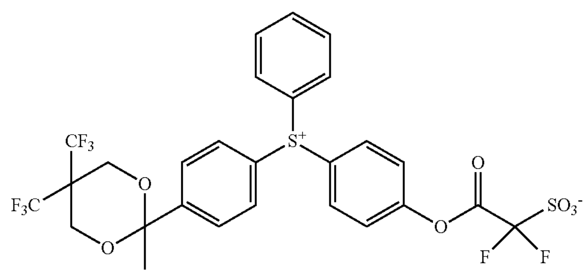
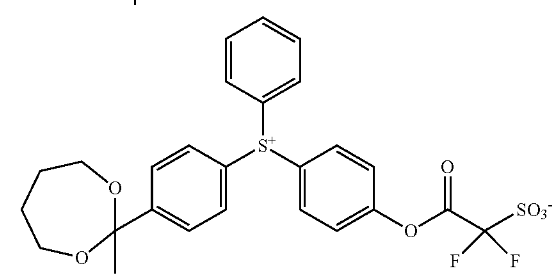
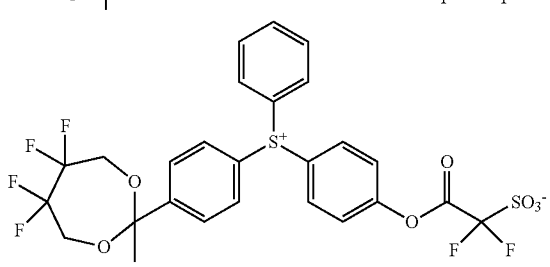
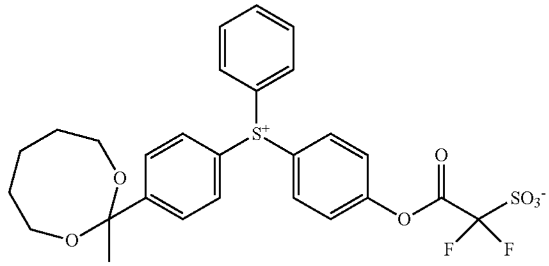
-continued
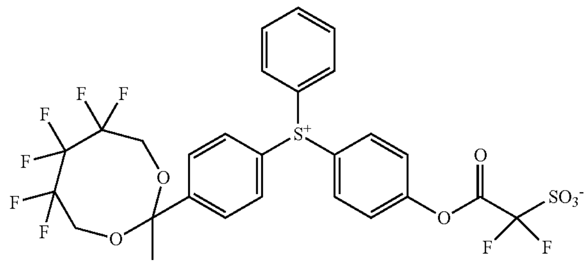
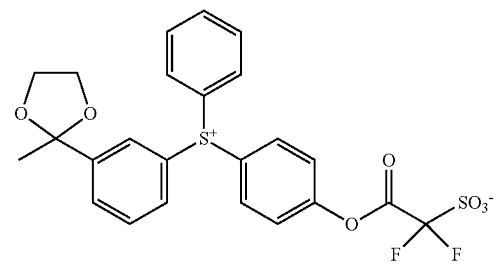
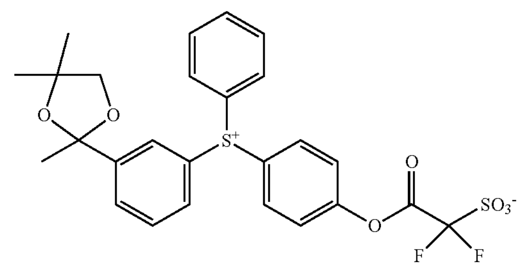
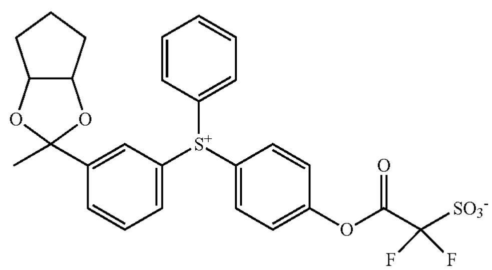
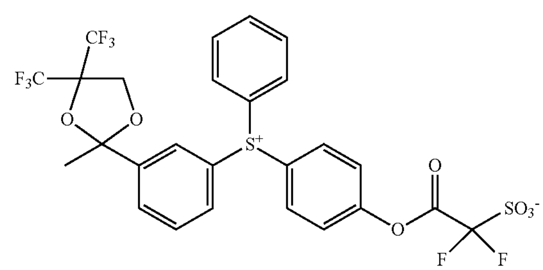
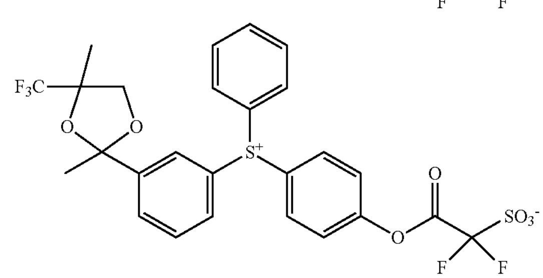

-continued
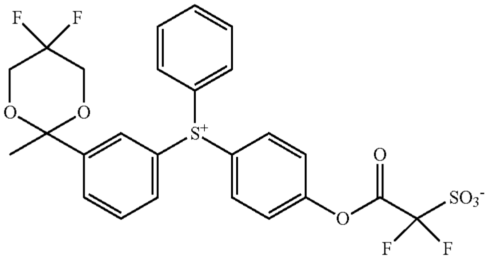
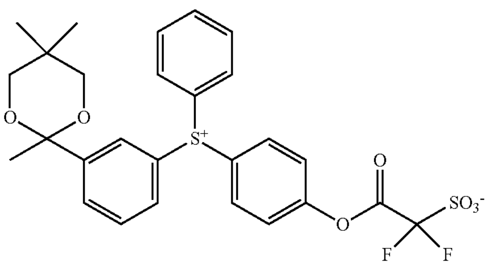
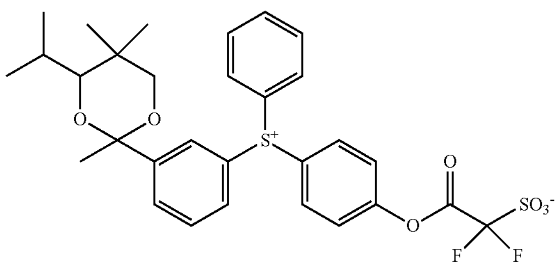
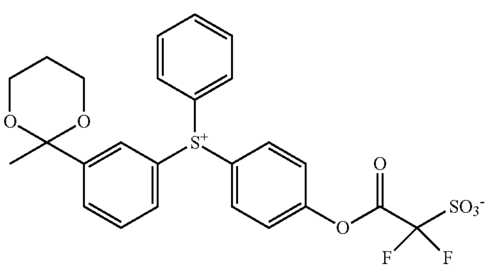
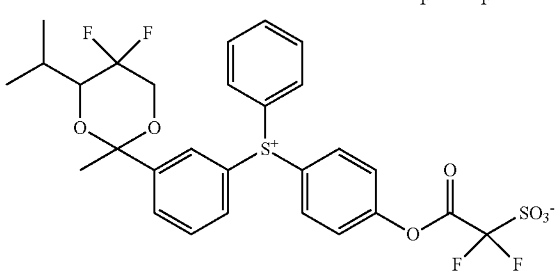
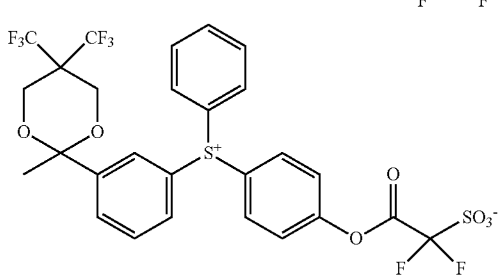
-continued
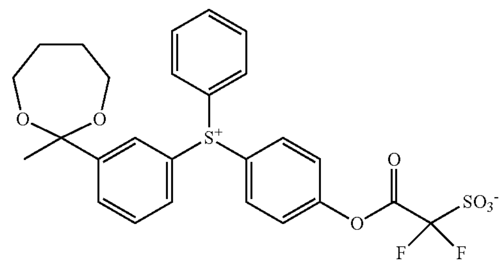
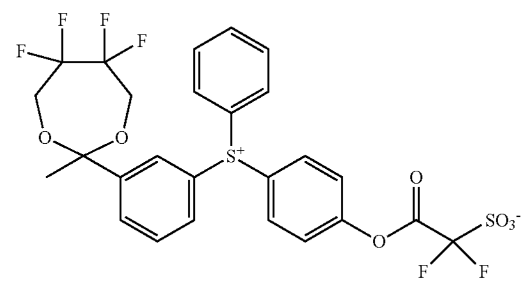
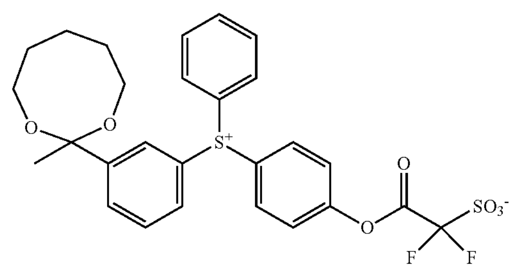
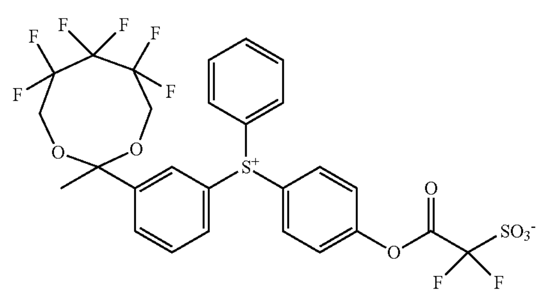
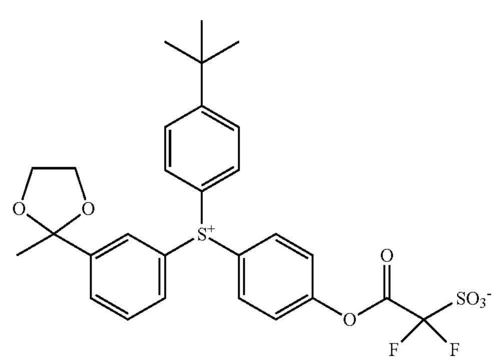

-continued
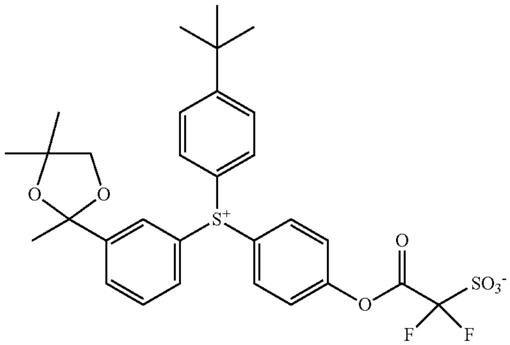
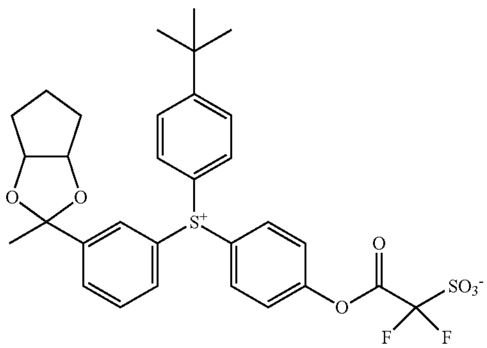
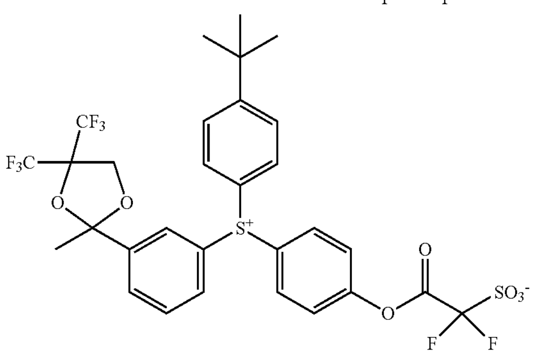
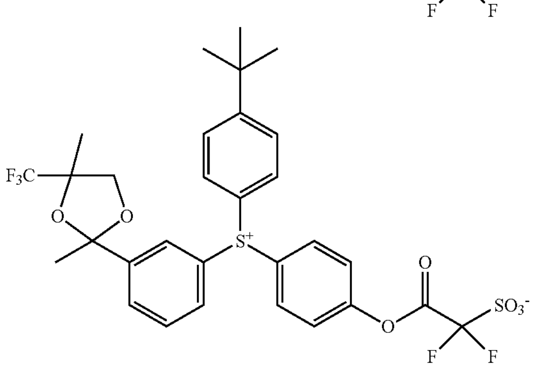
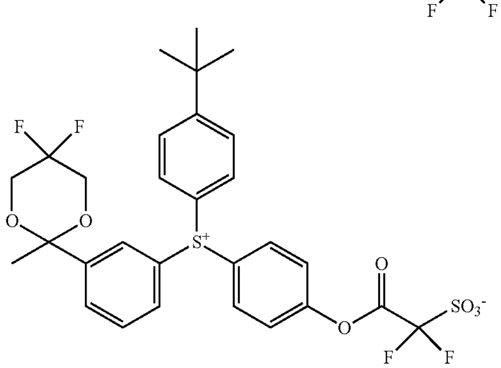
-continued
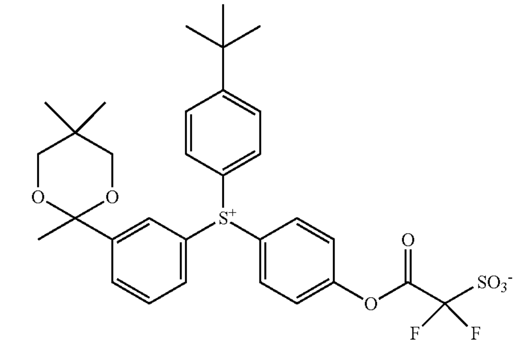
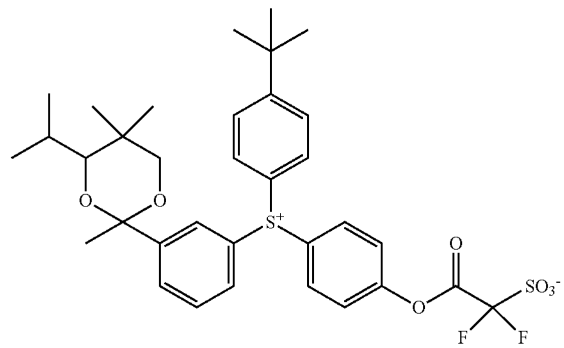
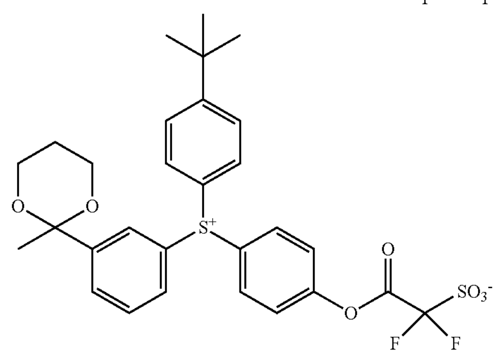
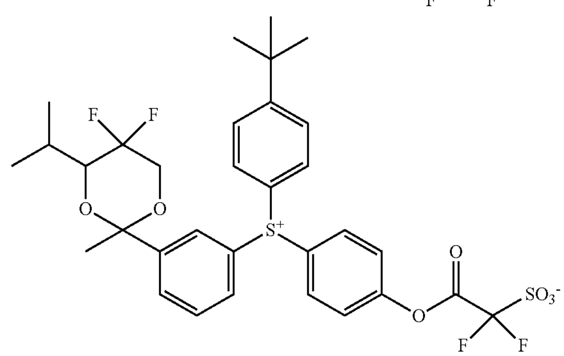
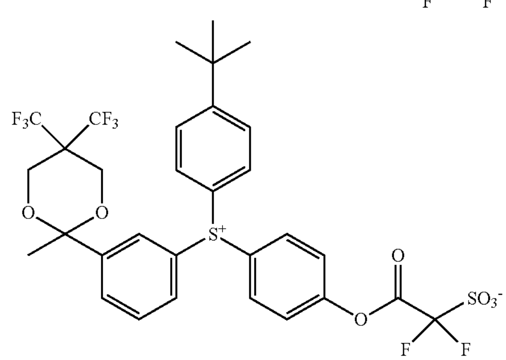

-continued
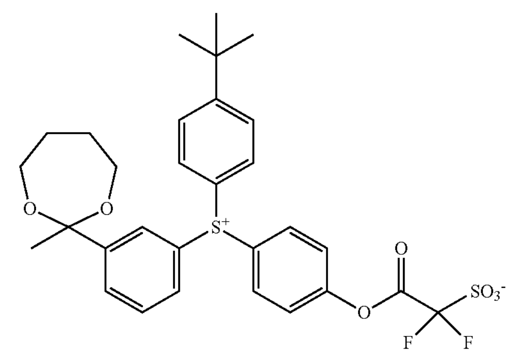
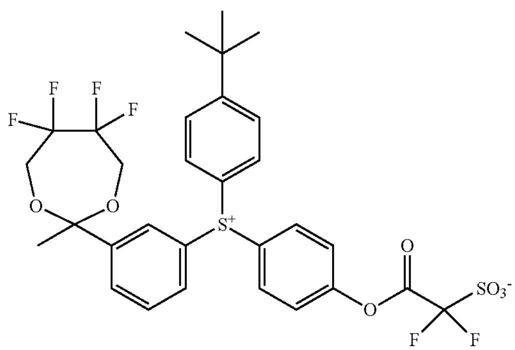
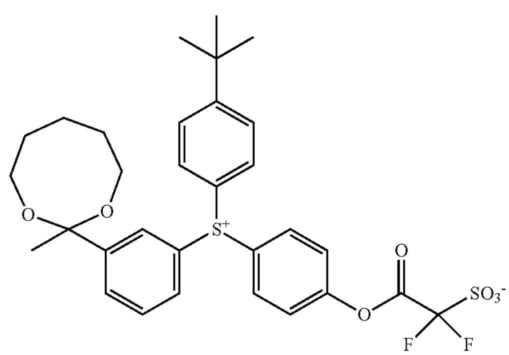
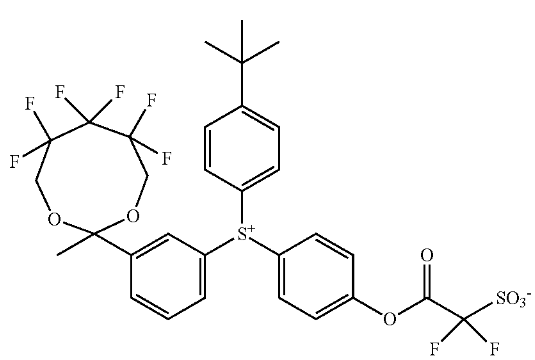
-continued
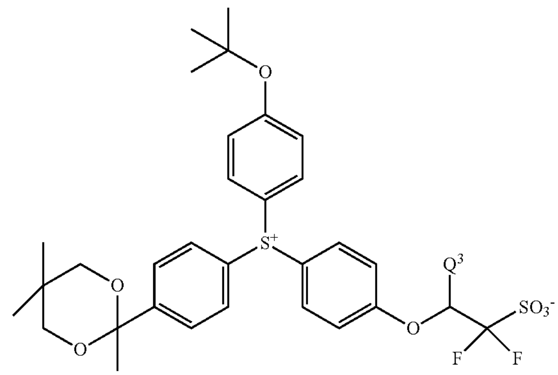
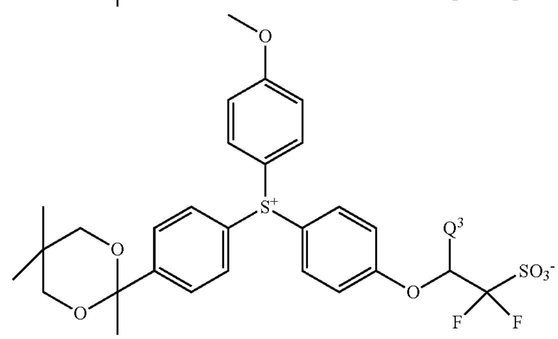
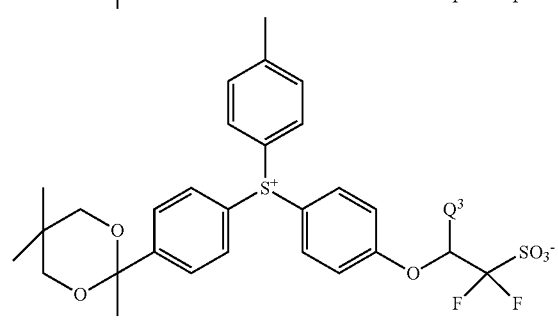
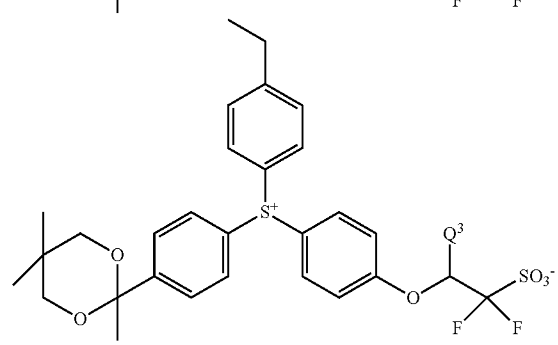
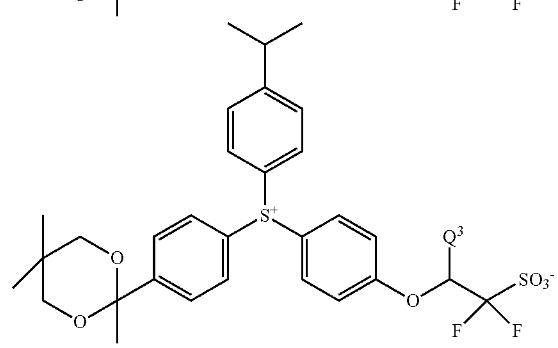

-continued
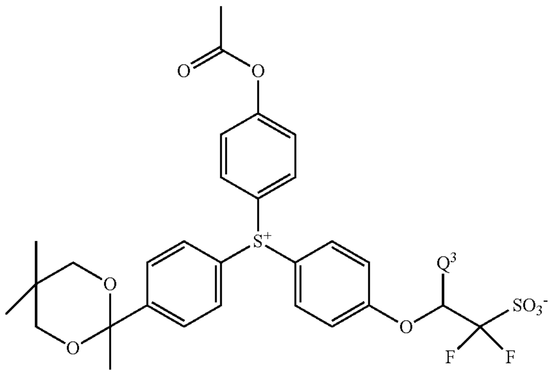
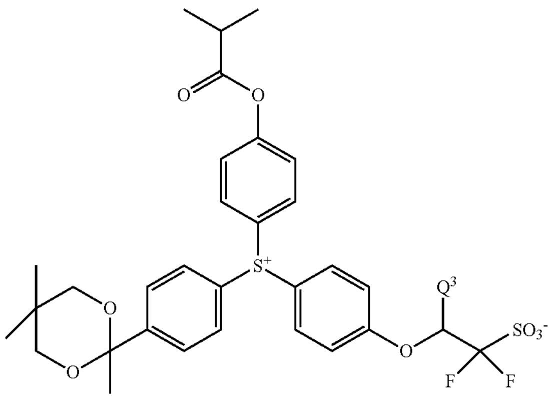
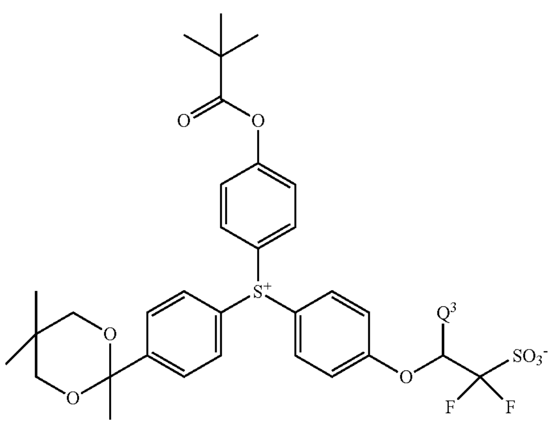
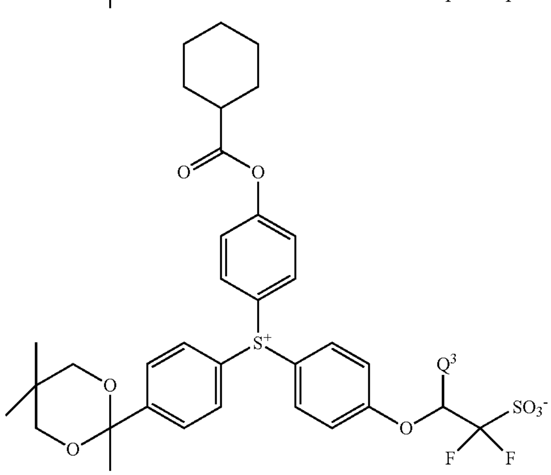
-continued
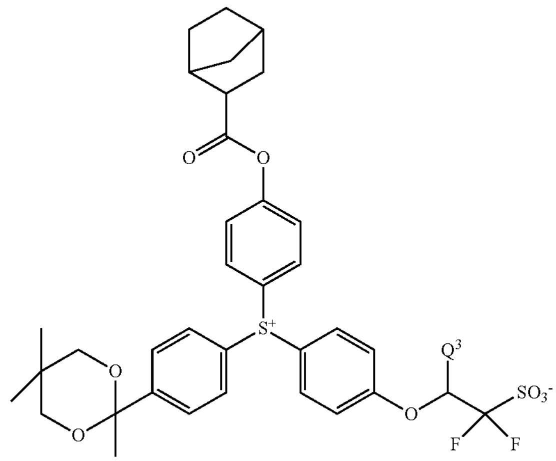
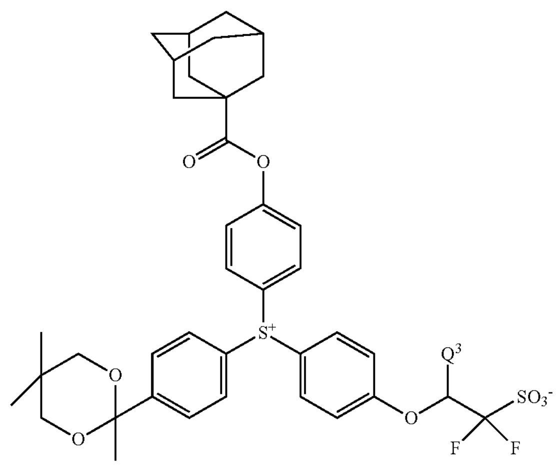
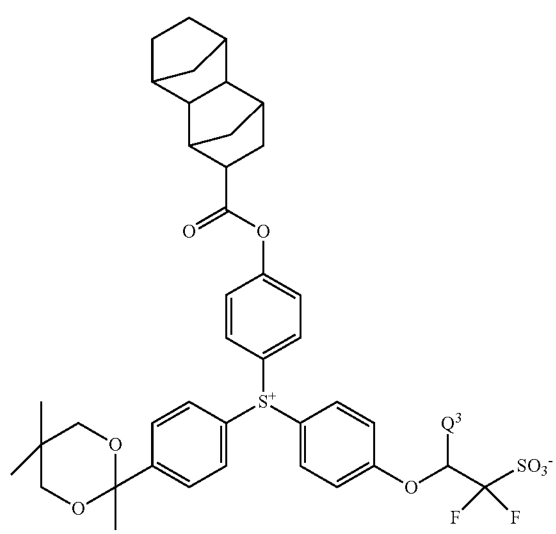

-continued
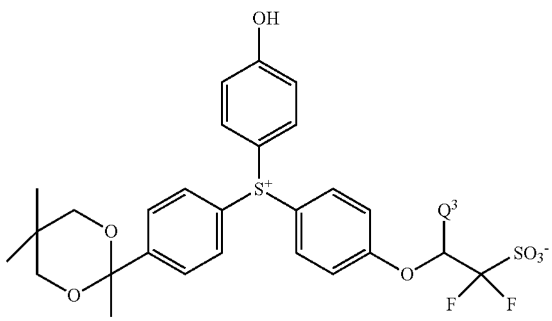
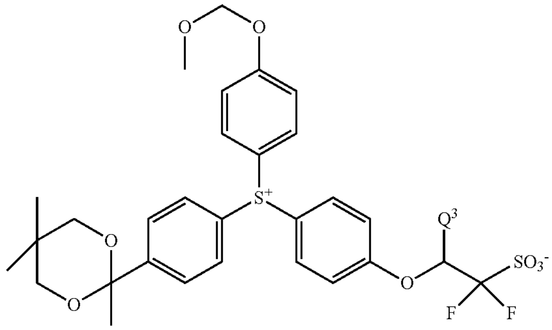
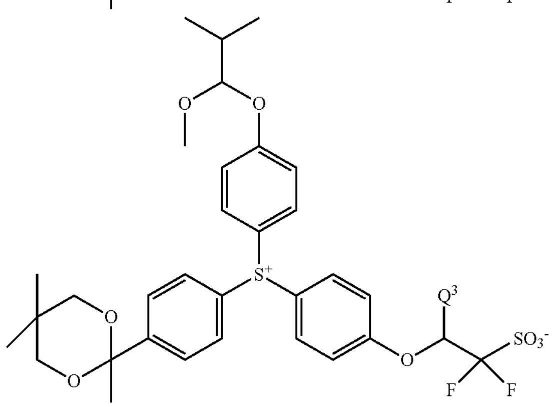
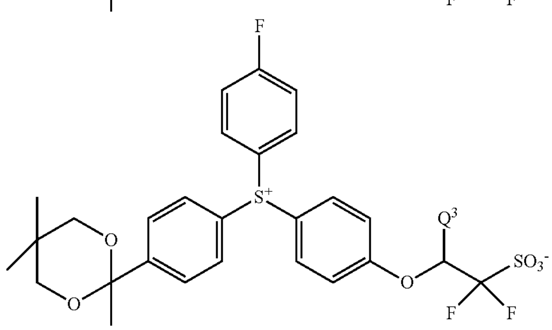
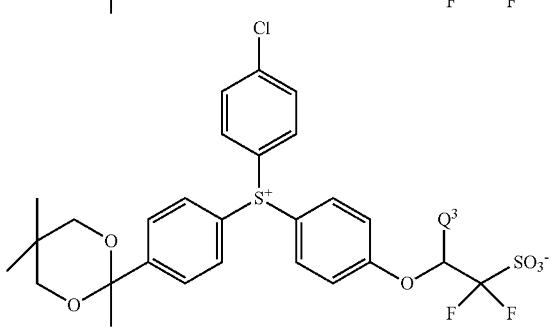
-continued
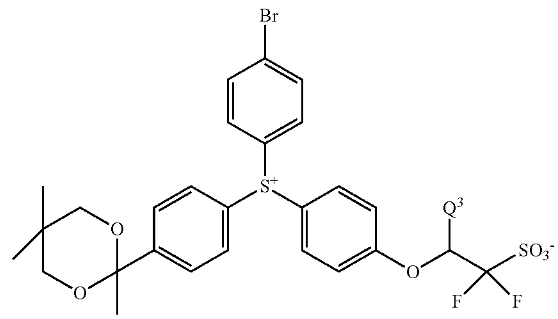
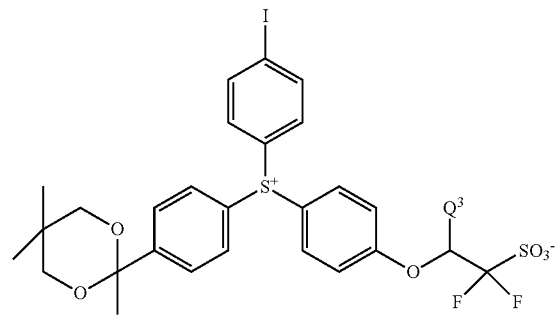
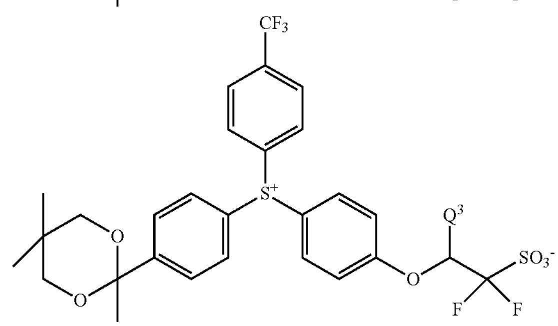
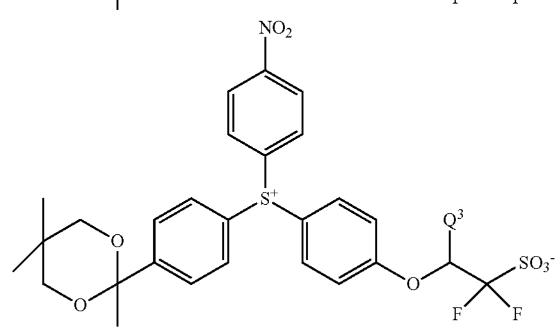
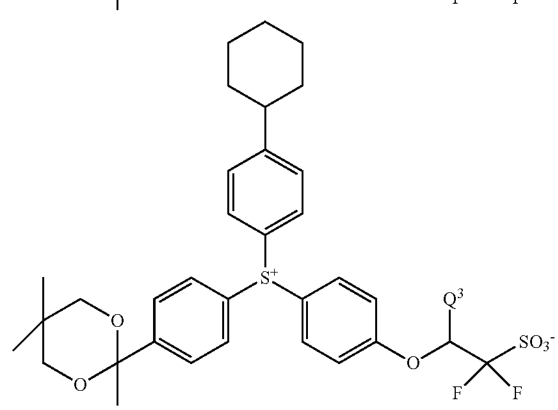

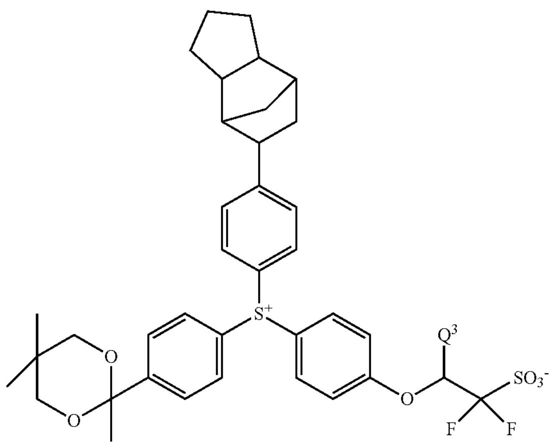
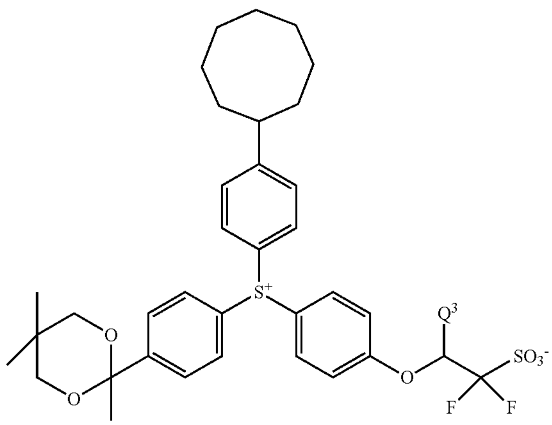
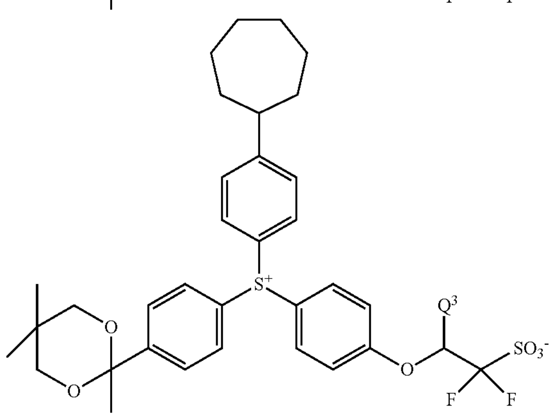
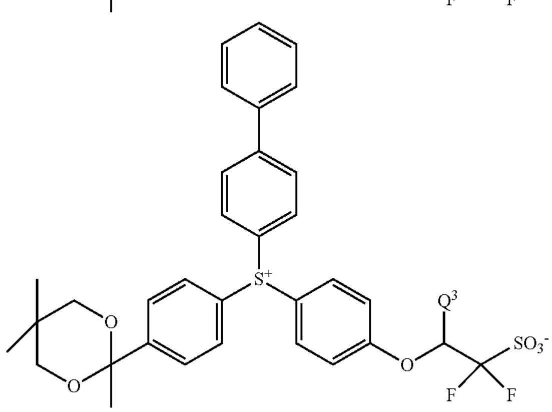
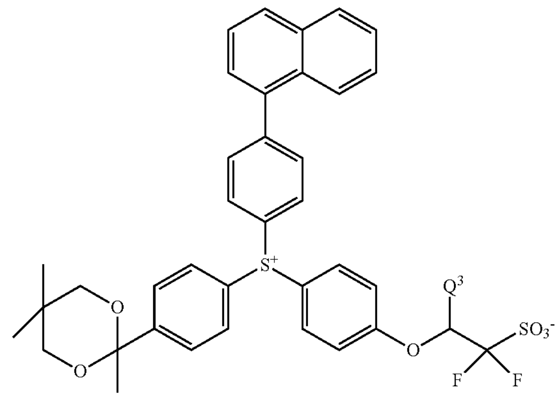
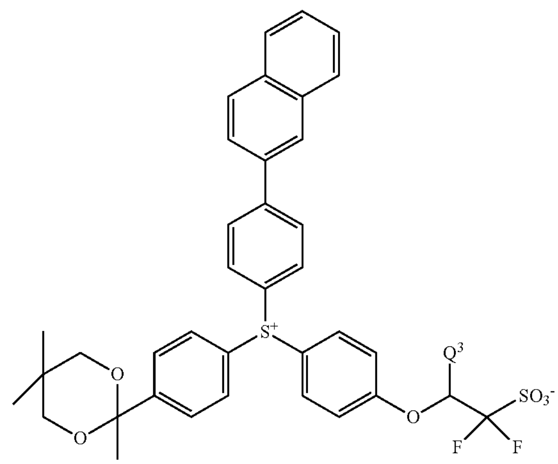
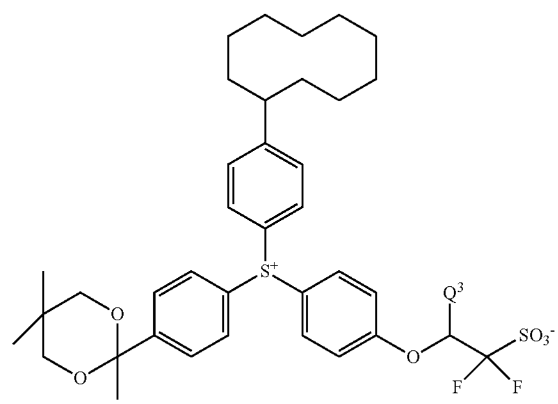
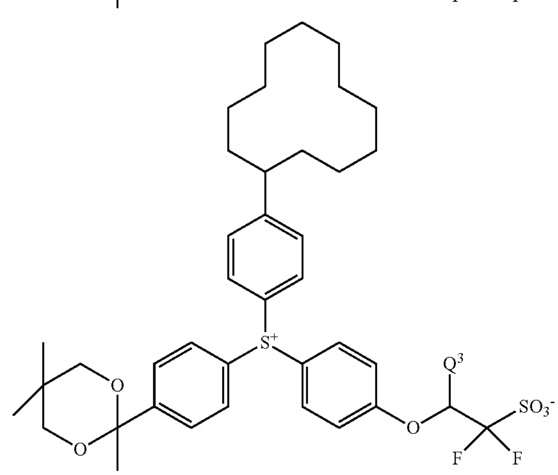

-continued
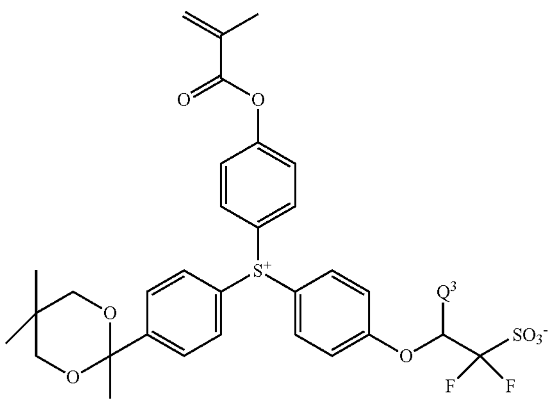
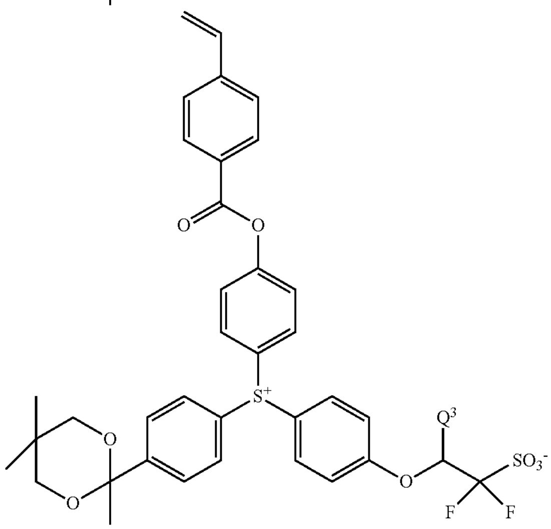
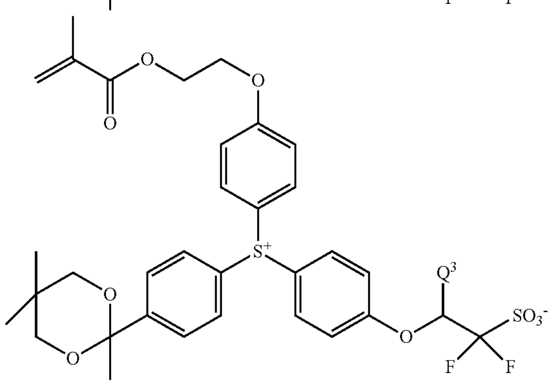
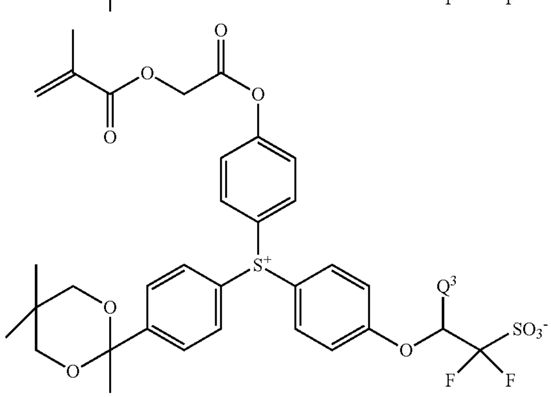
-continued
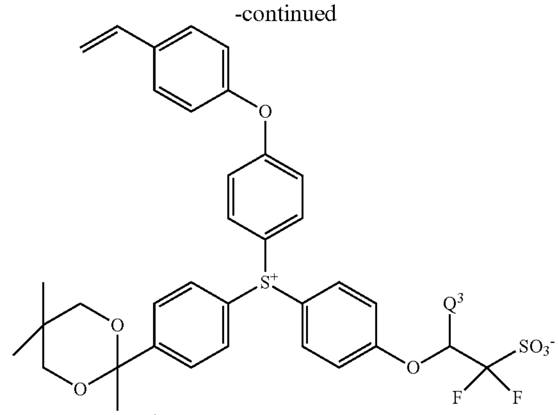
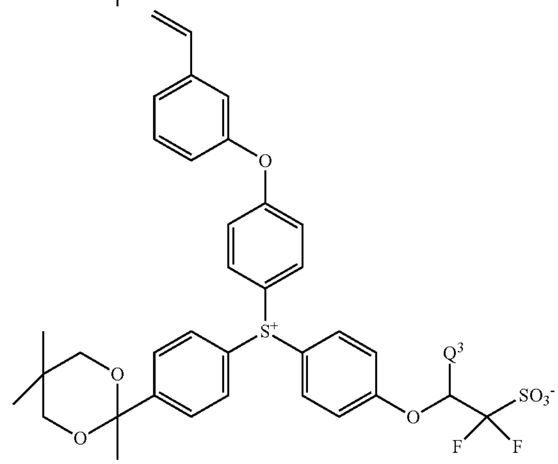
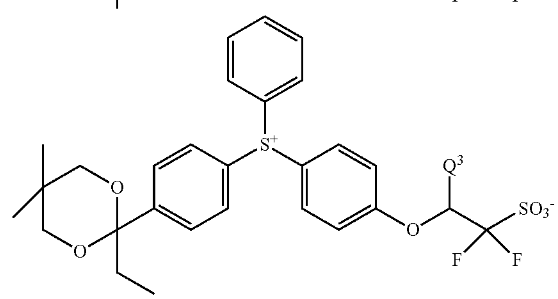
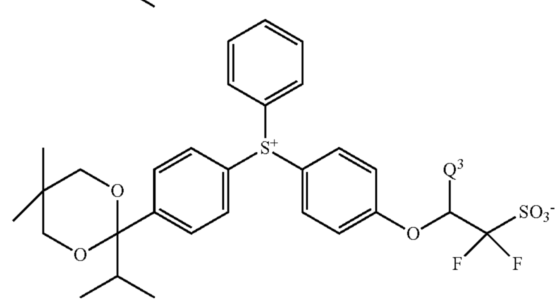
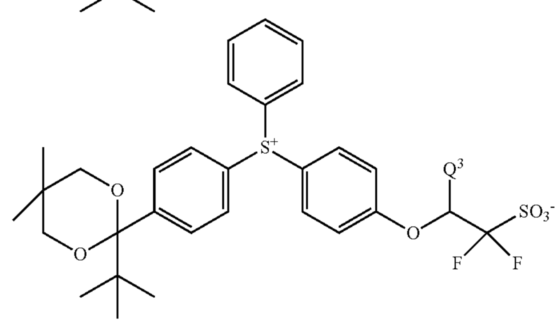

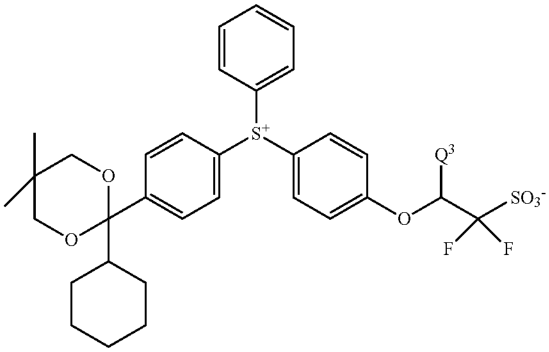
S+
O
O
Q3
SO3-
O
F
F
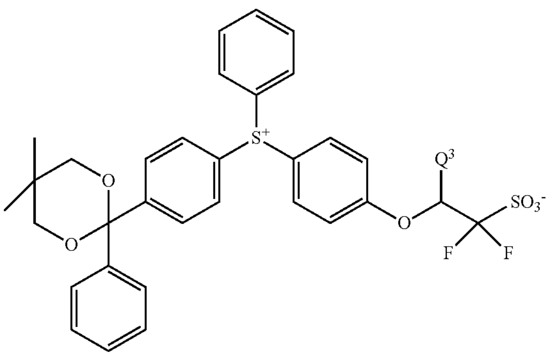
S+
O
O
Q3
SO3-
O
F
F
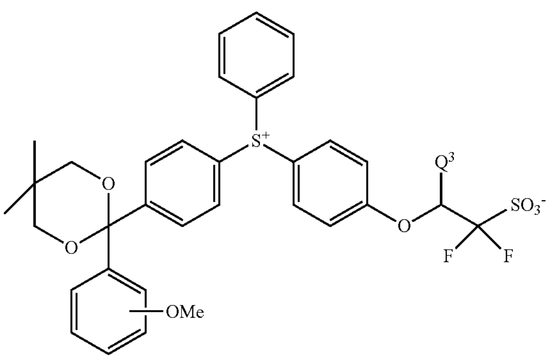
S+
O
O
Q3
SO3-
O
F
F
OMe
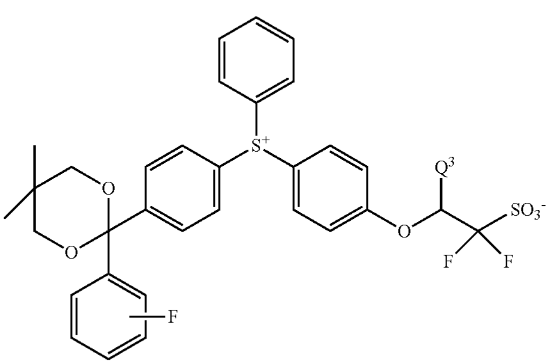
S+
O
O
Q3
SO3-
O
F
F
F
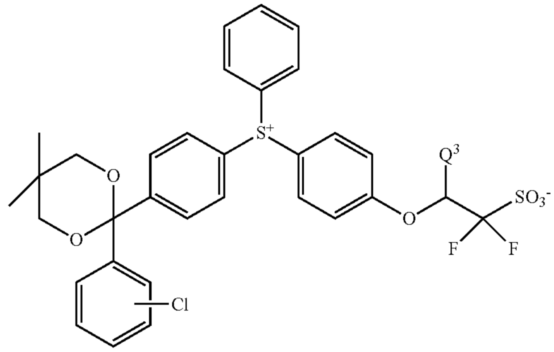
S+
O
O
Q3
SO3-
O
F
F
Cl
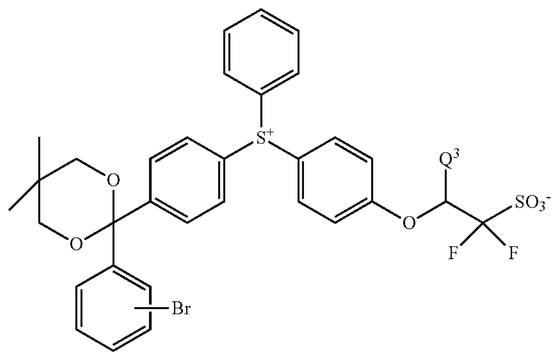
S+
O
O
Q3
SO3-
O
F
F
Br
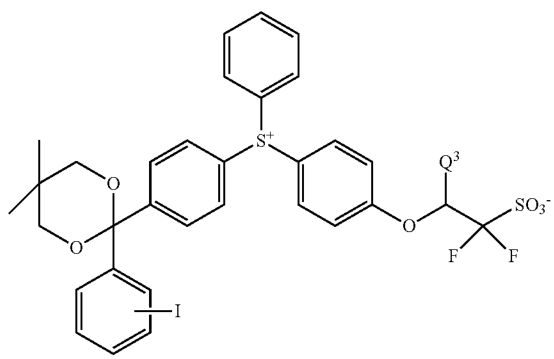
S+
O
O
Q3
SO3-
O
F
F
I
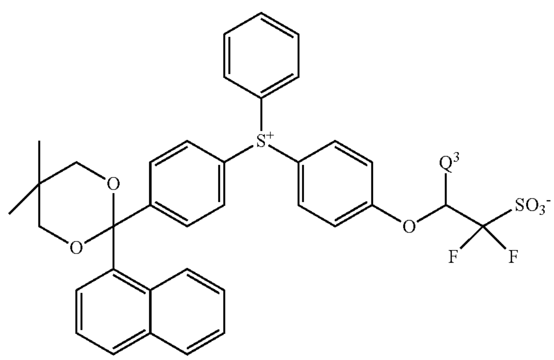
S+
O
O
Q3
SO3-
O
F
F -continued
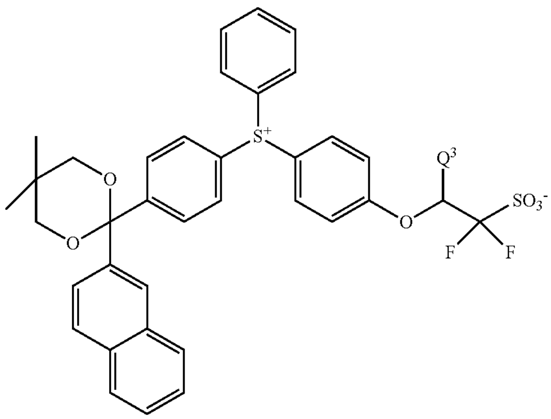
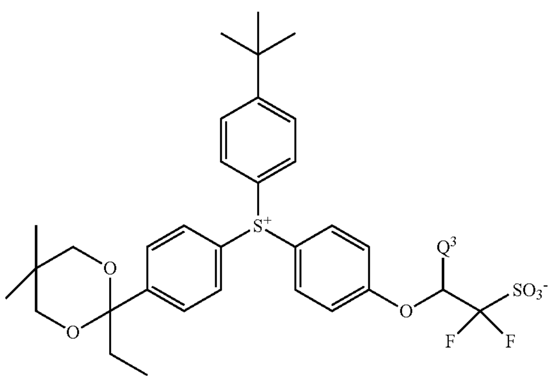
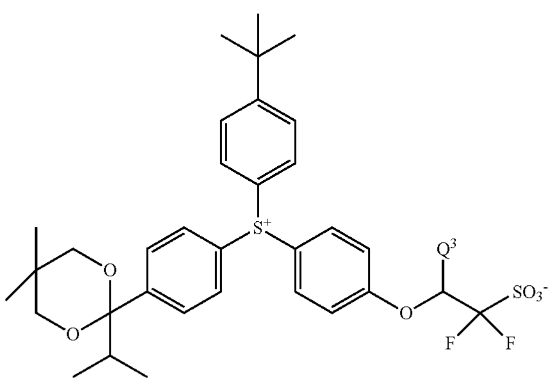
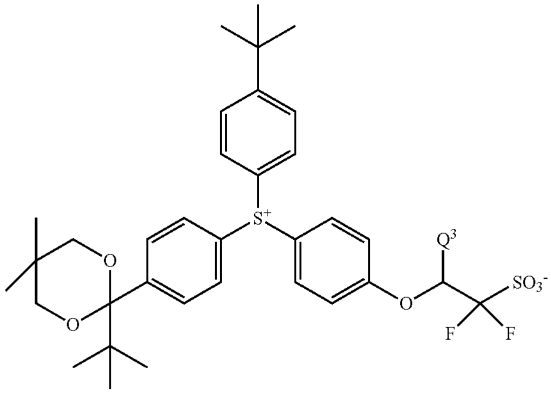
-continued
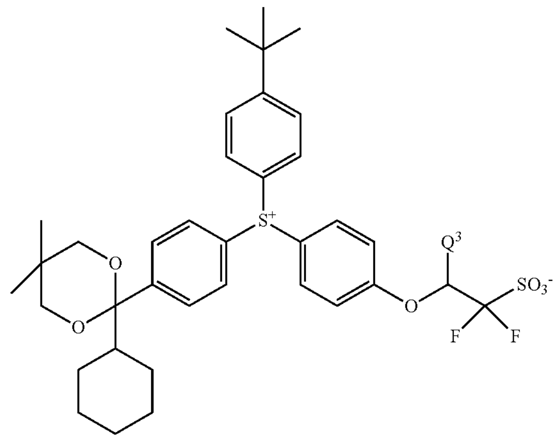
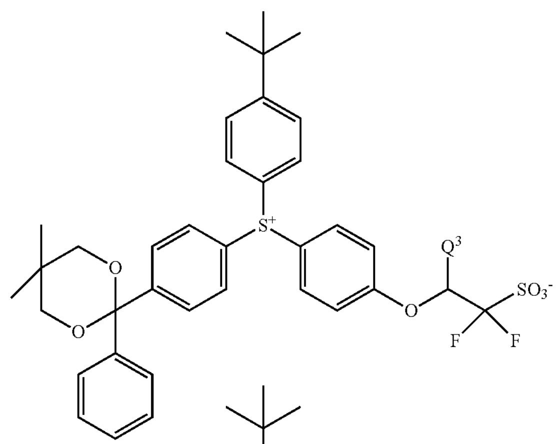
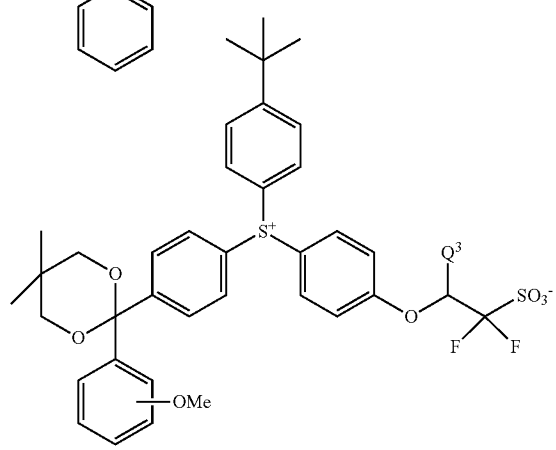
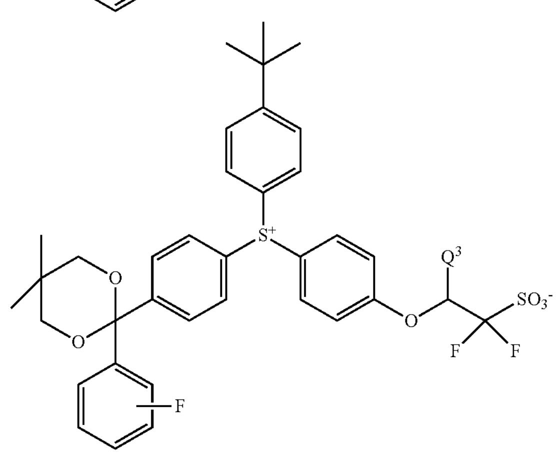

-continued

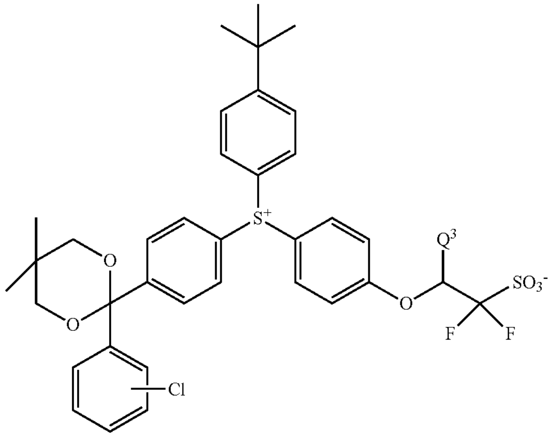

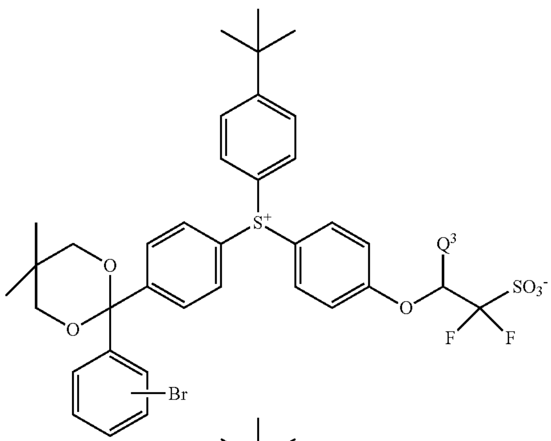

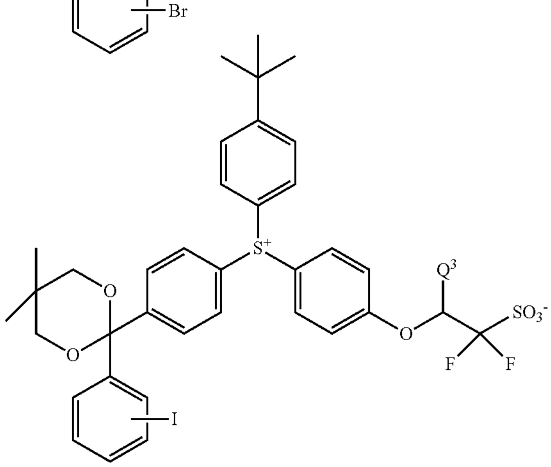

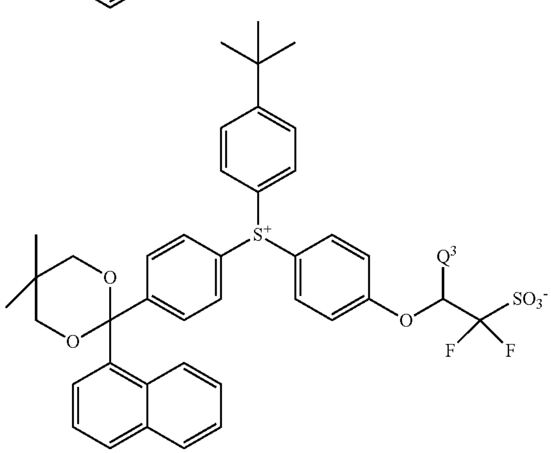

-continued

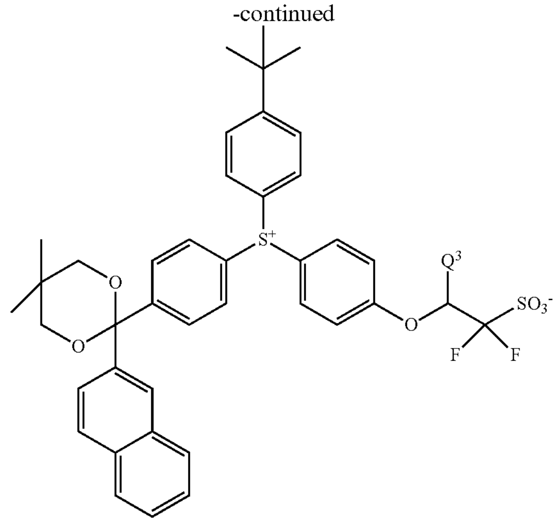

The molecular resist composition of the invention is characterized by comprising the betaine type onium compound and a solvent to be described later, but not a base resin. The term "base resin" refers to a resin or polymer which is commonly used in conventional resist compositions and present in the largest amount among other components exclusive of the solvent, that is, as the main component. In a resist composition comprising abase resin, the base resin is adapted to change its solubility in developer in response to exposure. In the resist composition of the invention, because of the absence of a base resin, the betaine type onium compound is uniformly dissolved and dispersed in the solvent without agglomeration. In the exposed region, the betaine type onium compound is photo-decomposed into a corresponding sulfonic acid having more affinity to alkaline developer. Since the sulfonic acid after photo-decomposition retains the cation moiety bonded thereto even after decomposition, it is believed that the acid is least diffusive. In the unexposed region, no photo-decomposition reaction takes place and the betaine structure is maintained. Since the cation and anion moieties are present in a common molecule, the covalent bond is predominant over the ionic bond, which indicates a poor affinity to the alkaline developer. The consequence is an enhancement of dissolution contrast between the exposed and unexposed regions. Due to the synergistic effect of the uniform dispersion of the betaine type onium compound and the high dissolution contrast between the exposed and unexposed regions, patterns of good profile having improved resolution, LWR and CDU are obtained.

The betaine type onium compound may be prepared, for example, according to the following scheme. Although reference is made to the synthesis of a sulfonium compound of cyclic acetal structure having the formula (A-a), the synthesis method is not limited thereto.

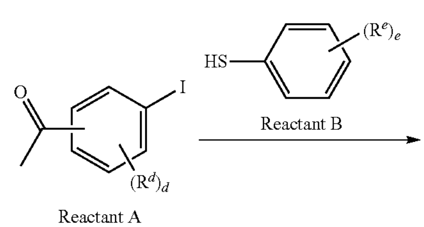

-continued

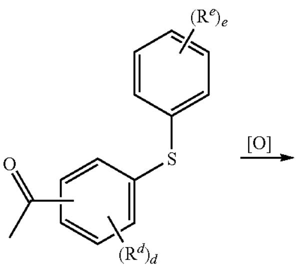

Intermediate A

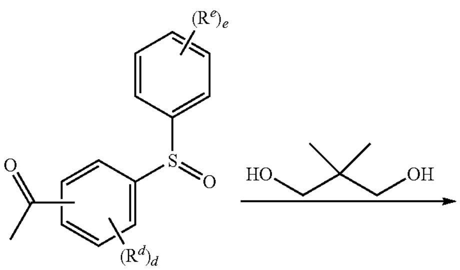

Intermediate B

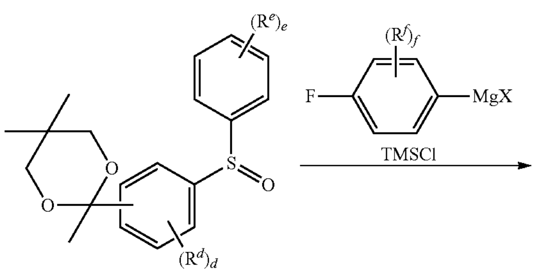

Intermediate C

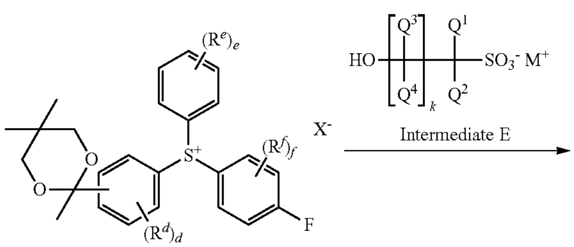

Intermediate D

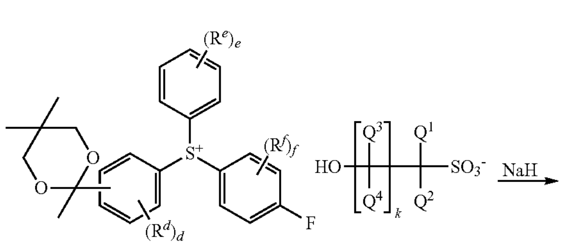

Intermediate F

-continued

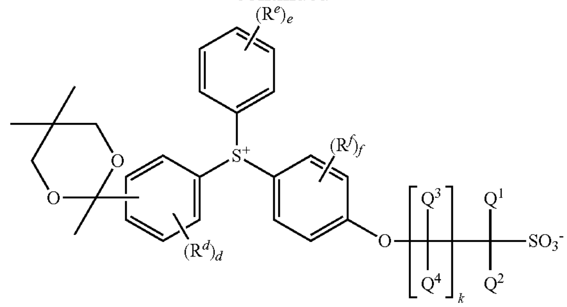

(A-a)

Herein $Q^1$ to $Q^4$ and k are as defined above. X is a halogen atom, and $X^-$ is a halide ion. $M^+$ is a counter cation. $R^d$, $R^e$ and $R^f$ are each independently a $C_1$-$C_{20}$ monovalent hydrocarbon group which may contain a heteroatom. The subscript d is an integer of 0 to 4, e is an integer of 0 to 5, and f is an integer of 0 to 4. In case of d≥2, $R^d$ may be identical or different and two $R^d$ may bond together to form a ring with the atom to which they are attached. In case of e≥2, $R^e$ may be identical or different and two $R^e$ may bond together to form a ring with the atom to which they are attached. In case of f≥2, $R^f$ may be identical or different and two $R^f$ may bond together to form a ring with the atom to which they are attached.

A first step is coupling reaction between reactants A and B to form Intermediate A or diaryl sulfide. Reactants A and B are commercially available or may be prepared by any well-known methods.

The reaction may be performed by a well-known organic synthesis method. Specifically, the reaction is performed by dissolving Reactants A and B in a solvent such as N-methylpyrrolidone, dimethylformamide or dimethylacetamide and adding a copper catalyst and a base. Suitable copper catalysts include copper(I) iodide, copper(I) bromide, and copper(I) chloride. Suitable bases include organic bases such as triethylamine, pyridine, and diisopropylethylamine, and inorganic bases such as sodium hydroxide, potassium carbonate, and lithium hydroxide. The reaction temperature is from 80° C. to around the boiling point of the solvent used. While it is desirable in view of yield that the reaction time is determined by monitoring the progress of reaction by gas chromatography (GC) or silica gel thin layer chromatography (TLC) to drive the reaction to completion, the reaction time is typically about 6 to 24 hours. After the completion of reaction, Intermediate A is recovered from the reaction mixture by ordinary aqueous workup. Intermediate A may be purified by conventional means such as distillation, silica gel column chromatography or recrystallization, if necessary.

A second step is oxidation of Intermediate A or diaryl sulfide to form Intermediate B or diaryl sulfoxide.

The reaction may be performed by a well-known organic synthesis method. Specifically, the reaction is performed by dissolving Intermediate A or diaryl sulfide in formic acid, acetic acid or the like, and adding aqueous hydrogen peroxide. Excess use of aqueous hydrogen peroxide relative to the sulfide can be accompanied by excessive oxidation to sultone. The reaction may also be performed by dissolving the sulfide in methylene chloride and adding m-chloroperbenzoic acid. The reaction temperature is from room temperature to about 50° C. While it is desirable in view of yield that the reaction time is determined by monitoring the progress of reaction by GC or TLC to drive the reaction to completion, the reaction time is typically about 6 to 24 hours. After the completion of reaction, Intermediate B is recovered from the reaction mixture by ordinary aqueous workup. Intermediate B may be purified by conventional means such as silica gel column chromatography or recrystallization, if necessary.

A third step is to react the carbonyl group on Intermediate B with a corresponding diol to form Intermediate C or cyclic acetal.

The reaction may be performed by a well-known organic synthesis method. Specifically, the reaction is performed by dissolving Intermediate B in toluene, xylene or the like, and adding the corresponding diol. The reaction rate may be accelerated by adding to the reaction system an acid catalyst such as hydrochloric acid, sulfuric acid, nitric acid, p-toluenesulfonic acid, methanesulfonic acid or trifluoromethanesulfonic acid. Also the reaction time may be reduced by removing the water of reaction from the reaction system to bias the reaction system equilibrium to the product side. The reaction temperature is about 80° C. to 150° C. While it is desirable in view of yield that the reaction time is determined by monitoring the progress of reaction by GC or TLC to drive the reaction to completion, the reaction time is typically about 6 to 24 hours. After the completion of reaction, Intermediate C is recovered from the reaction mixture by ordinary aqueous workup. Intermediate C may be purified by conventional means such as silica gel column chromatography or recrystallization, if necessary.

In a fourth step, a Grignard reagent prepared from halogenated fluorobenzene is added to Intermediate C to produce Intermediate D or triarylsulfonium salt.

The reaction may be performed by a well-known organic synthesis method. First, a Grignard reagent is prepared from halogenated fluorobenzene by the standard method. To the Grignard reagent is added a solution of Intermediate C in methylene chloride, tetrahydrofuran (THF) or the like. Then trimethylsilyl chloride is added dropwise to the solution. The reaction temperature is about 10° C. to 30° C. While it is desirable in view of yield that the reaction time is determined by monitoring the progress of reaction by TLC to drive the reaction to completion, the reaction time is typically about 1 to 2 hours. After the completion of reaction, Intermediate D is recovered from the reaction mixture by ordinary aqueous workup. Intermediate D may be purified by conventional means such as silica gel column chromatography or recrystallization, if necessary. Notably, $X^-$ in Intermediate D is preferably chloride or bromide ion.

A fifth step is a salt exchange between Intermediate D and Intermediate E to form Intermediate F.

The reaction may be performed by a well-known organic synthesis method. Specifically, the reaction is performed by dissolving or suspending Intermediate D and Intermediate E in methylene chloride, methyl isobutyl ketone or the like, adding water, and stirring the mixture. It is desirable in view of yield to monitor the progress of reaction by TLC. After the completion of reaction, Intermediate F is recovered from the reaction mixture by ordinary aqueous workup. Intermediate F may be purified by conventional means such as chromatography or recrystallization, if necessary.

In the reaction scheme, the ion exchange of 5th step is readily performed by a well-known method, for example, by following the teaching of JP-A 2007-145797.

A sixth step is aromatic nucleophilic displacement reaction of Intermediate F to produce the target sulfonium compound (A-a).

The reaction is performed by suspending sodium hydride in THF, cooling the suspension, and adding dropwise a THF solution of Intermediate F thereto. It is desirable in view of yield to monitor the progress of reaction by TLC. After the completion of reaction, sulfonium compound (A-a) is recovered from the reaction mixture by ordinary aqueous workup. The sulfonium compound (A-a) may be purified by conventional means such as chromatography or recrystallization, if necessary.

The preparation method according to the illustrated scheme is merely exemplary, and the method of preparing the betaine type onium compound is not limited thereto. While the scheme illustrates the synthesis of a compound having an ether bond, the skilled artisan can synthesize any sulfonium compound having an ester bond, sulfonate bond, carbonate bond or carbamate bond by resorting to the organic chemistry method within the common knowledge.

As component (A), the betaine type onium compound may be used alone or in combination of two or more.

(B) Organic Solvent

The organic solvent used as component (B) is not particularly limited as long as component (A) and other components are soluble therein. Suitable organic solvents include those described in JP-A 2008-111103, paragraphs [0144] to [0145], for example, ketones such as cyclohexanone and methyl-2-n-pentyl ketone; alcohols such as 3-methoxybutanol, 3-methyl-3-methoxybutanol, 1-methoxy-2-propanol, 1-ethoxy-2-propanol, and diacetone alcohol (DAA); ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone (GBL), which may be used alone or in admixture. Where an acid labile group of acetal form is used, a high boiling alcohol solvent such as diethylene glycol, propylene glycol, glycerol, 1,4-butanediol or 1,3-butanediol may be added to accelerate deprotection reaction of acetal.

Of these, 1-ethoxy-2-propanol, PGMEA, cyclohexanone, GBL, DAA, and mixtures thereof are preferred because the betaine type onium compound (A) is most soluble therein.

An appropriate amount of the organic solvent used is 200 to 5,000 parts, especially 400 to 3,000 parts by weight per 80 parts by weight of component (A).

(C) Surfactant

The resist composition may further comprise (C) a surfactant. It is preferably a surfactant which is insoluble or substantially insoluble in water and soluble in alkaline developer, and/or a surfactant which is insoluble or substantially insoluble in water and alkaline developer (hydrophobic resin). For the surfactant, reference should be made to JP-A 2010-215608 and JP-A 2011-016746.

While many examples of the surfactant which is insoluble or substantially insoluble in water and alkaline developer are described in the patent documents, preferred examples are FC-4430 (3M), Surflon S-381, KH-20 and KH-30 (AGC Seimi Chemical Co., Ltd.), and Olfine E1004 (Nissin Chemical Industry Co., Ltd.). Partially fluorinated oxetane ring-opened polymers having the structural formula (surf-1) are also useful.

(surf-1)

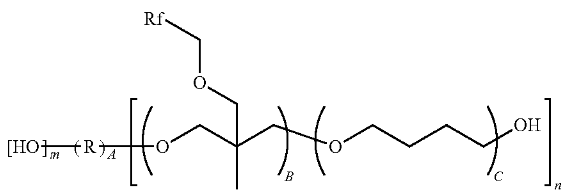

In formula (surf-1), R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

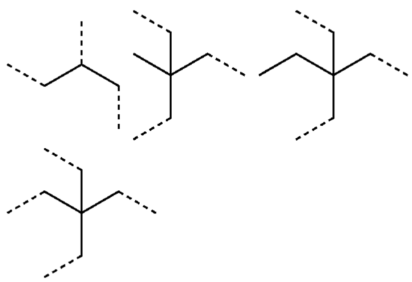

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

$R^f$ is trifluoromethyl or pentafluoroethyl, and preferably trifluoromethyl. The subscript m is an integer of 0 to 3, n is an integer of 1 to 4, and the sum of m and n, which represents the valence of R, is an integer of 2 to 4. "A" is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either blockwise or randomly. For the preparation of surfactants in the form of partially fluorinated oxetane ring-opened polymers, reference should be made to U.S. Pat. No. 5,650,483, for example.

The surfactant which is insoluble or substantially insoluble in water and soluble in alkaline developer is useful when ArF immersion lithography is applied to the resist composition in the absence of a resist protective film. In this embodiment, the surfactant has a propensity to segregate on the resist film surface for achieving a function of minimizing water penetration or leaching. The surfactant is also effective for preventing water-soluble components from being leached out of the resist film for minimizing any damage to the exposure tool. The surfactant becomes solubilized during alkaline development following exposure and PEB, and thus forms few or no foreign particles which become defects. The preferred surfactant is a polymeric surfactant which is insoluble or substantially insoluble in water, but soluble in alkaline developer, also referred to as "hydrophobic resin" in this sense, and especially which is water repellent and enhances water slippage.

Suitable polymeric surfactants include those containing recurring units of at least one type selected from the formulae (1A) to (1E).

(1A)

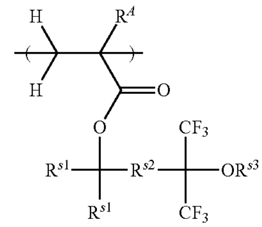

(1B)

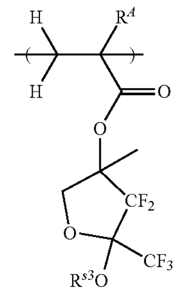

(1C)

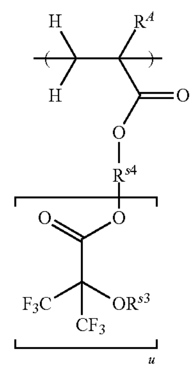

(1D)

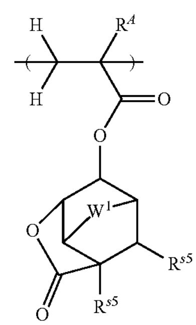

(1E)

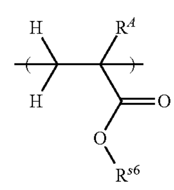

Herein, $R^A$ is hydrogen, fluorine, methyl or trifluoromethyl. $W^1$ is —$CH_2$—, —$CH_2CH_2$— or —O—, or two separate —H. $R^{s1}$ is each independently hydrogen or a $C_1$-$C_{10}$ monovalent hydrocarbon group. $R^{s2}$ is a single bond or a $C_1$-$C_5$ straight or branched divalent hydrocarbon group. $R^{s3}$ is each independently hydrogen, a $C_1$-$C_{15}$ monovalent hydrocarbon or fluorinated hydrocarbon group, or an acid labile group. When $R^{s3}$ is a monovalent hydrocarbon or fluorinated hydrocarbon group, an ether bond (—O—) or carbonyl moiety (—C(═O)—) may intervene in a carbon-carbon bond. $R^{s4}$ is a $C_1$-$C_{20}$ (u+1)-valent hydrocarbon or fluorinated hydrocarbon group, and u is an integer of 1 to 3. $R^{s5}$ is each independently hydrogen or a group having the formula.

—C(═O)—O—$R^{sa}$ wherein $R^{sa}$ is a $C_1$-$C_{20}$ fluorinated hydrocarbon group. $R^{s6}$ is a C-Cis monovalent hydrocarbon or fluorinated hydrocarbon group in which an ether bond (—O—) or carbonyl moiety (—C(═O)—) may intervene in a ca-car bon bond.

The monovalent hydrocarbon group represented by $R^{s1}$ may be straight, branched or cyclic and examples thereof include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, n-octyl, n-nonyl, n-decyl, adamantyl, and norbornyl. Inter alia, $C_1$-$C_6$ hydrocarbon groups are preferred.

The divalent hydrocarbon group represented by $R^{s2}$ may be straight, branched or cyclic and examples thereof include methylene, ethylene, propylene, butylene, and pentylene.

The monovalent hydrocarbon group represented by $R^{s3}$ or $R^{s6}$ may be straight, branched or cyclic and examples thereof include alkyl, alkenyl, and alkynyl groups, with the alkyl groups being preferred. Suitable alkyl groups include those exemplified for the monovalent hydrocarbon group represented by $R^{s1}$ as well as n-undecyl, n-dodecyl, tridecyl, tetradecyl, and pentadecyl. Examples of the monovalent fluorinated hydrocarbon group represented by $R^{s3}$ or $R^{s6}$ include the foregoing monovalent hydrocarbon groups in which some or all carbon-bonded hydrogen atoms are substituted by fluorine atoms. In these groups, an ether bond (—O—) or carbonyl moiety (—C(═O)—) may intervene in a carbon-carbon bond as mentioned above.

Examples of the acid labile group represented by $R^{s3}$ include groups of the formulae (L1) to (L4), $C_4$-$C_{20}$, preferably $C_4$-$C_{15}$ tertiary alkyl groups, trialkylsilyl groups in which each alkyl moiety has 1 to 6 carbon atoms, and $C_4$-$C_{20}$ oxoalkyl groups.

(L1)

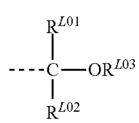

(L2)

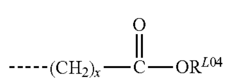

(L3)

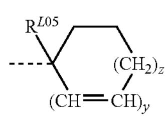

(L4)

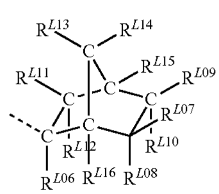

In formula (L1), $R^{L01}$ and $R^{L02}$ are each independently hydrogen or a $C_1$-$C_{18}$, preferably $C_1$-$C_{10}$ alkyl group. The alkyl group may be straight, branched or cyclic and examples thereof include methyl, ethyl, propyl, isopropyl, n-butyl, sec-butyl, tert-butyl, cyclopentyl, cyclohexyl, 2-ethylhexyl, n-octyl, norbomyl, tricyclodecanyl, tetracyclododecanyl, and adamantyl.

$R^{L03}$ is a $C_1$-$C_{18}$, preferably $C_1$-$C_{10}$ monovalent hydrocarbon group which may contain a heteroatom such as oxygen. Examples of the monovalent hydrocarbon group include straight, branched or cyclic alkyl groups and such groups in which some hydrogen is substituted by hydroxyl, alkoxy, oxo, amino, alkylamino or the like, or some carbon is replaced by a moiety containing a heteroatom such as oxygen. Suitable alkyl groups are as exemplified above for $R^{L01}$ and $R^{L02}$. Examples of the substituted alkyl groups are shown below.

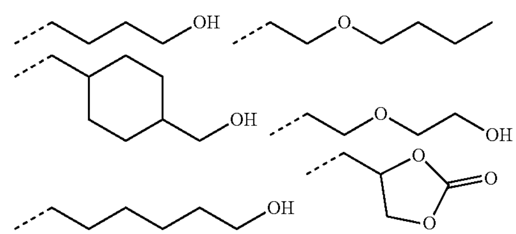

A pair of $R^{L01}$ and $R^{L02}$, $R^{L01}$ and $R^{L03}$, or $R^{L02}$ and $R^{L03}$ may bond together to form a ring with the carbon and oxygen atom to which they are attached. Each of $R^{L01}$, $R^{L02}$ and $R^{L03}$ is a $C_1$-$C_{18}$, preferably $C_1$-$C_{10}$ straight or branched alkanediyl group when they form a ring.

In formula (L2), $R^{L04}$ is a $C_4$-$C_{20}$, preferably $C_4$-$C_{15}$ tertiary alkyl group, a trialkylsilyl group in which each alkyl moiety has 1 to 6 carbon atoms, a $C_4$-$C_{20}$ oxoalkyl group, or a group of formula (L1). Exemplary tertiary alkyl groups include tert-butyl, tert-pentyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups include trimethylsilyl, triethylsilyl, and dimethyl-tert-butylsilyl. Exemplary oxoalkyl groups include 3-oxocyclohexyl, 4-methyl-2-oxooxan-4-yl, and 5-methyl-2-oxooxolan-5-yl. Letter x is an integer of 0 to 6.

In formula (L3), $R^{L}$ is an optionally substituted $C_1$-$C_8$ alkyl group or an optionally substituted $C_6$-$C_{20}$ aryl group. The optionally substituted alkyl group may be straight, branched or cyclic and examples thereof include methyl, ethyl, propyl, isopropyl, n-butyl, sec-butyl, tert-butyl, tert-pentyl, n-pentyl, n-hexyl, cyclopentyl and cyclohexyl, and substituted forms of the foregoing in which some hydrogen is substituted by hydroxyl, alkoxy, carboxyl, alkoxycarbonyl, oxo, amino, alkylamino, cyano, mercapto, alkylthio, sulfo or the like. Examples of the optionally substituted aryl groups include phenyl, methylphenyl, naphthyl, anthryl, phenanthryl, and pyrenyl, and substituted forms of the foregoing in which some hydrogen is substituted by hydroxyl, alkoxy, carboxyl, alkoxycarbonyl, oxo, amino, alkylamino, cyano, mercapto, alkylthio, sulfo or the like. Letter y is equal to 0 or 1, z is an integer of 0 to 3, and 2y+z is equal to 2 or 3.

In formula (L4), $R^{L06}$ is an optionally substituted $C_1$-$C_8$ alkyl group or an optionally substituted $C_6$-$C_{20}$ aryl group. The alkyl group may be straight, branched or cyclic. Examples of the alkyl and aryl groups are the same as exemplified for $R^{L05}$.

$R^{L07}$ to $R^{L16}$ are each independently hydrogen or an optionally substituted $C_1$-$C_{15}$ monovalent hydrocarbon group. Suitable hydrocarbon groups include straight, branched or cyclic alkyl groups such as methyl, ethyl, propyl, isopropyl, n-butyl, sec-butyl, tert-butyl, tert-pentyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen is substituted by hydroxyl, alkoxy, carboxyl, alkoxycarbonyl, oxo, amino, alkylamino, cyano, mercapto, alkylthio, sulfo or the like. Alternatively, two of $R^{L07}$ to $R^{L16}$ may bond together to form a ring with the carbon atom to which they are attached (for example, a pair of $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, $R^{L14}$ and $R^{L15}$, or a similar pair).

Of the acid labile groups having formula (L1), the straight and branched ones are exemplified by the following groups, but not limited thereto.

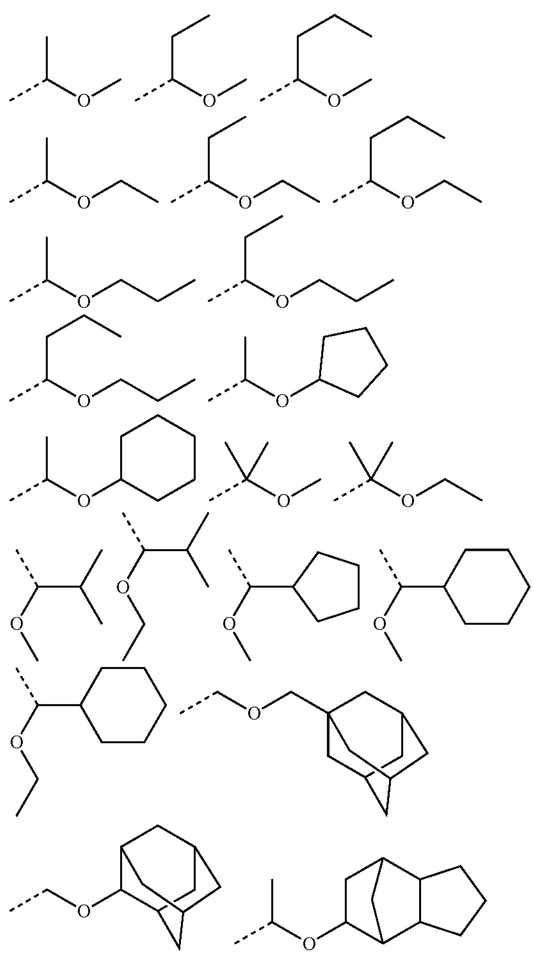

-continued

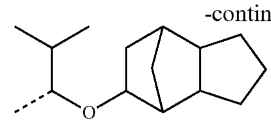

Of the acid labile groups having formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile group having formula (L2) include tert-butoxycarbonyl, tert-butoxycarbonylmethyl, tert-pentyloxycarbonyl, tert-pentyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile group having formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

Of the acid labile groups having formula (L4), groups having the following formulas (L4-1) to (L4-4) are preferred.

(L4-1)

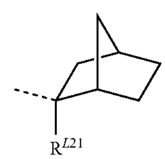

(L4-2)

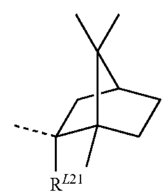

(L4-3)

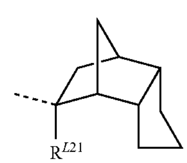

(L4-4)

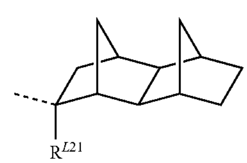

In formulas (L4-1) to (L4-4), the broken line denotes a bonding site and direction. $R^{L21}$ is each independently a $C_1$-$C_{10}$ monovalent hydrocarbon group. The monovalent hydrocarbon group may be straight, branched or cyclic, and examples thereof include alkyl groups such as methyl, ethyl, propyl, isopropyl, n-butyl, sec-butyl, tert-butyl, tert-pentyl, n-pentyl, n-hexyl, cyclopentyl and cyclohexyl.

For formulas (L4-1) to (L4-4), there can exist stereoisomers (enantiomers or diastereomers). Each of formulae (L4-1) to (L4-4) collectively represents all such stereoisomers. When the acid labile group is of formula (L4), there may be contained a plurality of stereoisomers.

For example, the formula (L4-3) represents one or a mixture of two selected from groups having the following formulas (L4-3-1) and (L4-3-2).

(L4-3-1)

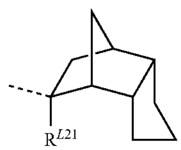

(L4-3-2)

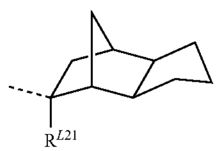

Herein $R^{L21}$ is as defined above.

Similarly, the formula (L4-4) represents one or a mixture of two or more selected from groups having the following formulas (L4-4-1) to (L4-4-4).

(L4-4-1)

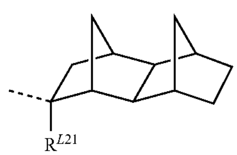

(L4-4-2)

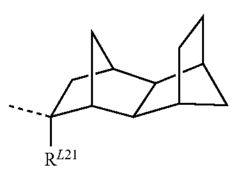

(L4-4-3)

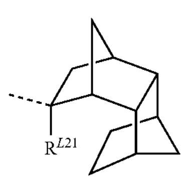

(L4-4-4)

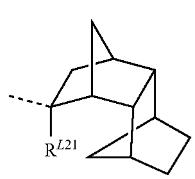

Herein $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

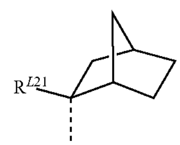

(L4-2-endo)

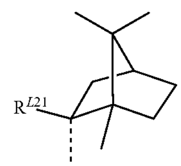

(L4-3endo)

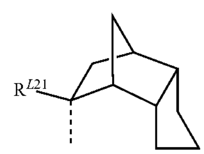

(L4-4-endo)

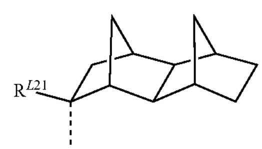

Herein $R^{L21}$ is as defined above.

Illustrative examples of the acid labile group having formula (L4) are given below.

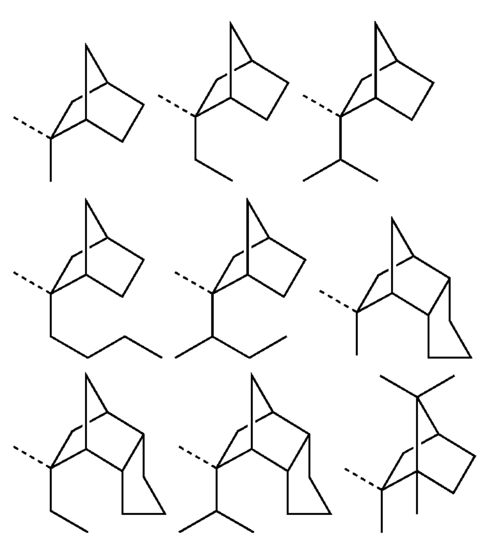

-continued

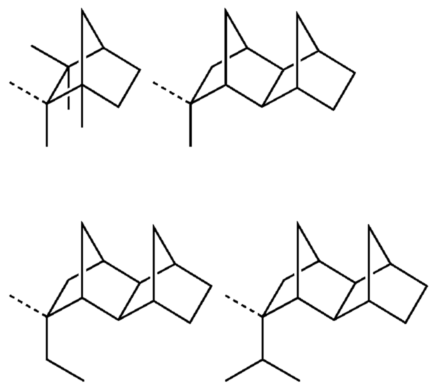

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^{s3}$, are as exemplified for $R^{L04}$.

The (u+1)-valent hydrocarbon or fluorinated hydrocarbon group represented by $R^{s4}$ may be straight, branched or cyclic and examples thereof include the foregoing monovalent hydrocarbon or fluorinated hydrocarbon groups from which the number (u) of hydrogen atoms are eliminated.

The fluorinated hydrocarbon group represented by $R^{sa}$ may be straight, branched or cyclic and examples thereof include the foregoing monovalent hydrocarbon groups in which some or all hydrogen atoms are substituted by fluorine atoms. Illustrative examples include trifluoromethyl, 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 2-(perfluorodecyl)ethyl.

Examples of the recurring units having formulae (1A) to (1E) are shown below, but not limited thereto. Herein $R^A$ is as defined above.

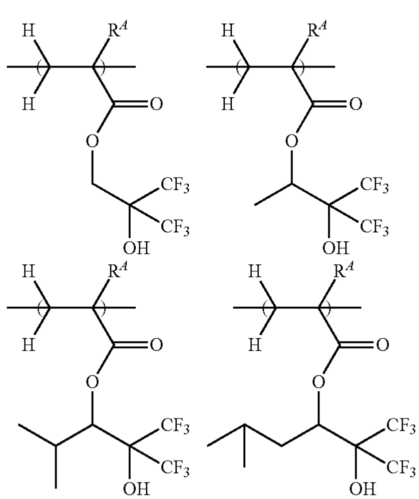

-continued

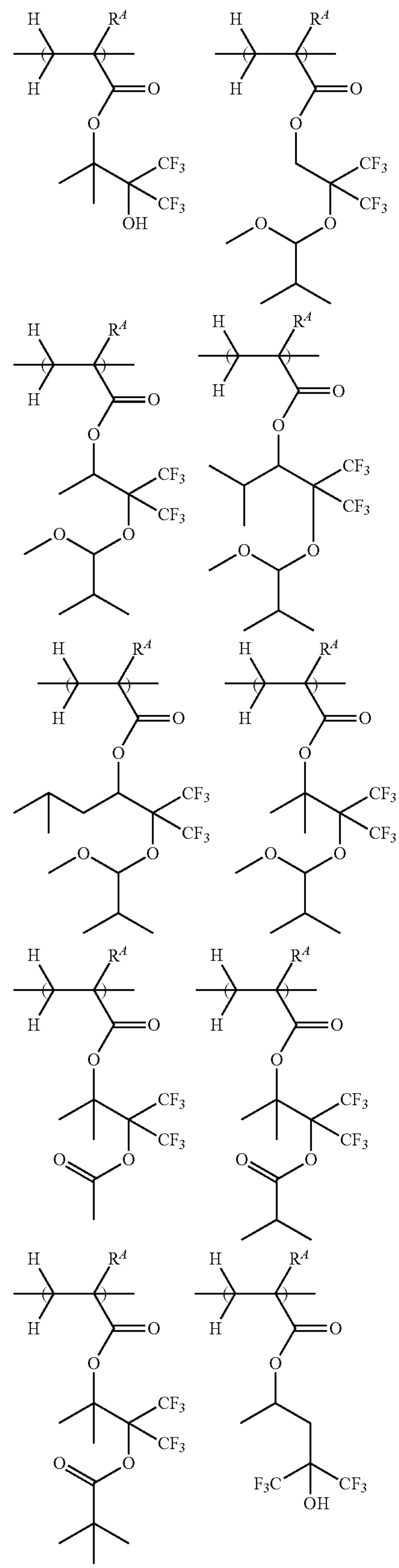

-continued
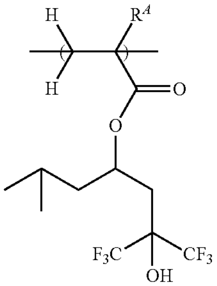
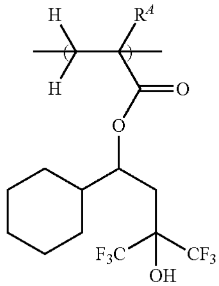
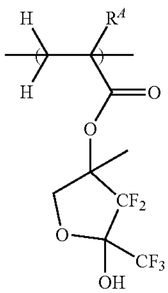
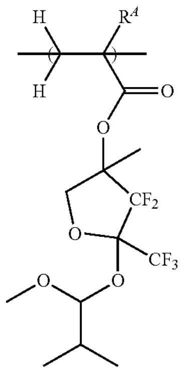
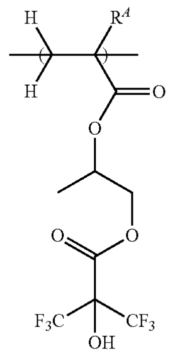
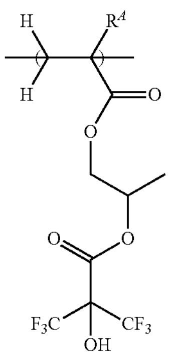
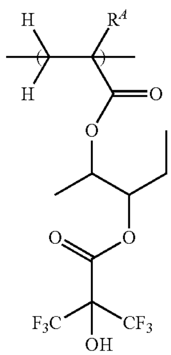
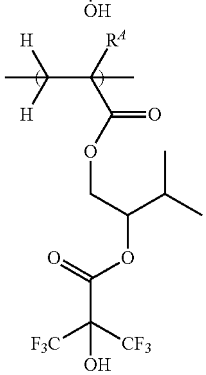
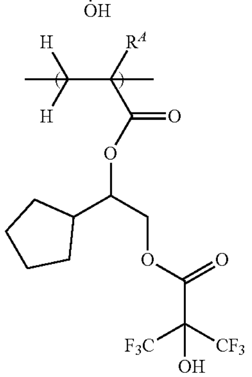
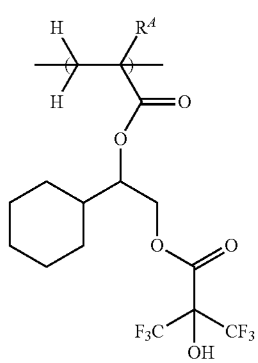
-continued
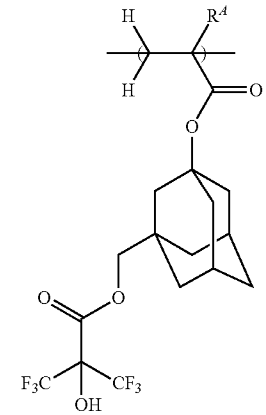
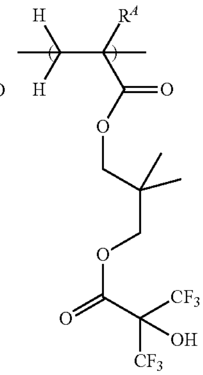
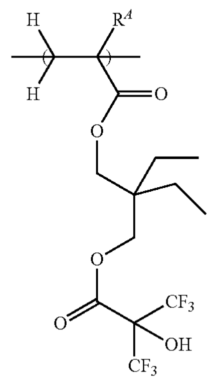
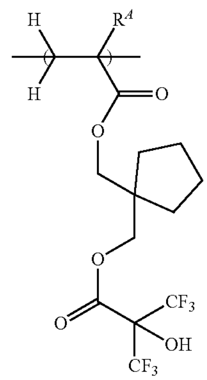
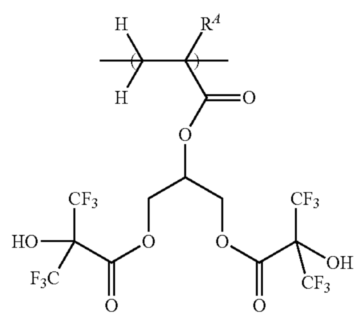
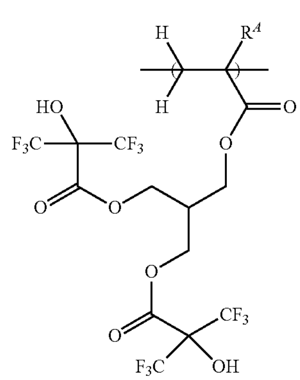

-continued
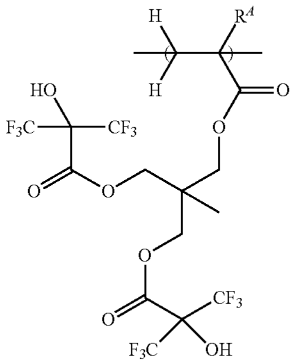
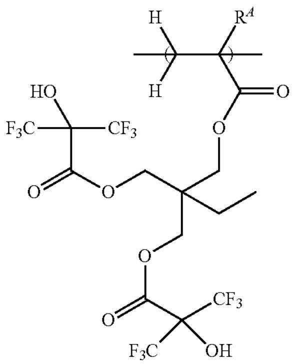
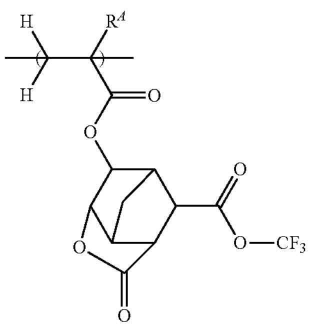
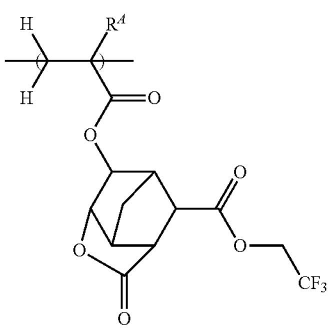
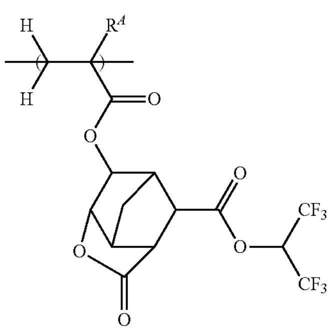
-continued
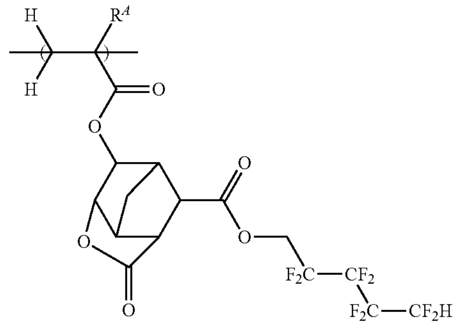
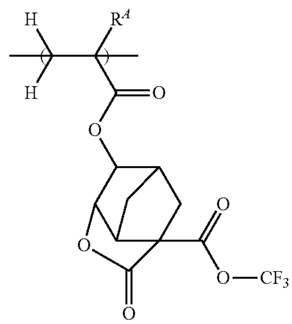
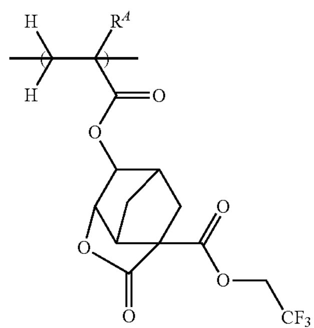
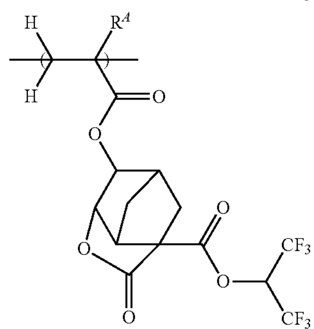
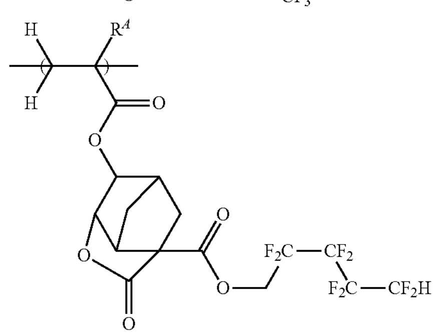

-continued

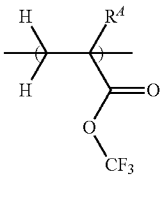
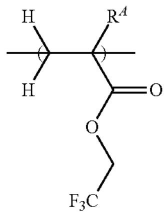
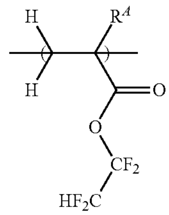
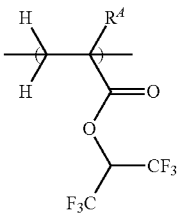
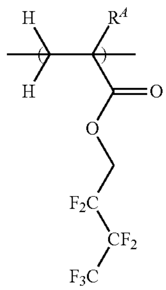
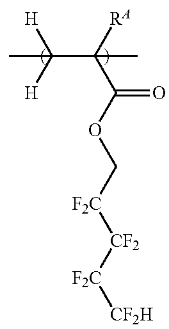
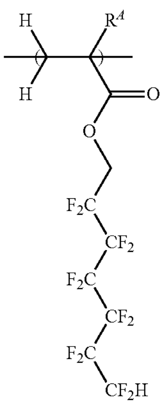
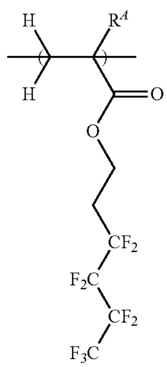
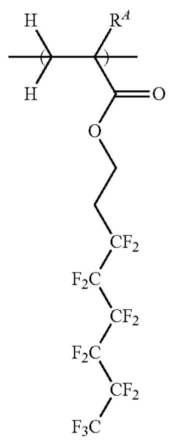
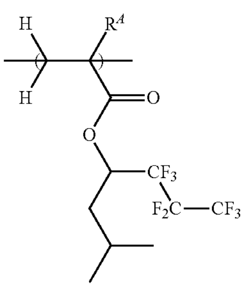
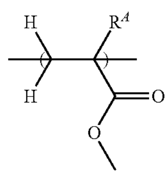
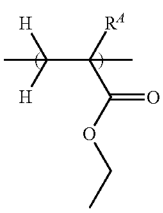
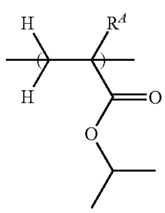
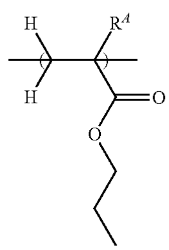

-continued

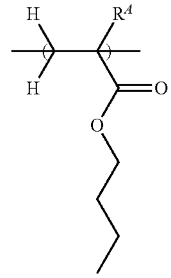
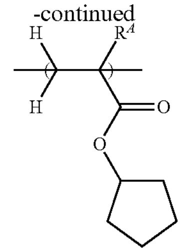
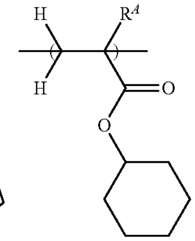
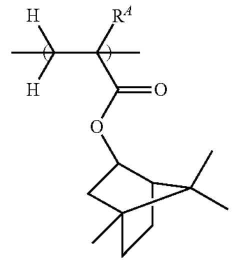
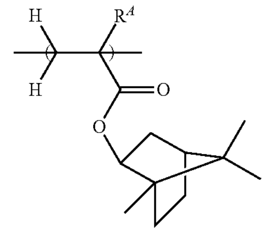
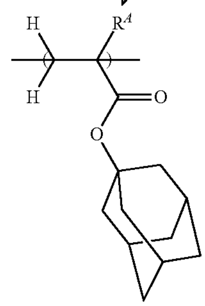
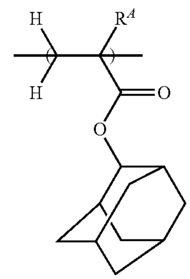

The polymeric surfactant may further contain recurring units other than the recurring units having formulae (1A) to (1E). Typical other recurring units are those derived from methacrylic acid and α-trifluoromethylacrylic acid derivatives. In the polymeric surfactant, the content of the recurring units having formulae (1A) to (1E) is preferably at least 20 mol %, more preferably at least 60 mol %, most preferably 100 mol % of the overall recurring units.

The polymeric surfactant preferably has a Mw of 1,000 to 500,000, more preferably 3,000 to 100,000 and a Mw/Mn of 1.0 to 2.0, more preferably 1.0 to 1.6. Notably, Mw and Mn are measured by GPC using THF solvent versus polystyrene standards.

The polymeric surfactant may be synthesized by any desired method, for example, by dissolving an unsaturated bond-containing monomer or monomers providing recurring units having formula (1A) to (1E) and optionally other recurring units in an organic solvent, adding a radical initiator, and heating for polymerization. Suitable organic solvents used herein include toluene, benzene, tetrahydrofuran (THF), diethyl ether, and dioxane. Examples of the polymerization initiator used herein include azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 100° C. and the reaction time is 4 to 24 hours. The acid labile group that has been incorporated in the monomer may be kept as such, or the polymer may be protected or partially protected therewith at the end of polymerization.

During the synthesis of polymeric surfactant, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

When the resist composition contains a surfactant (C), the amount thereof is preferably 0.1 to 50 parts by weight, and more preferably 0.5 to 10 parts by weight per 80 parts by weight of component (A). At least 0.1 part of the surfactant is effective in improving the receding contact angle with water of the resist film at its surface. Up to 50 parts of the surfactant is effective in forming a resist film having a low rate of dissolution in an alkaline developer and capable of maintaining the height of a fine pattern formed therein.

(D) Quencher

The resist composition may further include (D) a quencher or acid diffusion controlling agent. As used herein, the "quencher" refers to a compound capable of trapping the acid generated by the onium compound (A) in the resist film to prevent the acid from diffusing to the unexposed region thereof for thereby forming the desired pattern.

Typical of the quencher (D) are onium salts having the formulae (2) and (3).

$$R^{q1}\text{—}SO_3^- \; Mq^+ \quad (2)$$

$$R^{q2}\text{—}CO_2^- \; Mq^+ \quad (3)$$

In formula (2), $R^{q1}$ is hydrogen or a $C_1$-$C_{40}$ monovalent hydrocarbon group which may contain a heteroatom, exclusive of the group wherein hydrogen bonded to the carbon atom at α-position relative to the sulfo group is substituted by fluorine or fluoroalkyl.

In formula (3), $R^{q2}$ is hydrogen or a $C_1$-$C_{40}$ monovalent hydrocarbon group which may contain a heteroatom.

Examples of the monovalent hydrocarbon group $R^{q1}$ include methyl, ethyl, propyl, isopropyl, n-butyl, sec-butyl, tert-butyl, n-pentyl, tert-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbomyl, tricyclo[5.2.1.0$^{2,6}$]decanyl, adamantyl, phenyl, naphthyl, and anthracenyl. In these groups, some hydrogen may be substituted by a moiety containing a heteroatom such as oxygen, sulfur, nitrogen or halogen, and a moiety containing a heteroatom such as oxygen, sulfur or nitrogen may intervene between carbon atoms, so that the group may contain a hydroxyl moiety, cyano moiety, carbonyl moiety, ether bond, ester bond, sulfonic acid ester bond, carbonate bond, lactone ring, sultone ring, carboxylic anhydride, or haloalkyl moiety.

Examples of the monovalent hydrocarbon group $R^{q2}$ include fluoroalkyl groups such as trifluoromethyl and trifluoroethyl and fluoroaryl groups such as pentafluorophenyl and 4-trifluoromethylphenyl as well as the substituents exemplified above for $R^{q1}$.

Examples of the anion in the onium salt having formula (2) are shown below, but not limited thereto.

$CH_3SO_3^-$ $CH_3CH_2SO_3^-$

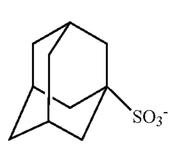

-continued

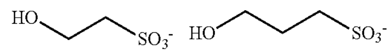

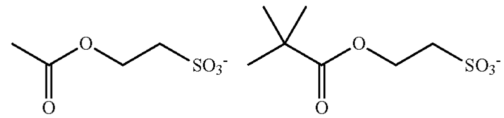

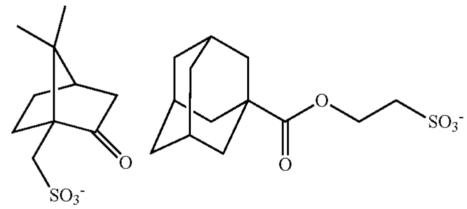

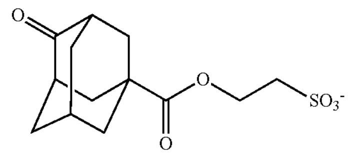

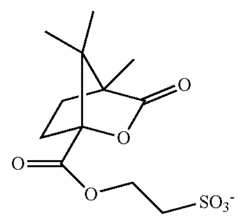

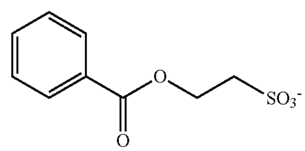

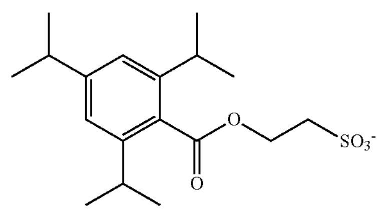

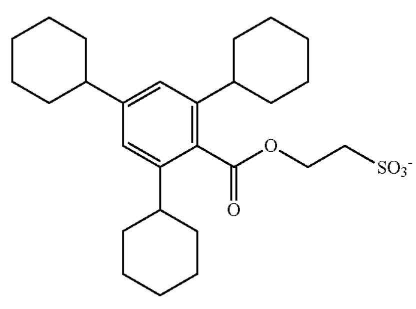

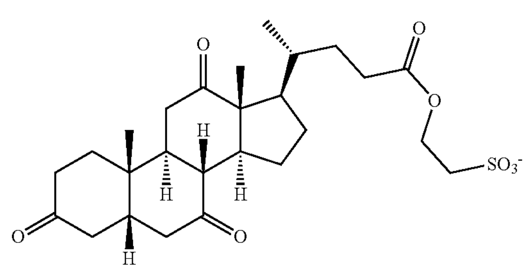

-continued
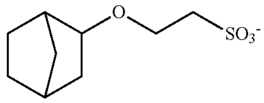
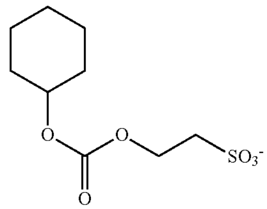
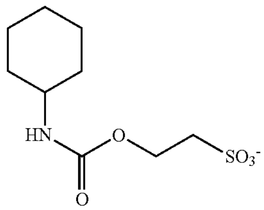
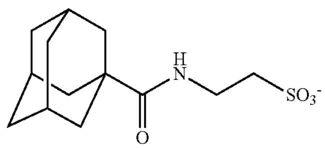
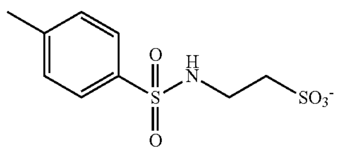
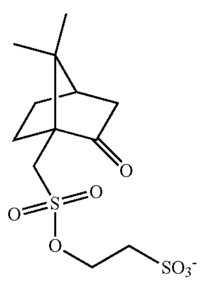
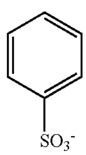
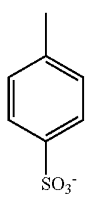
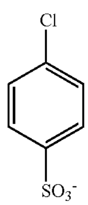
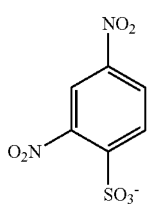
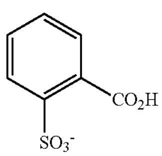
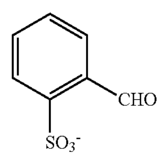
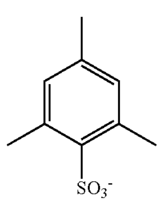
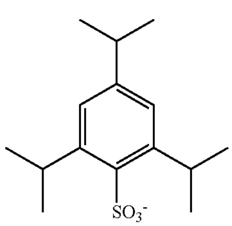
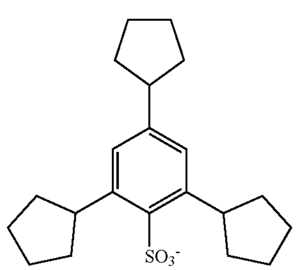
-continued
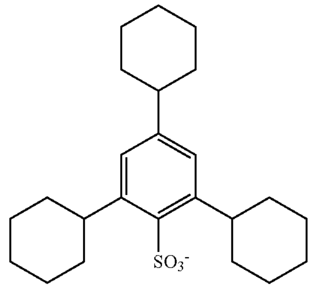
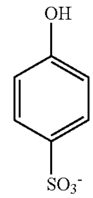
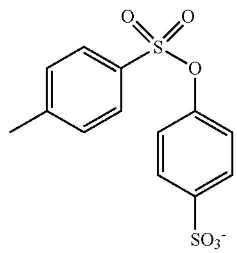
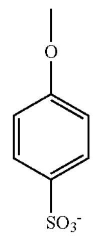
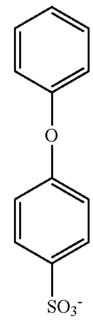
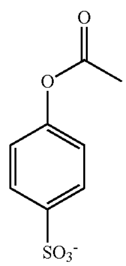
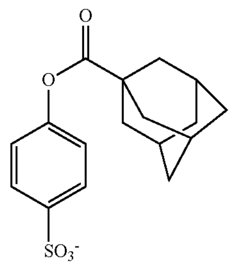
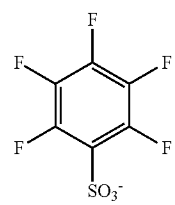
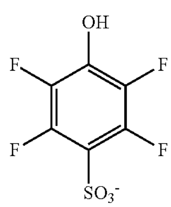
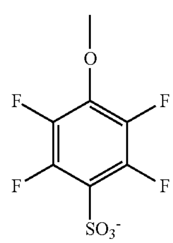
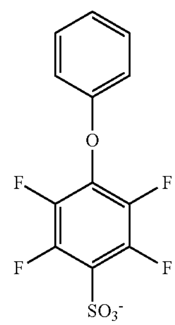
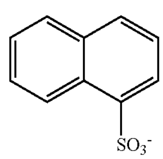
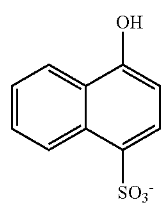
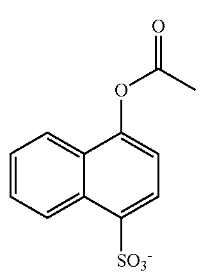
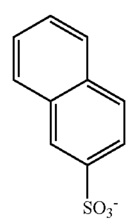
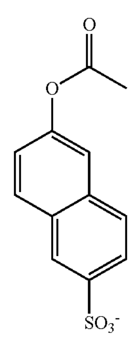

-continued
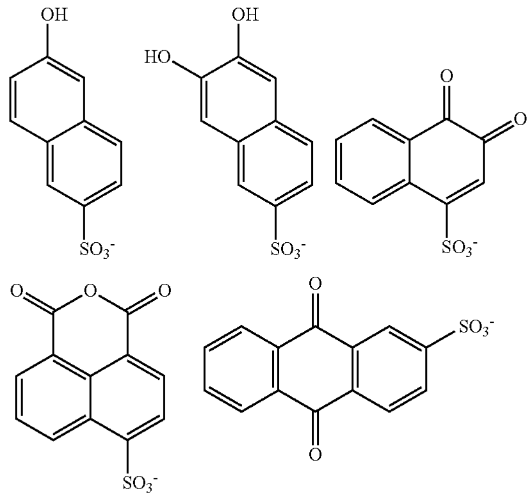
Examples of the anion in the onium salt having formula (3) are shown below, but not limited thereto.
$CH_3CO_2^-$ $CH_3CO_2CO_2^-$ $CH_3CH(CH_3)CO_2^-$
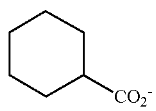
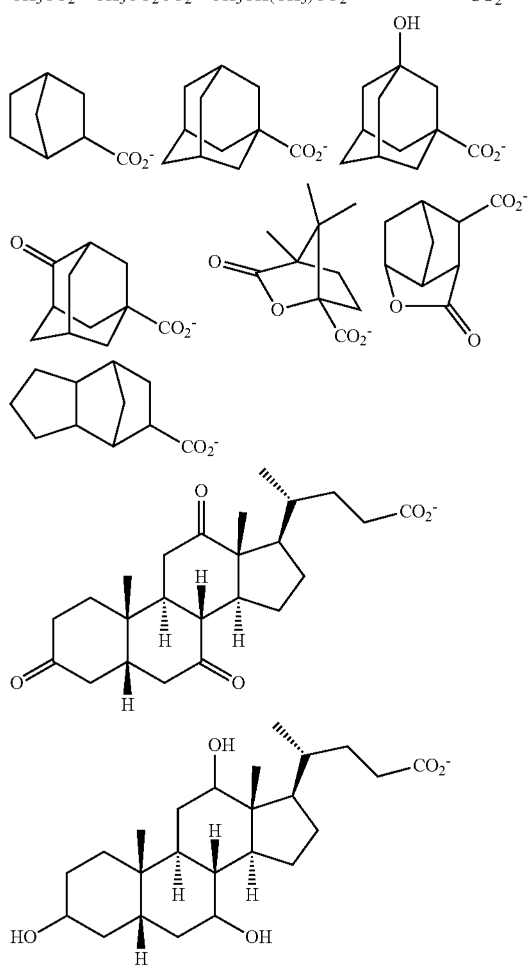
-continued
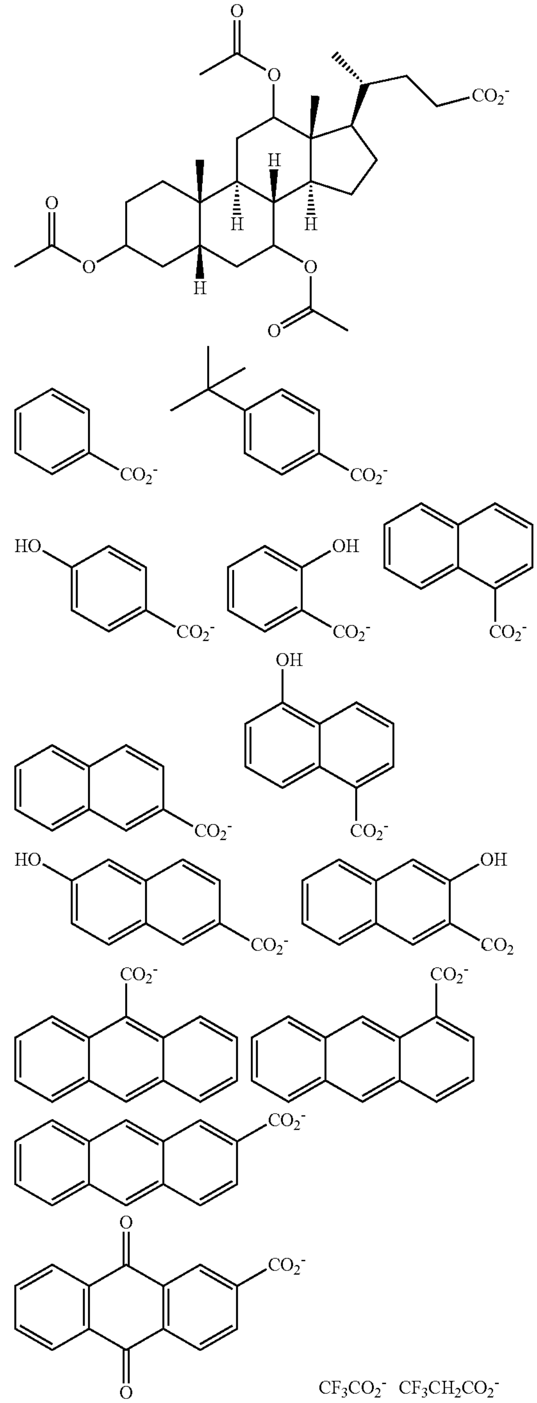
$CF_3CO_2^-$ $CF_3CH_2CO_2^-$
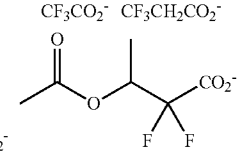
$CF_3CF_2CO_2^-$ $CF_3C(CF_3)(OH)CO_2^-$
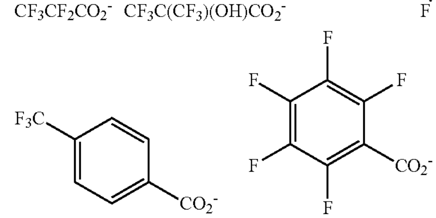

-continued

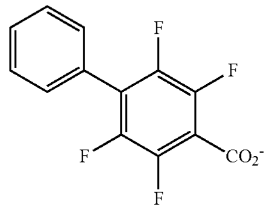

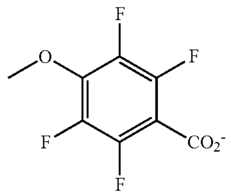

In formulae (2) and (3), $Mq^+$ is an onium cation, which is preferably selected from cations having the formulae (4a), (4b) and (4c).

(4a)

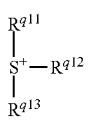

(4b)

$$R^{q14}—I^+—R^{q15}$$

(4c)

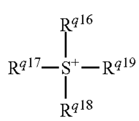

In formulae (4a) to (4c), $R^{q11}$ to $R^{q19}$ are each independently a $C_1$-$C_{40}$ monovalent hydrocarbon group which may contain a heteroatom. A pair of $R^{q11}$ and $R^{q12}$ may bond together to form a ring with the sulfur atom to which they are attached. A pair of $R^{q16}$ and $R^{q17}$ may bond together to form a ring with the nitrogen atom to which they are attached. Examples of the monovalent hydrocarbon group are as exemplified above for $R^{q1}$ in formula (2).

Examples of the onium cation represented by $Mq^+$ are shown below, but not limited thereto.

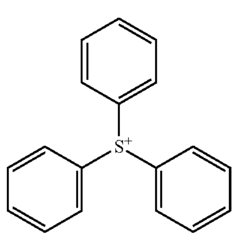

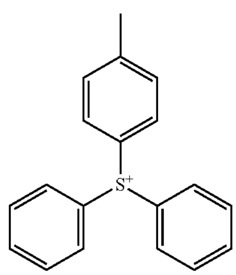

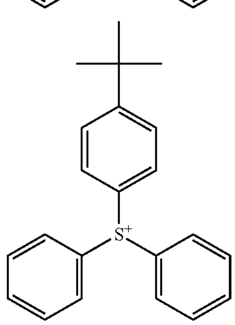

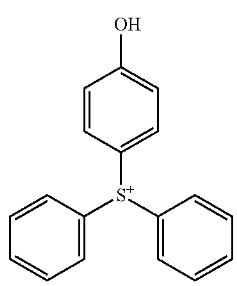

-continued

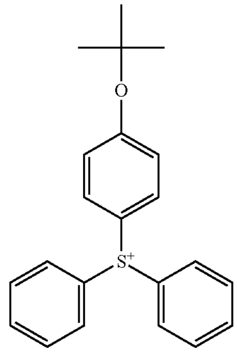

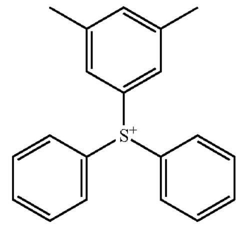

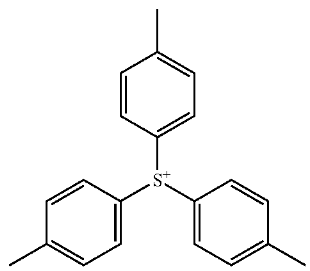

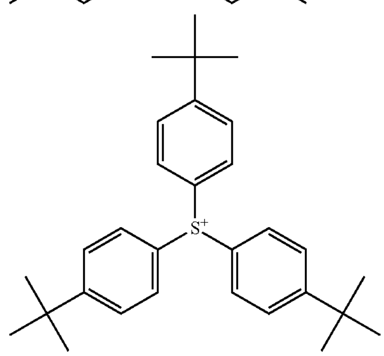

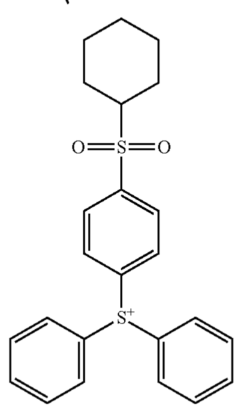

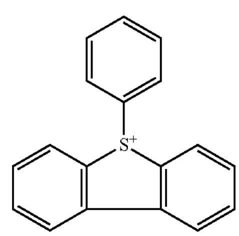

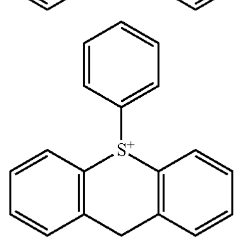

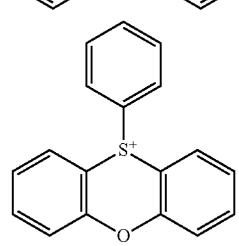

-continued
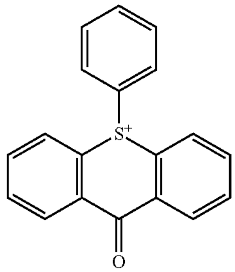
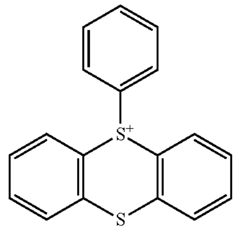
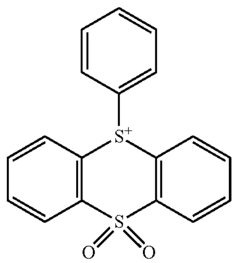
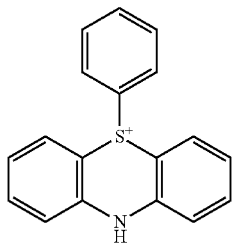
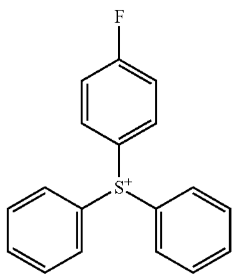
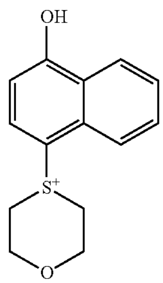
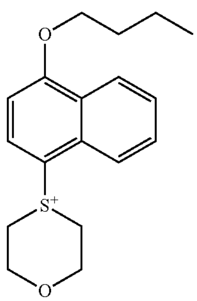
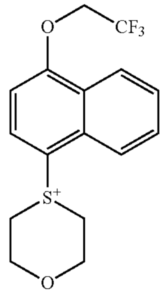
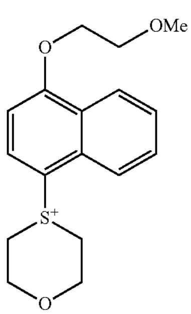
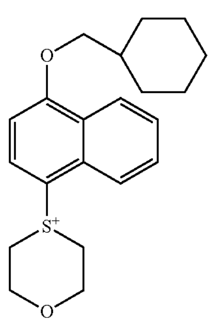
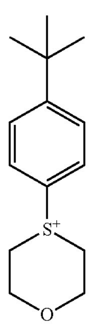
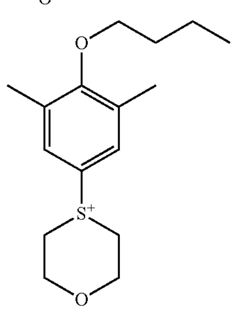
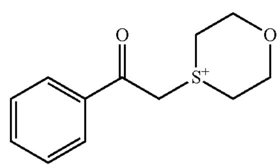
-continued
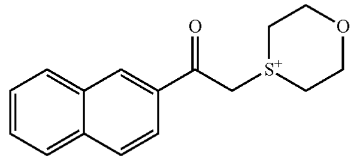
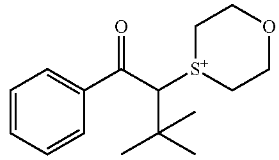
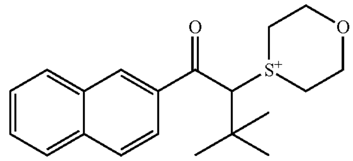
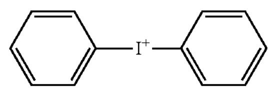
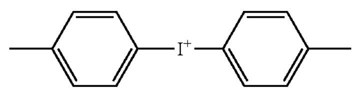
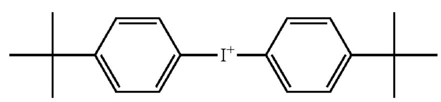
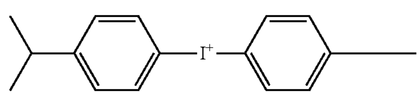
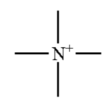
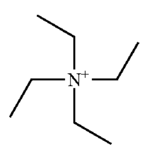
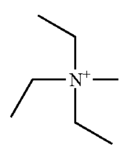
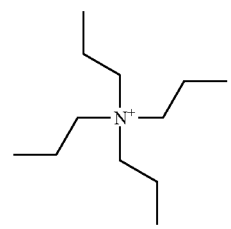
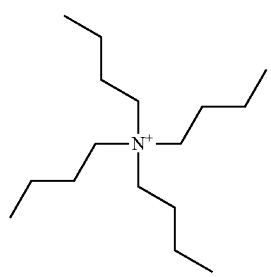
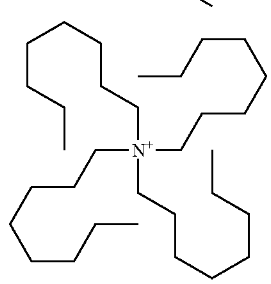
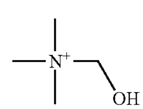

-continued

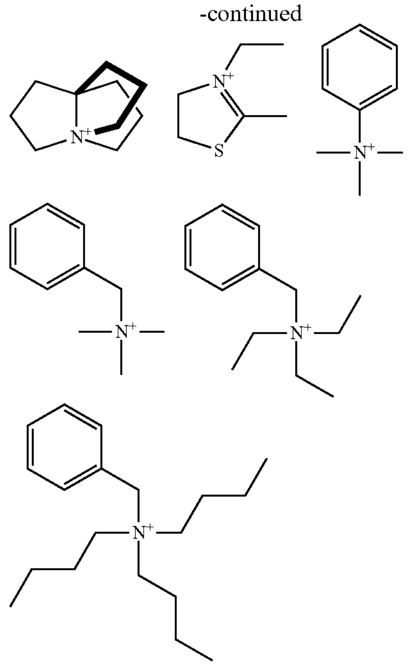

Examples of the onium salt having formula (2) or (3) include arbitrary combinations of anions with cations, both as exemplified above. These onium salts may be readily obtained from ion exchange reaction using any well-known organic chemistry technique. For the ion exchange reaction, reference may be made to JP-A 2007-145797, for example.

The onium salt having formula (2) or (3) functions as a quencher in the resist composition because the counter anion of the onium salt is a conjugated base of a weak acid. As used herein, the weak acid refers to an acid having a weaker acidity than the acid generated by the onium compound (A). The onium salt having formula (2) or (3) functions as a quencher when used in combination with an onium salt type PAG having a conjugated base of a strong acid (typically a sulfonic acid which is fluorinated at α-position) as the counter anion. In a system using a mixture of an onium salt capable of generating a strong acid (e.g., α-position fluorinated sulfonic acid) and an onium salt capable of generating a weak acid (e.g., α-position non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

When the onium salt having formula (2) or (3) is used as the quencher (D), the amount of the onium salt used is preferably 0.1 to 10 parts by weight, more preferably 0.1 to 5 parts by weight per 80 parts by weight of component (A). As long as the amount of component (D) is in the range, a satisfactory resolution is available without a substantial lowering of sensitivity. The onium salt having formula (2) or (3) may be used alone or in admixture.

Also nitrogen-containing compounds may be used as the quencher (D). Suitable nitrogen-containing compounds include primary, secondary and tertiary amine compounds, specifically amine compounds having a hydroxyl group, ether bond, ester bond, lactone ring, cyano group or sulfonate bond, as described in JP-A 2008-111103, paragraphs [0146]-[0164](U.S. Pat. No. 7,537,880), and primary or secondary amine compounds protected with a carbamate group, as described in JP 3790649.

A sulfonic acid sulfonium salt having a nitrogen-containing substituent may also be used as the nitrogen-containing compound. This compound functions as a quencher in the unexposed region, but as a so-called photo-degradable base in the exposed region because it loses the quencher function in the exposed region due to neutralization thereof with the acid generated by itself. Using a photo-degradable base, the contrast between exposed and unexposed regions can be further enhanced. With respect to the photo-degradable base, reference may be made to JP-A 2009-109595 and JP-A 2012-046501, for example.

When the nitrogen-containing compound is used as the quencher (D), the amount of the nitrogen-containing compound used is preferably 0.001 to 12 parts by weight, more preferably 0.01 to 8 parts by weight per 80 parts by weight of component (A). The nitrogen-containing compound may be used alone or in admixture.

Other Components

The resist composition may further comprise another component, for example, a compound which is decomposed with an acid to generate another acid (i.e., acid amplifier compound), an organic acid derivative, a fluorinated alcohol, and a compound having a Mw of up to 3,000 which changes its solubility in developer under the action of an acid (i.e., dissolution inhibitor). Specifically, the acid amplifier compound is described in JP-A 2009-269953 and JP-A 2010-215608 and preferably used in an amount of 0 to 5 parts, more preferably 0 to 3 parts by weight per 80 parts by weight of component (A). An extra amount of the acid amplifier compound can make the acid diffusion control difficult and cause degradations to resolution and pattern profile. With respect to the remaining additives, reference should be made to JP-A 2009-269953 and JP-A 2010-215608.

Process

Another embodiment of the invention is a pattern forming process using the molecular resist composition defined above. A pattern may be formed from the resist composition using any well-known lithography process. The preferred process includes the steps of applying the resist composition onto a substrate to form a resist film, exposing a selected region of the resist film to i-line, KrF excimer laser, ArF excimer laser, EB or EUV, and developing the exposed resist film in a developer. Any desired steps may be added to the process if necessary.

The substrate used herein may be a substrate for integrated circuitry fabrication, e.g., Si, $SiO_2$, SiN, SiON, TiN, WSi, BPSG, SOG, organic antireflective film, etc. or a substrate for mask circuitry fabrication, e.g., Cr, CrO, CrON, $MoSi_2$, $SiO_2$, etc.

The resist composition is applied onto a substrate by a suitable coating technique such as spin coating. The coating is prebaked on a hot plate preferably at a temperature of 60 to 150° C. for 1 to 10 minutes, more preferably at 80 to 140° C. for 1 to 5 minutes. The resulting resist film preferably has a thickness of 0.05 to 2 μm.

Then the resist film is exposed patternwise to high-energy radiation. On use of i-line, KrF excimer laser, ArF excimer laser or EUV of wavelength 13.5 nm, the resist film is exposed through a mask having a desired pattern, preferably in a dose of 1 to 200 $mJ/cm^2$, more preferably 10 to 100 $mJ/cm^2$. On use of EB, a pattern may be written directly or through a mask having a desired pattern, preferably in a dose of 1 to 300 $\mu C/cm^2$, more preferably 10 to 200 $\mu C/cm^2$.

The exposure may be performed by conventional lithography whereas the immersion lithography of holding a liquid on the resist film may be employed if desired. In the immersion lithography, preferably a liquid having a refractive index of at least 1.0 is held between the resist film and the projection lens. The liquid is typically water, and in this case, a protective film which is insoluble in water may be formed on the resist film.

While the water-insoluble protective film which is used in the immersion lithography serves to prevent any components from being leached out of the resist film and to improve water sliding on the film surface, it is generally divided into two types. The first type is an organic solvent-strippable protective film which must be stripped, prior to alkaline development, with an organic solvent in which the resist film is not dissolvable. The second type is an alkali-soluble protective film which is soluble in an alkaline developer so that it can be removed simultaneously with the removal of solubilized regions of the resist film.

The protective film of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective film of the second type is formed.

After the exposure, the resist film may be baked (PEB), for example, on a hotplate at 60 to 150° C. for 1 to 5 minutes, preferably at 80 to 140° C. for 1 to 3 minutes.

The resist film is then developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

Any desired step may be added to the pattern forming process. For example, after the resist film is formed, a step of rinsing with pure water (post-soaking) may be introduced to extract the acid generator or the like from the film surface or wash away particles. After exposure, a step of rinsing (post-soaking) may be introduced to remove any water remaining on the film after exposure.

Also, a double patterning process may be used for pattern formation. The double patterning process includes a trench process of processing an underlay to a 1:3 trench pattern by a first step of exposure and etching, shifting the position, and forming a 1:3 trench pattern by a second step of exposure, for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

In the pattern forming process, negative tone development may also be used. That is, an organic solvent may be used instead of the aqueous alkaline solution as the developer for developing and dissolving away the unexposed region of the resist film.

The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

EXAMPLES

Synthesis Examples, Examples and Comparative Examples are given below by way of illustration and not by way of limitation. The abbreviation "pbw" is parts by weight. GC stands for gas chromatography, TLC for thin layer chromatography, THF for tetrahydrofuran, and MIBK for methyl isobutyl ketone. Analytic instruments are as shown below.

IR: NICOLET 6700 by Thermo Fisher Scientific Inc.

$^1$H-NMR: ECA-500 by JEOL Ltd.

LC-MS: ACQUITY UPLC H-Class System and ACQUITY QDa by Waters

[1] Synthesis of Sulfonium Compounds

Synthesis Example 1-1

Synthesis of PAG-1

PAG-1 was synthesized according to the following scheme.

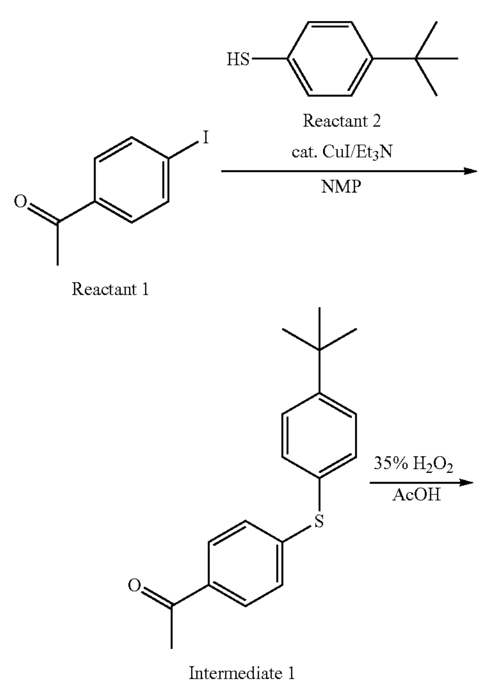

-continued

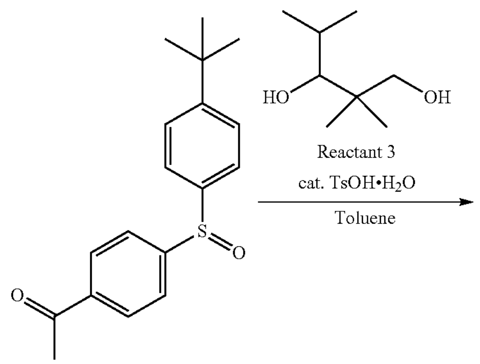

Intermediate 2

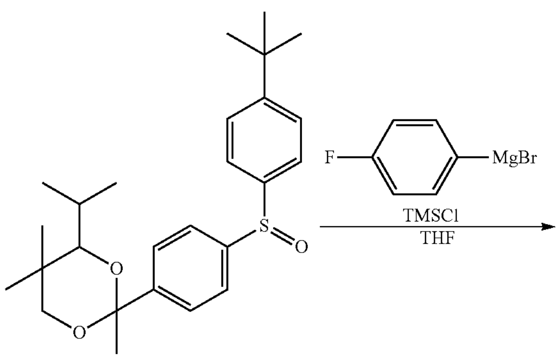

Intermediate 3

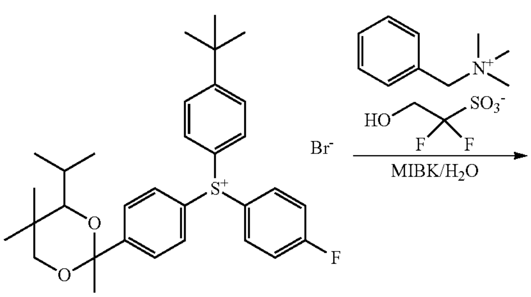

Intermediate 4

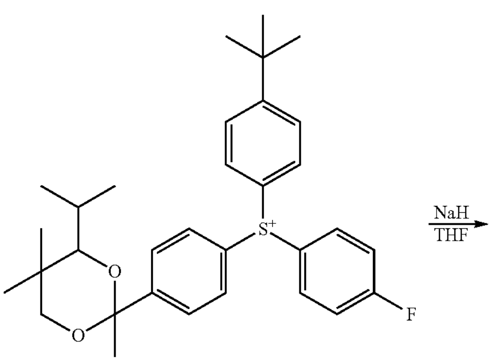

Intermediate 5

-continued

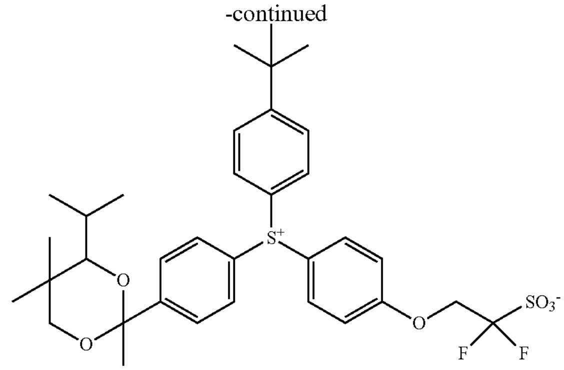

PAG-1

Synthesis Example 1-1-1

Synthesis of Intermediate 1

In a flask under nitrogen atmosphere, 225 g of Reactant 1, 182 g of Reactant 2 and 4.4 g of copper(I) iodide were dissolved in 700 g of N-methylpyrrolidone, which was heated at 70° C. Then, 102 g of triethylamine was added dropwise to the solution, which was aged at an internal temperature of 80° C. for 24 hours. After the extinction of Reactant 1 was confirmed by GC, the reaction system was cooled, and 1,000 g of water was added dropwise to quench the reaction. This was followed by extraction with 2,000 mL of toluene, ordinary aqueous workup, solvent distillation, and recrystallization from hexane. There was obtained 233 g of Intermediate 1 as white crystals (yield 90%).

Synthesis Example 1-1-2

Synthesis of Intermediate 2

Under nitrogen atmosphere, a flask was charged with 119 g of Intermediate 1 and 500 g of acetic acid, and Intermediate 1 was dissolved at 30° C. With the temperature kept below 40° C., 41 g of 35 wt % aqueous hydrogen peroxide was added dropwise to the solution. At the end of addition, the solution was aged at 40° C. for 20 hours. At the end of aging, the reaction system was cooled. A solution of 20 g of sodium thiosulfate pentahydrate in 400 g of water was added dropwise to quench the reaction. Then 1,300 mL of toluene and 300 mL of ethyl acetate were added to extract the reaction product. This was followed by ordinary aqueous workup, solvent distillation, and recrystallization from hexane. There was obtained 115 g of Intermediate 2 as white crystals (yield 92%).

Synthesis Example 1-1-3

Synthesis of Intermediate 3

Under nitrogen atmosphere, a flask was charged with 15.6 g of Intermediate 2, 1.0 g of p-toluenesulfonic acid monohydrate, 15.2 g of Reactant 3, and 70 g of toluene, which was heated under reflux at 105° C. for 7 hours. After the distinction of Intermediate 2 was confirmed by TLC, the reaction solution was ice cooled, and 1.0 g of triethylamine was added to quench the reaction. Further, 50 mL of saturated sodium hydrogencarbonate aqueous solution was added to the reaction solution, after which the desired compound was extracted with 50 mL of toluene. This was followed by ordinary aqueous workup, solvent distillation, and purification by silica gel column chromatography (eluent: 15/1 hexane/ethyl acetate). There was obtained 21.8 g of Intermediate 3 as colorless oily matter (yield 98%).

Synthesis Example 1-1-4

Synthesis of Intermediate 4

In a flask under nitrogen atmosphere, a Grignard reagent was prepared from 26.8 g of 4-bromofluorobenzene, 3.7 g of metallic magnesium, and 60 g of THF. Once the reaction system was cooled, a solution of 21.8 g of Intermediate 3 in 25 g of THF was added thereto. Below 20° C., 16.6 g of trimethylsilyl chloride was added dropwise to the solution, which was aged in an ice bath for 2 hours. After aging, the reaction system was cooled, 100 mL of saturated ammonium chloride aqueous solution was added dropwise to quench the reaction. This was followed by extraction with 150 mL of MIBK, ordinary aqueous workup, solvent distillation, and recrystallization from hexane. There was obtained 28.3 g of Intermediate 4 as white crystals (yield 94%).

Synthesis Example 1-1-5

Synthesis of Intermediate 5

Under nitrogen atmosphere, a flask was charged with 14.2 g of Intermediate 4, 9.0 g of benzyltrimethylammonium 1,1-difluoro-2-hydroxyethane-1-sulfonate, 70 g of MIBK, and 50 g of water, which were stirred for 30 minutes. The organic layer was taken out, washed with water, and concentrated under reduced pressure. Hexane was added to the concentrate for washing. There was obtained 15.2 g of Intermediate 5 as oily matter (yield 94%).

Synthesis Example 1-1-6

Synthesis of PAG-1

Under nitrogen atmosphere, 0.6 g of sodium hydride was suspended in 56 g of THF, and the suspension was cooled. A solution of 7.9 g of Intermediate 5 in 55.5 g of THF was added dropwise to the suspension below 5° C. The solution was aged at room temperature for 12 hours. After aging, the reaction system was cooled, and 60 mL of water was added dropwise to quench the reaction. This was followed by extraction with 150 g of MIBK, ordinary aqueous workup, solvent distillation, and recrystallization from hexane. There was obtained 7.1 g of PAG-1 as white crystals (yield 92%).

PAG-1 was analyzed by IR spectroscopy and LC-MS, with the data shown below. FIG. 1 is the $^1$H-NMR/DMSO-$d_6$ spectrum of PAG-1.

IR (D-ATR): ν=3484, 3094, 2963, 2872, 1589, 1494, 1397, 1368, 1316, 1259, 1237, 1180, 1152, 1110, 1068, 1035, 989, 932, 879, 833, 779, 689, 667, 649, 635, 619, 591, 552, 524 cm$^{-1}$

LC-MS: positive [M+H]+ 649

Synthesis Example 1-2

Synthesis of PAG-2

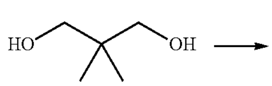

Reactant 4

-continued

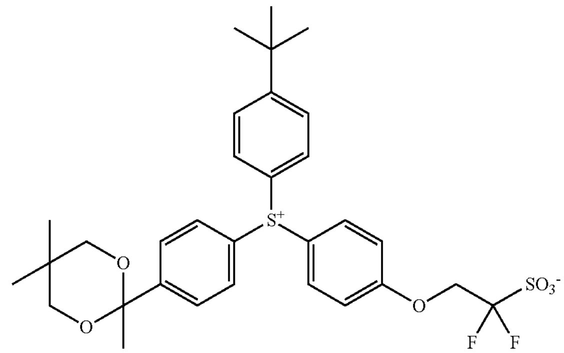

PAG-2

PAG-2 was obtained by the same procedure as in Synthesis Example 1-1 aside from using Reactant 4 instead of Reactant 3. Amount 5.0 g, final step yield 94%.

Figure 2:
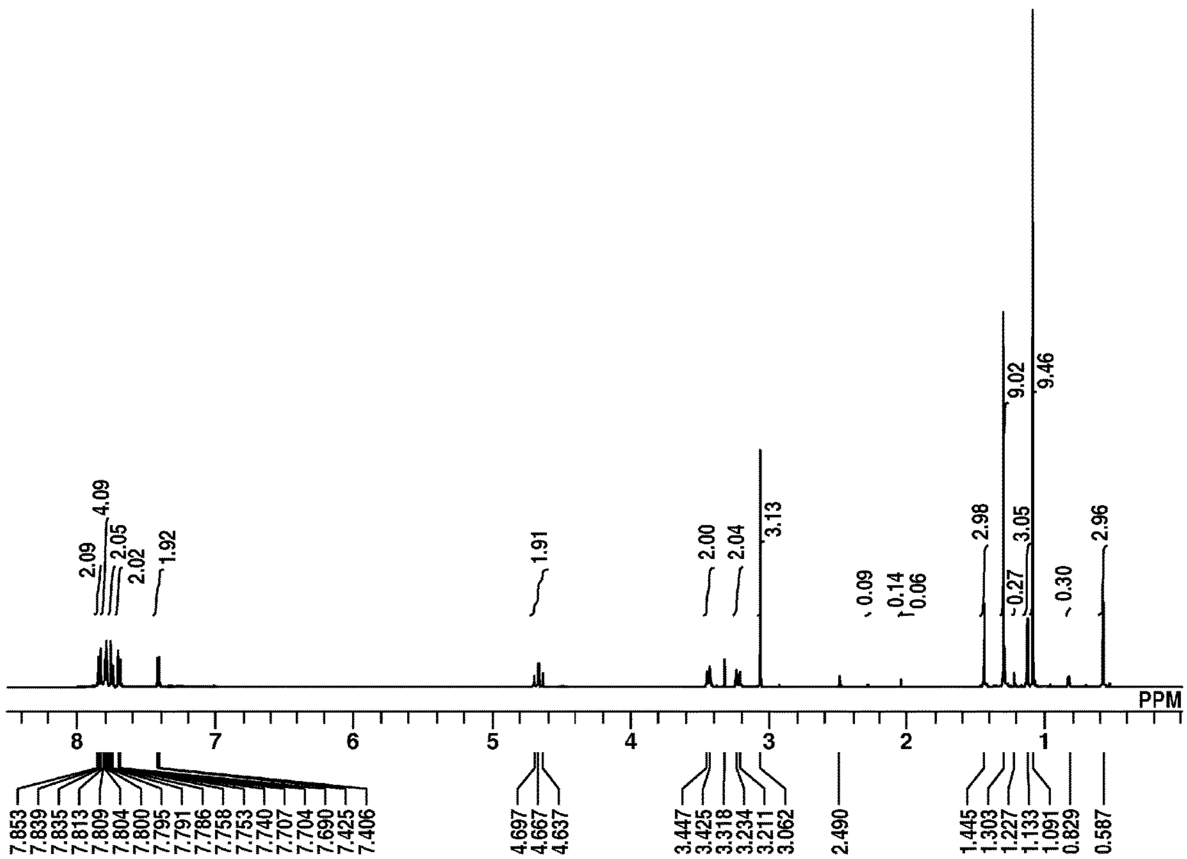
FIG. 2 is a diagram showing the $^1$H-NMR spectrum of PAG-2 in Synthesis Example 1-2.

PAG-2 was analyzed by IR spectroscopy and LC-MS, with the data shown below. FIG. 2 is the $^1$H-NMR/DMSO-d6 spectrum of PAG-2.

IR (D-ATR): ν=3492, 3064, 2963, 2870, 1589, 1494, 1398, 1365, 1317, 1256, 1237, 1215, 1181, 1125, 1104, 1078, 1034, 1009, 988, 949, 914, 876, 834, 777, 743, 726, 670, 651, 635, 619, 590, 552, 524 cm$^{-1}$

LC-MS: positive $[M+H]^+$ 607

Synthesis Example 1-3

Synthesis of PAG-3

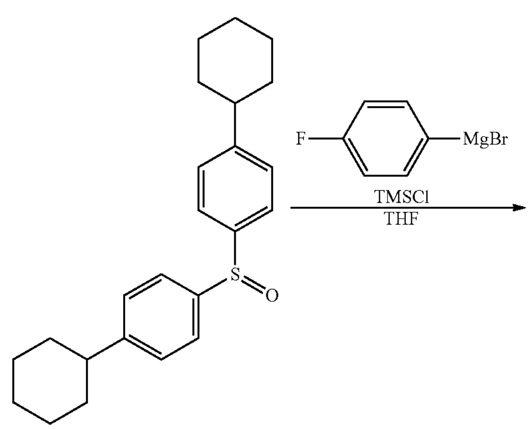

Reactant 5

-continued

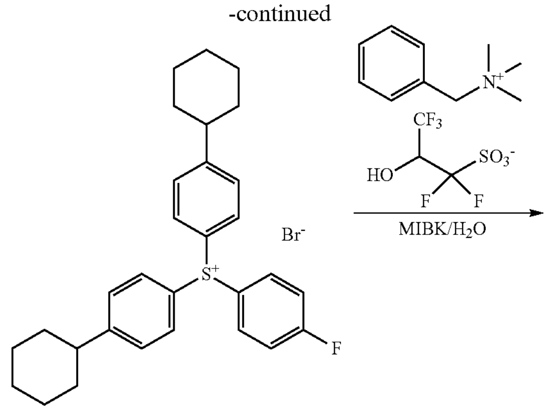

Intermediate 6

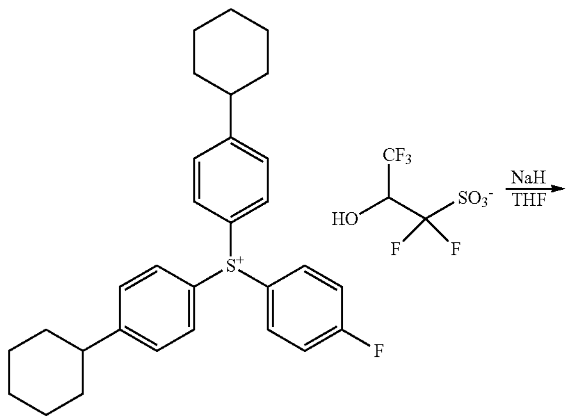

Intermediate 7

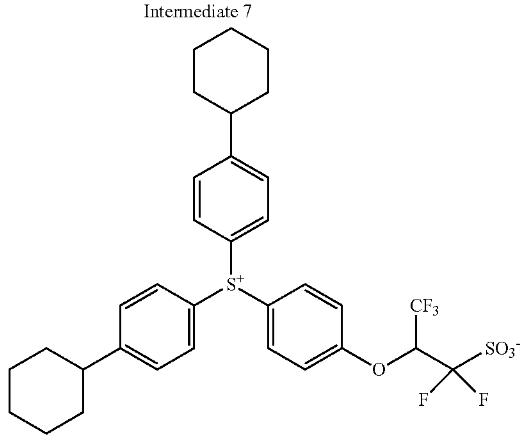

PAG-3

Synthesis Example 1-3-1

Synthesis of Intermediate 6

Intermediate 6 was obtained by the same procedure as in Synthesis Example 1-1-4 aside from using Reactant 5 instead of Intermediate 3.

Synthesis Example 1-3-2

Synthesis of PAG-3

PAG-3 was synthesized by the same procedure as in Synthesis Examples 1-1-5 to 1-1-6 aside from using Intermediate 6 instead of Intermediate 4, and benzyltrimethylammonium 1,1,3,3,3-pentafluoro-2-hydroxypropane-1-sulfonate instead of benzyltrimethylammonium 1,1-difluoro-2-hydroxyethane-1-sulfonate.

Figure 3:
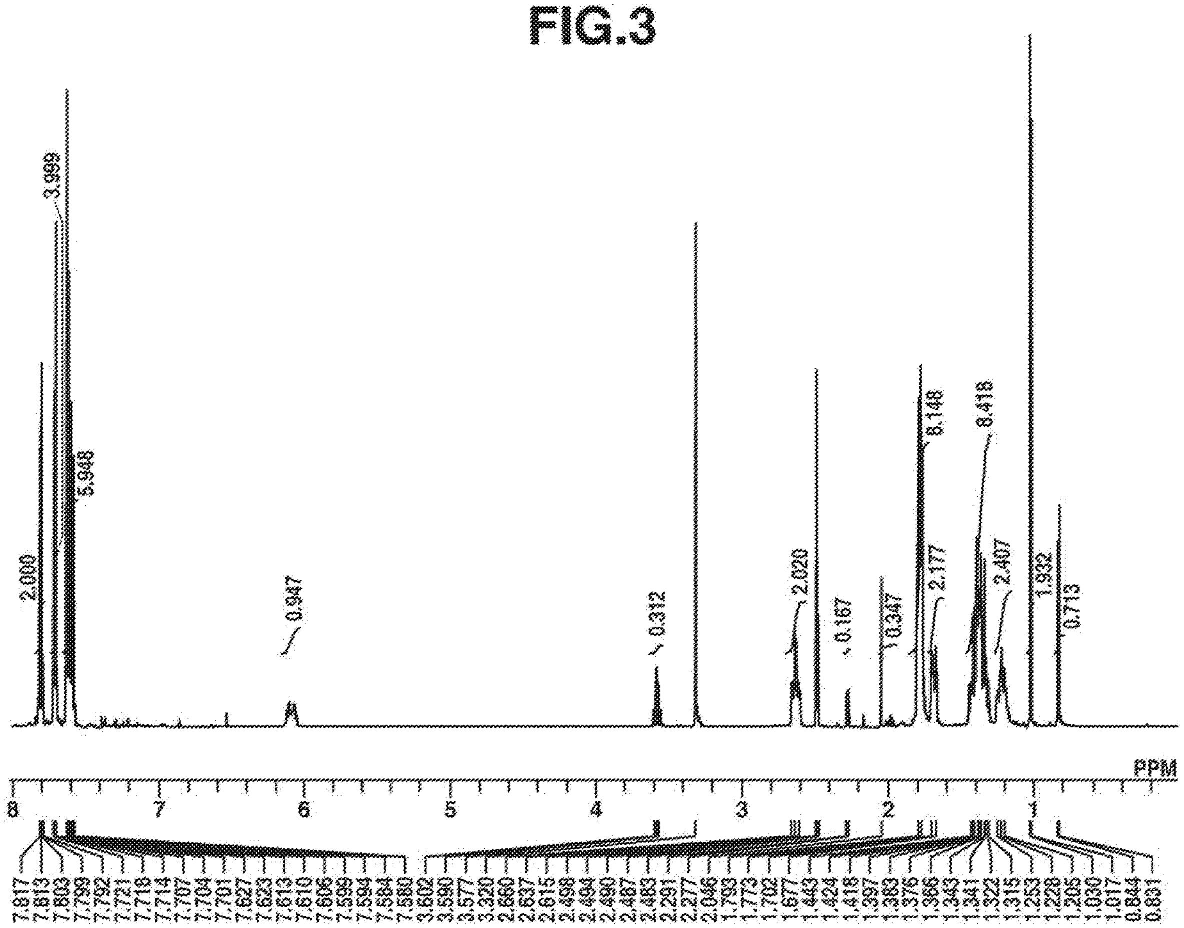
FIG. 3 is a diagram showing the $^1$H-NMR spectrum of PAG-3 in Synthesis Example 1-3-2.

PAG-3 was analyzed by IR spectroscopy and LC-MS, with the data shown below. FIG. 3 is the $^{1}$H-NMR/DMSO-$d_6$ spectrum of PAG-3.

IR (D-ATR): ν=3062, 2926, 2852, 1587, 1491, 1449, 1413, 1367, 1245, 1184, 1161, 1112, 1070, 998, 884, 828, 719, 684, 664, 641, 584, 557 $cm^{-1}$

LC-MS: positive $[M+H]^+$ 655

Synthesis Example 1-4

Synthesis of PAG-4

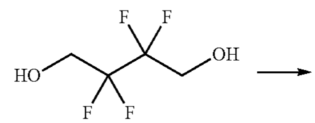

Reactant 6

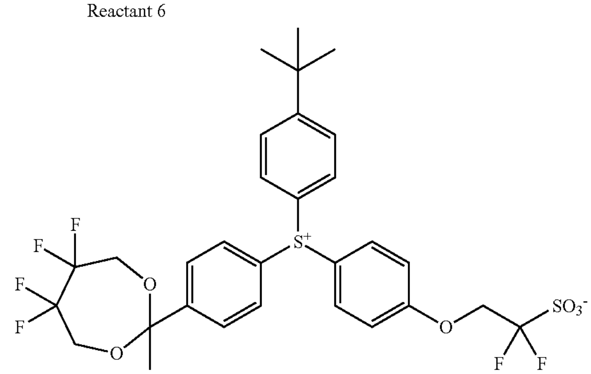

PAG-4

PAG-4 was obtained by the same procedure as in Synthesis Example 1-1 aside from using Reactant 6 instead of Reactant 3. Amount 8.4 g, final step yield 78%.

Figure 4:
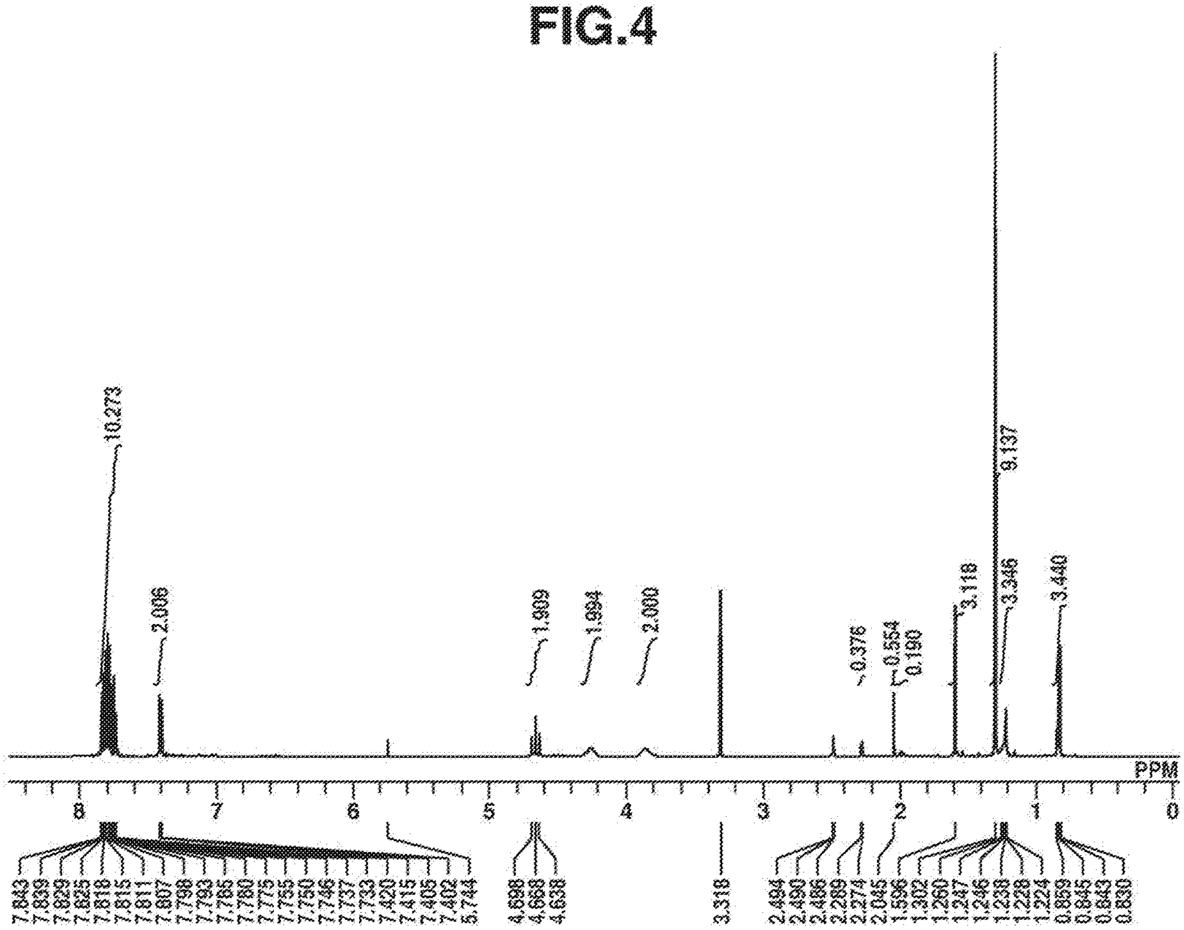
FIG. 4 is a diagram showing the $^1$H-NMR spectrum of PAG-4 in Synthesis Example 1-4.
Figure 5:
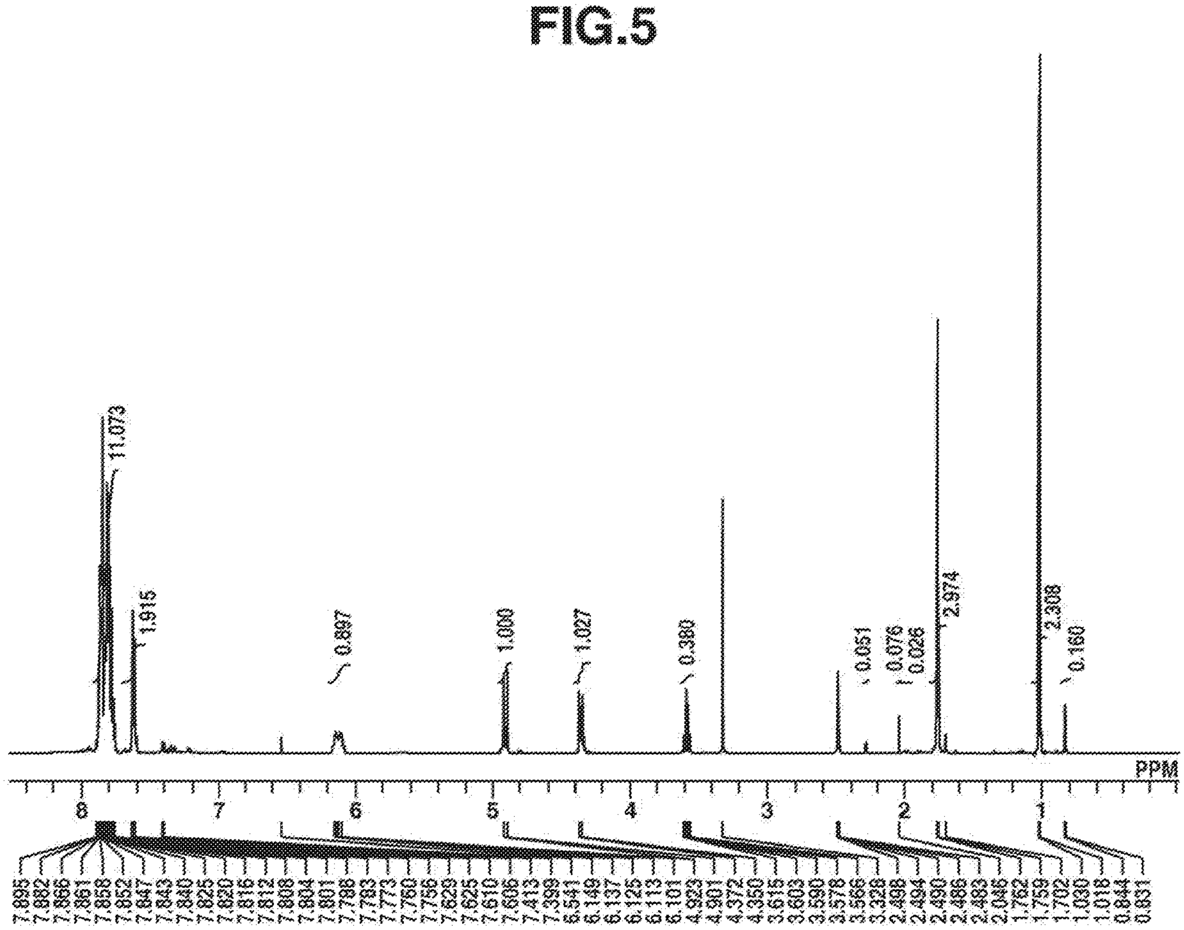
FIG. 5 is a diagram showing the $^1$H-NMR spectrum of PAG-5 in Synthesis Example 1-5-3.

PAG-4 was analyzed by IR spectroscopy and LC-MS, with the data shown below. FIG. 4 is the $^{1}$H-NMR/DMSO-$d_6$ spectrum of PAG-4.

IR (D-ATR): ν=3488, 3096, 2961, 2873, 1589, 1494, 1454, 1399, 1315, 1261, 1236, 1172, 1135, 1115, 1073, 1032, 1009, 989, 935, 834, 778, 712, 678, 651, 636, 620, 591, 573, 545, 524 $cm^{-1}$

LC-MS: positive $[M+H]^+$ 665

Synthesis Example 1-5

Synthesis of PAG-5

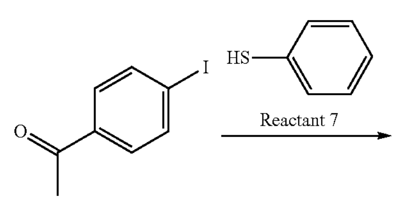

Reactant 1

-continued

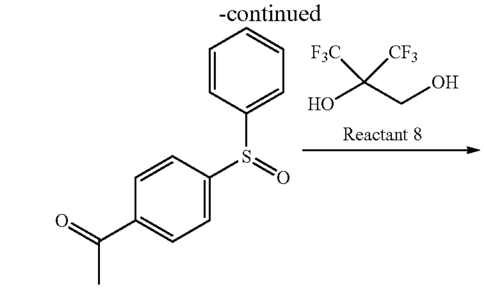

Intermediate 8

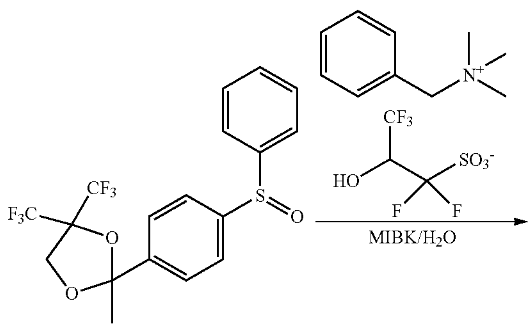

Intermediate 9

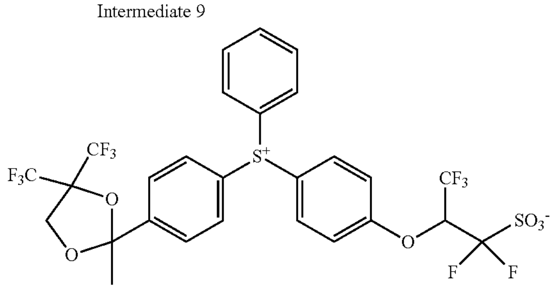

PAG-5

Synthesis Example 1-5-1

Synthesis of Intermediate 8

Intermediate 8 was obtained by the same procedure as in Synthesis Examples 1-1-1 to 1-1-2 aside from using Reactant 7 instead of Reactant 2.

Synthesis Example 1-5-2

Synthesis of Intermediate 9

Intermediate 9 was obtained by the same procedure as in Synthesis Example 1-1-3 aside from using Reactant 8 instead of Reactant 3.

Synthesis Example 1-5-3

Synthesis of PAG-5

PAG-5 was synthesized by the same procedure as in Synthesis Examples 1-1-4 to 1-1-6 aside from using Intermediate 9 instead of Intermediate 3, and benzyltrimethylammonium 1,1,3,3,3-pentafluoro-2-hydroxypropane-1-sulfonate instead of benzyltrimethylammonium 1,1-difluoro-2-hydroxyethane-1-sulfonate.

PAG-5 was analyzed by IR spectroscopy and LC-MS, with the data shown below. FIG. 4 is the $^{1}$H-NMR/DMSO-$d_6$ spectrum of PAG-5.

IR (D-ATR): ν=3486, 3097, 2976, 1587, 1493, 1448, 1401, 1369, 1318, 1245, 1161, 1107, 1087, 1060, 1012, 998, 913, 884, 834, 751, 741, 690, 642, 593, 553, 525 $cm^{-1}$

LC-MS: positive $[M+H]^+$ 713

Synthesis Examples 1-6 to 1-11

Synthesis of Additional Acid Generators PAG-6 to PAG-11

PAG-6

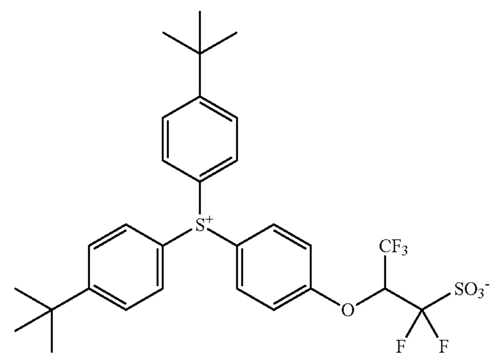

PAG-7

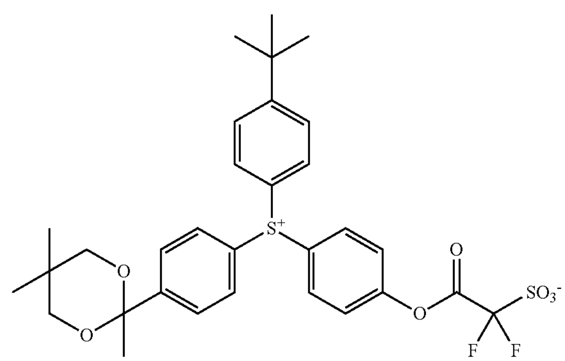

PAG-8

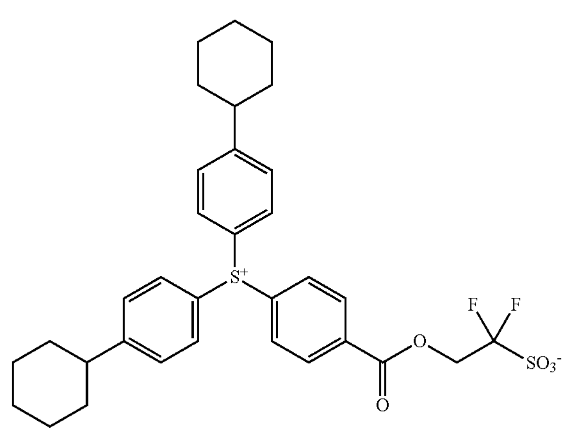

-continued

PAG-9

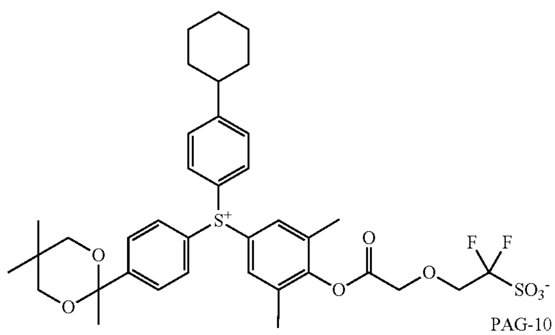

PAG-10

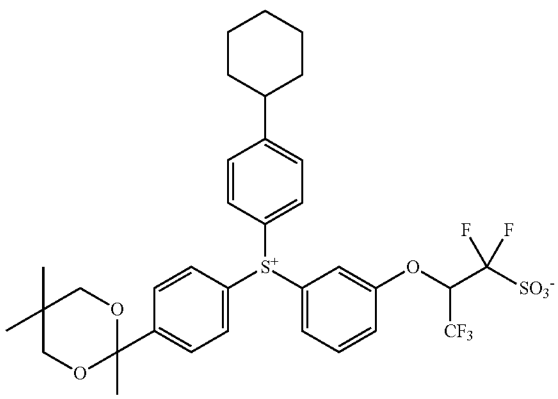

-continued

PAG-11

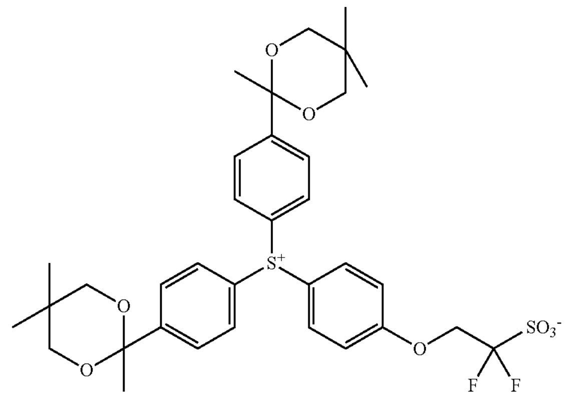

PAG-6 to PAG-11 were synthesized by well-known synthesis methods using corresponding reactants.

[2] Preparation of Resist Composition

Examples 1-1 to 1-19, Comparative Examples 1-1 to 1-7 and Reference Examples 1-1 to 1-2

Resist compositions in solution form were prepared by dissolving a betaine type onium compound (PAG-1 to PAG-11) or comparative betaine type onium compound or onium salt (PAG-A to PAG-F), base resin (P-1 or P-2), quencher (Q-1 or Q-2), and alkali-soluble surfactant (SF-1) in a solvent containing 0.01 wt % of surfactant A in accordance with the formulation shown in Tables 1 to 3, and filtering through a Teflon® filter with a pore size of 0.2 μm.

TABLE 1

| | | Resist composition | Onium compound (pbw) | Base resin (pbw) | Quencher (pbw) | Surfactant (pbw) | Solvent 1 (pbw) | Solvent 2 (pbw) |
|---|---|---|---|---|---|---|---|---|
| Example | 1-1 | R-01 | PAG-1 (80) | — | — | — | PGMEA (2,240) | DAA (960) |
| | 1-2 | R-02 | PAG-2 (80) | — | — | — | PGMEA (2,240) | DAA (960) |
| | 1-3 | R-03 | PAG-3 (80) | — | — | — | PGMEA (2,240) | DAA (960) |
| | 1-4 | R-04 | PAG-4 (80) | — | — | — | PGMEA (2,240) | DAA (960) |
| | 1-5 | R-05 | PAG-5 (80) | — | — | — | PGMEA (2,240) | DAA (960) |
| | 1-6 | R-06 | PAG-6 (80) | — | — | — | PGMEA (2,240) | DAA (960) |
| | 1-7 | R-07 | PAG-7 (80) | — | — | — | PGMEA (2,240) | DAA (960) |
| | 1-8 | R-08 | PAG-8 (80) | — | — | — | PGMEA (2,240) | DAA (960) |
| | 1-9 | R-09 | PAG-9 (80) | — | — | — | PGMEA (2,240) | DAA (960) |
| | 1-10 | R-10 | PAG-10 (80) | — | — | — | PGMEA (2,240) | DAA (960) |
| | 1-11 | R-11 | PAG-11 (80) | — | — | — | PGMEA (2,240) | DAA (960) |
| | 1-12 | R-12 | PAG-1 (40) | — | Q-1 (40) | — | PGMEA (2,240) | DAA (960) |
| | 1-13 | R-13 | PAG-2 (80) | — | Q-2 (4.5) | SF-1 (0.1) | PGMEA (2,240) | DAA (960) |
| | 1-14 | R-14 | PAG-3 (40) | — | Q-1 (40) | SF-1 (0.1) | PGMEA (2,240) | DAA (960) |
| | 1-15 | R-15 | PAG-7 (80) | — | Q-2 (4.5) | — | PGMEA (2,240) | DAA (960) |
| | 1-16 | R-16 | PAG-8 (40) | — | Q-1 (40) | SF-1 (0.1) | PGMEA (2,240) | DAA (960) |
| | 1-17 | R-17 | PAG-9 (40) | — | Q-1 (40) | — | PGMEA (2,240) | DAA (960) |

TABLE 1-continued

| | Resist composition | Onium compound (pbw) | Base resin (pbw) | Quencher (pbw) | Surfactant (pbw) | Solvent 1 (pbw) | Solvent 2 (pbw) |
|---|---|---|---|---|---|---|---|
| 1-18 | R-18 | PAG-10 (40) | — | Q-1 (40) | SF-1 (0.1) | PGMEA (2,240) | DAA (960) |
| 1-19 | R-19 | PAG-11 (80) | — | Q-2 (4.5) | SF-1 (0.1) | PGMEA (2,240) | DAA (960) |

TABLE 2

| | Resist composition | Onium compound (pbw) | Base resin (pbw) | Quencher (pbw) | Surfactant (pbw) | Solvent 1 (pbw) | Solvent 2 (pbw) |
|---|---|---|---|---|---|---|---|
| Comparative Example 1-1 | R-20 | PAG-A (80) | — | — | — | PGMEA (2,240) | DAA (960) |
| 1-2 | R-21 | PAG-B (80) | — | — | — | PGMEA (2,240) | DAA (960) |
| 1-3 | R-22 | PAG-C (80) | — | — | — | PGMEA (2,240) | DAA (960) |
| 1-4 | R-23 | PAG-D (80) | — | — | — | PGMEA (2,240) | DAA (960) |
| 1-5 | R-24 | PAG-E (80) | — | — | — | PGMEA (2,240) | DAA (960) |
| 1-6 | R-25 | PAG-F (80) | — | — | — | PGMEA (2,240) | DAA (960) |
| 1-7 | R-26 | PAG-F (10) | P-1 (80) | Q-1 (3.5) | SF-1 (0.1) | PGMEA (2,436) | DAA (1,044) |

TABLE 3

| | Resist composition | Onium compound (pbw) | Base resin (pbw) | Quencher (pbw) | Surfactant (pbw) | Solvent 1 (pbw) | Solvent 2 (pbw) |
|---|---|---|---|---|---|---|---|
| Reference Example 1-1 | R-27 | PAG-2 (10) | P-1 (80) | Q-1 (3.5) | SF-1 (0.1) | PGMEA (2,436) | DAA (1,044) |
| 1-2 | R-28 | PAG-2 (10) | P-2 (80) | Q-2 (4.5) | SF-1 (0.1) | PGMEA (2,436) | DAA (1,044) |

The solvents, comparative betaine type onium compounds or onium salts PAG-A to PAG-F, base resins P-1 and P-2, quenchers Q-1 and Q-2, alkali-soluble surfactant SF-1, and surfactant A in Tables 1 to 3 are identified below.

Solvent:

PGMEA (propylene glycol monomethyl ether acetate)

DAA (diacetone alcohol)

Comparative Betaine Type Onium Compounds or Onium Salts: PAG-A to PAG-F

PAG-A

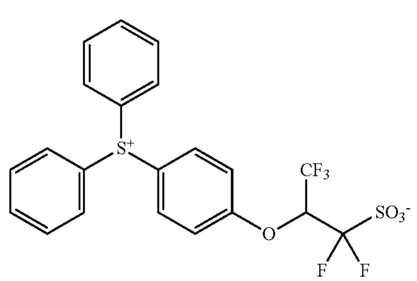

-continued

PAG-B

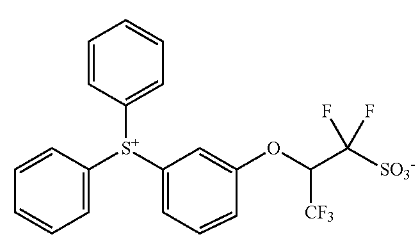

PAG-C

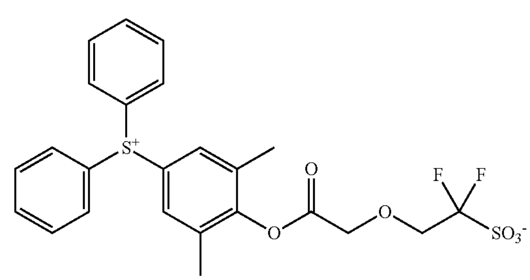

-continued
PAG-D
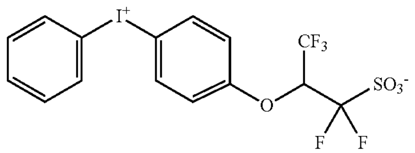
PAG-E
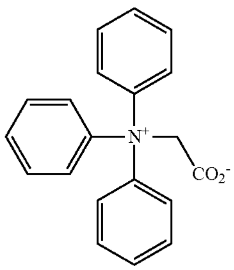
PAG-F
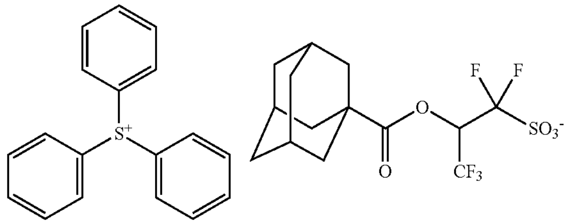
Base Resins: P-1 and P-2
P-1
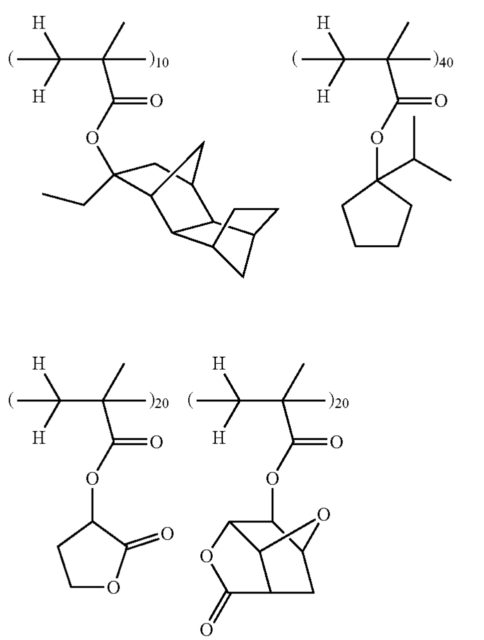
-continued
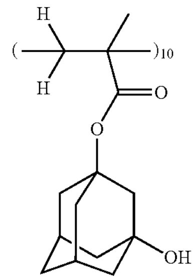
Mw = 8,100
Mw/Mn = 1.73
P-2
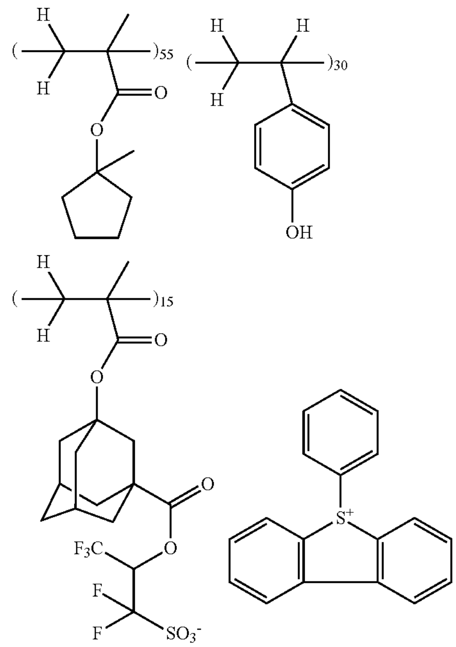
Mw = 11,400
Mw/Mn = 2.07
Quenchers: Q-1 and Q-2
Q-1
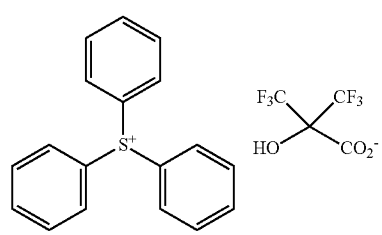
Q-2
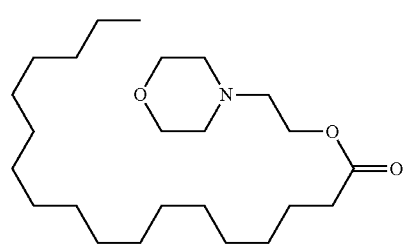

Alkali-Soluble Surfactant SF-1:

poly(2,2,3,3,4,4,4-heptafluoro-1-isobutyl-1-butyl methacrylate/9-(2,2,2-trifluoro-1-trifluoroethyloxycarbonyl)-4-oxatricyclo[4.2.1.$0^{3,7}$]nonan-5-on-2-yl methacrylate)

Mw=7,700

Mw/Mn=1.82

SF-1

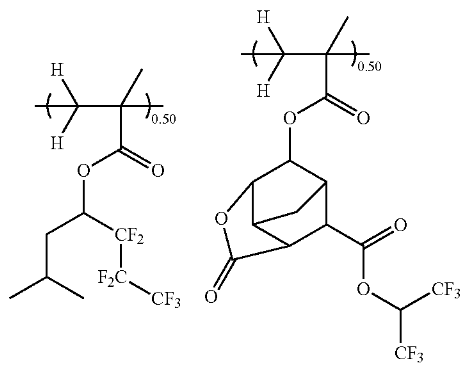

Surfactant A:

3-methyl-3-(2,2,2-trifluoroethoxymethyl)oxetane/tetrahydrofuran/2,2-dimethyl-1,3-propane diol copolymer (Omnova Solutions, Inc.)

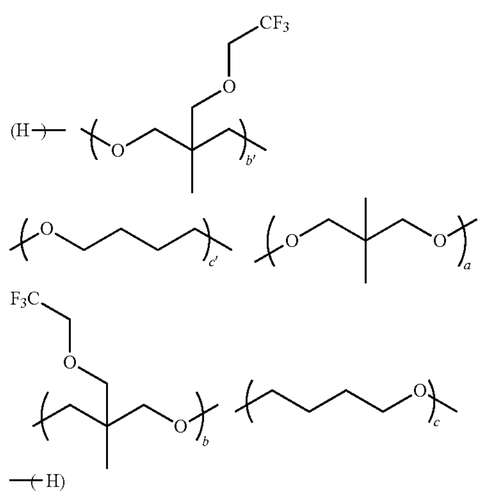

a:(b+b'):(c+c')=1:4-7:0.01-1 (molar ratio)

Mw=1,500

[3] Resist Composition Evaluation #1: Casting Solution Dissolution Test

Examples 2-1 to 2-2 and Comparative Examples 2-1 to 2-2

In a 50-mL vial, 80 parts by weight of each onium compound (PAG-1, PAG-2, PAG-A, PAG-B) was dissolved in 960 parts by weight of DAA, after which 2,240 parts by weight of PGMEA was added. Using a magnetic stirrer, the mixture was stirred at 23° C. for 24 hours, obtaining a resist composition (R-01, R-02, R-20, R-21). The liquid in the vial was visually observed to evaluate solubility. It was rated "good" when the compound was fully dissolved in the solvents and "poor" when the liquid looked white turbid. The results are shown in Table 4.

TABLE 4

| | | Resist composition | Onium compound | Solubility |
|---|---|---|---|---|
| Example | 2-1 | R-01 | PAG-1 | good |
| | 2-2 | R-02 | PAG-2 | good |
| Comparative Example | 2-1 | R-20 | PAG-A | poor |
| | 2-2 | R-21 | PAG-B | poor |

As seen from Table 4, the onium compounds used in resist compositions of Examples are fully soluble in solvents, demonstrating that molecular resist compositions are constructed using the onium compounds.

[4] Resist Composition Evaluation #2: Film Forming Test

Examples 3-1 to 3-3 and Comparative Examples 3-1 to 3-2

A silicon substrate having a diameter of 8 inches was primed with hexamethyldisilazane (HMDS). Using a coater/developer system Clean Track ACT™ 8 (Tokyo Electron Ltd.), each of the resist compositions (R-03, R-04, R-05, R-22, R-25) was spin coated onto the substrate at 1,500 rpm, pre-baked on a hotplate at 100° C. for 60 seconds, and cooled at 23° C. for 30 seconds. A resist film on the substrate was visually observed. The film formation was rated "good" when a resist film was confirmed and "poor" when striae or pinholes were observed. Thereafter, using an ellipsometer Atlas XP+(Nanometrics Inc.), the thickness of the resist film on the silicon substrate was measured at 29 points which were equally spaced apart in X axis direction, to evaluate a variation of film thickness. The results are shown in Table 5.

TABLE 5

| | | Resist composition | Film formation | Variation of film thickness (nm) |
|---|---|---|---|---|
| Example | 3-1 | R-03 | good | 1.1 |
| | 3-2 | R-04 | good | 1.0 |
| | 3-3 | R-05 | good | 0.9 |
| Comparative Example | 3-1 | R-22 | poor | — |
| | 3-2 | R-25 | poor | — |

As seen from Table 5, the onium compounds used in resist compositions of Examples are effective for forming a film with a minimal variation of thickness, indicating that the film functions as a resist film for micropatterning.

[5] Resist Composition Evaluation #3: Developer Dissolution Test

Examples 4-1 to 4-6 and Comparative Example 4-1

Using a coater/developer system Clean Track ACT™ 8 (Tokyo Electron Ltd.), each of the resist compositions (R-06 to R-11, R-23) was spin coated onto a HMDS-primed silicon substrate of 8 inches at 1,500 rpm, and pre-baked on a hotplate at 100° C. for 60 seconds to form a resist film of 50 nm thick. Thereafter, the resist film was puddle developed in 2.38 wt % TMAH aqueous solution for 30 seconds, rinsed with deionized water, and spin dried. Using an ellipsometer Atlas XP+ (Nanometrics Inc.), the thickness of the resist film on the silicon substrate was measured, with the results shown in Table 6.

TABLE 6

| | | Resist composition | Film thickness as developed (nm) |
|---|---|---|---|
| Example | 4-1 | R-06 | 49.8 |
| | 4-2 | R-07 | 49.3 |
| | 4-3 | R-08 | 49.5 |
| | 4-4 | R-09 | 49.3 |
| | 4-5 | R-10 | 49.1 |
| | 4-6 | R-11 | 49.5 |
| Comparative Example | 4-1 | R-23 | 0 |

As seen from Table 6, the unexposed regions of the resist compositions of Examples have a low dissolution rate in the alkaline developer. It is demonstrated that the resist compositions of Examples behave as positive tone resist relative to the alkaline developer.

[6] Resist Composition Evaluation #4: Evaluation of Contrast Curve

Examples 5-1 to 5-13 and Comparative Example 5-1

An antireflective coating solution DUV-42 (Nissan Chemical Industries, Ltd.) was coated onto a silicon substrate and baked at 200° C. for 60 seconds to form an antireflective coating of 61 nm thick thereon. Each of the resist compositions (R-1 to R-19, R-24) was spin coated on the ARC, and baked on a hotplate at 100° C. for 60 seconds to form a resist film of 50 nm thick. By means of KrF excimer laser scanner NSR-S206D (Nikon Corp., NA=0.86, conventional illumination), the resist film was subjected to open-frame exposure in a dose varying from 1 mJ/cm$^2$ to 200 mJ/cm$^2$ at a pitch of 1 mJ/cm$^2$. The resist film was baked (PEB) at the temperature shown in Table 7 for 60 seconds, puddle developed in a 2.38 wt % TMAH aqueous solution for 30 seconds, rinsed with deionized water, and spin dried. Using a spectroscopic film thickness measurement system VM-2200 (Screen Semiconductor Solutions Co., Ltd.), the resist film after development was measured for thickness in the regions subject to different doses. $E_0$ is the dose providing a film thickness of 0. The slope of exposed regions where the film thickness varied from 10 nm to 40 nm was determined and reported as contrast. The results are shown in Table 7.

TABLE 7

| | | Resist composition | PEB temp. (° C.) | $E_0$ (mJ/cm$^2$) | Contrast |
|---|---|---|---|---|---|
| Example | 5-1 | R-01 | 100 | 23 | 0.8 |
| | 5-2 | R-02 | 100 | 20 | 0.8 |
| | 5-3 | R-02 | 60 | 38 | 0.6 |
| | 5-4 | R-02 | 23 | 54 | 0.5 |
| | 5-5 | R-03 | 100 | 40 | 0.5 |
| | 5-6 | R-12 | 100 | 96 | 1.1 |
| | 5-7 | R-13 | 100 | 42 | 0.5 |
| | 5-8 | R-14 | 100 | 106 | 0.6 |
| | 5-9 | R-15 | 100 | 50 | 0.4 |
| | 5-10 | R-16 | 100 | 88 | 0.3 |
| | 5-11 | R-17 | 100 | 115 | 0.8 |
| | 5-12 | R-18 | 100 | 90 | 0.9 |
| | 5-13 | R-19 | 100 | 49 | 0.5 |
| Comparative Example | 5-1 | R-24 | 100 | — | — |

As seen from Table 7, the resist compositions within the scope of the invention have a practically acceptable sensitivity and contrast.

[7] Resist Composition Evaluation #5: EB Writing Test

Example 6-1, Comparative Example 6-1 and Reference Examples 2-1 to 2-2

An antireflective coating solution DUV-42 (Nissan Chemical Industries, Ltd.) was coated onto a silicon substrate and baked at 200° C. for 60 seconds to form an antireflective coating of 61 nm thick thereon. Each of the resist compositions (R-02, R-26, R-27, R-28) was spin coated on the ARC, and baked on a hotplate at 100° C. for 60 seconds to form a resist film of 50 nm thick. Using an EB lithography system ELS-F125 (Elionix Co., Ltd., accelerating voltage 125 kV), the resist film was exposed to EB so as to write a line-and-space pattern with a size 100 nm and a pitch 200 nm (on-wafer size) while varying the dose from 50 μC/cm$^2$ at a step of 5 μC/cm$^2$. After exposure, the resist film was baked (PEB) at the temperature shown in Table 8 for 60 seconds. The resist film was then puddle developed in a 2.38 wt % TMAH aqueous solution for 30 seconds, rinsed with deionized water and spin dried, yielding a positive pattern. The pattern after development was observed under an electron microscope CD-SEM S-9380 (Hitachi High-Technologies Corp.). Sensitivity and LWR were evaluated by the following methods. The results are shown in Table 8.

Evaluation of Sensitivity

As an index of sensitivity, the optimum dose Eop (μC/cm$^2$) which provided a L/S pattern with a line width of 100 nm and a pitch of 200 nm was determined. A smaller value indicates a higher sensitivity.

Evaluation of LWR

For the L/S pattern formed by exposure in the optimum dose Eop, the line width was measured at longitudinally spaced apart 10 points, from which a 3-fold value (36) of standard deviation (6) was determined and reported as LWR. A smaller value of 36 indicates a pattern having a lower roughness and more uniform line width.

TABLE 8

| | | Resist composition | PEB temp. (° C.) | Eop (μC/cm$^2$) | LWR (nm) |
|---|---|---|---|---|---|
| Example | 6-1 | R-02 | 60 | 350 | 4.3 |
| Comparative Example | 6-1 | R-26 | 100 | 150 | 5.6 |
| Reference Example | 2-1 | R-27 | 100 | 170 | 4.9 |
| | 2-2 | R-28 | 105 | 160 | 4.7 |

As seen from Table 8, the molecular resist compositions comprising the onium compounds within the scope of the invention are improved in LWR and thus suited as resist materials for EB and EUV lithography processes.

Japanese Patent Application No. 2019-098585 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A molecular resist composition comprising:

(A) a betaine type onium compound having a sulfonium cation moiety and a sulfonate anion moiety in a common molecule, the sulfonium cation moiety having a sulfur atom and a phenyl group substituted with an acid labile group of acetal form having the following formula (A'), the phenyl group being attached to the sulfur atom, and (B) an organic solvent, the resist composition being free of a base resin, (A')

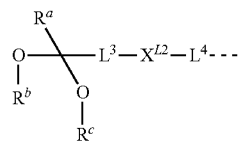

wherein $L^3$ and $L^4$ are each independently a single bond, ether bond, ester bond, sulfonate bond, carbonate bond or carbamate bond, $X^{L2}$ is a single bond or a $C_1$-$C_{40}$ divalent hydrocarbon group which may contain a heteroatom, $R^a$ is hydrogen or a $C_1$-$C_{20}$ monovalent hydrocarbon group which may contain a heteroatom, $R^b$ and $R^c$ are each independently a $C_1$-$C_{40}$ monovalent hydrocarbon group which may contain a heteroatom, $R^b$ and $R^c$ may bond together to form a ring with the oxygen atoms to which they are attached and the intervening carbon atom.

2. The molecular resist composition of claim 1 wherein the betaine type onium compound has the formula (A):

(A)

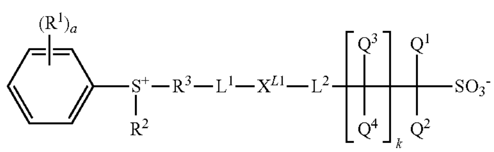

wherein a is an integer of 1 to 5, k is an integer of 0 to 3, $Q^1$ and $Q^2$ are each independently fluorine or a $C_1$-$C_6$ fluoroalkyl group, $Q^3$ and $Q^4$ are each independently hydrogen, fluorine or a $C_1$-$C_6$ fluoroalkyl group, $L^1$ and $L^2$ are each independently a single bond, ether bond, ester bond, sulfonate bond, carbonate bond, or carbamate bond, $X^{L1}$ is a single bond or a $C_1$-$C_{40}$ divalent hydrocarbon group which may contain a heteroatom, $R^1$ is an acid labile group of acetal form having the formula (A'), in case of a ≥2, $R^1$ may be identical or different and two $R^1$ may bond together to form a ring with the atoms to which they are attached, $R^2$ is a $C_1$-$C_{50}$ monovalent hydrocarbon group which may contain a heteroatom, $R^3$ is a $C_1$-$C_{50}$ divalent hydrocarbon group which may contain a heteroatom, any two of the phenyl group to which $R^1$ is attached, $R^2$, and $R^3$ may bond together to form a ring with the sulfur atom to which they are attached.

3. The molecular resist composition of claim 2 wherein the betaine type onium compound has the formula (A-1):

(A-1)

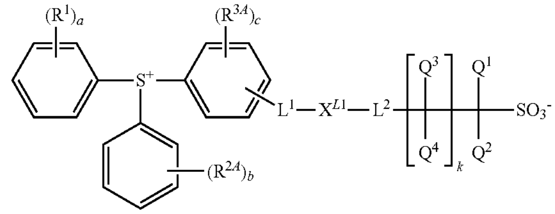

wherein a, k, $Q^1$ to $Q^4$, $L^1$, $L^2$, $X^{L1}$, and $R^1$ are as defined above, $R^{2A}$ and $R^{3A}$ are each independently a $C_1$-$C_{40}$ monovalent hydrocarbon group which may contain a heteroatom, b is an integer of 0 to 5, c is an integer of 0 to 4, in case of b ≥2, $R^{2A}$ may be identical or different and two $R^{2A}$ may bond together to form a ring with the atoms to which they are attached, in case of c≥2, $R^{3A}$ may be identical or different and two $R^{3A}$ may bond together to form a ring with the atoms to which they are attached.

4. The molecular resist composition of claim 3 wherein the betaine type onium compound has the formula (A-2):

(A-2)

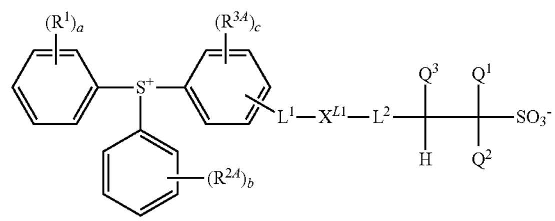

wherein a, b, c, $Q^1$ to $Q^3$, $L^1$, $L^2$, $X^{L1}$, $R^1$, $R^{2A}$, and $R^{3A}$ are as defined above.

5. The molecular resist composition of claim 1, further comprising (C) a surfactant.

6. The molecular resist composition of claim 1, further comprising (D) a quencher.

7. A pattern forming process comprising the steps of applying the molecular resist composition of claim 1 onto a substrate to form a resist film thereon, exposing the resist film to high-energy radiation, and developing the exposed resist film in a developer.

8. The process of claim 7 wherein the high-energy radiation is i-line, KrF excimer laser, ArF excimer laser, EB, or EUV of wavelength 3 to 15 nm.

9. The molecular resist composition of claim 2 wherein the acid labile group of acetal form is selected from the group consisting of the following formulae:

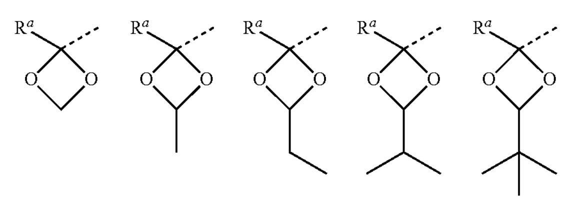

-continued
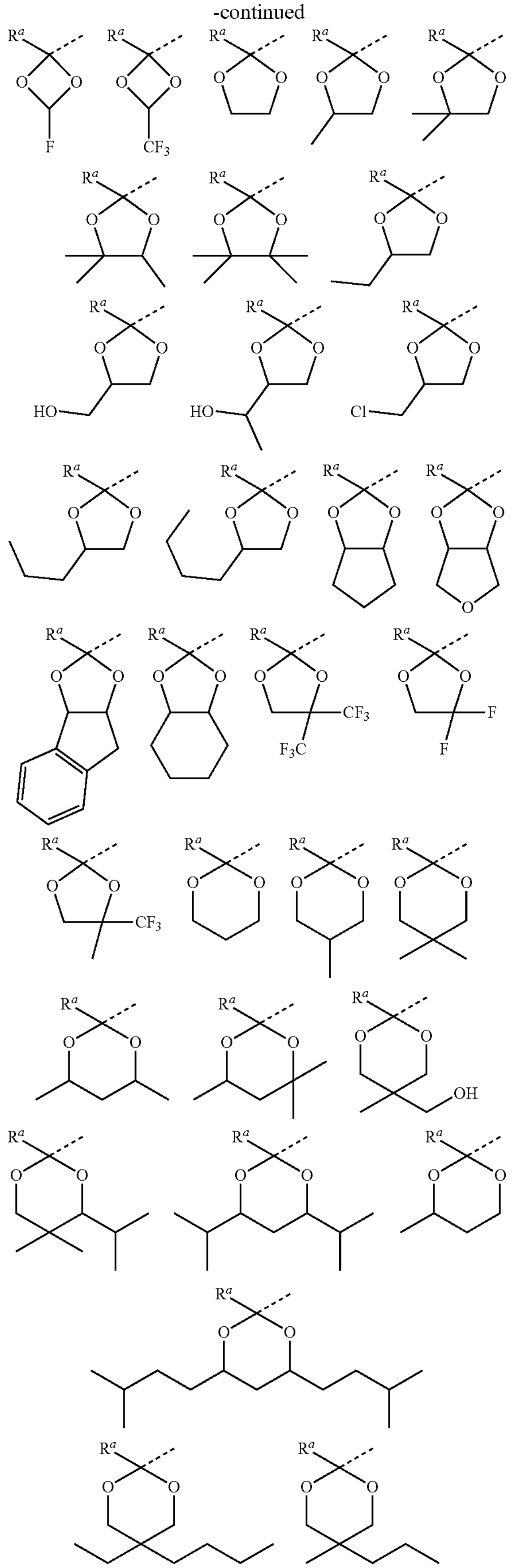
-continued
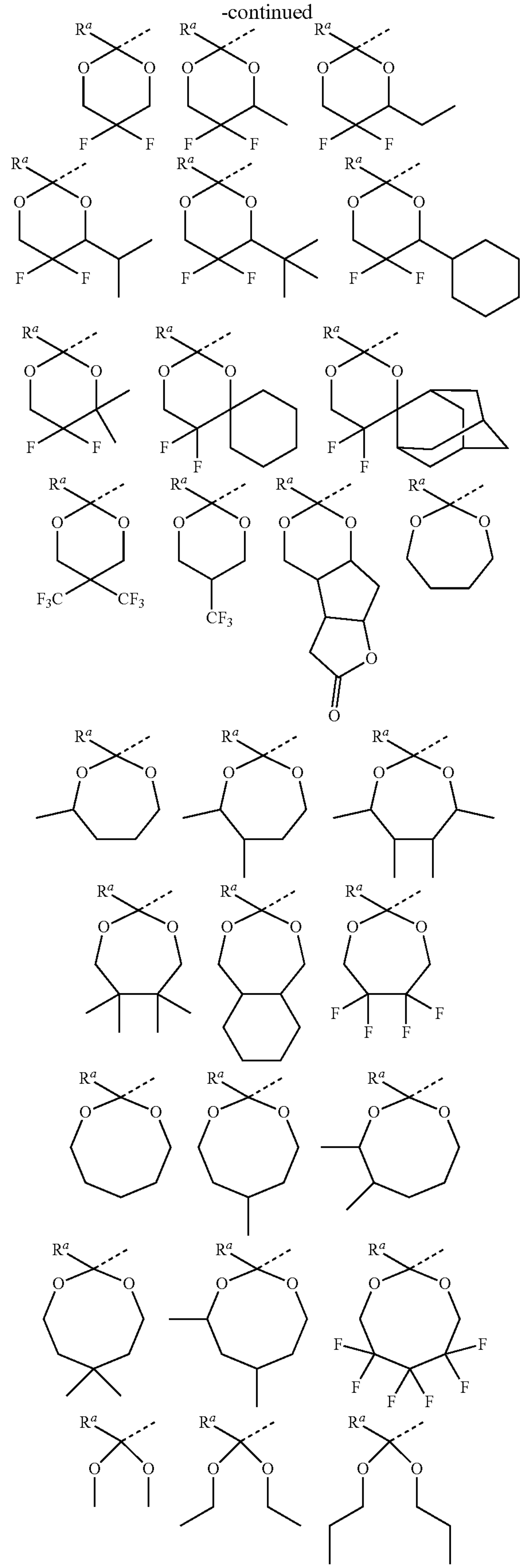

-continued
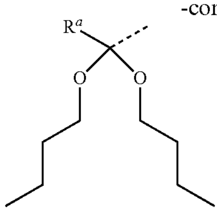
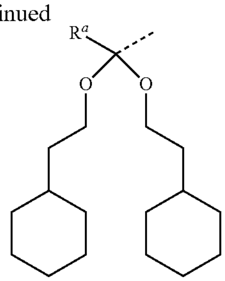
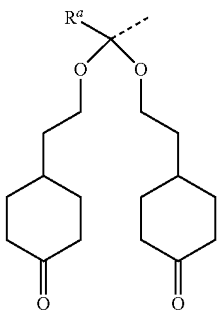
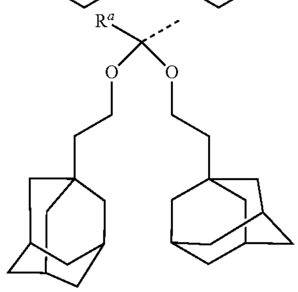
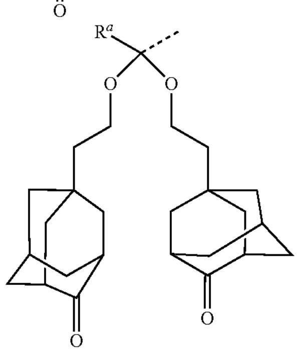
-continued
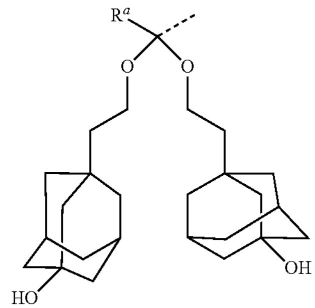
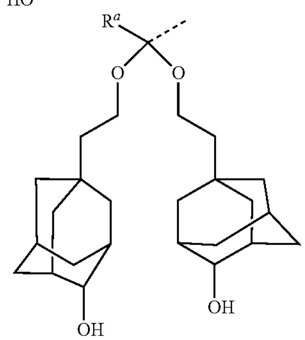
wherein $R^a$ is as defined above.
10. The molecular resist composition of claim 1 wherein $R^b$ and $R^c$ bond together to form a ring with the oxygen atoms to which they are attached and the intervening carbon atom.
* * * * *